US012261080B2

(12) United States Patent
Tirukkonda et al.

(10) Patent No.: US 12,261,080 B2
(45) Date of Patent: Mar. 25, 2025

(54) METHOD OF MAKING A THREE-DIMENSIONAL MEMORY DEVICE USING COMPOSITE HARD MASKS FOR FORMATION OF DEEP VIA OPENINGS

(71) Applicant: SANDISK TECHNOLOGIES LLC, Addison, TX (US)

(72) Inventors: Roshan Jayakhar Tirukkonda, Milpitas, CA (US); Monica Titus, Santa Clara, CA (US); Senaka Kanakamedala, San Jose, CA (US); Raghuveer S. Makala, Campbell, CA (US); Rahul Sharangpani, Fremont, CA (US); Adarsh Rajashekhar, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 454 days.

(21) Appl. No.: 17/657,521

(22) Filed: Mar. 31, 2022

(65) Prior Publication Data

US 2022/0223470 A1 Jul. 14, 2022

Related U.S. Application Data

(63) Continuation-in-part of application No. 17/590,278, filed on Feb. 1, 2022, which is a continuation-in-part (Continued)

(51) Int. Cl.
*H01L 21/768* (2006.01)
*H01L 21/306* (2006.01)

(52) U.S. Cl.
CPC .. *H01L 21/76831* (2013.01); *H01L 21/30608* (2013.01)

(58) Field of Classification Search
CPC ............ H01L 23/5385; H01L 23/3675; H01L 23/5384; H01L 23/5386; H01L 21/4853; H01L 21/4857; H01L 21/486; H01L 21/565; H01L 21/568; H01L 21/6835; H01L 24/16; H01L 24/81; H01L 24/32;

(Continued)

(56) References Cited

U.S. PATENT DOCUMENTS 8,492,824 B2 7/2013 Yahashi
8,614,126 B1 12/2013 Lee et al.

(Continued)

OTHER PUBLICATIONS

USPTO Office Communication, Notice of Allowance and Fee(s) Due for U.S. Appl. No. 17/355,955, mailed on Dec. 28, 2023, 15 pages.

(Continued)

*Primary Examiner* — Tu-Tu V Ho
(74) *Attorney, Agent, or Firm* — THE MARBURY LAW GROUP PLLC

(57) ABSTRACT

A method of forming a structure includes forming an alternating stack of first material layers and second material layers over a substrate, forming a mask layer over the alternating stack, forming a cavity in the mask layer, forming a first cladding liner on a sidewall of the cavity in the mask layer, and forming a via opening the alternating stack by performing an anisotropic etch process that transfers a pattern of the cavity in the mask layer through the alternating stack using a combination of the first cladding liner and the mask layer as an etch mask.

20 Claims, 131 Drawing Sheets

Related U.S. Application Data of application No. 17/508,036, filed on Oct. 22, 2021, which is a continuation-in-part of application No. 17/494,114, filed on Oct. 5, 2021, which is a continuation-in-part of application No. 17/355,955, filed on Jun. 23, 2021, now Pat. No. 11,972,954, which is a continuation-in-part of application No. 17/136,471, filed on Dec. 29, 2020, now Pat. No. 12,010,841.

(58) Field of Classification Search
CPC ..... H01L 24/73; H01L 25/0655; H01L 25/18; H01L 2221/68345; H01L 2221/68359; H01L 2224/16227; H01L 2224/32225; H01L 2224/73204; H01L 2224/81005
USPC ........................................... 257/668; 438/637
See application file for complete search history.

(56) References Cited

U.S. PATENT DOCUMENTS

| | | | |
|---|---|---|---|
| 9,093,480 | B2 | 7/2015 | Makala et al. |
| 9,099,496 | B2 | 8/2015 | Tian et al. |
| 9,331,094 | B2 | 5/2016 | Hada |
| 9,379,124 | B2 | 6/2016 | Sharangpani et al. |
| 9,496,419 | B2 | 11/2016 | Sharangpani et al. |
| 9,524,976 | B2 | 12/2016 | Pachamuthu et al. |
| 9,530,787 | B2 | 12/2016 | Tsutsumi et al. |
| 9,530,788 | B2 | 12/2016 | Oginoe et al. |
| 9,548,313 | B2 | 1/2017 | Yada et al. |
| 9,570,460 | B2 | 2/2017 | Kanakamedala et al. |
| 9,666,590 | B2 | 5/2017 | Chien et al. |
| 9,768,270 | B2 | 9/2017 | Gunji-Yoneoka et al. |
| 9,806,090 | B2 | 10/2017 | Sharangpani et al. |
| 9,985,098 | B2 | 5/2018 | Matsumoto et al. |
| 9,991,280 | B2 | 6/2018 | Nakamura et al. |
| 10,008,570 | B2 | 6/2018 | Yu et al. |
| 10,020,363 | B2 | 7/2018 | Ogawa et al. |
| 10,056,399 | B2 | 8/2018 | Costa et al. |
| 10,199,359 | B1 | 2/2019 | Sakakibara et al. |
| 10,224,340 | B2 | 3/2019 | Hada et al. |
| 10,381,443 | B2 | 8/2019 | Matsumoto et al. |
| 10,403,500 | B2 | 9/2019 | Lee |
| 10,438,964 | B2 | 10/2019 | Makala et al. |
| 11,018,152 | B2 | 5/2021 | Hinoue et al. |
| 11,101,284 | B2 | 8/2021 | Pachamuthu et al. |
| 2011/0287612 | A1 | 11/2011 | Lee et al. |
| 2015/0076580 | A1 | 3/2015 | Pachamuthu et al. |
| 2015/0318297 | A1 | 11/2015 | Hada |
| 2015/0348984 | A1 | 12/2015 | Yada et al. |
| 2015/0380419 | A1 | 12/2015 | Gunji-Yoneoka et al. |
| 2015/0380422 | A1 | 12/2015 | Sharangpani et al. |
| 2016/0035742 | A1 | 2/2016 | Kanakamedala et al. |
| 2016/0293617 | A1 | 10/2016 | Sharangpani et al. |
| 2017/0236835 | A1 | 8/2017 | Nakamura et al. |
| 2018/0122904 | A1 | 5/2018 | Matsumoto et al. |
| 2018/0122905 | A1 | 5/2018 | Ogawa et al. |
| 2018/0122906 | A1 | 5/2018 | Yu et al. |
| 2018/0277596 | A1 | 9/2018 | Mori |
| 2018/0331117 | A1 | 11/2018 | Titus et al. |
| 2018/0366486 | A1 | 12/2018 | Hada et al. |
| 2018/0374866 | A1 | 12/2018 | Makala et al. |
| 2019/0043830 | A1 | 2/2019 | Sakakibara et al. |
| 2020/0006080 | A1 | 1/2020 | Osawa et al. |

OTHER PUBLICATIONS

USPTO Office Communication, Non-Final Office for U.S. Appl. No. 17/136,471, mailed Oct. 3, 2023, 10 pages.

Chung, C.K. et al., "Reaction of Carbon and Silicon at High Temperature," Proceedings of the 3$^{rd}$ IEEE Int. Conf. on Nano/Micro Engineered and Molecular Systems, Jan. 6-9, 2008, Sanya, China.

Endoh et al., "Novel Ultra High Density Memory with a Stacked-Surrounding Gate Transistor (S-SGT) Structured Cell," IEDM Proc. (2001) 33-36.

Kim, D. et al., "Profile simulation of high aspect ratio contact etch," Thin Solid Films, vol. 515, No. 12, pp. 4874-4878, (Apr. 2007); https://doi.org/10.1016/j.tsf.2006.10.023.

Lee, J.K. et al., "Mechanism of Sidewall Necking and Bowing in the Plasma Etching of High Aspect-Ratio Contact Holes," *Journal of The Electrochemical Society*, vol. 157, No. 3, D142, (2010); DOI :10.1149/1.3276511.

Morel, T. et al., "Tungsten metal gate etching in $Cl_2/O_2$ inductively coupled high density plasmas," Journal of Vacuum Science & Technology B: Microelectronics and Nanometer Structures Processing, Measurement, and Phenomena, vol. 26, No. 1875, (2008); https://doi.org/10.1116/1.3002392.

Murdzek, J. A. et al., "Thermal atomic layer etching of amorphous and crystalline $Al_2O_3$ films," Journal of Vacuum Science & Technology A, vol. 39, 042602 (2021); https://doi.org/10.1116/6.0000995.

Singer, P. et al., "A New Hardmask Process, Saphira," https://ssl.semiconductor-digest.com/2014/12/a-new-hardmask-process-saphira/ visited Dec. 29, 2020.

U.S. Appl. No. 17/136,471, filed Dec. 28, 2020, SanDisk Technologies LLC.

U.S. Appl. No. 17/355,955, filed Jun. 23, 2021, SanDisk Technologies LLC.

U.S. Appl. No. 17/494,114, filed Oct. 5, 2021, SanDisk Technologies LLC.

U.S. Appl. No. 17/508,036, filed Oct. 22, 2021, SanDisk Technologies LLC.

U.S. Appl. No. 17/590,278, filed Feb. 1, 2022, SanDisk Technologies LLC.

USPTO Office Communication, Ex Parte Quayle for U.S. Appl. No. 17/508,036, mailed on Aug. 27, 2024, 17 pages.

USPTO Office Communication, Ex Parte Quayle for U.S. Appl. No. 17/590,278, mailed on Aug. 27, 2024, 17 pages.

METHOD OF MAKING A THREE-DIMENSIONAL MEMORY DEVICE USING COMPOSITE HARD MASKS FOR FORMATION OF DEEP VIA OPENINGS

RELATED APPLICATIONS

This application is a continuation-in-part (CIP) application of U.S. application Ser. No. 17/590,278 filed on Feb. 1, 2022, which is a CIP application of U.S. application Ser. No. 17/508,036 filed on Oct. 22, 2021, which is a CIP application of Ser. No. 17/494,114 filed on Oct. 5, 2021, which is a CIP application of U.S. application Ser. No. 17/355,955 filed on Jun. 23, 2021, which is a CIP application of U.S. application Ser. No. 17/136,471 filed on Dec. 29, 2020, the entire contents of which are incorporated herein by reference.

FIELD

The present disclosure relates generally to the field of semiconductor devices, and particularly to a method of making a three-dimensional memory device using composite hard masks for formation of deep via openings.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a structure includes forming an alternating stack of first material layers and second material layers over a substrate, forming a mask layer over the alternating stack, forming a cavity in the mask layer, forming a first cladding liner on a sidewall of the cavity in the mask layer, and forming a via opening the alternating stack by performing an anisotropic etch process that transfers a pattern of the cavity in the mask layer through the alternating stack using a combination of the first cladding liner and the mask layer as an etch mask.

According to an aspect of the present disclosure, a method of forming a semiconductor structure comprises forming an alternating stack of first material layers and second material layers over a substrate; forming a composite hard mask layer over the alternating stack, wherein the composite hard mask layer comprises a layer stack including a lower patterning film, a first cladding material layer overlying the lower patterning film, and an upper patterning film overlying the first cladding material layer; forming a patterned photoresist layer including openings therethrough over the composite hard mask layer; forming openings in the hard mask layer by performing a hard-mask-open anisotropic etch process that transfers a pattern of the openings in the photoresist layer through the hard mask layer; and forming via openings through the alternating stack by performing an anisotropic etch process that transfers a pattern of the openings in the composite hard mask layer through the alternating stack. The upper patterning film functions as an etch mask at least during an initial phase of the anisotropic etch process and the first cladding material layer functions as an etch mask at least during a subsequent phase of the anisotropic etch process, and the first cladding material layer has higher etch resistance than the upper patterning film and the lower patterning film during the anisotropic etch process.

According to an aspect of the present disclosure, a method of forming a semiconductor structure is provided, which comprises: forming a source-level semiconductor layer over a substrate; forming an alternating stack of first material layers and second material layers over the source-level semiconductor layer; forming a hard mask layer over the alternating stack; forming cavities in the hard mask layer; forming via openings through the alternating stack by performing an anisotropic etch process that transfers a pattern of the cavities in the hard mask layer through the alternating stack; forming a cladding liner on sidewalls of the cavities in the hard mask layer and on a top surface of the hard mask layer; and vertically extending the via openings at least through the source-level semiconductor layer by performing a second anisotropic etch process employing a combination of the cladding liner and the hard mask layer as an etch mask.

According to an aspect of the present disclosure, a method of forming a semiconductor structure comprises forming an alternating stack of first material layers and second material layers over a substrate, forming a hard mask layer over the alternating stack, applying and patterning a photoresist layer over the hard mask layer, wherein openings are formed in the photoresist layer, forming cavities in the hard mask layer, forming a cladding liner on sidewalls of the cavities in the hard mask layer, and forming via openings the alternating stack by performing an anisotropic etch process that transfers a pattern of the cavities in the hard mask layer through each layer within the alternating stack employing a combination of the cladding liner and the hard mask layer as an etch mask.

DETAILED DESCRIPTION

Figure 1:
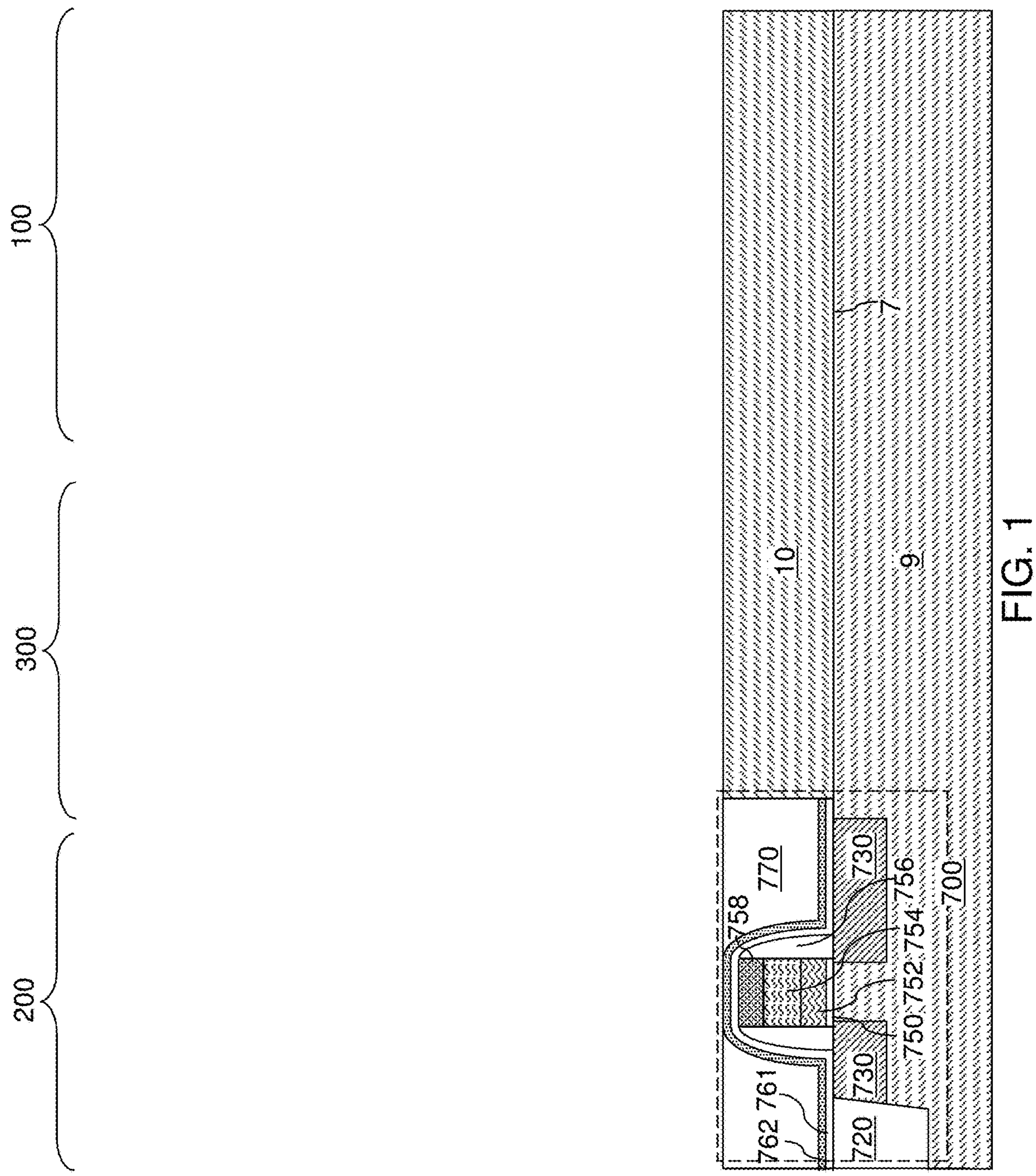
FIG. 1 is a schematic vertical cross-sectional view of a first exemplary structure after formation of at least one peripheral device, a semiconductor material layer, and a gate dielectric layer according to the first embodiment of the present disclosure.

As discussed above, the present disclosure is directed to methods of making a three-dimensional memory device using composite hard masks for formation of deep via openings, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770. The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
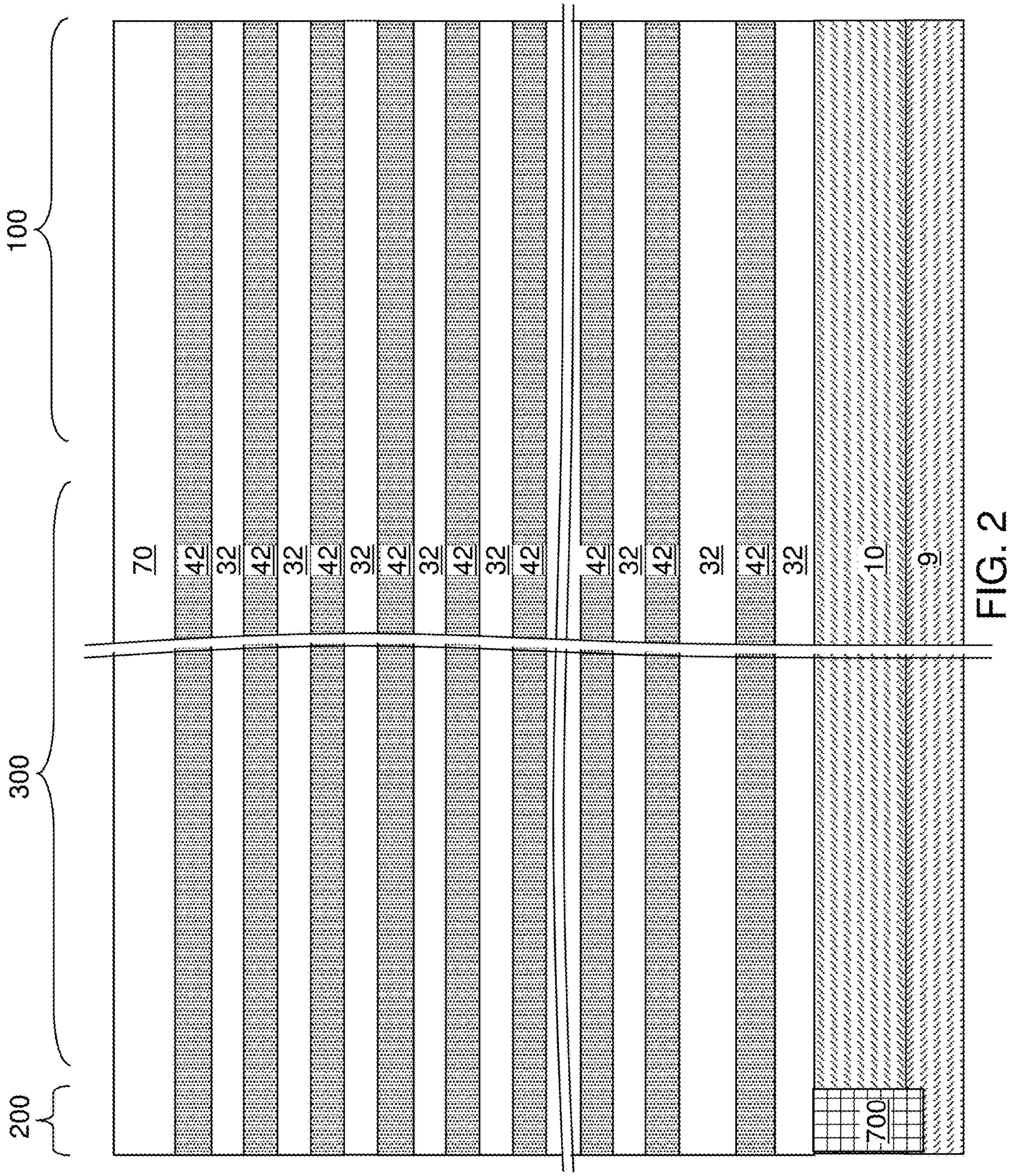
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
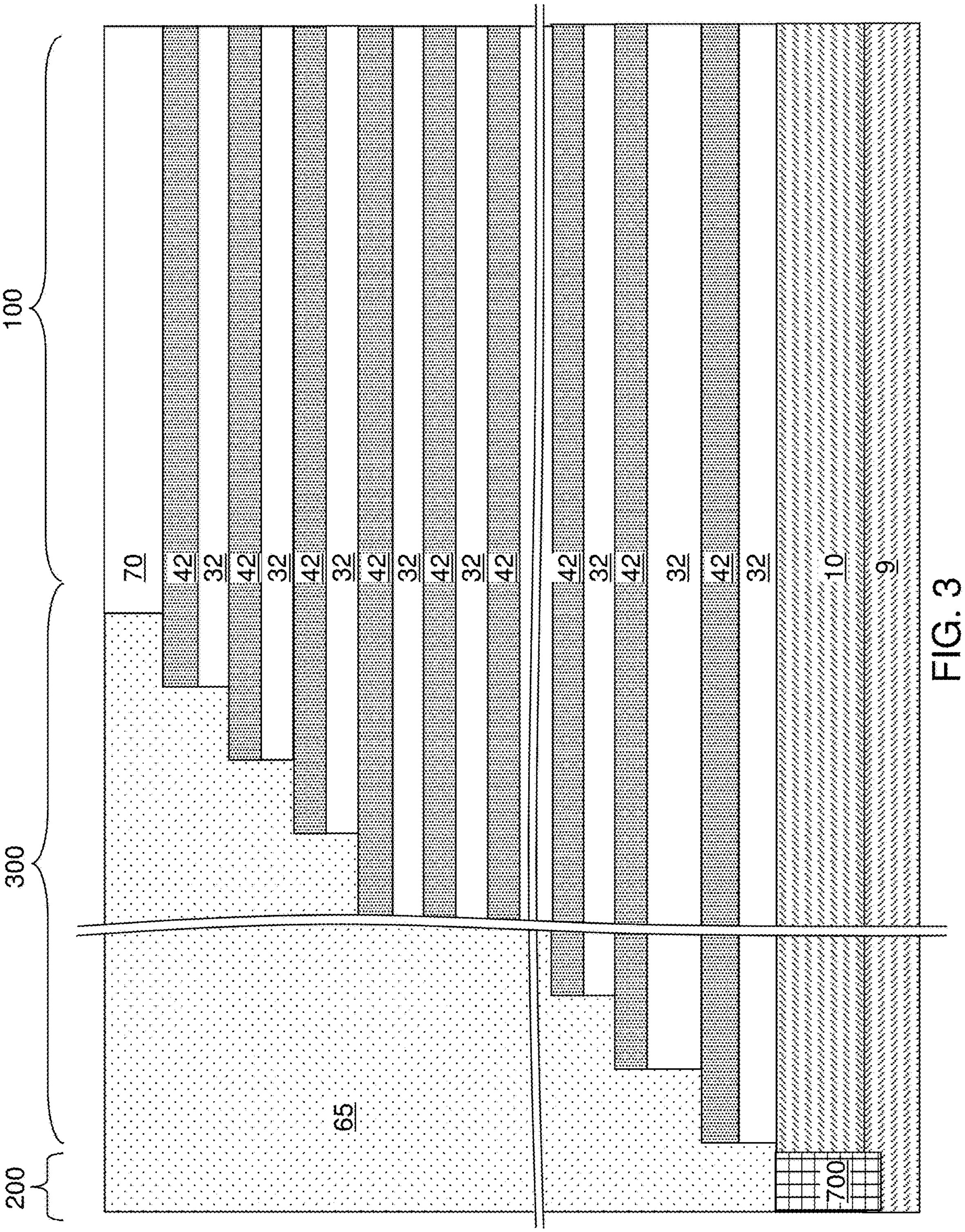
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, “stepped surfaces” refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A “stepped cavity” refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a “level” of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple “columns” of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a “retro-stepped” element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
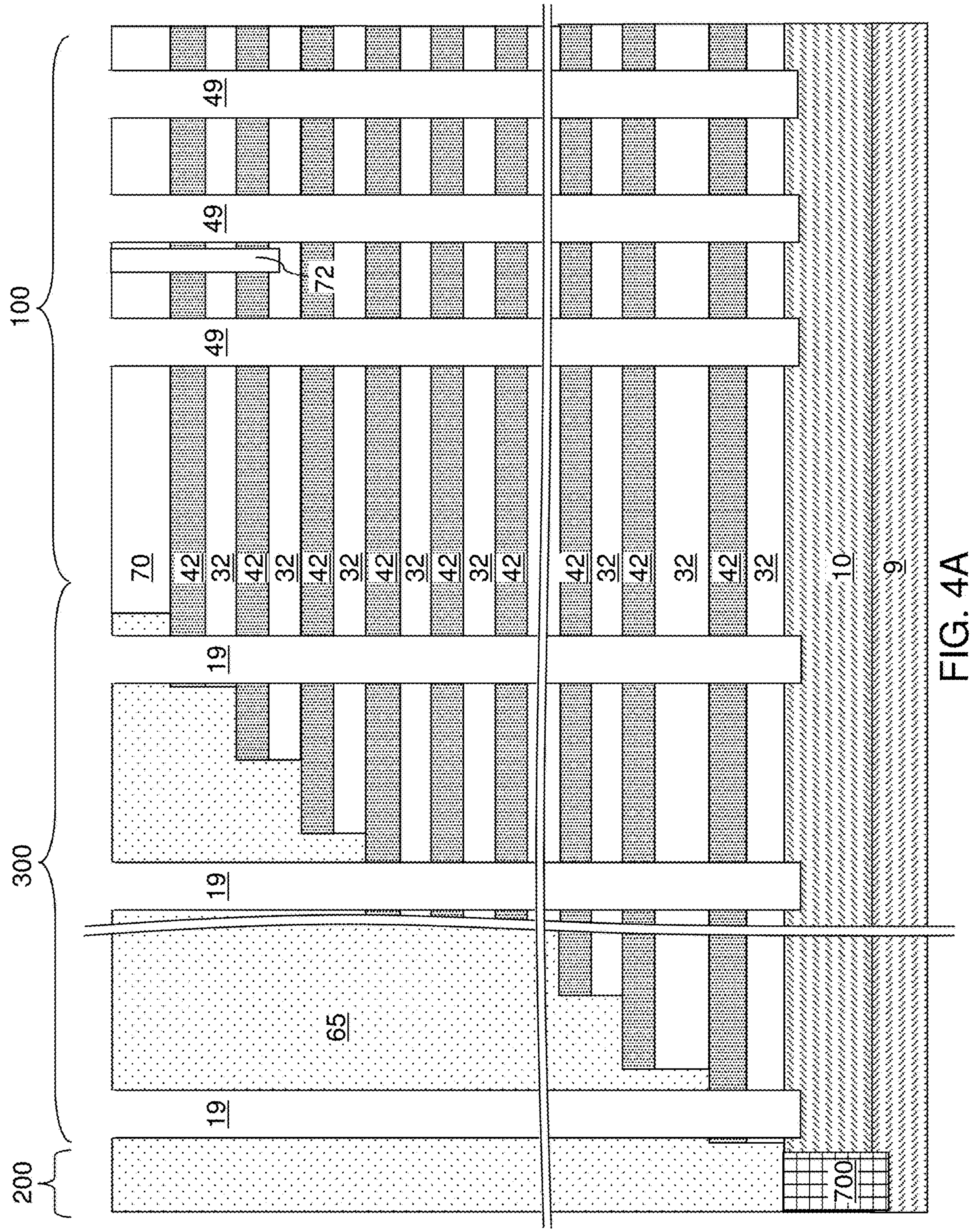
FIG. 4A is a schematic vertical cross-sectional view of the first exemplary structure after formation of memory openings and support openings according to the first embodiment of the present disclosure.
Figure 4B:
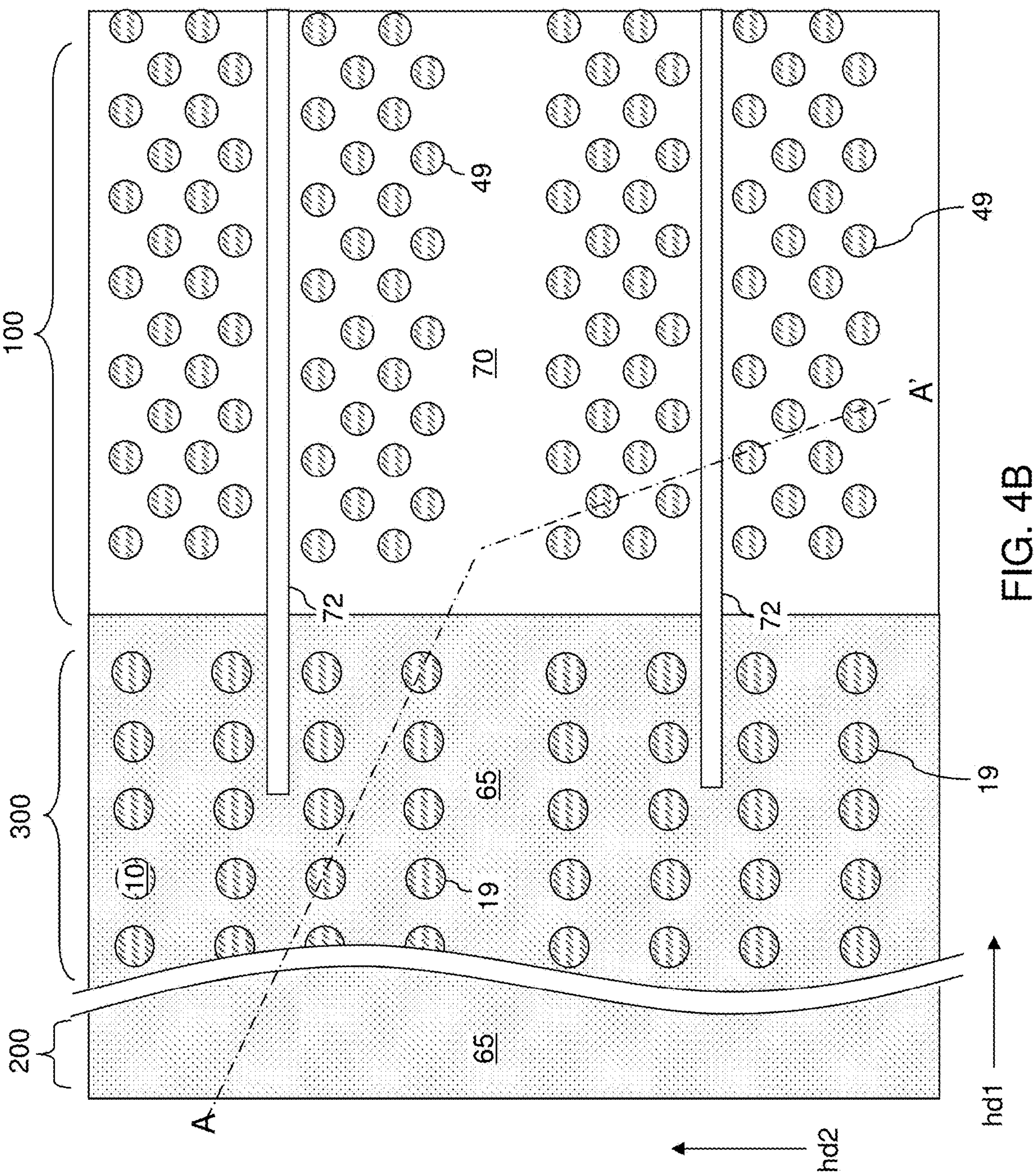
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5D are sequential vertical cross-sectional views of a region of a first configuration of the first exemplary structure during formation of the memory openings 49 according to a first embodiment of the present disclosure. In other words, the processing steps of FIGS. 5A-5D can be employed on the first exemplary structure of FIG. 3 to form the first exemplary structure of FIGS. 4A and 4B.

Figure 5D:
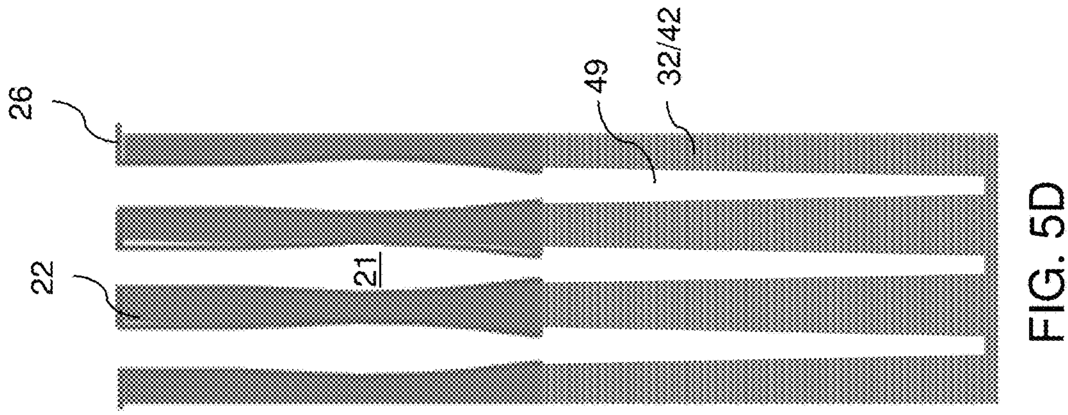
FIGS. 5A-5D are sequential vertical cross-sectional views of a region of a first configuration of the first exemplary structure during formation of the memory openings according to the first embodiment of the present disclosure.
Figure 5C:
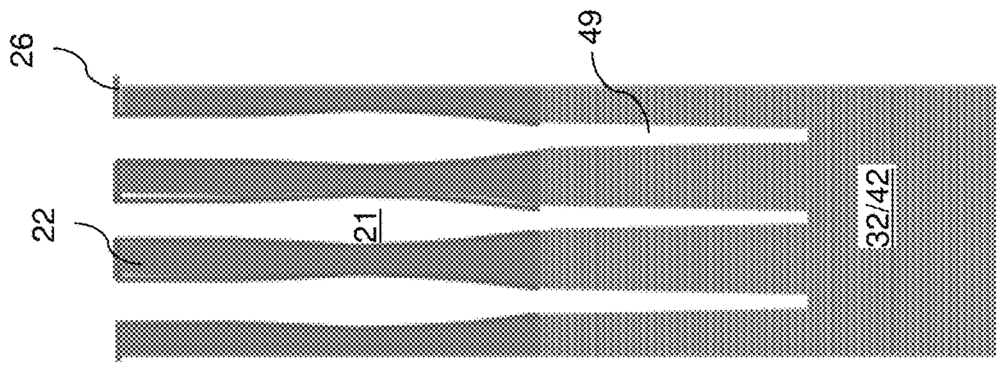
Figure 5B:
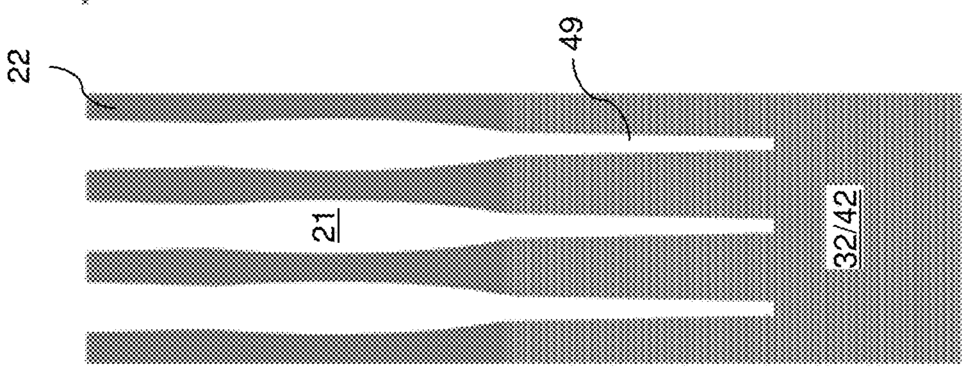
Figure 5A:
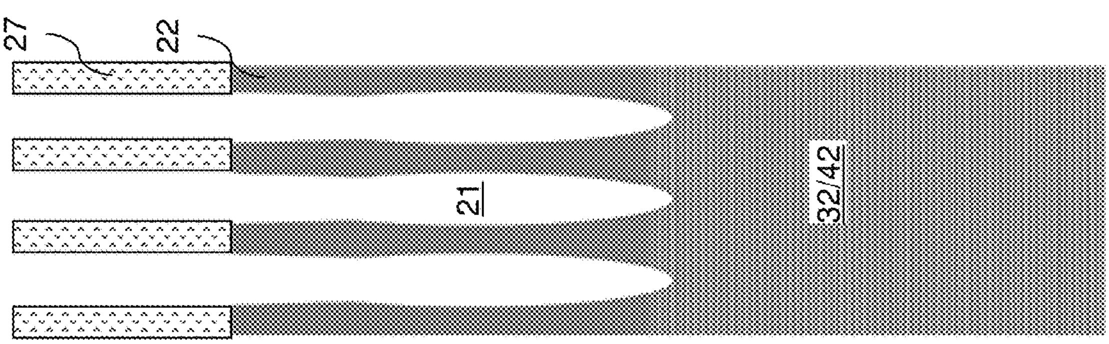

Referring to FIG. 5A, a hard mask layer 22 can be formed over the alternating stack (32, 42) of the first exemplary structure of FIG. 3. Preferably, the hard mask layer 22 comprises a carbon-based hard mask layer which comprises at least 60% of carbon in atomic concentration. For example, the carbon-based hard mask layer 22 may include amorphous carbon, diamond-like carbon, boron-doped carbon, or a commercially available carbon-based mask material, such as Advanced Patterning Film™ provided by Applied Materials, Inc™ In one embodiment, the carbon-based hard mask layer 22 may include at least 10% of hydrogen in atomic concentration. In one embodiment, the total atomic percentage of carbon atoms and hydrogen atoms in the carbon-based hard mask layer 22 may be at least 80%, such as at least 90%, for example 80 to 100%. The carbon-based hard mask layer 22 may be deposited by a conformal or non-conformal deposition process. The thickness of the carbon-based hard mask layer 22 may be in a range from 1 micron to 10 microns, such as 2 microns to 5 microns although lesser and greater thicknesses may also be employed.

A photoresist layer 27 can be applied over the carbon-based hard mask layer 22, and can be lithographically patterned to form openings in a pattern that is the same as the pattern of the memory openings 49 and the support openings 19 illustrated in FIGS. 4A and 4B. The pattern in the photoresist layer 27 can be transferred through the carbon-based hard mask layer 22 by performing a first anisotropic etch process. Cavities 21 can be formed in the carbon-based hard mask layer 22 by the first anisotropic etch process, which transfers the pattern of the openings in the photoresist layer 27 through the carbon-based hard mask layer 22. In one embodiment, the vertical cross-sectional profile of each cavity 21 through the carbon-based hard mask layer 22 may be tapered at an upper portion and may include a bulge at a lower portion. A bottom portion of a cavity 21 may vertically extend into one or more topmost layers of the alternating stack (32, 42).

Referring to FIG. 5B, a second anisotropic etch process, such as a reactive ion etch (RIE) process, may be performed to transfer the pattern of the cavities 21 in the carbon-based hard mask layer 22 into an upper portion of the alternating stack (32, 42), i.e., into a subset of the insulating layers 32 and the sacrificial material layers 42 that are located within the upper portion of the alternating stack (32, 42). The chemistry of the second anisotropic etch process can be selected such that the second anisotropic etch process etches the materials of the insulating layers 32 and the sacrificial material layers 42 selective to the material of the carbon-based hard mask layer 22. The photoresist layer 27 may be consumed during the second anisotropic etch process, or may be removed prior to or after the second anisotropic etch process. Via openings (49, 19), which include memory openings 49 and the support openings 19, can be formed through the alternating stack (32, 42). The number of layers within the alternating stack (32, 42) through which the memory openings 49 vertically extend at the end of the second anisotropic etch process may be in a range from 20% to 80%, such as from 40% to 60%, of the total number of the layers within the alternating stack (32, 42). Generally, the via openings (49, 19) can be formed through the upper portion of the alternating stack (32, 42) by performing the second anisotropic etch process, which transfers the pattern of the cavities 21 in the carbon-based hard mask layer 22 through an upper subset of layers of the alternating stack (32, 42). In one embodiment, the via openings (49, 19) as formed by the second anisotropic etch process may have tapered sidewalls.

Referring to FIG. 5C, a cladding liner 26 including a cladding material can be deposited on sidewalls of the cavities 21 in the carbon-based hard mask layer 22. In one embodiment, the cladding liner 26 may be deposited by a selective deposition process that grows the cladding material (i.e., the material of the cladding liner 26) from physically exposed surfaces of the carbon-based hard mask layer 22 without growth of the cladding material from physically exposed surfaces of the alternating stack (32, 42). In this case, the cladding material may be any material that allows selective deposition on the material of the carbon-based hard mask layer 22 without growth from surfaces of the alternating stack (32, 42). Thus, the cladding liner 26 is deposited conformally on the physically exposed surfaces of the carbon-based hard mask layer 22, and is not deposited on the physically exposed surfaces of the alternating stack (32, 42).

In one embodiment, the cladding liner 26 comprises, and/or consists essentially of, an inorganic material selected from amorphous carbon, diamond-like carbon, amorphous silicon, polycrystalline silicon, silicon carbide, or boron nitride. For example, silicon carbide may be selectively formed on the carbon-based hard mask layer 22 by selectively depositing a silicon layer (e.g., crystalline silicon layer) on the carbon-based hard mask layer 22, followed by annealing the silicon layer at a sufficiently high temperature (e.g., at 600 degrees Celsius or higher, such as 600 to 800 degrees Celsius) to react the silicon layer with the carbon-based hard mask layer 22 to selectively form a conformal silicon carbide cladding liner 26 on the carbon-based hard mask layer 22. In another embodiment, the cladding liner 26 comprises, and/or consists essentially of, a metallic (i.e., electrically conductive metal or metal alloy) material that can be selectively deposited on surfaces of the carbon-based hard mask layer 22. Metallic materials that can be selectively deposited on surfaces of the carbon-based hard mask layer 22 include, but are not limited to, TiN, Ru, Co or Mo. For example, Ru can be selectively deposited by ALD on the carbon-based hard mask layer 22. In another embodiment, the cladding liner 26 comprises, and/or consists essentially of, silicon oxide. The cladding liner 26 may be deposited by a conformal selective deposition process such as a chemical vapor deposition (CVD) process and/or an atomic layer deposition (ALD) process. The thickness of the cladding liner 26 may be in a range from 1 nm to 40 nm, such as from 2 nm to 20 nm, although lesser and greater thicknesses may also be employed.

Referring to FIG. 5D, a third anisotropic etch process, such as an RIE process, can be performed to transfer the pattern of the cavities 21 (as reduced in volume due to the presence of the cladding liner 26) through a lower portion of the alternating stack (32, 42), i.e., into a subset of the insulating layers 32 and the sacrificial material layers 42 that are located within the lower portion of the alternating stack (32, 42). The chemistry of the third anisotropic etch process can be selected such that the third anisotropic etch process etches the materials of the insulating layers 32 and the sacrificial material layers 42 selective to the materials of the cladding liner 26 and the carbon-based hard mask layer 22. The cladding liner 26 may be partially or fully consumed during the third anisotropic etch process. The third anisotropic etch process vertically extends the via openings (49, 19) through the lower portion of the alternating stack (32, 42). Generally, the via openings (49, 19) can be vertically extended through all layers within the alternating stack (32, 42) by performing the third anisotropic etch process, which employs a combination of the cladding liner 26 and the carbon-based hard mask layer 22 as an etch mask. Thus, the via openings (49, 19) vertically extend through each layer within the alternating stack (32, 42) after the third anisotropic etch process.

The via openings (49, 19) as formed by the third anisotropic etch process may have tapered sidewalls. The cladding liner 26 reduces the taper angle of the sidewalls of the via openings (49, 19) compared to an alternative etch scheme that does not employ the cladding liner 26. For example, the taper angle (as measured between a vertical direction and a sidewall of the via openings (49, 19)) can be in a range from 0.01 degree to 3 degrees, such as from 0.1 degree to 1.5 degrees, although lesser and greater taper angles may also be employed. In other words, the cladding liner 26 prevents or decreases a change in the mask profile during the latter part of a relatively long RIE of the deep, high aspect ratio via openings, which decreases the undesirable change in the via opening profile during the etching such via openings. The cladding liner 26 and the carbon-based hard mask layer 22 can be subsequently removed, for example, by ashing or selective etching.

FIGS. 6A-6D are sequential vertical cross-sectional views of a region of a second configuration of the first exemplary structure during formation of the memory openings according to an embodiment of the present disclosure.

Figure 6D:
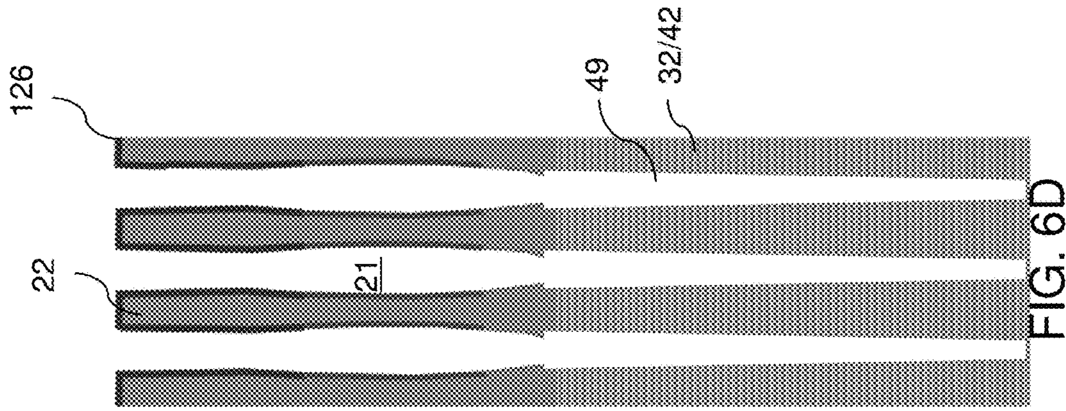
FIGS. 6A-6D are sequential vertical cross-sectional views of a region of a second configuration of the first exemplary structure during formation of the memory openings according to the first embodiment of the present disclosure.
Figure 6C:
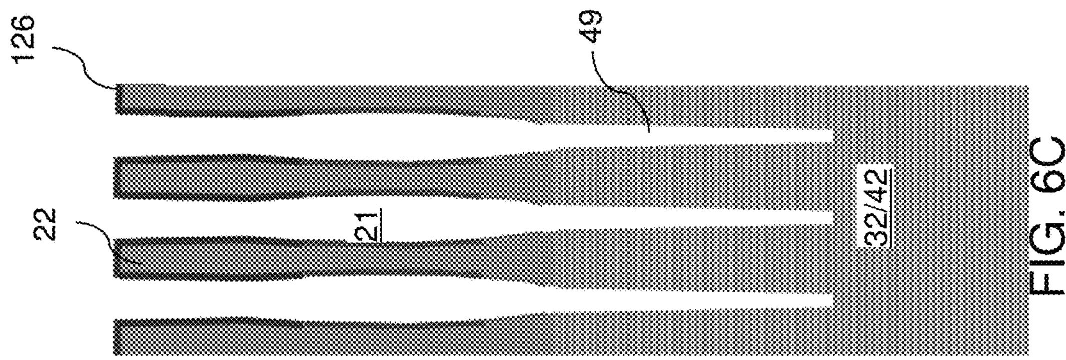
Figure 6B:
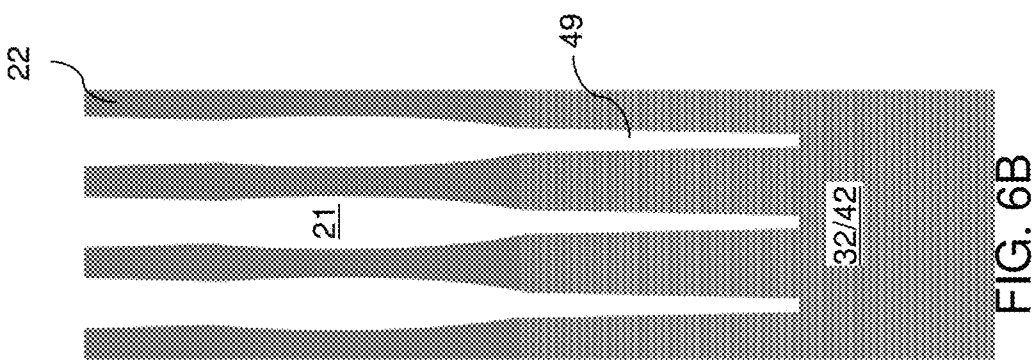
Figure 6A:
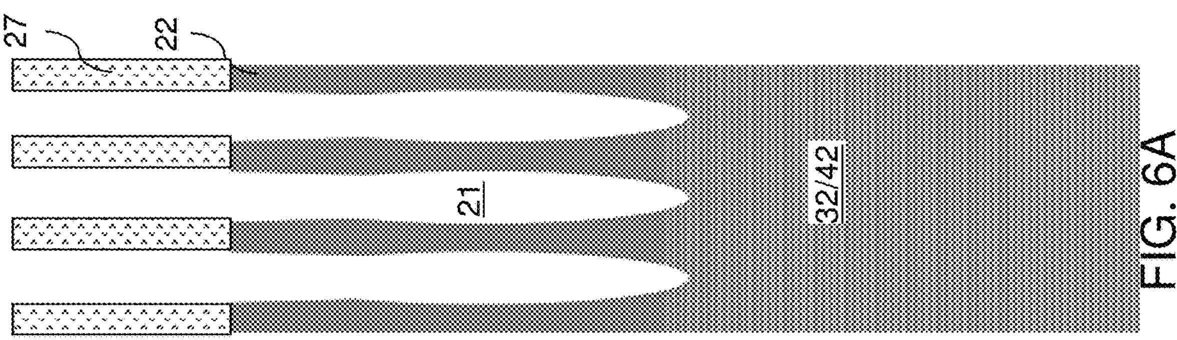

Referring to FIG. 6A, the second configuration of the first exemplary structure at the processing steps of FIG. 6A can be the same as the first configuration of the first exemplary structure at the processing step of FIG. 5A.

Referring to FIG. 6B, the processing steps of FIG. 5B can be performed. Thus, the second configuration of the first exemplary structure at the processing steps of FIG. 6B can be the same as the first configuration of the first exemplary structure at the processing step of FIG. 5B.

Referring to FIG. 6C, a cladding liner 26 including a cladding material can be deposited on sidewalls of the cavities 21 in the carbon-based hard mask layer 22. In one embodiment, the cladding liner 26 may be deposited by a selective but non-conformal deposition process that deposits a cladding material (i.e., the material of the cladding liner 26) anisotropically by directionally depositing the cladding material. The cladding material can be deposited with a variable thickness that decreases with a vertical distance from a horizontal plane including a top surface of the carbon-based hard mask layer 22. In this case, the cladding material may be any material that may be deposited anisotropically and provides etch resistance to the etch chemistry of a third anisotropic etch process to be subsequently employed. Thus, the cladding liner 26 is deposited on the physically exposed sidewalls of the carbon-based hard mask layer 22 with a variable thickness that decreases with a downward distance from a horizontal plane including the top surface of the carbon-based hard mask layer 22. The cladding liner 26 is not deposited on sidewalls of the via openings (49, 19).

In one embodiment, the cladding liner 26 comprises, and/or consists essentially of, an inorganic material selected from amorphous carbon, diamond-like carbon, amorphous silicon, polycrystalline silicon, or boron nitride. In another embodiment, the cladding liner 26 comprises, and/or consists essentially of, a metallic material. Metallic materials that can be employed for the cladding liner 26 include, but are not limited to, TiN, Ru, Co or Mo. In one embodiment, the cladding liner 26 comprises, and/or consists essentially of, silicon oxide. The cladding liner 26 may be deposited by a nonconformal deposition process such as ALD, physical vapor deposition, atmospheric chemical vapor deposition (A-CVD) or a plasma-enhanced chemical vapor deposition process. For example, silicon oxide or carbon may be deposited non-conformally by ALD or A-CVD by controlling the flow of precursors, deposition time and number of cycles. The maximum thickness of the cladding liner 26 over the top surface of the carbon-based hard mask layer 22 may be in a range from 2 nm to 40 nm, such as from 4 nm to 20 nm, although lesser and greater thicknesses may also be employed.

Referring to FIG. 6D, a third anisotropic etch process, such as a RIE process, can be performed to transfer the pattern of the cavities 21 (as reduced in volume due to the presence of the cladding liner 26) through a lower portion of the alternating stack (32, 42), i.e., into a subset of the insulating layers 32 and the sacrificial material layers 42 that are located within the lower portion of the alternating stack (32, 42). The chemistry of the third anisotropic etch process can be selected such that the third anisotropic etch process etches the materials of the insulating layers 32 and the sacrificial material layers 42 selective to the materials of the cladding liner 26 and the carbon-based hard mask layer 22. The cladding liner 26 may be partially or fully consumed during the third anisotropic etch process. The third anisotropic etch process vertically extends the via openings (49, 19) through the lower portion of the alternating stack (32, 42). Generally, the via openings (49, 19) can be vertically extended through all layers within the alternating stack (32, 42) by performing the third anisotropic etch process, which employs a combination of the cladding liner 26 and the carbon-based hard mask layer 22 as an etch mask. Thus, the via openings (49, 19) vertically extend through each layer within the alternating stack (32, 42) after the third anisotropic etch process.

The via openings (49, 19) formed by the third anisotropic etch process may have tapered sidewalls. The cladding liner 26 reduces the taper angle of the sidewalls of the via openings (49, 19) compared to an alternative etch scheme that does not employ the cladding liner 26. For example, the taper angle (as measured between a vertical direction and a sidewall of the via openings (49, 19)) can be in a range from 0.01 degree to 3 degrees, such as from 0.1 degree to 1.5 degrees, although lesser and greater taper angles may also be employed. The thicker upper portion of the cladding liner 26 protects the upper part of the carbon-based hard mask layer 22 and controls the critical dimension bow. The gradual reduction of thickness of the lower portion of the cladding liner 26 allows for bottom critical dimension expansion. The cladding liner 26 and the carbon-based hard mask layer 22 can be subsequently removed, for example, by ashing.

Figure 7A:
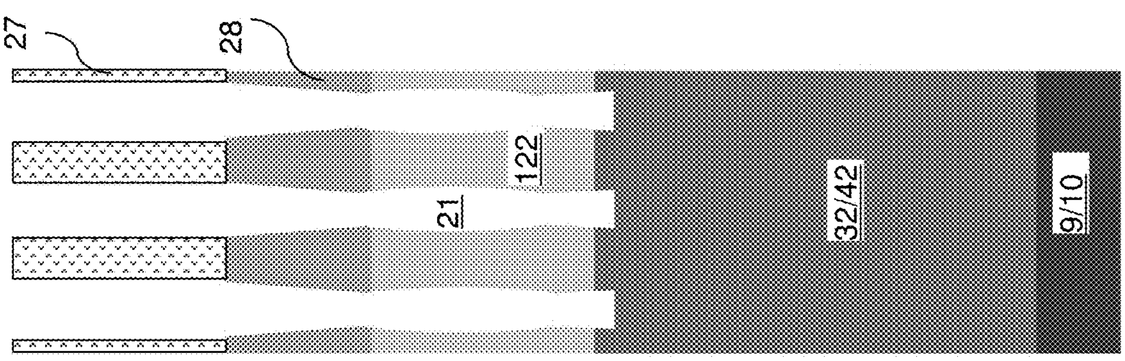
FIGS. 7A-7C are sequential vertical cross-sectional views of a region of a third configuration of the first exemplary structure during formation of the memory openings according to a third embodiment of the present disclosure.
Figure 7B:
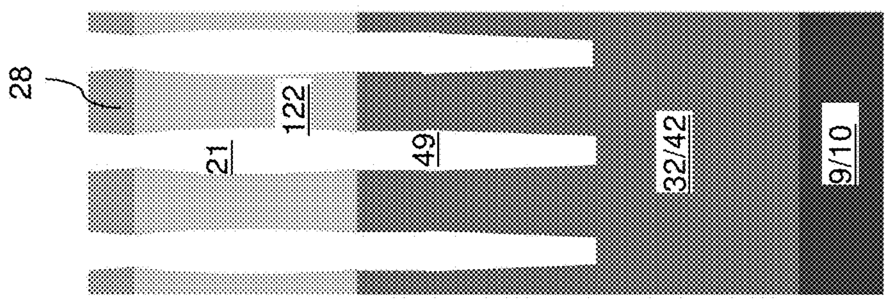
Figure 7C:
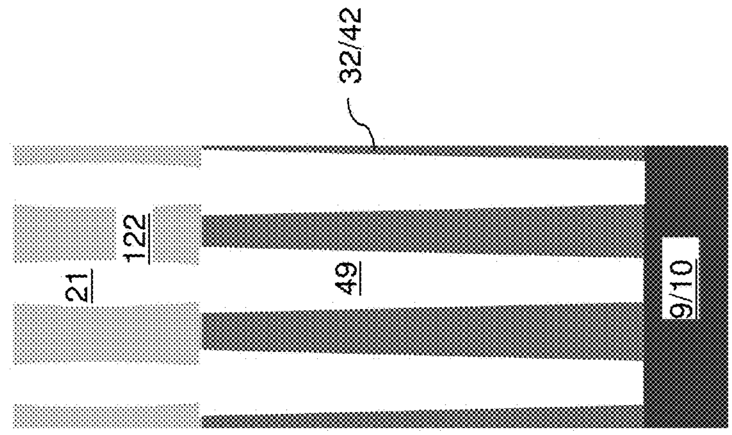

FIGS. 7A-7C are sequential vertical cross-sectional views of a region of a third configuration of the first exemplary structure during formation of the memory openings according to an embodiment of the present disclosure.

Referring to FIG. 7A, a vertical stack including a first hard mask layer 122 comprising, and/or consisting essentially of, a doped carbon-based material and a second hard mask layer 28 having a different material composition than the first hard mask layer 122 over the alternating stack (32, 42). In one embodiment, the first hard mask layer 122 can include boron doped carbon hard mask material, such as Saphira™ hard mask material available from Applied Materials, Inc. In one embodiment, the first hard mask layer 122 may be a carbon-based hard mask layer containing 1 to 40 weight percent boron and having a homogenous material composition throughout (i.e., having a uniform boron doping as a function of thickness). The thickness of the first hard mask layer 122 may be in a range from 1 micron to 7 microns, such as from 2 microns to 4 microns, although lesser and greater thicknesses may also be employed The second hard mask layer 28 is an additional hard mask layer that is formed over the first hard mask layer 122. The second hard mask layer 28 comprises, and/or consists essentially of, a material selected from amorphous silicon, polysilicon, undoped amorphous or diamond-like carbon, a doped amorphous or diamond-like carbon material. For example, the second hard mask layer 28 may comprise the above described undoped APF which is not doped with boron. Generally, the second hard mask layer 28 may have a different material composition than the first hard mask layer 122. The thickness of the second hard mask layer 28 may be in a range from 100 nm to 2 microns, such as from 500 nm to 1 micron, although lesser and greater thicknesses may also be employed A photoresist layer 27 can be applied over the vertical stack of the first hard mask layer 122 and the second hard mask layer 28, and can be lithographically patterned to form openings in a pattern that is the same as the pattern of the memory openings 49 and the support openings 19 illustrated in FIGS. 4A and 4B. The pattern in the photoresist layer 27 can be transferred through the vertical stack of the first hard mask layer 122 and the second hard mask layer 28 by performing a first anisotropic etch process. Cavities 21 can be formed in the vertical stack of the first hard mask layer 122 and the second hard mask layer 28 by the first anisotropic etch process, which transfers the pattern of the openings in the photoresist layer 27 through the vertical stack of the first hard mask layer 122 and the second hard mask layer 28. In one embodiment, the vertical cross-sectional profile of each cavity 21 may be tapered within the second hard mask layer 28 and may include a bulge within the first hard mask layer 122 due to various effects of the first anisotropic etch process such as accumulation etch residues, shadowing by overlying material portions, and differential etch rates between the materials of the first hard mask layer 122 and the second hard mask layer 28. The first hard mask layer 124 may have a higher etch resistance than the second hard mask layer 28 during the second and third anisotropic etch processes described below. A bottom portion of a cavity 21 may vertically extend into one or more topmost layers of the alternating stack (32, 42).

Referring to FIG. 7B, a second anisotropic etch process, such as a RIE process, may be performed to transfer the pattern of the cavities 21 in the vertical stack of the first hard mask layer 122 and the second hard mask layer 28 into an upper portion of the alternating stack (32, 42), i.e., into a subset of the insulating layers 32 and the sacrificial material layers 42 that are located within the upper portion of the alternating stack (32, 42). The chemistry of the second anisotropic etch process can be selected such that the second anisotropic etch process etches the materials of the insulating layers 32 and the sacrificial material layers 42 selective to the material of the second hard mask layer 28. The photoresist layer 27 may be consumed during or prior to the second anisotropic etch process. The second hard mask layer 28 can be partially consumed during the second anisotropic etch process. During the second anisotropic etch process, the critical dimension of the upper portion of the first hard mask layer 122 does not significantly change, while the critical dimension of the lower portion of the first hard mask layer 122 continues to expand. Via openings (49, 19), which include memory openings 49 and the support openings 19, can be formed through the alternating stack (32, 42). The number of layers within the alternating stack (32, 42) through which the memory openings 49 vertically extend at the end of the second anisotropic etch process may be in a range from 20% to 80%, such as from 40% to 60%, of the total number of the layers within the alternating stack (32, 42). Generally, the via openings (49, 19) can be formed through the upper portion of the alternating stack (32, 42) by performing the second anisotropic etch process, which transfers the pattern of the cavities 21 through an upper subset of layers of the alternating stack (32, 42). In one embodiment, the via openings (49, 19) as formed by the second anisotropic etch process may have tapered sidewalls. In one embodiment, the bowing within the first hard mask layer 122 can be self-limiting due to the tapered profile of the sidewalls of the via openings (49, 19) at the level of the second hard mask layer 28.

Referring to FIG. 7C, a third anisotropic etch process, such as a RIE process, can be performed to transfer the pattern of the cavities 21 through a lower portion of the alternating stack (32, 42), i.e., into a subset of the insulating layers 32 and the sacrificial material layers 42 that are located within the lower portion of the alternating stack (32, 42). The chemistry of the third anisotropic etch process can be selected such that the third anisotropic etch process etches the materials of the insulating layers 32 and the sacrificial material layers 42 selective to the materials of the first hard mask layer 122, which is a carbon-based hard mask layer. In one embodiment, the second hard mask layer 28 may be entirely consumed during the third anisotropic etch process. During the third anisotropic etch process, the critical dimension of the upper portion of the first hard mask layer 122 has a minimal change, while the critical dimension of the lower portion of the first hard mask layer 122 continues to expand. Likewise, the bow critical dimension of the first hard mask layer 122 has a minimal change. The third anisotropic etch process vertically extends the via openings (49, 19) through the lower portion of the alternating stack (32, 42). Thus, the via openings (49, 19) vertically extend through each layer within the alternating stack (32, 42) after the third anisotropic etch process.

The via openings (49, 19) as formed by the third anisotropic etch process may have tapered sidewalls. The bow profile of each sidewalls of the cavities 21 in the first hard mask layer 122 can remain substantially invariant throughout the third anisotropic etch process due to the etch resistance of the doped carbon hard mask material within the first hard mask layer 122 during the third anisotropic etch process. For example, the taper angle (as measured between a vertical direction and a sidewall of the via openings (49, 19)) can be in a range from 0.01 degree to 3 degrees, such as from 0.1 degree to 1.5 degrees, although lesser and greater taper angles may also be employed. The first hard mask layer 122 can be subsequently removed, for example, by ashing.

Figure 8C:
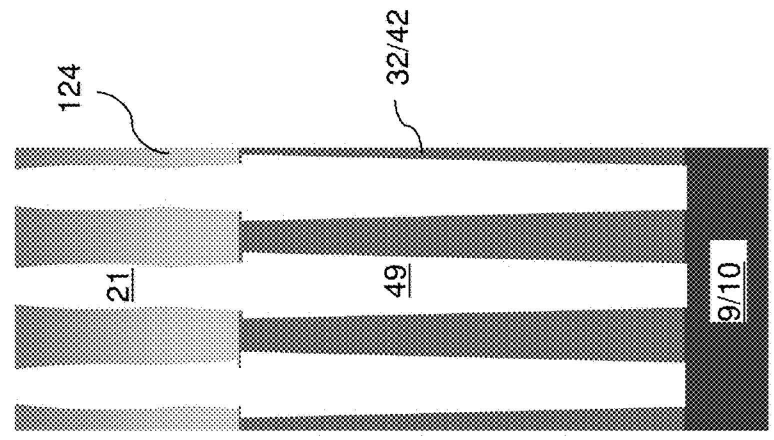
FIGS. 8A-8C are sequential vertical cross-sectional views of a region of a fourth configuration of the first exemplary structure during formation of the memory openings according to a fourth embodiment of the present disclosure.
Figure 8B:
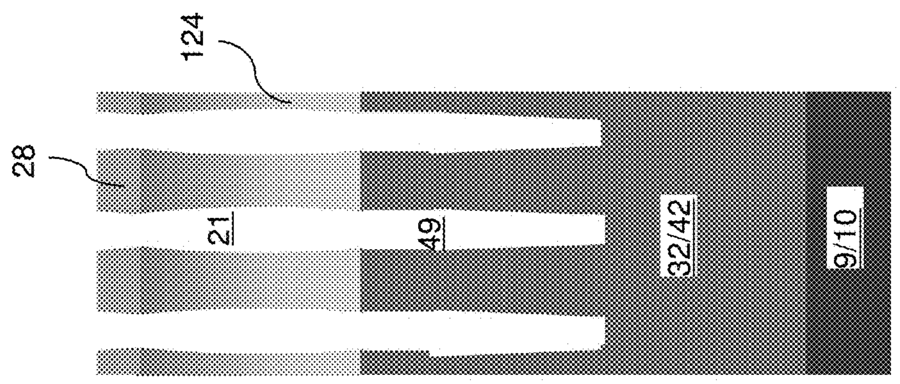
Figure 8A:
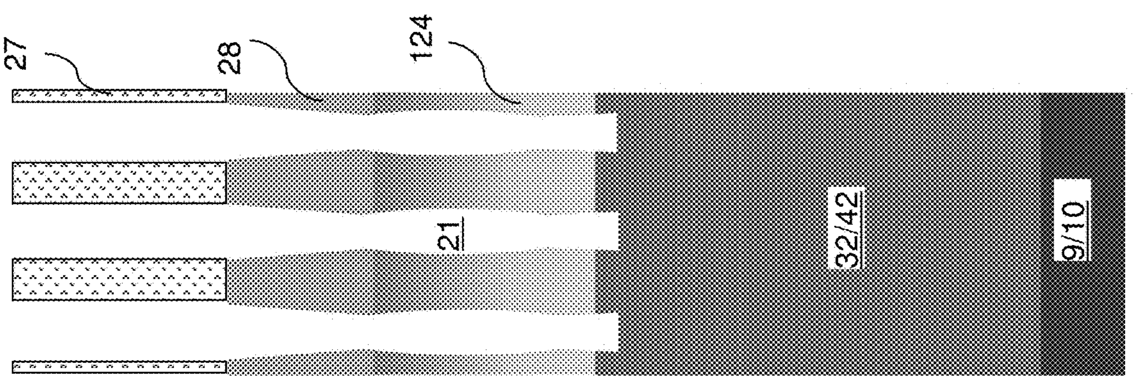

FIGS. 8A-8C are sequential vertical cross-sectional views of a region of a fourth configuration of the first exemplary structure during formation of the memory openings according to an embodiment of the present disclosure.

Referring to FIG. 8A, a vertical stack including a first hard mask layer 124 comprising and/or consisting essentially of doped a carbon-based material and a second hard mask layer 28 having a different material composition than the first hard mask layer 124 over the alternating stack (32, 42). In one embodiment, the first hard mask layer 124 may comprise a boron doped carbon-based hard mask material having a boron dopant composition gradient along a vertical direction. In one embodiment, the first hard mask layer 124 may include a boron dopant at a variable dopant concentration that increases monotonically with a vertical distance from the substrate (9, 10). In one embodiment, the increasing dopant concentration within the first hard mask layer 124 may increase the etch resistance of the carbon-based hard mask material, and the dopant concentration gradient controls the etching selectivity. The first hard mask layer 124 may include 1 to 40 weight percent boron. The thickness of the first hard mask layer 124 may be the same as that of the first hard mask layer 122 described above. The second hard mask layer 28 may have the same material composition and the same thickness range as described above. The first hard mask layer 124 may have a higher etch resistance than the second hard mask layer 28 during the second and third anisotropic etch processes described below.

Referring to FIG. 8B, a second anisotropic etch process, such as a RIE process, may be performed to transfer the pattern of the cavities 21 in the vertical stack of the first hard mask layer 124 and the second hard mask layer 28 into an upper portion of the alternating stack (32, 42), i.e., into a subset of the insulating layers 32 and the sacrificial material layers 42 that are located within the upper portion of the alternating stack (32, 42). The second anisotropic etch process of FIG. 8B may be the same as in the processing steps of FIG. 7B. The second hard mask layer 28 can be partially consumed during the second anisotropic etch process. Via openings (49, 19), which include memory openings 49 and the support openings 19, can be formed through the alternating stack (32, 42). In one embodiment, the via openings (49, 19) as formed by the second anisotropic etch process may have tapered sidewalls. In one embodiment, the vertical cross-sectional profile of each cavity 21 at an upper portion of the first hard mask layer 124 can remain relatively narrow due to higher etch resistance of the higher boron concentration in the upper portion of the first hard mask layer 124. In contrast, the bottom portion of each cavity 21 may be widened due to a lower etch resistance of the lower boron concentration in the lower portion of the first hard mask layer 124.

Referring to FIG. 8C, a third anisotropic etch process, such as an RIE process can be performed to transfer the pattern of the cavities 21 through a lower portion of the alternating stack (32, 42), i.e., into a subset of the insulating layers 32 and the sacrificial material layers 42 that are located within the lower portion of the alternating stack (32, 42). The chemistry of the third anisotropic etch process can be selected such that the third anisotropic etch process etches the materials of the insulating layers 32 and the sacrificial material layers 42 selective to the materials of the first hard mask layer 124, which is a carbon-based hard mask layer. In one embodiment, the second hard mask layer 28 may be entirely consumed during the third anisotropic etch process. The third anisotropic etch process vertically extends the via openings (49, 19) through the lower portion of the alternating stack (32, 42). Thus, the via openings (49, 19) vertically extend through each layer within the alternating stack (32, 42) after the third anisotropic etch process.

Therefore, during the second and third anisotropic etch processes, the critical dimension of the upper portion of the first hard mask layer 124 has a minimal change, while the critical dimension of the lower portion of the first hard mask layer 124 continues to expand. Likewise, the bow critical dimension of the first hard mask layer 124 has a minimal change. This reduces or prevents excessive bowing of the via openings (49, 19) within the alternating stack (49, 19). Therefore, the via openings (49, 19) as formed by the third anisotropic etch process may have tapered sidewalls. The bow profile of each sidewalls of the cavities 21 in the first hard mask layer 124 can remain substantially invariant throughout the third anisotropic etch process due to the etch resistance of the carbon-based hard mask material within the first hard mask layer 124 during the third anisotropic etch process. For example, the taper angle (as measured between a vertical direction and a sidewall of the via openings (49, 19)) can be in a range from 0.01 degree to 3 degrees, such as from 0.1 degree to 1.5 degrees, although lesser and greater taper angles may also be employed. The first hard mask layer 124 can be subsequently removed, for example, by ashing.

FIGS. 9A-9D are sequential vertical cross-sectional views of a region of a fifth configuration of the first exemplary structure during formation of the memory openings according to an embodiment of the present disclosure.

Figures 9A, 9B, 9C, 9D:
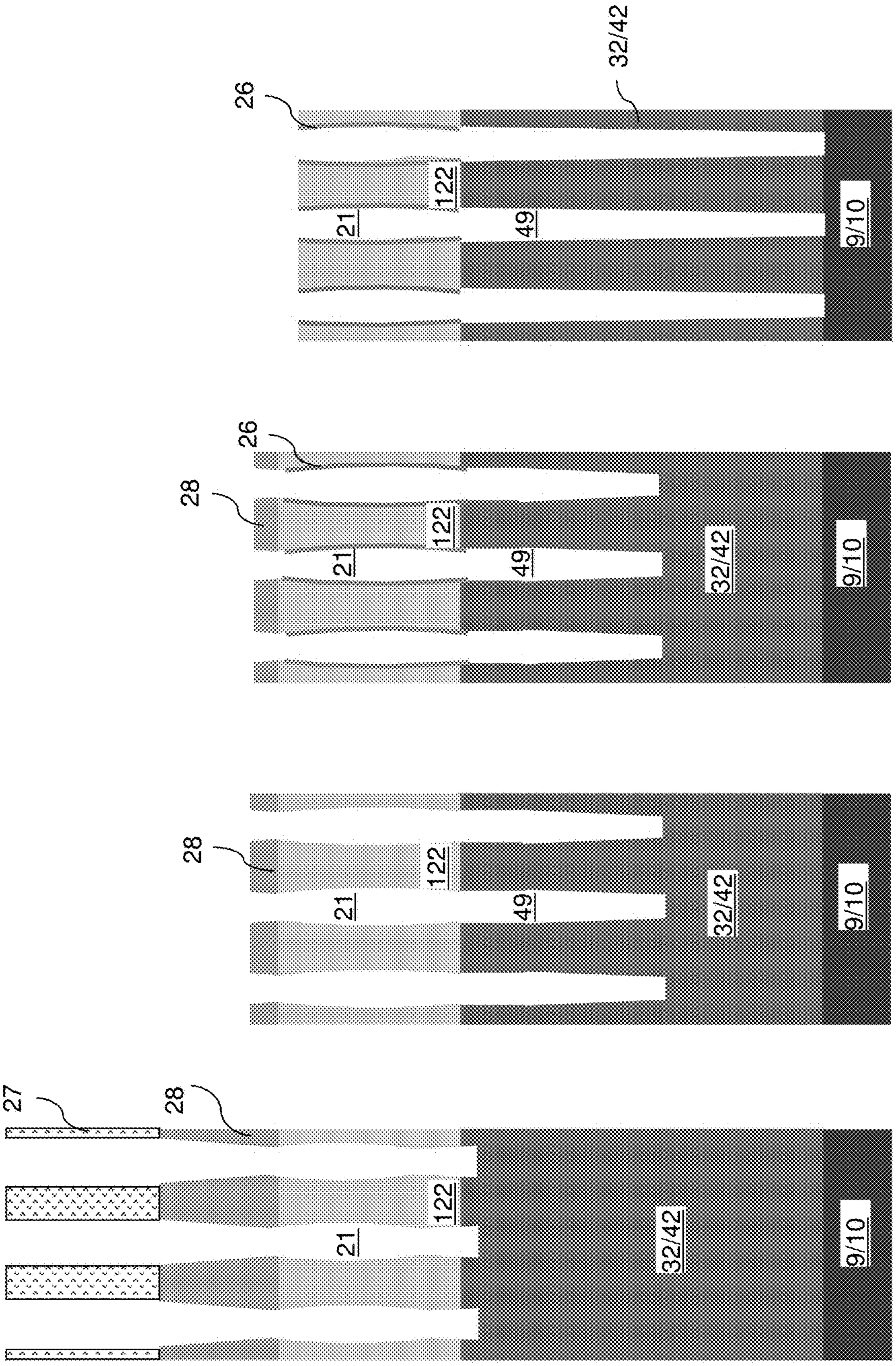
FIGS. 9A-9D are sequential vertical cross-sectional views of a region of a fifth configuration of the first exemplary structure during formation of the memory openings according to a fifth embodiment of the present disclosure.

Referring to FIG. 9A, the fifth configuration of the first exemplary structure at the processing steps of FIG. 9A can be the same as the third configuration of the first exemplary structure at the processing step of FIG. 7A.

Referring to FIG. 9B, the processing steps of FIG. 7B can be performed. Thus, the fifth configuration of the first exemplary structure at the processing steps of FIG. 9B can be the same as the third configuration of the first exemplary structure at the processing step of FIG. 7B.

Referring to FIG. 9C, a cladding liner 26 including a cladding material can be deposited on sidewalls of the first hard mask layer 122 around the cavities 21. In one embodiment, the cladding liner 26 may be deposited by a selective deposition process that grows the cladding material (i.e., the material of the cladding liner 26) from physically exposed surfaces of the first hard mask layer 122 without growth of the cladding material from physically exposed surfaces of the alternating stack (32, 42) or from physically exposed surfaces of the second hard mask layer 28. In this case, the cladding material may be any material that allows selective deposition on the boron doped carbon-based material of the first hard mask layer 122 without growth from surfaces of the alternating stack (32, 42) or from surfaces of the second hard mask layer 28. Thus, the cladding liner 26 is deposited on the physically exposed surfaces of the first hard mask layer 122, and is not deposited on the physically exposed surfaces of the alternating stack (32, 42) or the second hard mask layer 28.

In one embodiment, the cladding liner 26 comprises, and/or consists essentially of, an inorganic material selected from amorphous carbon, diamond-like carbon, amorphous silicon, polycrystalline silicon, or boron nitride. In another embodiment, the cladding liner 26 comprises, and/or consists essentially of, a metallic material that can be selectively deposited on surfaces of the carbon-based hard mask layer 22. Metallic materials that can be selectively deposited on surfaces of the carbon-based hard mask layer 22 include, but are not limited to tungsten. For example, low fluorine tungsten ALD deposition may be used to selectively deposit tungsten on boron doped first hard mask layer 122 rather than on undoped carbon second hard mask layer 28. In one embodiment, the cladding liner 26 comprises, and/or consists essentially of, silicon oxide. The cladding liner 26 may be deposited by a conformal selective deposition process such as a chemical vapor deposition (CVD) process and/or an atomic layer deposition (ALD) process. The thickness of the cladding liner 26 may be in a range from 1 nm to 40 nm, such as from 2 nm to 20 nm, although lesser and greater thicknesses may also be employed.

Referring to FIG. 9D, a third anisotropic etch process, such as an RIE process, can be performed to transfer the pattern of the cavities 21 (as reduced in volume due to the presence of the cladding liner 26) through a lower portion of the alternating stack (32, 42), i.e., into a subset of the insulating layers 32 and the sacrificial material layers 42 that are located within the lower portion of the alternating stack (32, 42). The chemistry of the third anisotropic etch process can be selected such that the third anisotropic etch process etches the materials of the insulating layers 32 and the sacrificial material layers 42 selective to the materials of the cladding liner 26 and the first hard mask layer 122. The cladding liner 26 may be partially or fully consumed during the third anisotropic etch process. The third anisotropic etch process vertically extends the via openings (49, 19) through the lower portion of the alternating stack (32, 42). Generally, the via openings (49, 19) can be vertically extended through all layers within the alternating stack (32, 42) by performing the third anisotropic etch process, which employs a combination of the cladding liner 26 and the first hard mask layer 122 as an etch mask. Thus, the via openings (49, 19) vertically extend through each layer within the alternating stack (32, 42) after the third anisotropic etch process.

The via openings (49, 19) as formed by the third anisotropic etch process may have tapered sidewalls. The cladding liner 26 reduces the taper angle of the sidewalls of the via openings (49, 19) compared to an alternative etch scheme that does not employ the cladding liner 26. For example, the taper angle (as measured between a vertical direction and a sidewall of the via openings (49, 19)) can be in a range from 0.01 degree to 3 degrees, such as from 0.1 degree to 1.5 degrees, although lesser and greater taper angles may also be employed. The cladding liner 26 and the first hard mask layer 122 can be subsequently removed, for example, by ashing.

FIGS. 10A-10D are sequential vertical cross-sectional views of a region of a sixth configuration of the first exemplary structure during formation of the memory openings according to an embodiment of the present disclosure.

Figure 10D:
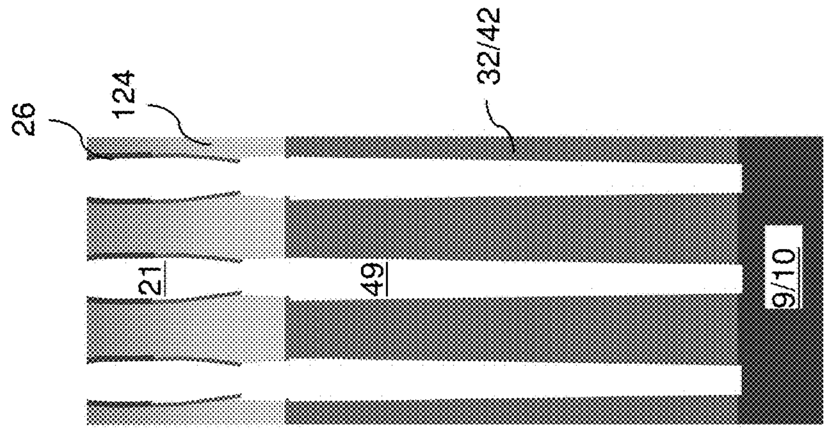
FIGS. 10A-10D are sequential vertical cross-sectional views of a region of a sixth configuration of the first exemplary structure during formation of the memory openings according to a sixth embodiment of the present disclosure.
Figure 10C:
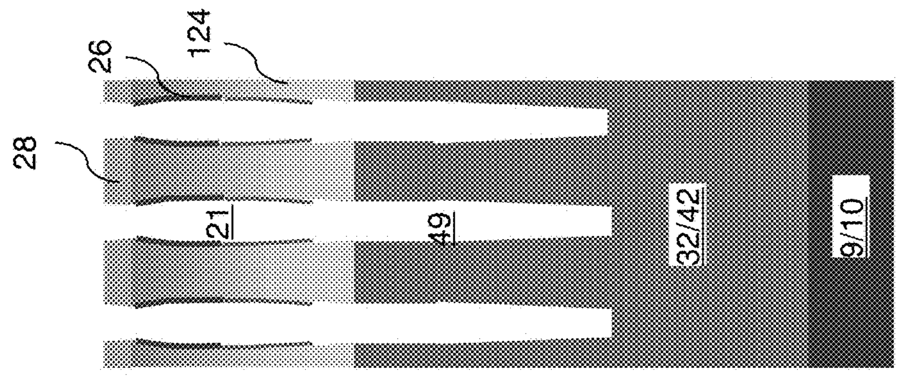
Figure 10B:
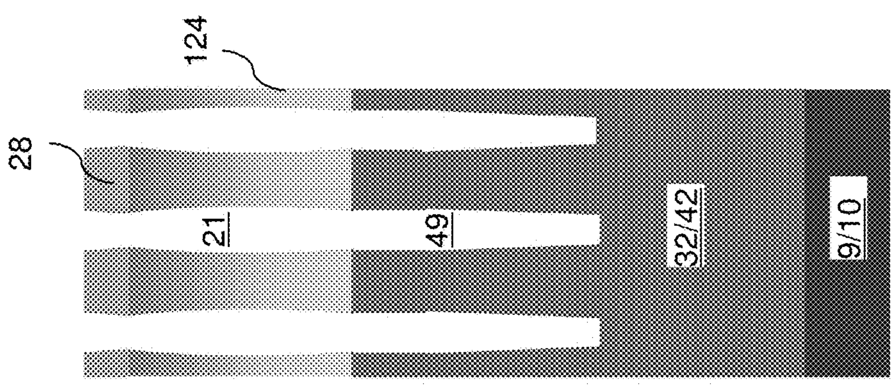
Figure 10A:
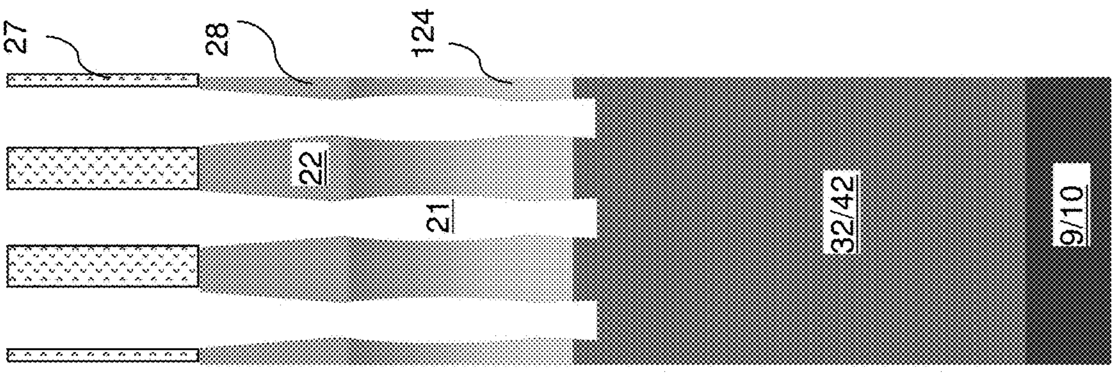

Referring to FIG. 10A, the sixth configuration of the first exemplary structure at the processing steps of FIG. 10A can be the same as the fourth configuration of the first exemplary structure at the processing step of FIG. 8A.

Referring to FIG. 10B, the processing steps of FIG. 8B can be performed. Thus, the sixth configuration of the first exemplary structure at the processing steps of FIG. 10B can be the same as the fourth configuration of the first exemplary structure at the processing step of FIG. 8B.

Referring to FIG. 10C, the processing steps of FIG. 9C can be performed. Thus, the sixth configuration of the first exemplary structure at the processing steps of FIG. 10C can be the same as the fifth configuration of the first exemplary structure at the processing step of FIG. 9C. In other words, the cladding liner 26 may be deposited by a selective deposition process that deposits a cladding material (i.e., the material of the cladding liner 26) on upper portions of the sidewalls of the first hard mask layer 124 which comprises a boron doped carbon-based material.

Referring to FIG. 10D, the processing steps of FIG. 10D can be performed. Thus, the sixth configuration of the first exemplary structure at the processing steps of FIG. 10D can be the same as the sixth configuration of the first exemplary structure at the processing step of FIG. 9D.

Any of the processing sequences illustrated in FIGS. 5A-D, 6A-6D, 7A-7C, 8A-8C, 9A-9D, and 10A-10D may be employed to form the first exemplary structure illustrated in FIGS. 4A and 4B. Subsequently, a series of processing steps can be performed to form a memory opening fill structure in each memory opening and to form a support pillar structure in each support opening. FIGS. 11A-11H are sequential schematic vertical cross-sectional views of a memory opening within the first exemplary structure during formation of a memory stack structure, an optional dielectric core, and a drain region therein according to an embodiment of the present disclosure.

Figure 11B:
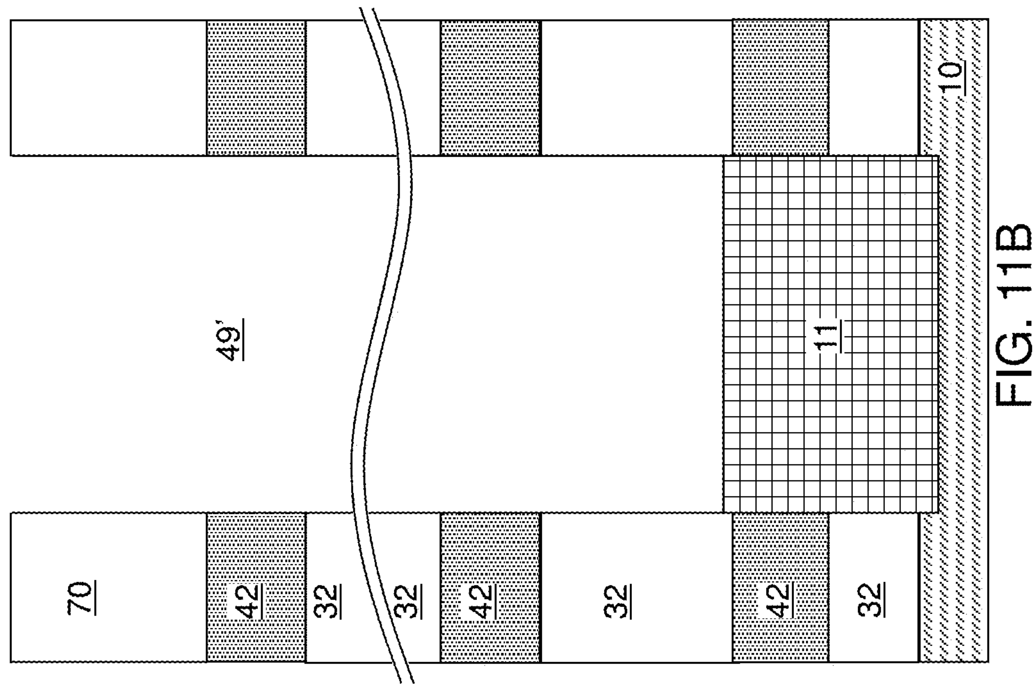
FIGS. 11A-11H are sequential schematic vertical cross-sectional views of a memory opening within the first exemplary structure during formation of a memory stack structure, an optional dielectric core, and a drain region therein according to the first embodiment of the present disclosure.
Figure 11A:
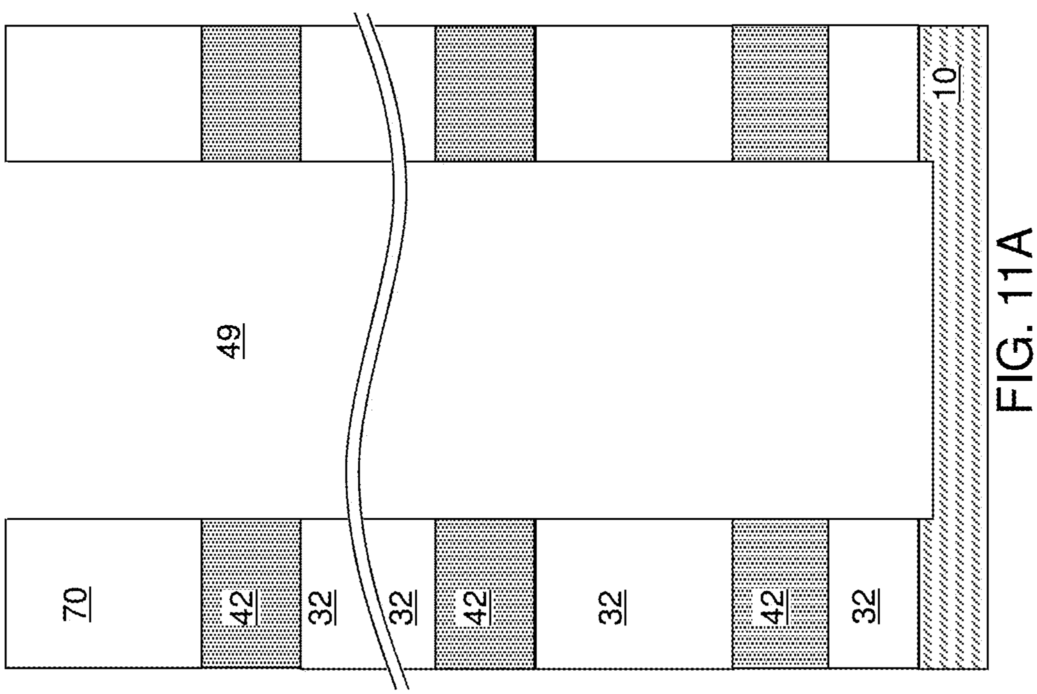

Referring to FIG. 11A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 11B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 11D:
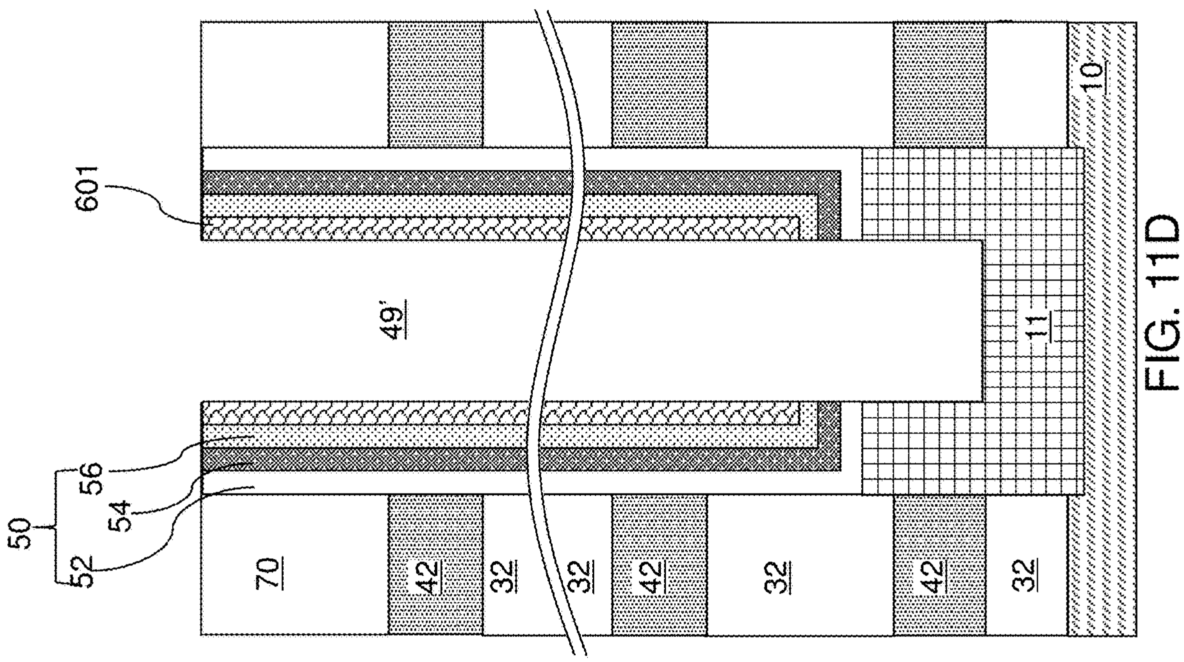
Figure 11C:
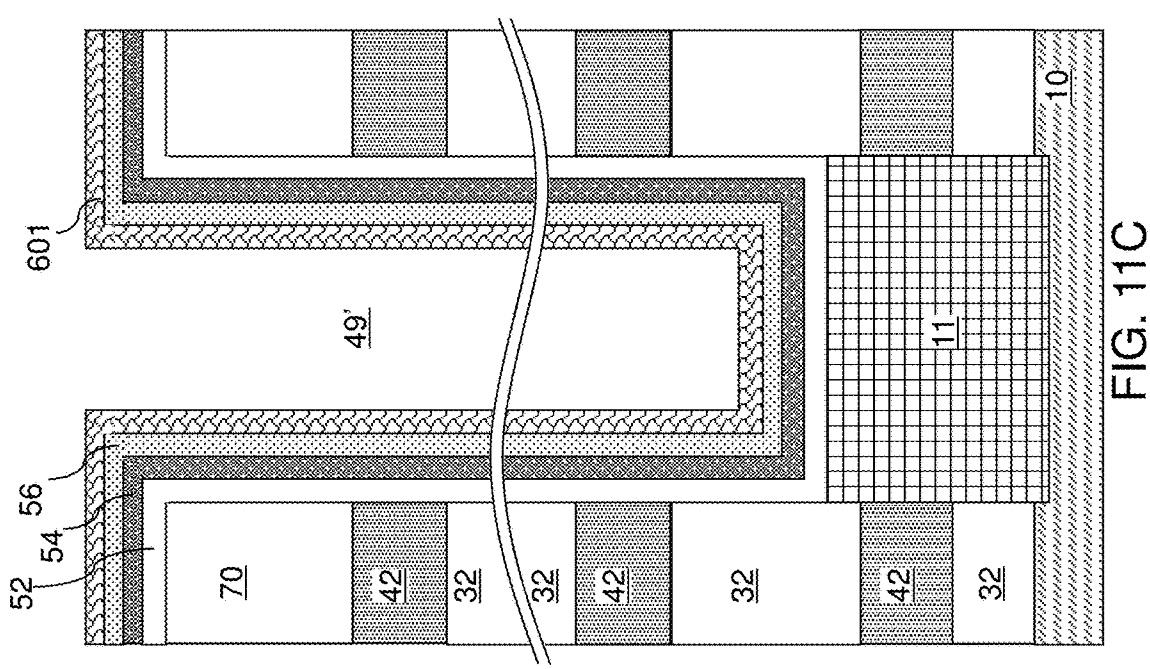

Referring to FIG. 11C, a stack of layers including a blocking dielectric layer 52, a memory material layer 54, a tunneling dielectric layer 56, and an optional sacrificial cover material layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

In one embodiment, each vertical stack of memory elements comprises a vertical stack of charge storage material portions that retain electrical charges therein upon programming, or a vertical stack of ferroelectric memory elements that retains electrical polarization therein upon programming. In case the vertical stack of ferroelectric memory elements is used, the memory material layer 54 may comprise a continuous ferroelectric material layer or a plurality of discrete, vertically separated ferroelectric material portions. The ferroelectric material may comprise orthorhombic phase hafnium oxide doped with silicon, aluminum or zirconium for example.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional sacrificial cover material layer 601 includes a sacrificial material that can be subsequently removed selective to the material of the tunneling dielectric layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 11D, the optional sacrificial cover material layer 601, the tunneling dielectric layer 56, the memory material layer 54, the blocking dielectric layer 52 are sequentially anisotropically etched employing at least one anisotropic etch process. The portions of the sacrificial cover material layer 601, the tunneling dielectric layer 56, the memory material layer 54, and the blocking dielectric layer 52 located above the top surface of the insulating cap layer 70 can be removed by the at least one anisotropic etch process. Further, the horizontal portions of the sacrificial cover material layer 601, the tunneling dielectric layer 56, the memory material layer 54, and the blocking dielectric layer 52 at a bottom of each memory cavity 49' can be removed to form openings in remaining portions thereof. Each of the sacrificial cover material layer 601, the tunneling dielectric layer 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material or a ferroelectric material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the tunneling dielectric layer 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the memory material layer 54. A set of a blocking dielectric layer 52, a memory material layer 54, and a tunneling dielectric layer 56 in a memory opening 49 constitutes a memory film 50, which includes a plurality of charge storage regions (as embodied as the memory material layer 54) that are insulated from surrounding materials by the blocking dielectric layer 52 and the tunneling dielectric layer 56. In one embodiment, the sacrificial cover material layer 601, the tunneling dielectric layer 56, the memory material layer 54, and the blocking dielectric layer 52 can have vertically coincident sidewalls. The sacrificial cover material layer 601 can be subsequently removed selective to the material of the tunneling dielectric layer 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Figure 11F:
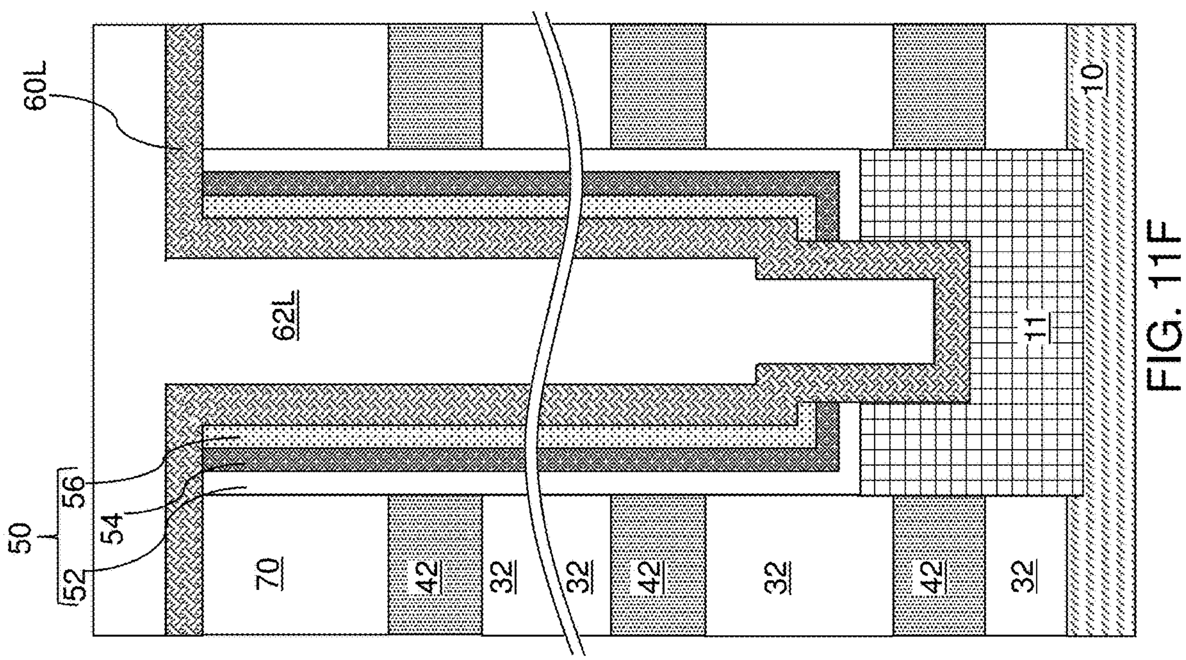
Figure 11E:
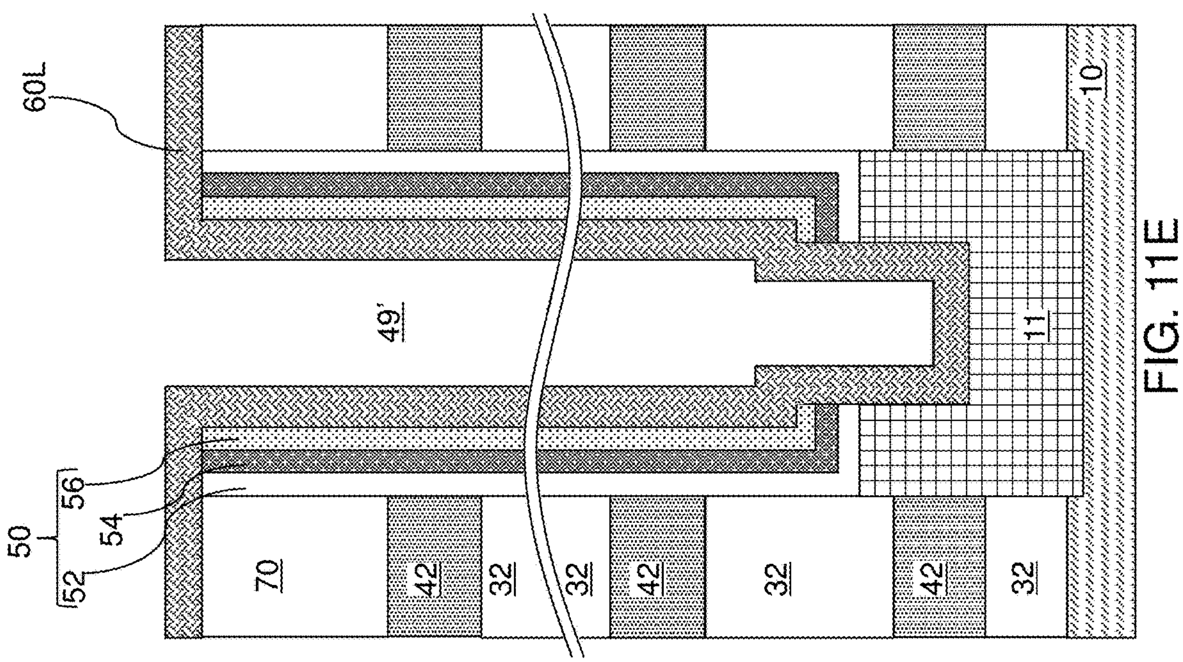

Referring to FIG. 11E, a semiconductor channel layer 60L can be deposited directly on the semiconductor surface of the pedestal channel portion 11 or the semiconductor material layer 10 if the pedestal channel portion 11 is omitted, and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 11F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 11H:
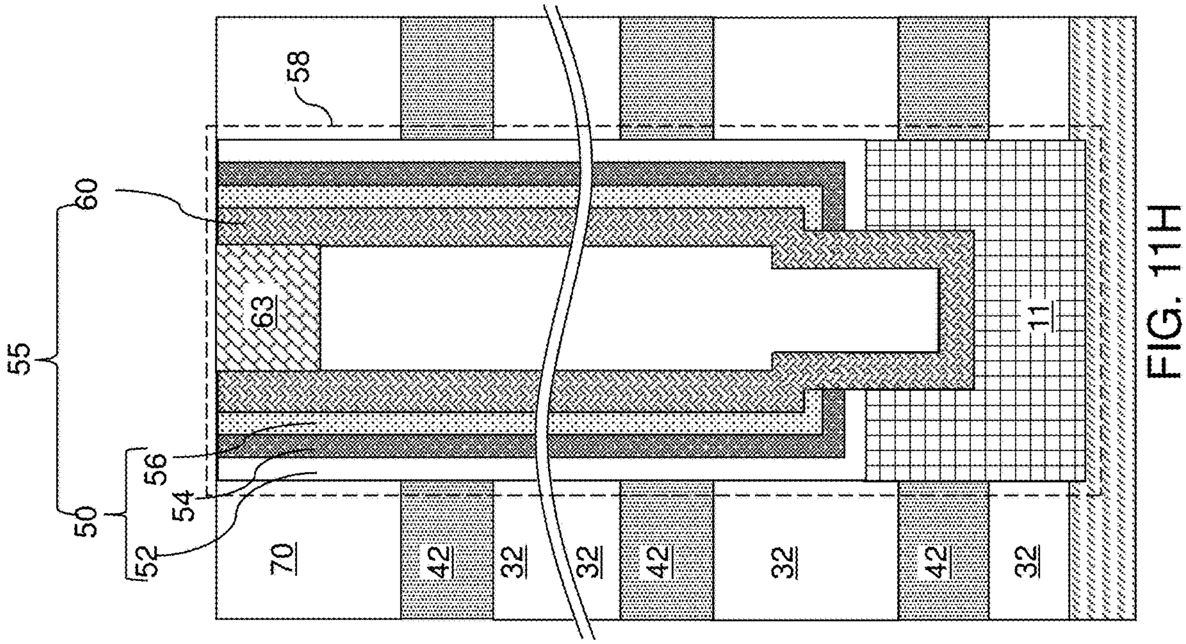
Figure 11G:
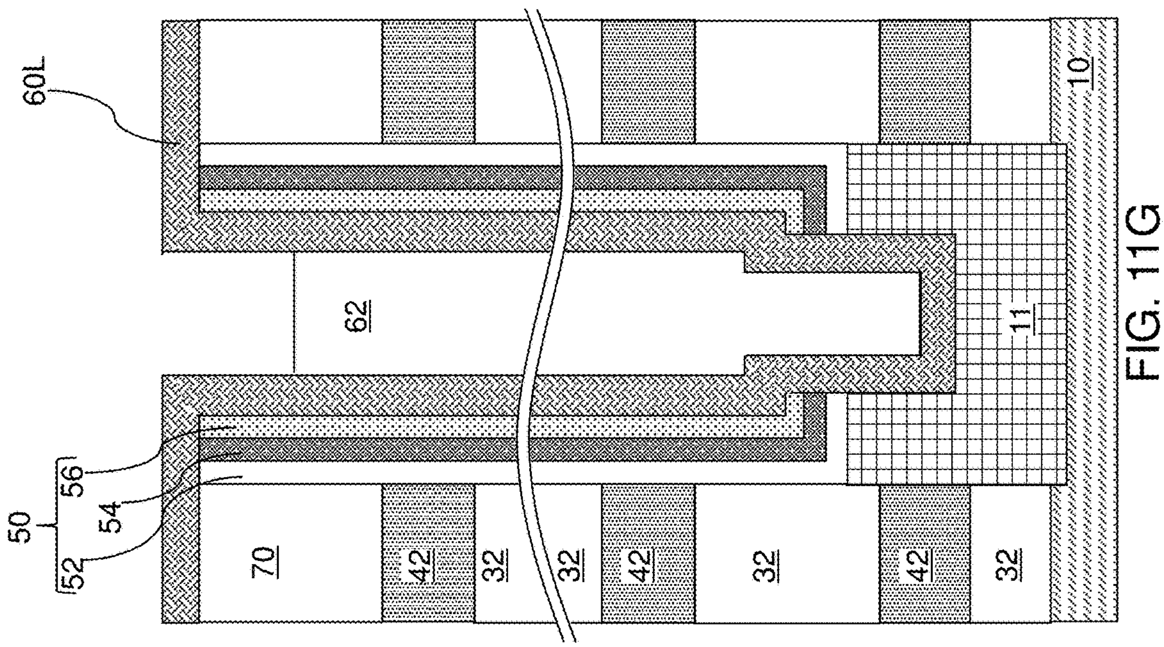

Referring to FIG. 11G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 11H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{19}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges or ferroelectric polarization with a macroscopic retention time. In some embodiments, a blocking dielectric layer 52 may not be present in the memory film 50 at this step, and a blocking dielectric layer may be subsequently formed after formation of backside recesses. Furthermore, if the ferroelectric memory material layer 54 is used, then the tunneling dielectric layer 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 12:
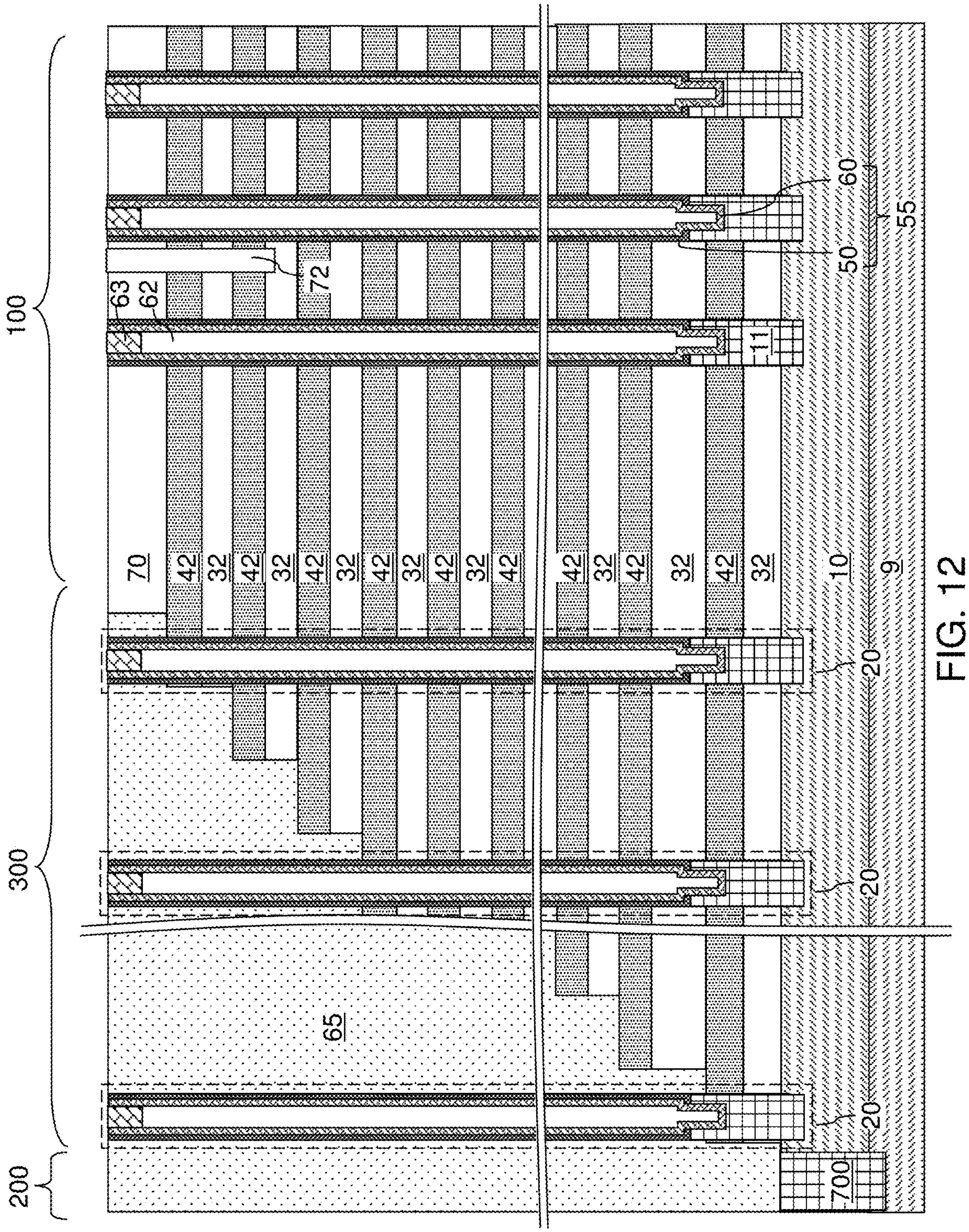
FIG. 12 is a schematic vertical cross-sectional view of the first exemplary structure after formation of memory stack structures and support pillar structures according to the first embodiment of the present disclosure.

Referring to FIG. 12, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a tunneling dielectric layer 56 laterally surrounding the vertical semiconductor channel 60 and a vertical stack of charge storage regions or ferroelectric regions (e.g., comprising portions of the memory material layer 54) laterally surrounding the tunneling dielectric layer 56 (if present in combination with the charge storage regions) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 13A:
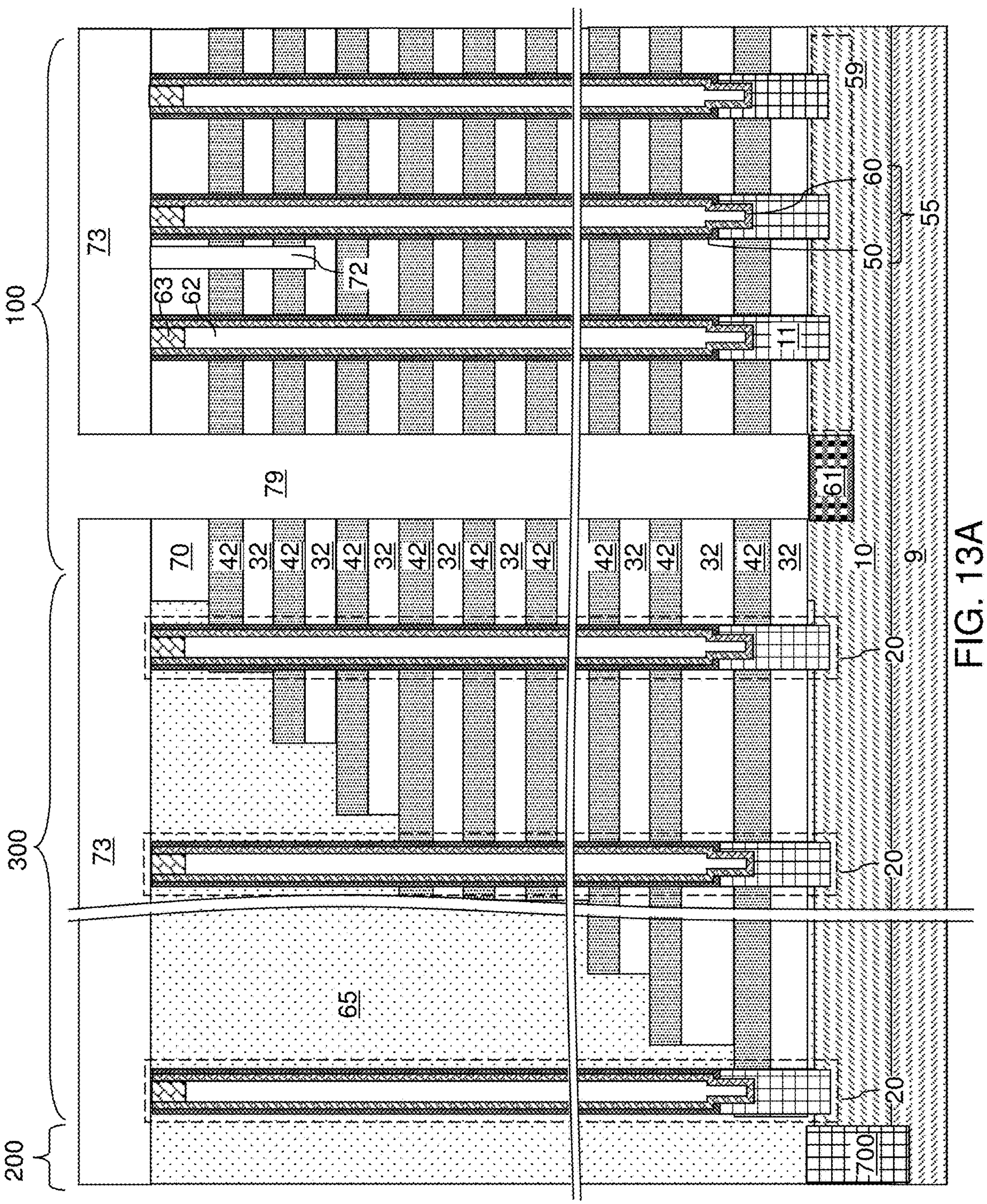
FIG. 13A is a schematic vertical cross-sectional view of the first exemplary structure after formation of backside trenches and source regions according to the first embodiment of the present disclosure.
Figure 13B:
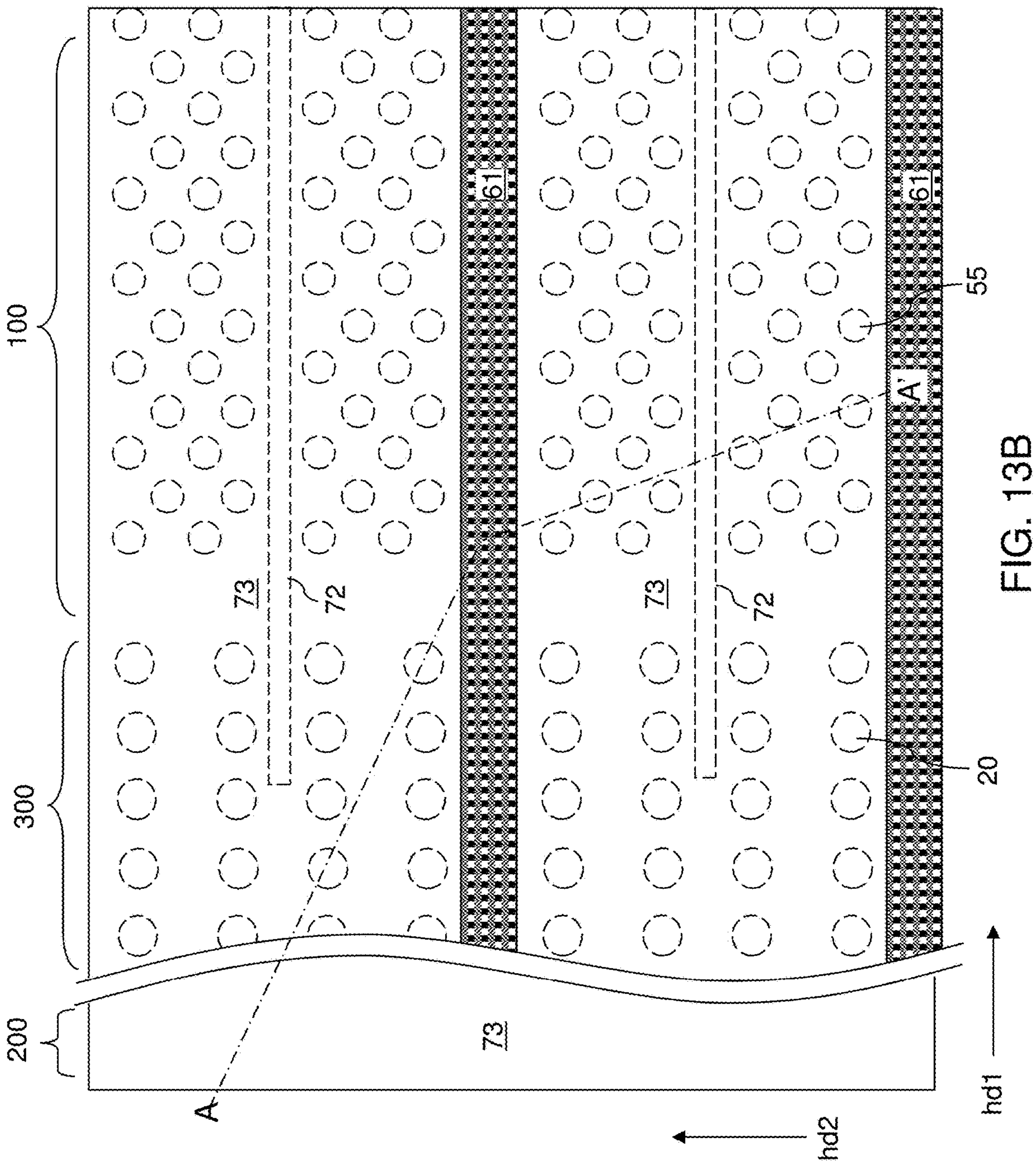
FIG. 13B is a partial see-through top-down view of the first exemplary structure of FIG. 13A. The vertical plane A-A' is the plane of the schematic vertical cross-sectional view of FIG. 13A.

Referring to FIGS. 13A and 13B, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart from each other along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the alternating stack (32, 42). The alternating stack (32, 42) as formed at the processing steps of FIG. 3 is divided into multiple alternating stacks (32, 42) that are laterally spaced apart along the second horizontal direction hd2 by the backside trenches 79. Layer stacks (32, 42, 70, 73) are formed, each of which includes a respective patterned portion of the contact-level dielectric layer 73 and a respective patterned portion of the alternating stack (32, 42) as formed at the processing steps of FIG. 3 and laterally spaced from each other by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 14:
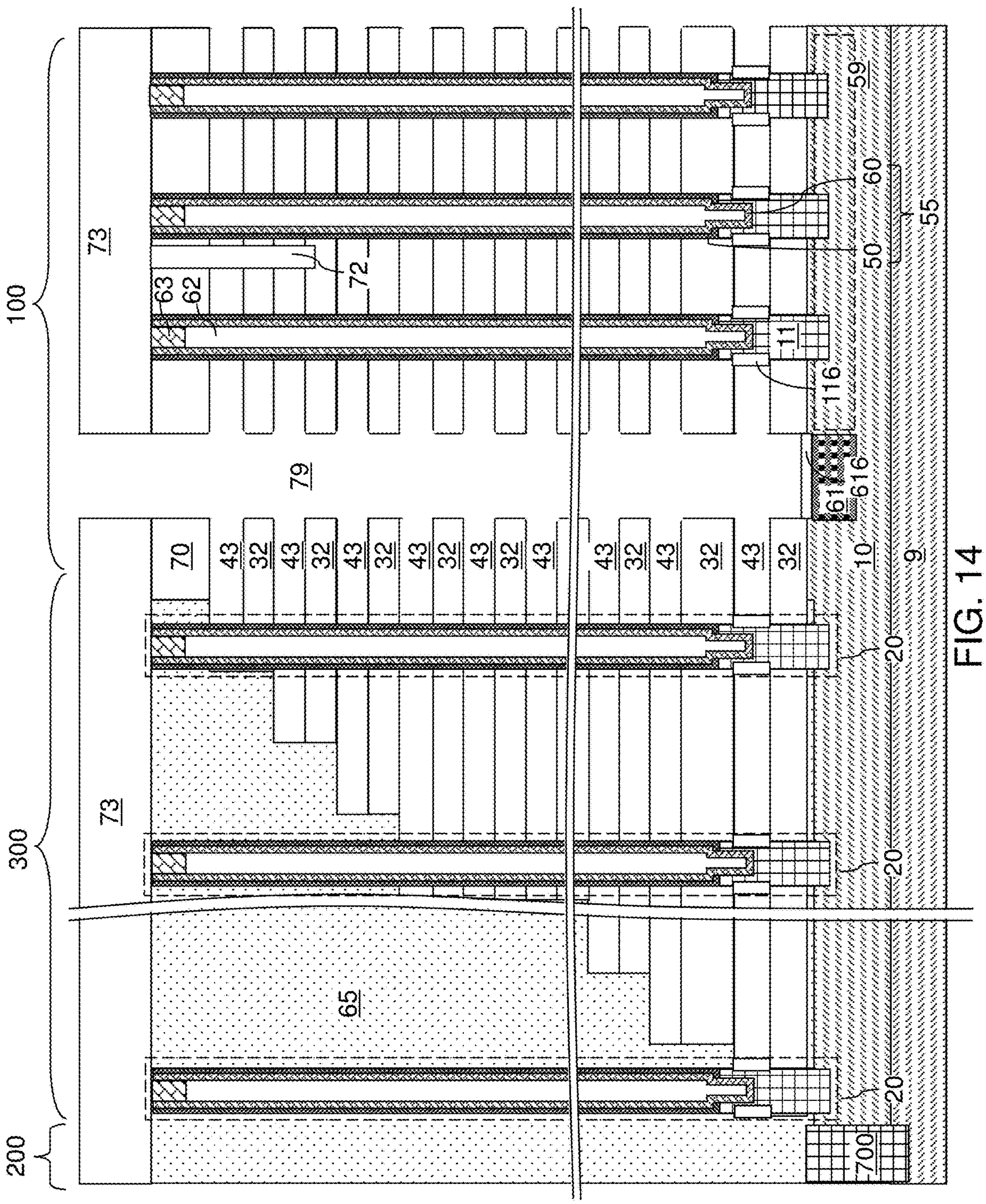
FIG. 14 is a schematic vertical cross-sectional view of the first exemplary structure after formation of backside recesses according to the first embodiment of the present disclosure.
Figure 15A:
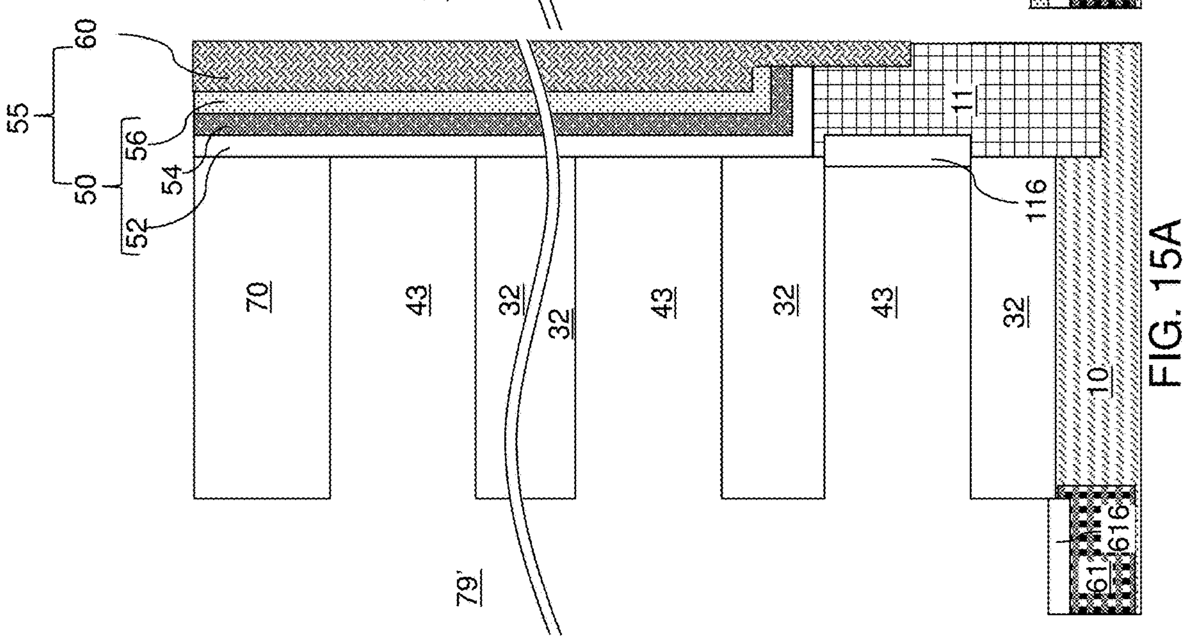
FIGS. 15A-15D are sequential vertical cross-sectional views of a region of the first exemplary structure during formation of electrically conductive layers according to the first embodiment of the present disclosure.

Referring to FIGS. 14 and 15A, an etchant that selectively etches the second material of the sacrificial material layers 42 with respect to the first material of the insulating layers 32 can be introduced into the backside cavities 79', for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Generally, the backside recesses 43 can be formed by removing the sacrificial material layers 42 (which are patterned portions of the sacrificial material layers as formed at the processing steps of FIG. 3) selective to the insulating layers 32 (which are patterned portions of the insulating layers 32 as formed at the processing steps of FIG. 3).

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 15B:
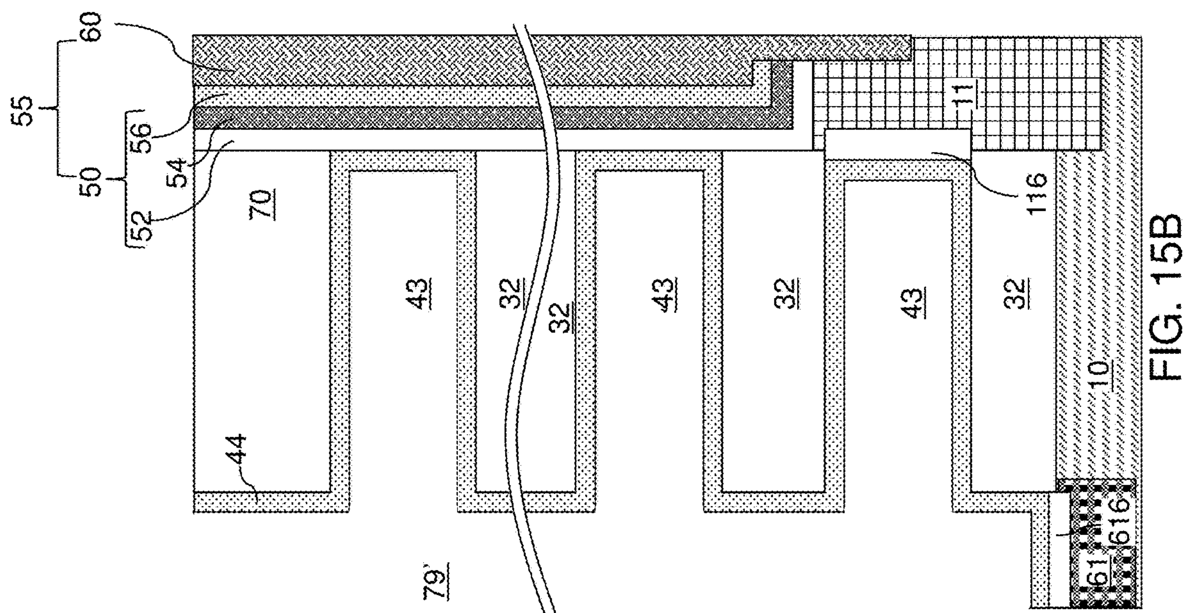

Referring to FIG. 15B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 15D:
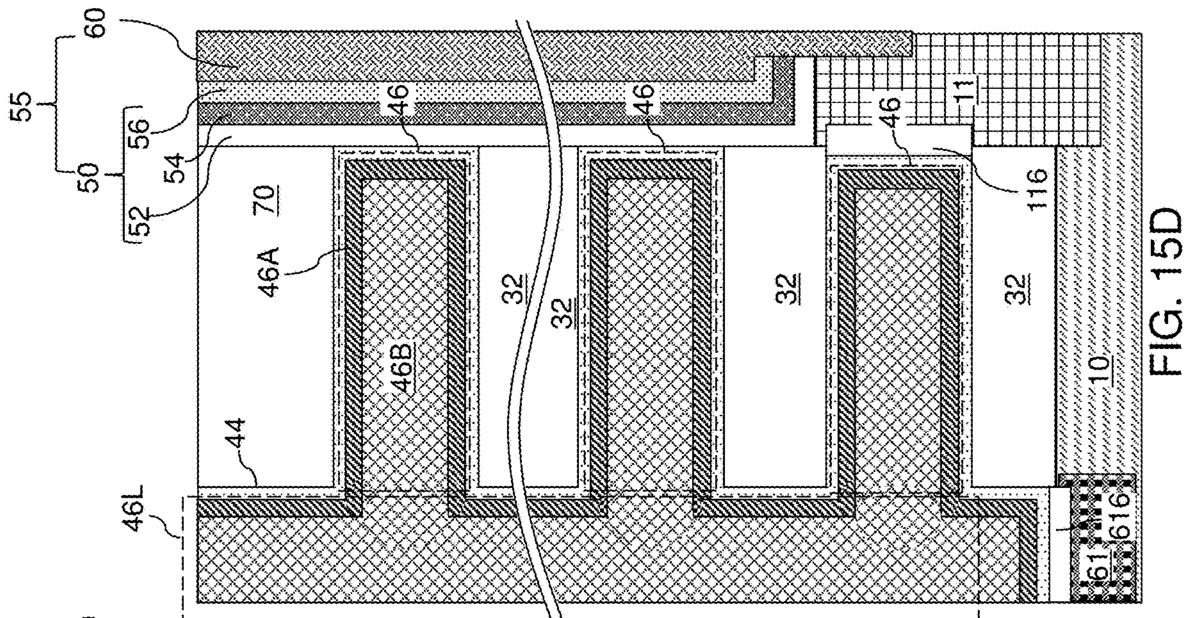
Figure 15C:
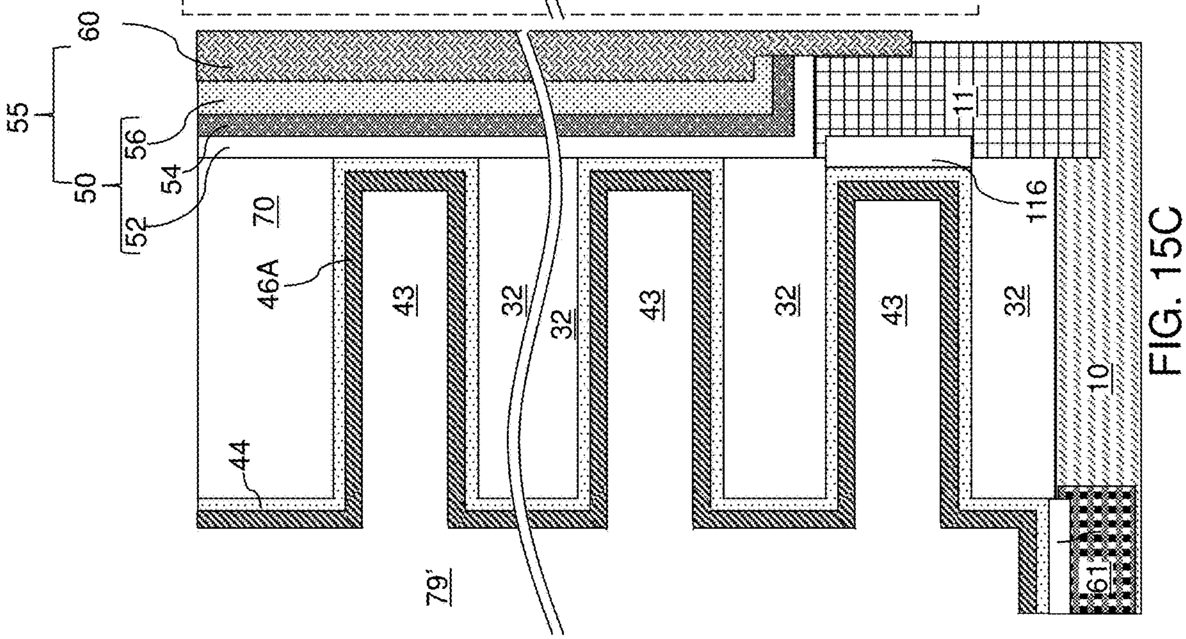

Referring to FIG. 15C, at least one conductive material can be deposited in the backside recesses 43 by providing at least one reactant gas into the backside recesses 43 through the backside trenches 79. A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 16:
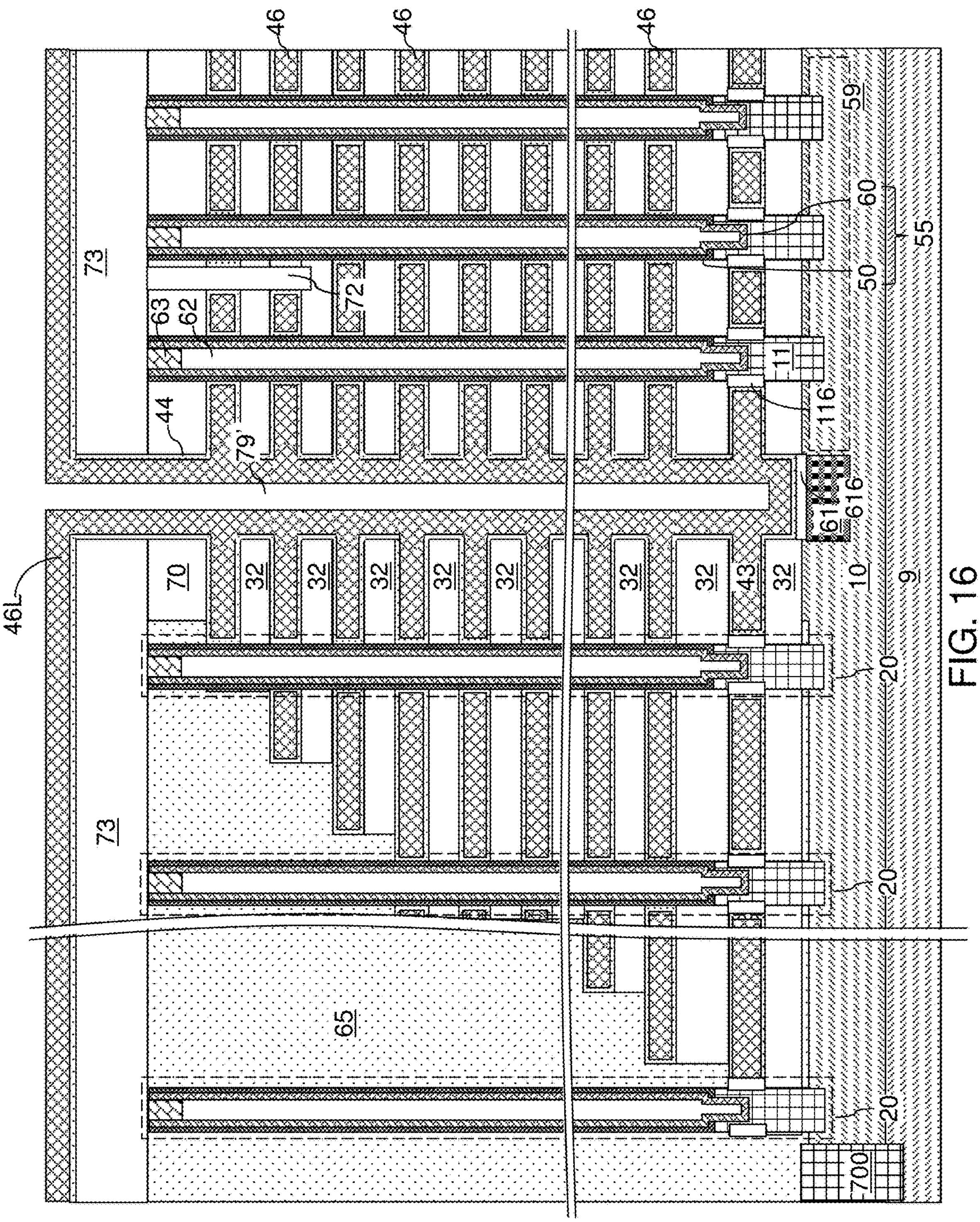
FIG. 16 is a schematic vertical cross-sectional view of the first exemplary structure at the processing step of FIG. 15D.

Referring to FIGS. 15D and 16, a metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 17A:
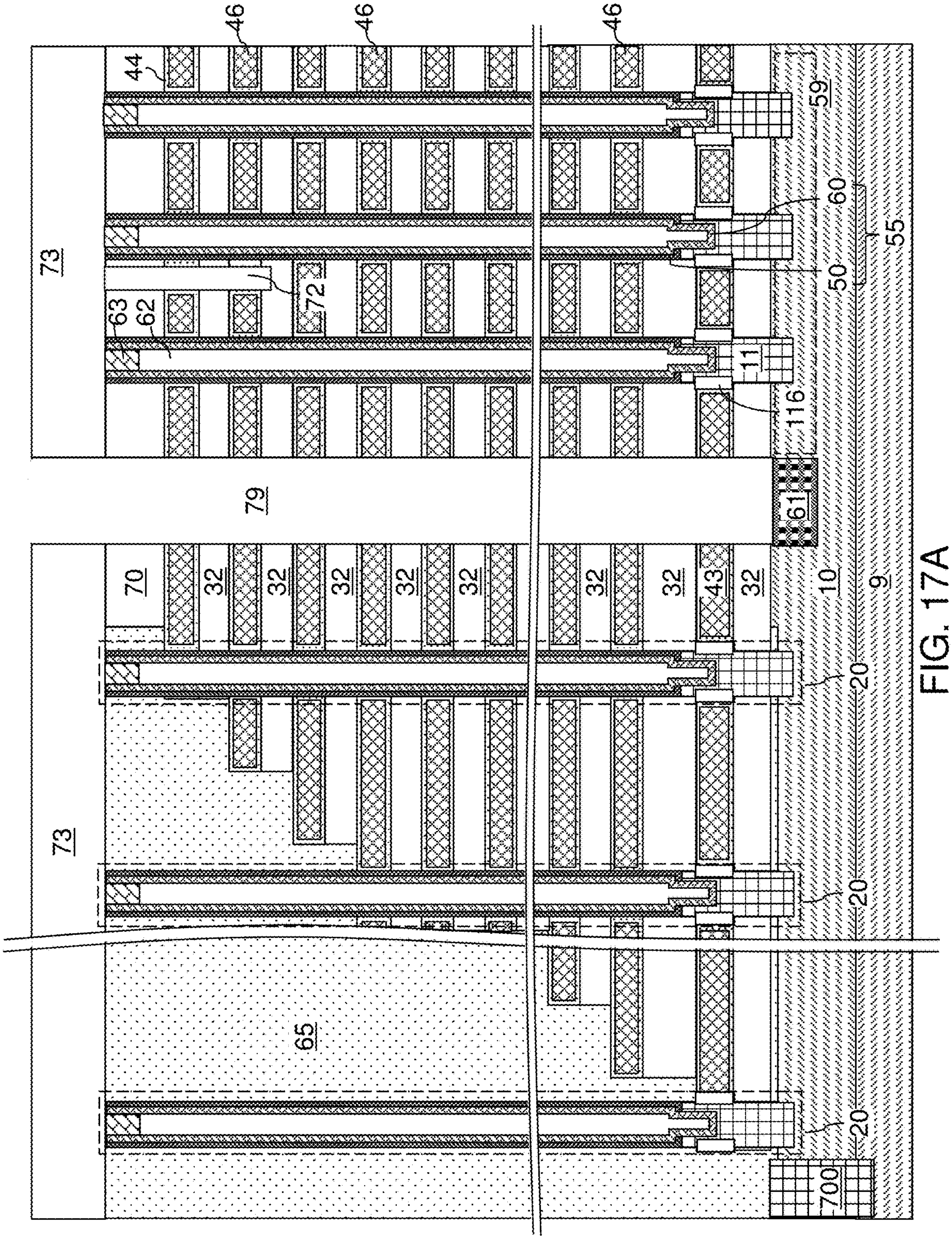
FIG. 17A is a schematic vertical cross-sectional view of the first exemplary structure after removal of conductive materials from within the backside trenches according to the first embodiment of the present disclosure.
Figure 17B:
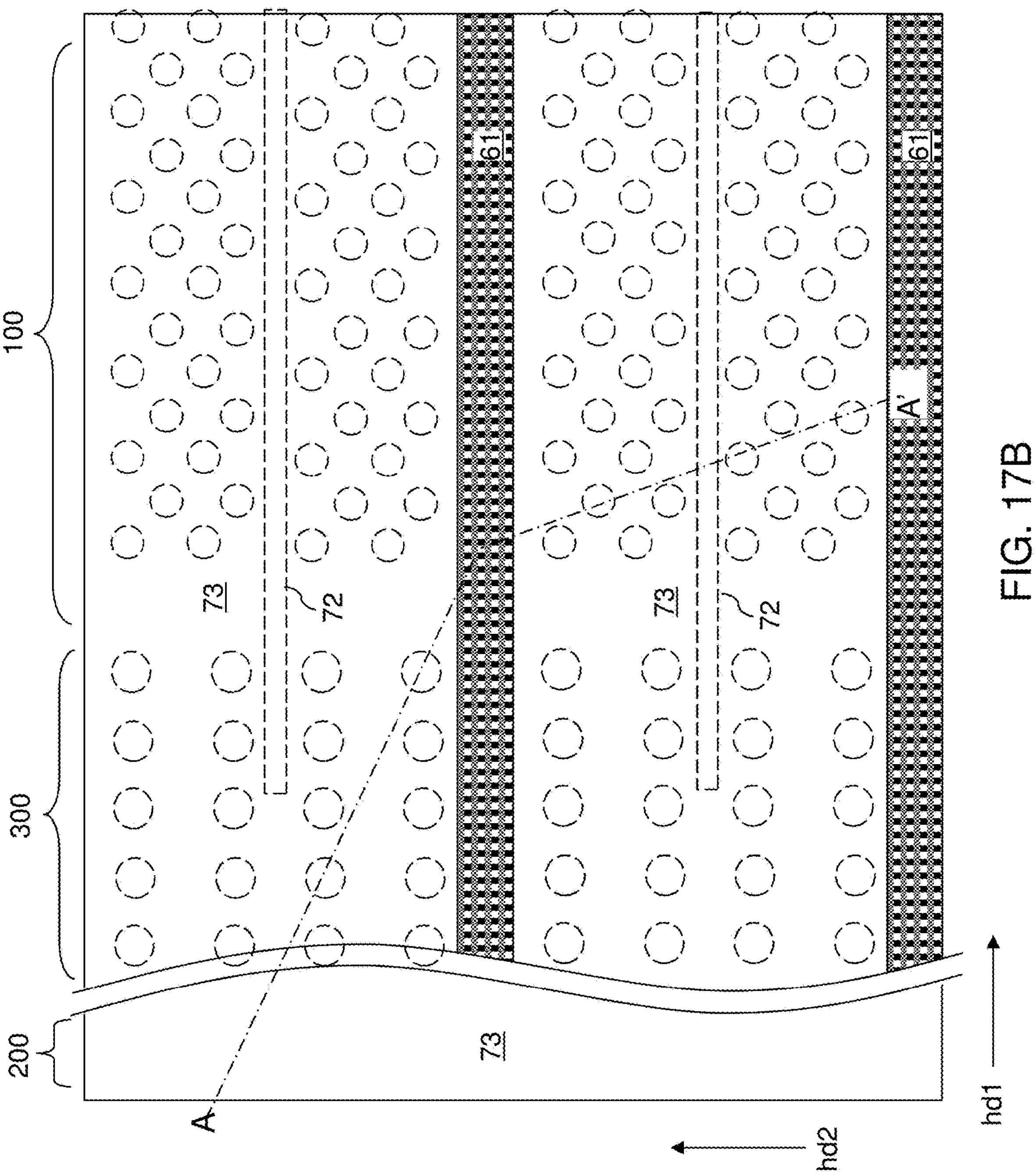
FIG. 17B is a partial see-through top-down view of the first exemplary structure of FIG. 17A. The vertical plane A-A' is the plane of the schematic vertical cross-sectional view of FIG. 17A.

Referring to FIGS. 17A and 17B, the deposited metallic material of the continuous electrically conductive material layer 46L is etched back from the sidewalls of each backside trench 79 and from above the contact-level dielectric layer 73 by performing an isotropic etch process that etches the at least one conductive material of the continuous electrically conductive material layer 46L. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity is present within each backside trench 79. Each backside cavity continuous extends along the first horizontal direction hd1.

Figure 18A:
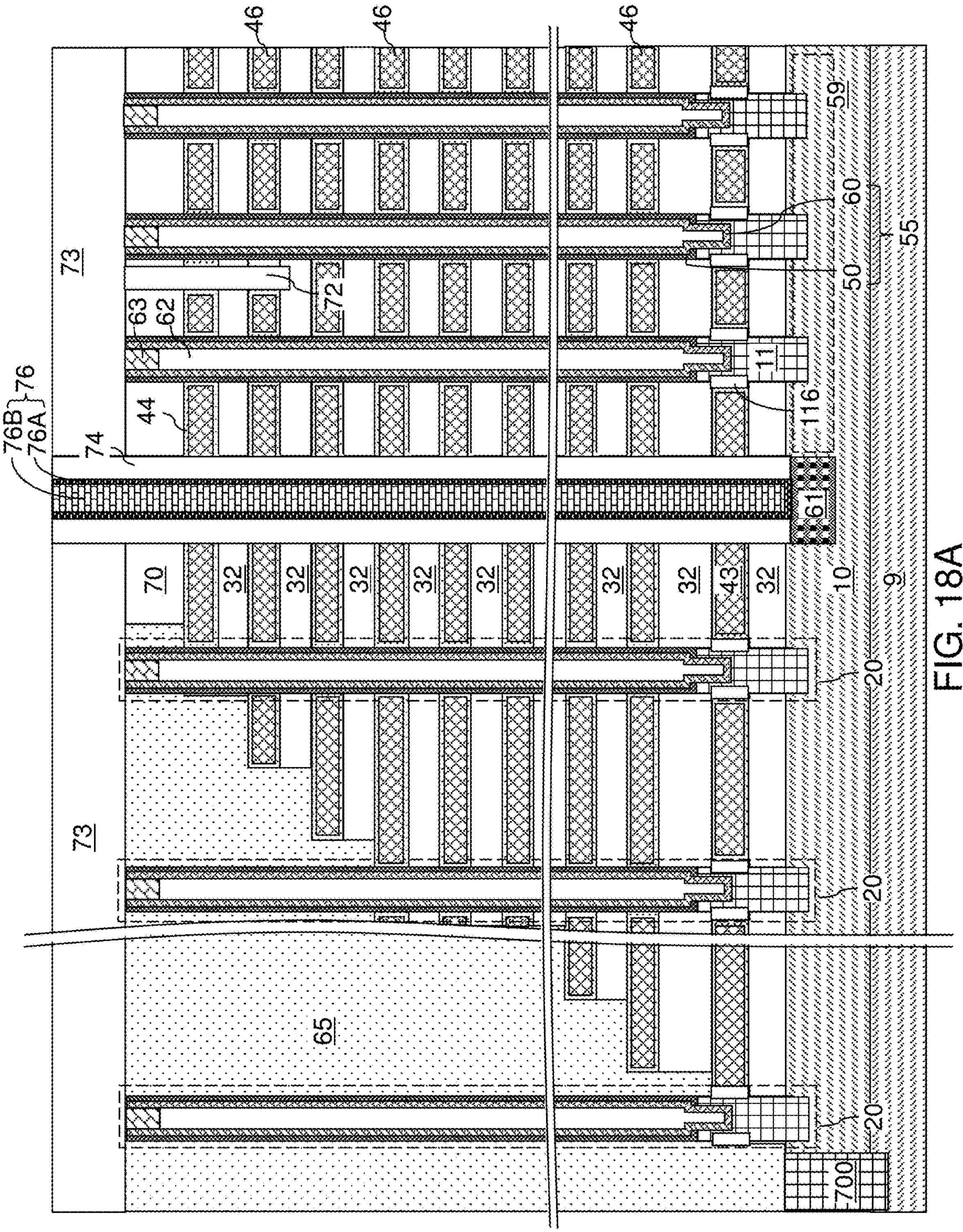
FIG. 18A is a schematic vertical cross-sectional view of the first exemplary structure after formation of insulating spacers and backside contact via structures according to the first embodiment of the present disclosure.
Figure 18B:
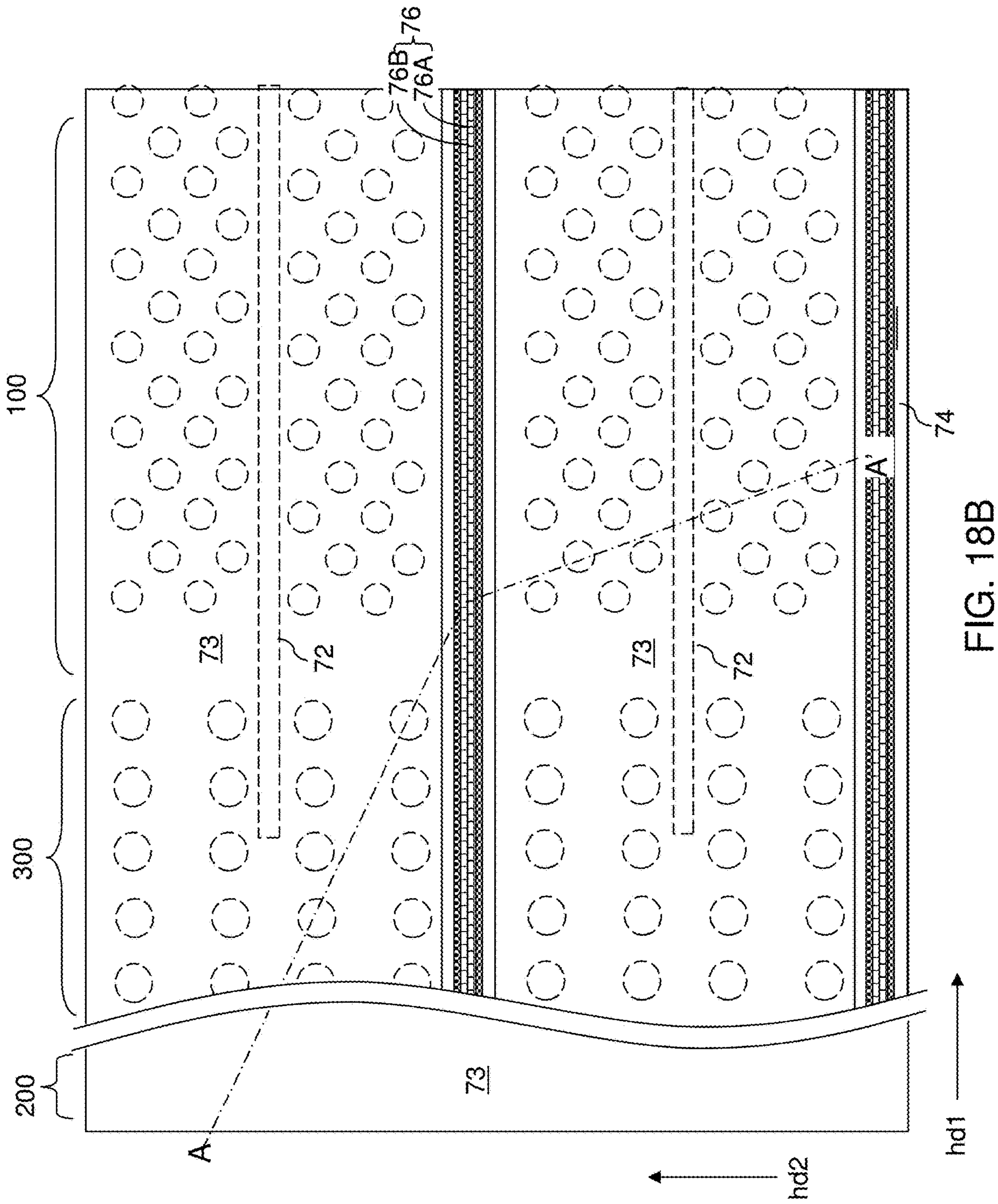
FIG. 18B is a partial see-through top-down view of the first exemplary structure of FIG. 18A. The vertical plane A-A' is the plane of the schematic vertical cross-sectional view of FIG. 18A.

Referring to FIGS. 18A and 18B, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74.

A top surface of a source region 61 can be physically exposed at the bottom of each backside trench 79. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. Each backside contact via structure 76 extends through the alternating stacks (32, 46), and contacts a top surface of a respective source region 61. If a backside blocking dielectric layer 44 is employed, each backside contact via structure 76 can contact a sidewall of the backside blocking dielectric layer 44.

Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

Figure 19A:
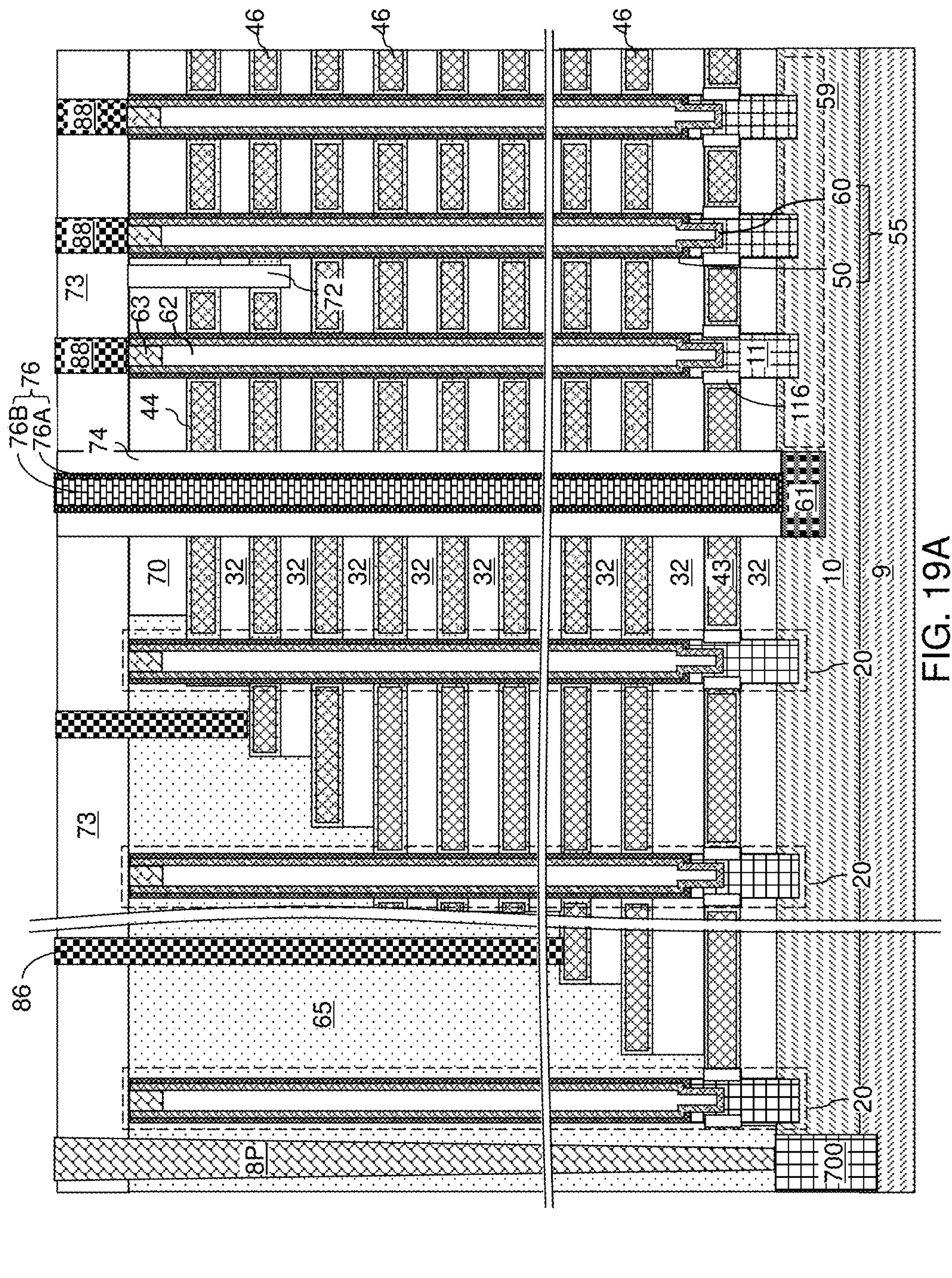
FIG. 19A is a schematic vertical cross-sectional view of the first exemplary structure after formation of additional contact via structures according to the first embodiment of the present disclosure.
Figure 19B:
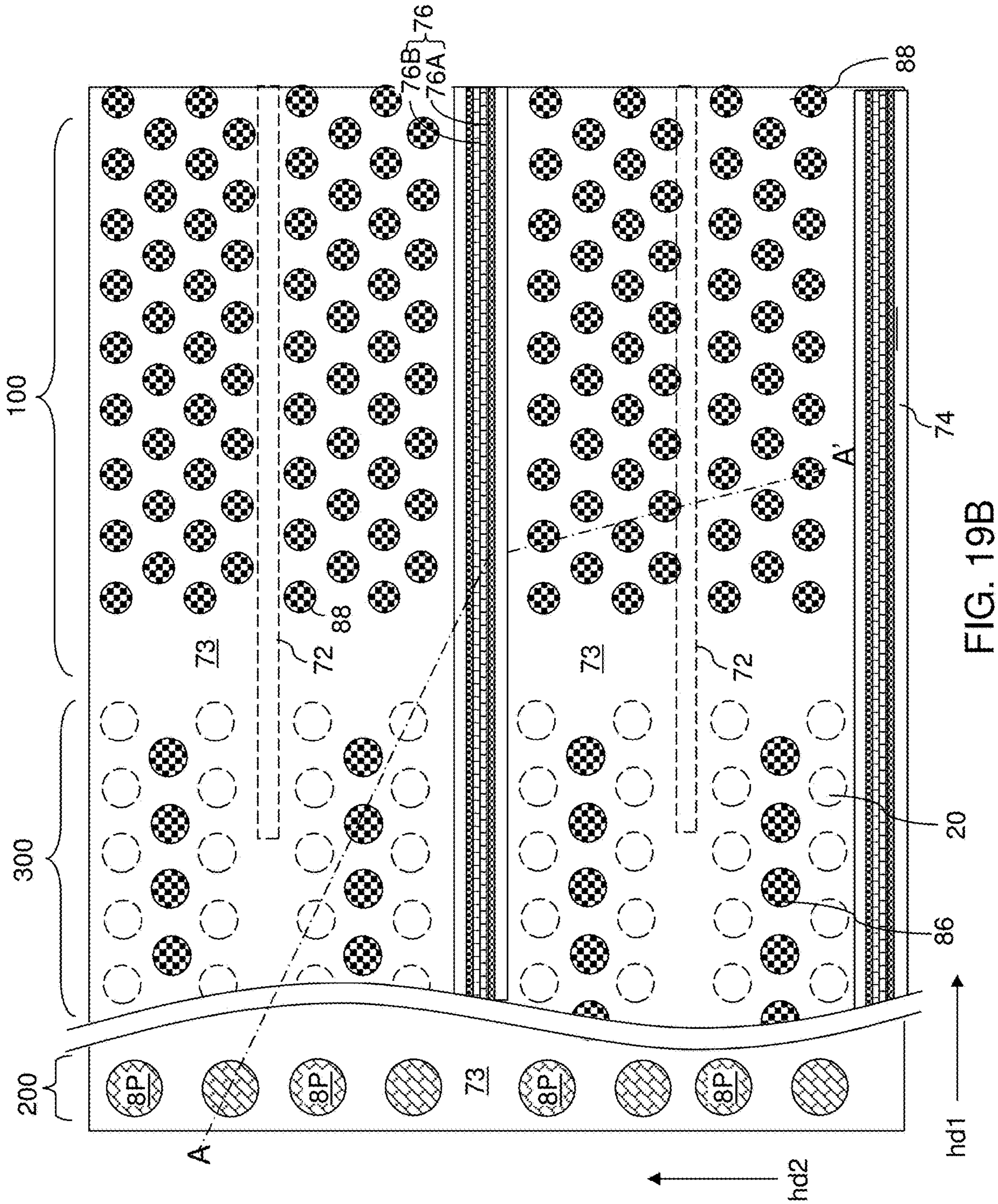
FIG. 19B is a top-down view of the first exemplary structure of FIG. 19A. The vertical plane A-A' is the plane of the schematic vertical cross-sectional view of FIG. 19A.

Referring to FIGS. 19A and 19B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Figure 20A:
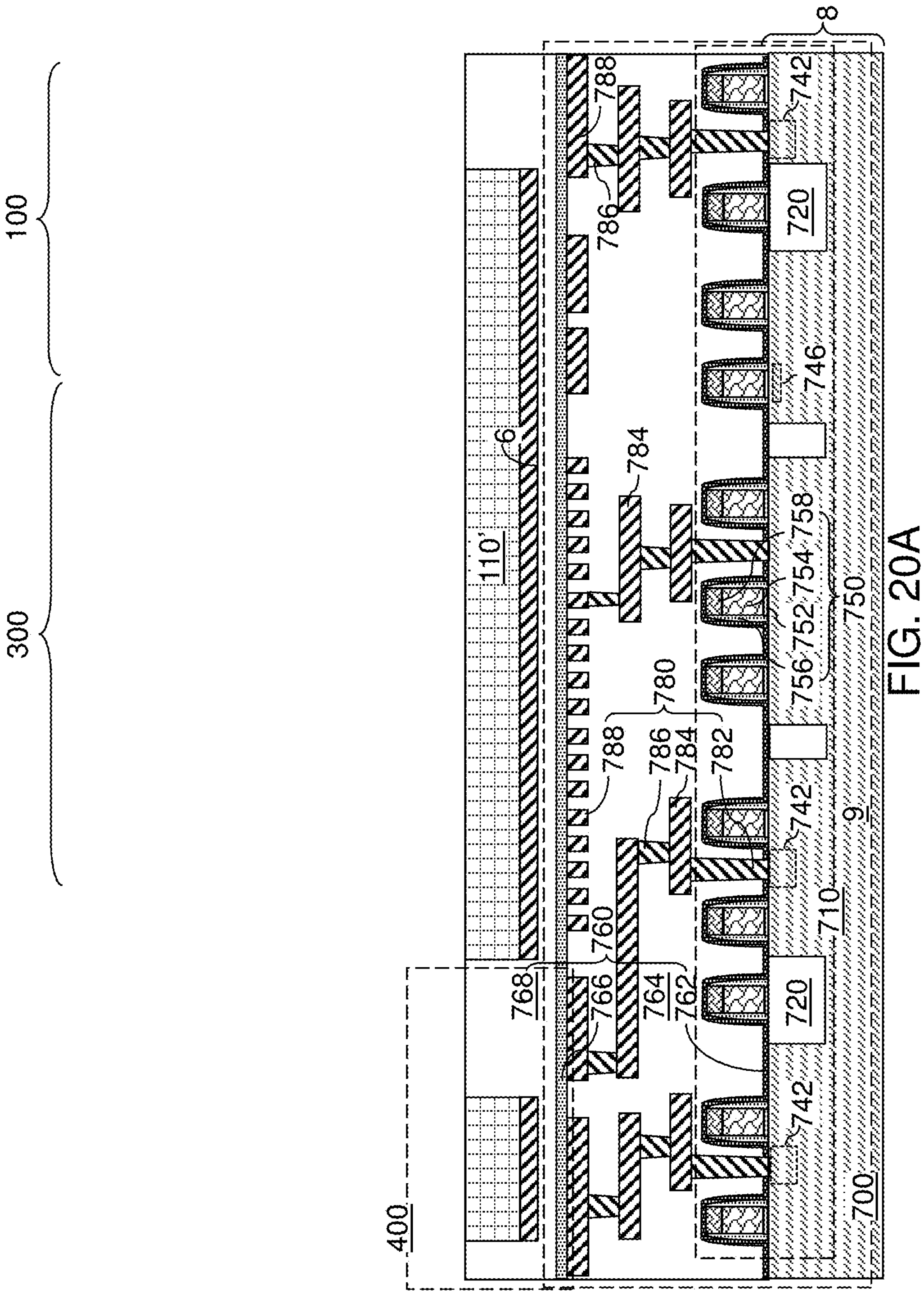
FIG. 20A is a vertical cross-sectional view of a second exemplary structure after formation of semiconductor devices, lower level dielectric layers, lower metal interconnect structures, and in-process source level material layers on a semiconductor substrate according to the second embodiment of the present disclosure.
Figure 20B:
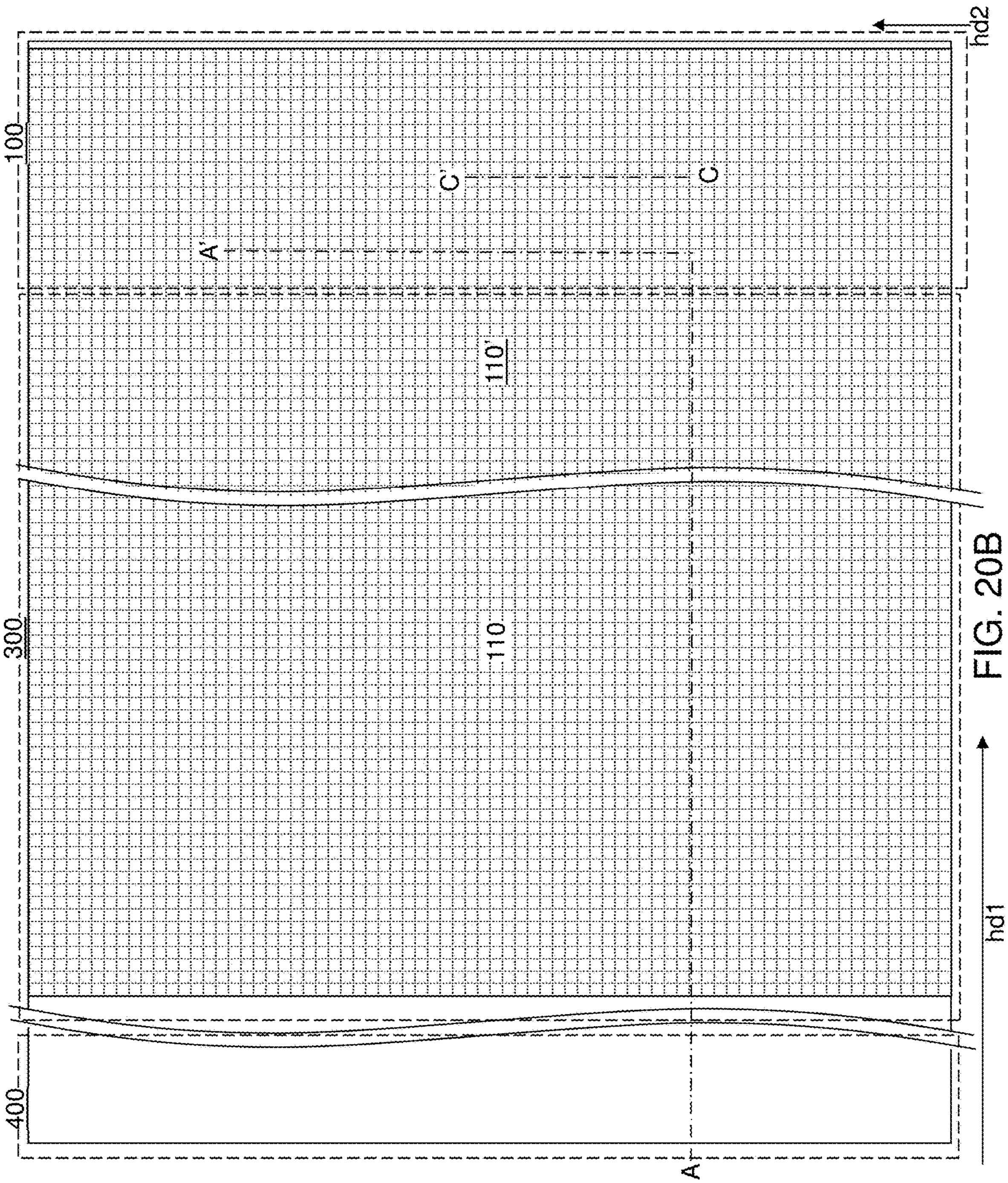
FIG. 20B is a top-down view of the second exemplary structure of FIG. 20A. The hinged vertical plane A-A' is the plane of the vertical cross-sectional view of FIG. 20A.
Figure 20C:
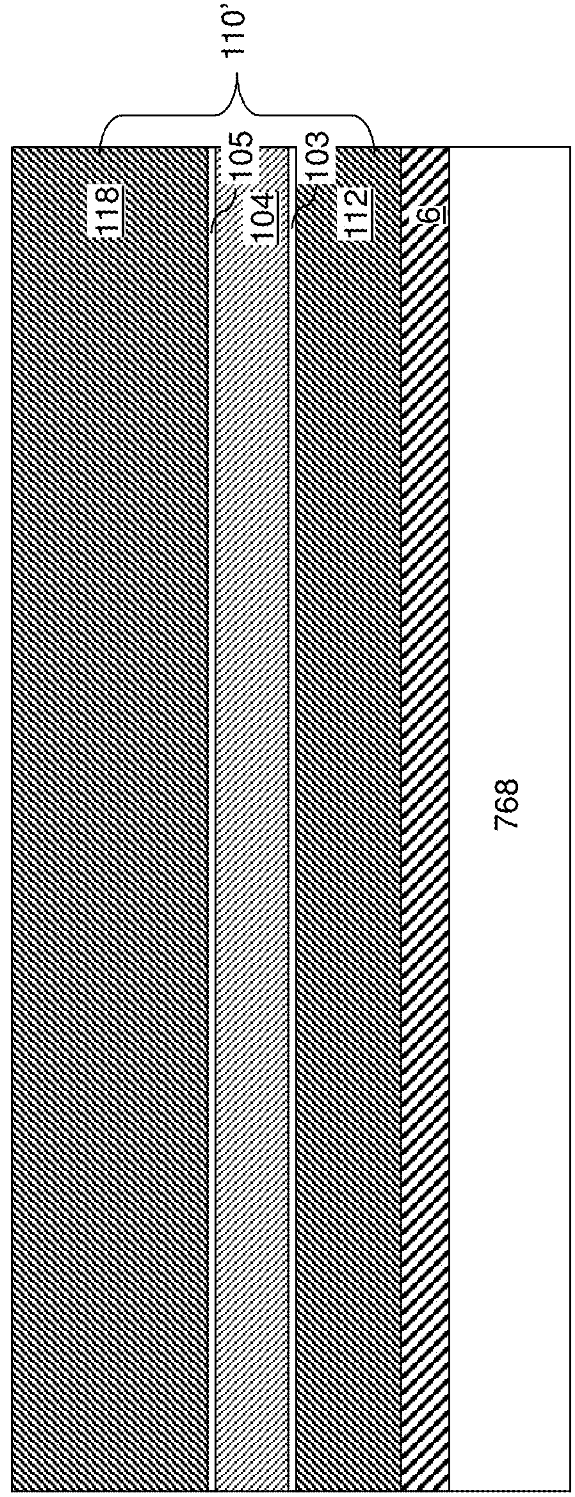
FIG. 20C is a magnified view of the in-process source level material layers along the vertical plane C-C' of FIG. 20B.

Referring to FIGS. 20A-20C, a second exemplary structure according to the second embodiment of the present disclosure is illustrated. FIG. 20C is a magnified view of an in-process source-level material layers 110' illustrated in FIGS. 20A and 20B. The second exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and one or more layers of semiconductor and insulating material may be deposited over, or within patterned recesses of, the at least one second dielectric material layer 768, and are lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal, metal silicide, or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) or silicide (e.g. tungsten or titanium silicide) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, and an upper source-level semiconductor layer 118.

The lower source-level semiconductor layer 112 and the upper source-level semiconductor layer 118 may include a doped semiconductor material, such as doped polysilicon or doped amorphous silicon. The conductivity type of the lower source-level semiconductor layer 112 and the upper source-level semiconductor layer 118 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 118 have a doping of a second conductivity type that is the opposite of the first conductivity type. The thickness of each of the lower source-level semiconductor layer 112 and the upper source-level semiconductor layer 118 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a dielectric material, such as silicon nitride. Alternatively, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a contact region 300 in which contact via structures contacting word line electrically conductive layers are to be subsequently formed. In one embodiment, the contact region 300 may be laterally spaced from the memory array region 100 along a first horizontal direction (e.g., word line direction) hd1. A horizontal direction that is perpendicular to the first horizontal direction hd1 is herein referred to as a second horizontal direction (e.g., bit line direction) hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the contact region 300.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 21:
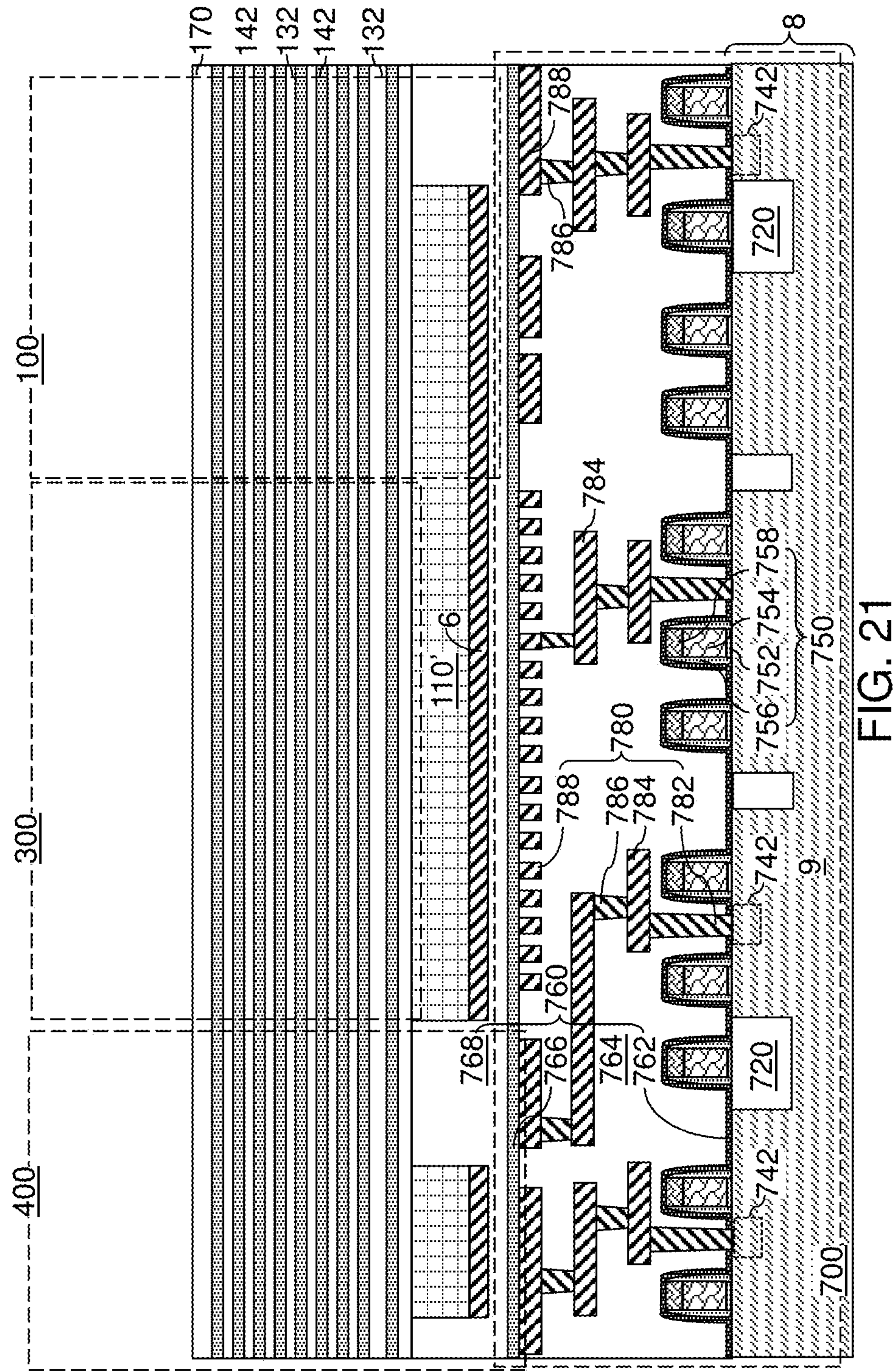
FIG. 21 is a vertical cross-sectional view of the second exemplary structure after formation of a first-tier alternating stack of first insulting layers and first spacer material layers according to the second embodiment of the present disclosure.

Referring to FIG. 21, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142. Generally, an alternating stack of first material layers (such as the first insulating layers 132) and second material layers (such as the first sacrificial material layers 142) may be formed over a semiconductor material layer (such as the upper source-level semiconductor layer 118).

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 22:
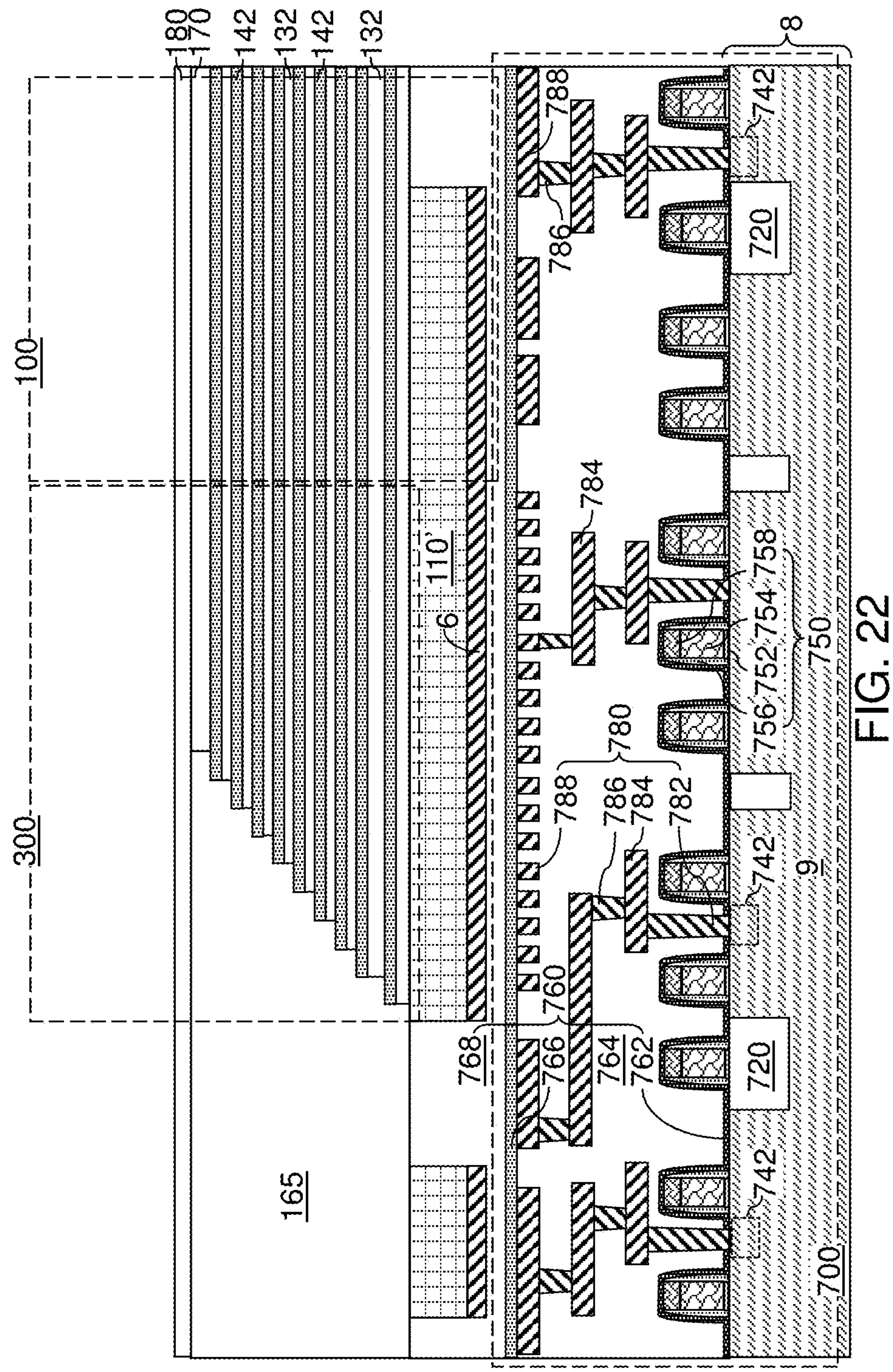
FIG. 22 is a vertical cross-sectional view of the second exemplary structure after patterning a first-tier staircase region, a first retro-stepped dielectric material portion, and an inter-tier dielectric layer according to the second embodiment of the present disclosure.

Referring to FIG. 22, the first insulating cap layer 170 and the first-tier alternating stack (132, 142) may be patterned to form first stepped surfaces in the contact region 300. The contact region 300 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a “retro-stepped” element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include borosilicate glass, phosphosilicate glass, or borophosphosilicate glass. The thickness of the inter-tier dielectric layer 180 may be in a range from 30 nm to 300 nm, although lesser and greater thicknesses may also be used.

Figure 23A:
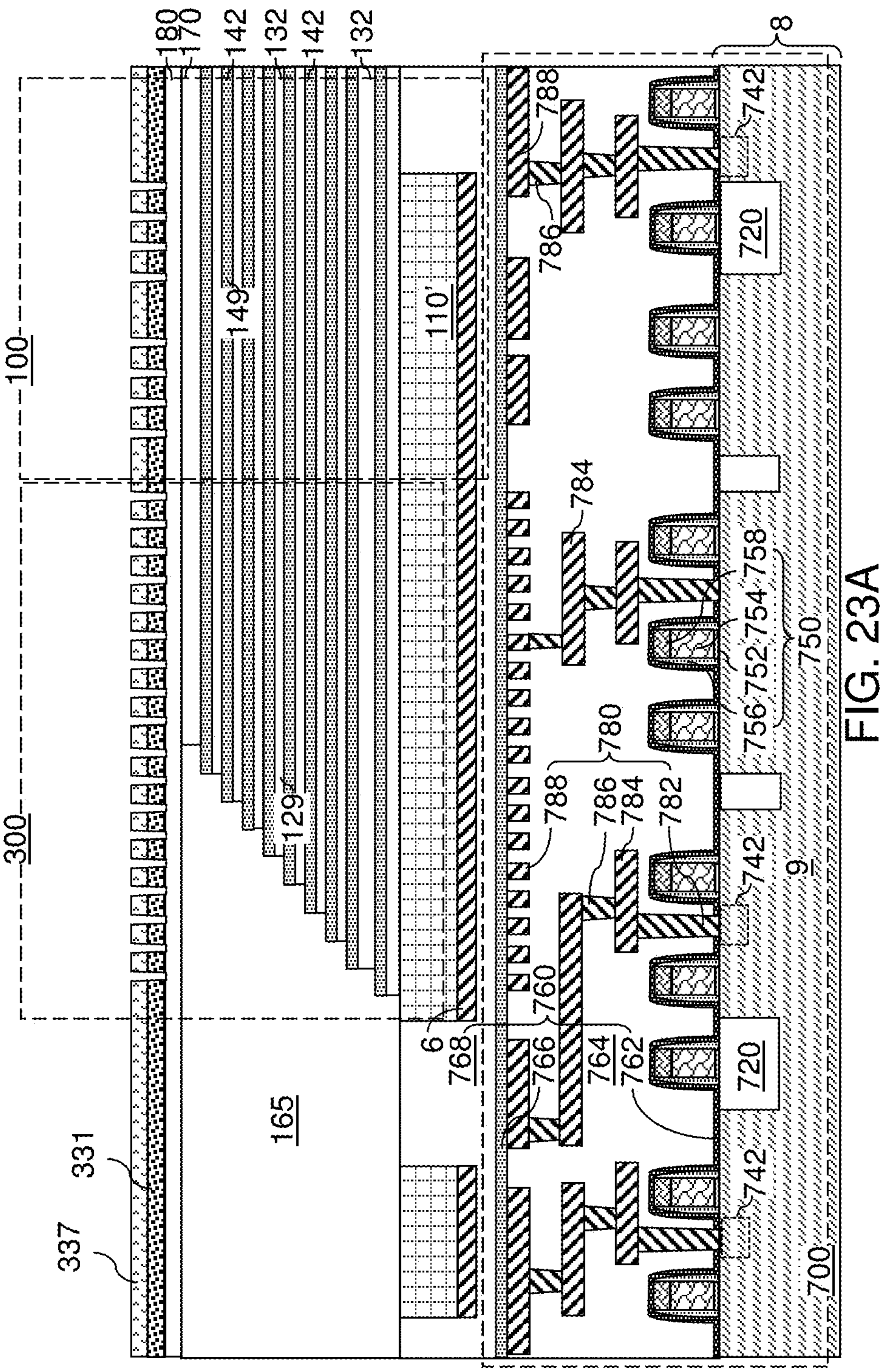
FIG. 23A is a vertical cross-sectional view of the second exemplary structure after application of a patterning film and a photoresist layer, patterning of the photoresist layer, and transfer of a pattern of openings in the photoresist layer through the patterning film according to the second embodiment of the present disclosure.
Figure 23B:
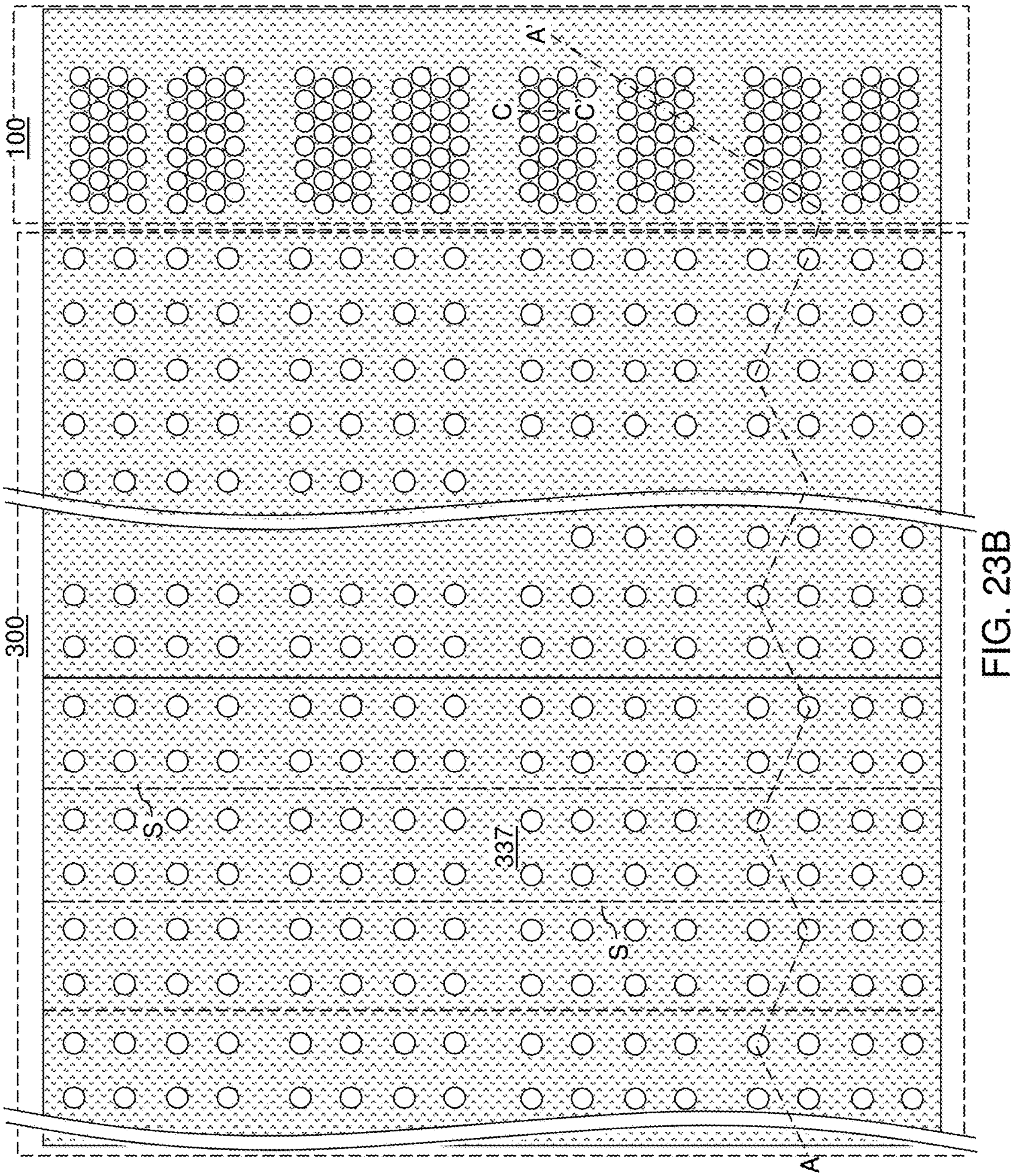
FIG. 23B is a top-down view of the first exemplary structure of FIG. 23A. The vertical plane A-A' is the plane of the schematic vertical cross-sectional view of FIG. 23A.
Figure 23C:
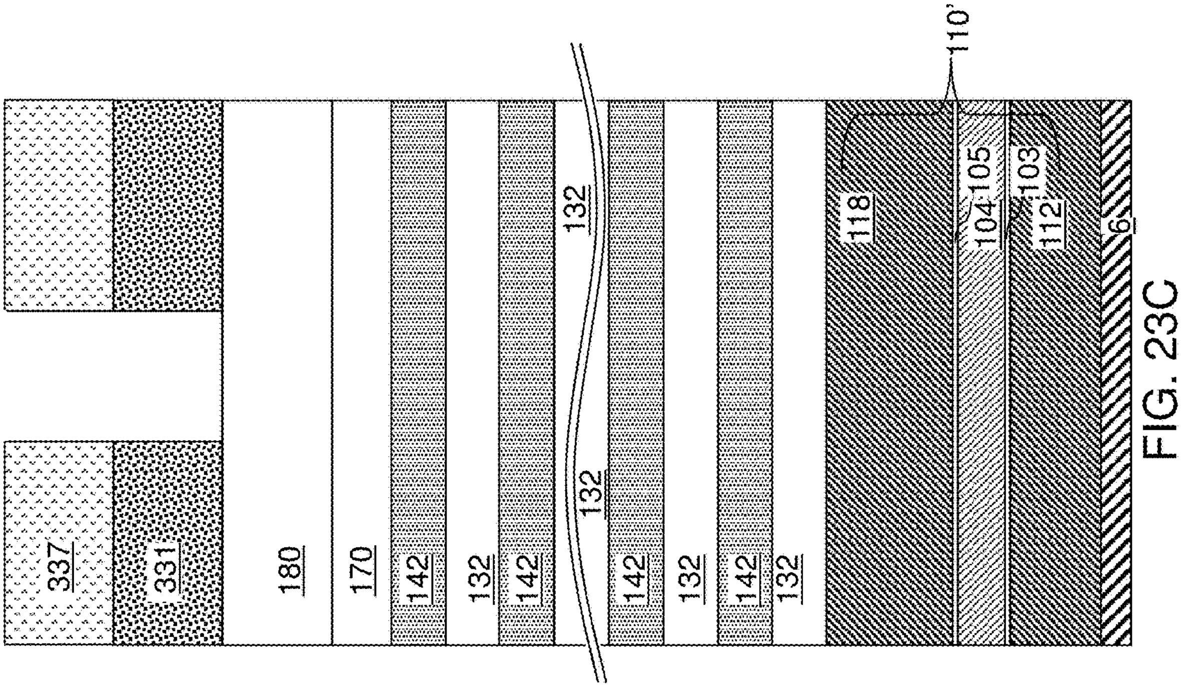
FIG. 23C is vertical cross-sectional view of a region of the second exemplary structure along the vertical plane C-C' of FIG. 23B.

Referring to FIGS. 23A-23C, a patterning film 331 can be deposited over the top surface of the inter-tier dielectric layer 180. The patterning film 331 comprises a material that provides high etch selectivity during a subsequent anisotropic etch process to be employed to form via openings through the first-tier alternating stack (132, 142). In one embodiment, the patterning film 331 comprises amorphous carbon or diamond-like carbon at an atomic percentage in a range from 80% to 100%. In one embodiment, the patterning film 331 may comprise an inorganic carbon-based material that can be subsequently employed as a hard mask material. In one embodiment, the patterning film 331 may have a homogeneous material composition throughout. In one embodiment, the patterning film 331 may comprise a commercially-available carbon-based patterning film such as Advanced Patterning Film™ from Applied Materials, Inc™, a commercially-available boron-doped carbon-based patterning film such as Saphira™ from Applied Materials, Inc™, or a tungsten boron carbide material. The patterning film 331 may be deposited by a conformal or nonconformal deposition process. For example, the patterning film 331 may be deposited by a chemical vapor deposition process. The thickness of the patterning film 331 may be in a range from 200 nm to 1,000 nm, such as from 300 nm to 600 nm, although lesser and greater thicknesses may also be employed.

A photoresist layer 337 can be applied over the patterning film 331, and can be lithographically patterned to form openings therein. The pattern of the openings in the photoresist layer 337 include arrays of openings that are formed in the memory array region 100 and arrays of openings that are formed in the contact region 300. The pattern of the openings in the photoresist layer 337 that are formed in the memory array region 100 is a pattern for subsequently forming via openings through the first-tier alternating stack (132, 142), which are herein referred to as first-tier memory openings. The pattern of the openings in the photoresist layer 337 that are formed in the contact region 300 is a pattern for subsequently forming via openings through the first retro-stepped dielectric material portion 165 and the first-tier alternating stack (132, 142), which are herein referred to as first-tier support openings. In one embodiment, the openings in the photoresist layer 337 may have circular horizontal cross-sectional shapes or elliptical horizontal cross-sectional shapes. The maximum lateral dimension (such as a diameter) of each opening in the photoresist layer 337 may be in a range from 30 nm to 600 nm, such as from 60 nm to 300 nm, although lesser and greater maximum lateral dimensions may also be employed.

An anisotropic etch process may be performed to transfer the pattern in the photoresist layer 337 though the patterning film 331. For example, a reactive ion etch may be performed to transfer the pattern of the openings in the photoresist layer 337 through the patterning film 331. A top surface of the inter-tier dielectric layer 180 may be physically exposed at the bottom of each opening through the patterning film 331. Generally, the sidewalls of the openings through the patterning film 331 may be vertical or substantially vertical.

Figure 24A:
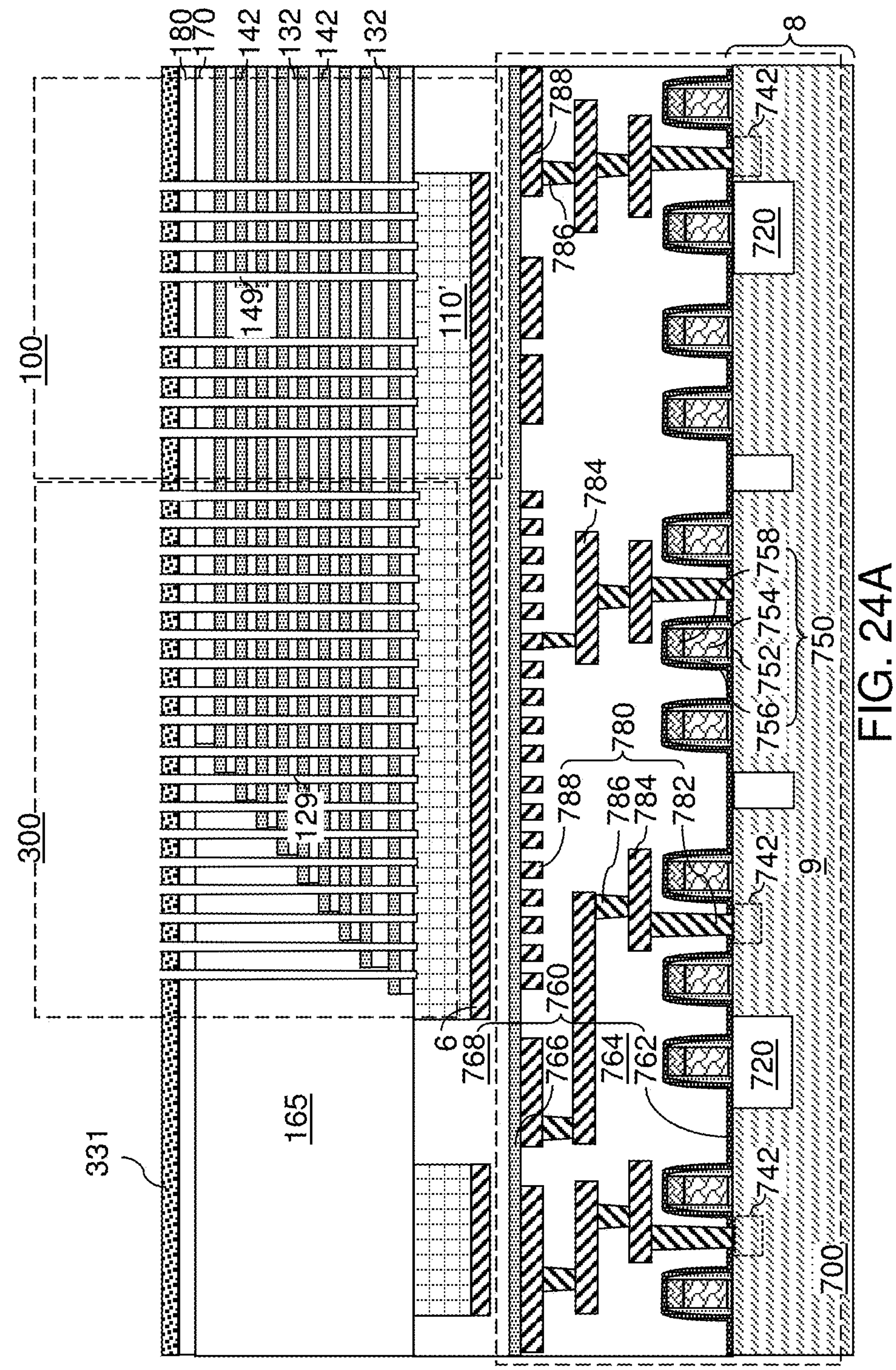
FIG. 24A is a vertical cross-sectional view of the second exemplary structure after a first anisotropic etch process that transfers a pattern of openings in the patterning film through the first alternating stack according to the second embodiment of the present disclosure.
Figure 24B:
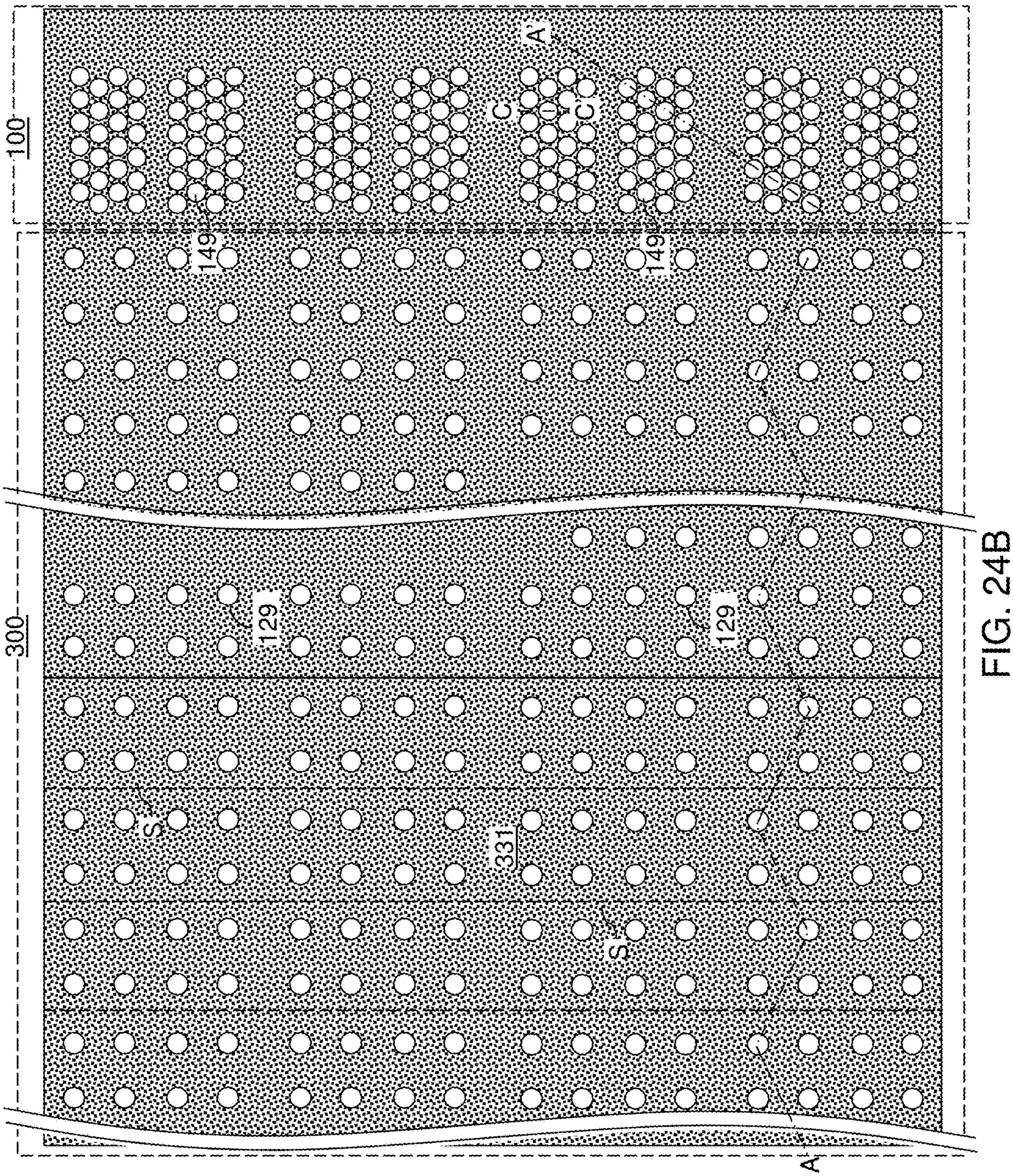
FIG. 24B is a top-down view of the first exemplary structure of FIG. 24A. The vertical plane A-A' is the plane of the schematic vertical cross-sectional view of FIG. 24A.
Figure 24C:
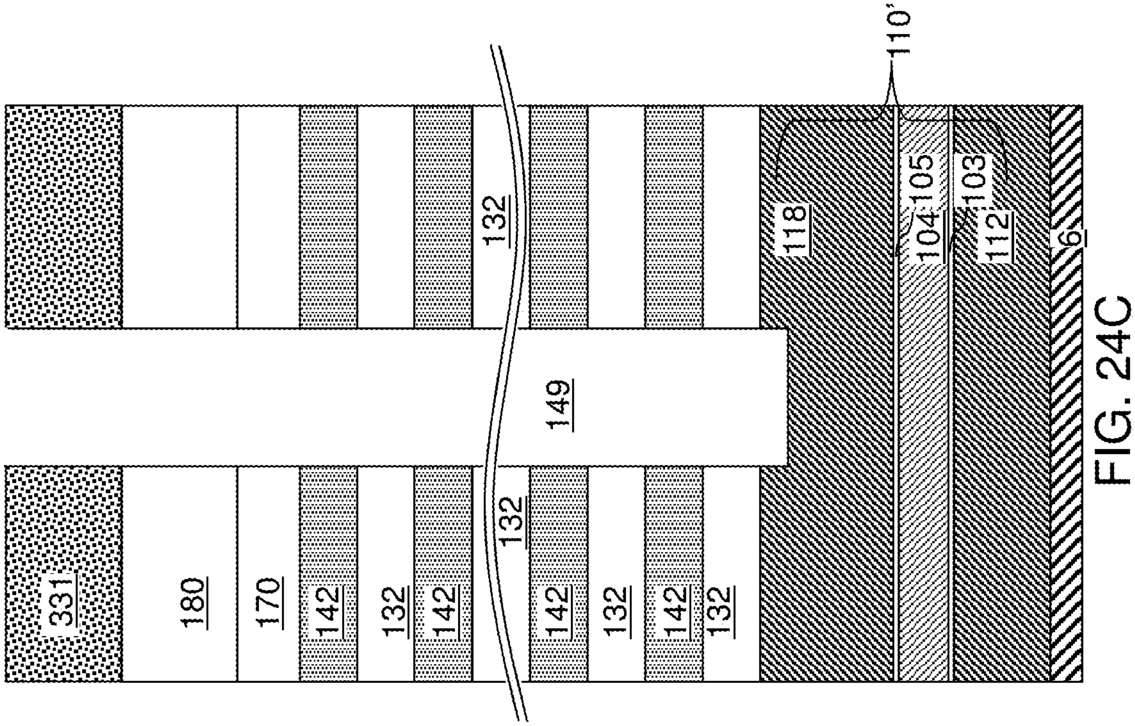
FIG. 24C is vertical cross-sectional view of a region of the second exemplary structure along the vertical plane C-C' of FIG. 24B.

Referring to FIGS. 24A-24C, a first anisotropic etch process may be performed to transfer the pattern of the openings in the patterning film 331 through the first-tier alternating stack (132, 142). The chemistry of the first anisotropic etch process can be selected such that the materials of the first-tier alternating stack (132, 142) and the first retro-stepped dielectric material portion 165 are etched selective to the material of the upper source-level semiconductor layer 118. For example, if the first insulating layers 132 comprise silicon oxide, the first sacrificial material layers 142 comprise silicon nitride, and the first retro-stepped dielectric material portion 165 comprise silicon oxide, the first anisotropic etch process may have an etch chemistry employing a mixture of $CF_4$, $O_2$, optionally Ar, and optionally $C_4F_8$ and/or $CF_2Br_2$. The pattern of the openings can be transferred through the first-tier alternating stack (132, 142) by the first anisotropic etch process.

In one embodiment, the materials of the first-tier alternating stack (132, 142) are etched concurrently with the material of the first retro-stepped dielectric material portion 165 during the first anisotropic etch process. The chemistry of the initial etch step may alternate to optimize etching of the first and second materials in the first-tier alternating stack (132, 142) while providing a comparable average etch rate to the material of the first retro-stepped dielectric material portion 165. The sidewalls of the various first-tier openings (149, 129) may be substantially vertical, or may be tapered.

Via openings are formed through the first-tier alternating stack (132, 142) underneath each opening in the patterning film 331. The photoresist layer 337 may be consumed during the first anisotropic etch process. Alternatively, the photoresist layer 337 may be removed prior to or after the first anisotropic etch process. In one embodiment, the etch chemistry of the first anisotropic etch process may be selective to the semiconductor material of the upper source-level semiconductor layer 118. Alternatively, the first anisotropic etch process may be timed such that the via openings do not extend into the upper source-level semiconductor layer 118 by more than a predefined recess depth, which may be in a range from 1% to 50%, such as from 2% to 20%, of the thickness of the upper source-level semiconductor layer 118.

The via openings formed through the first-tier alternating stack (132, 142) and the first retro-stepped dielectric material portion 165 are herein referred to first-tier openings (149, 129), which comprise first-tier memory openings 149 and first-tier support openings 129. The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the contact region 300, and are subsequently employed to form support pillar structures. A subset of the first-tier support openings 129 that is formed through the first retro-stepped dielectric material portion 165 may be formed through a respective horizontal surface of the first stepped surfaces.

The first anisotropic etch process transfers the pattern of the openings in the patterning film 331 through each layer in the alternating stack (132, 142). Generally, the via openings (149, 129) can vertically extend through the alternating stack (132, 142) at least to a top surface of the upper source-level semiconductor layer 118 by the first anisotropic etch process.

Figure 25B:
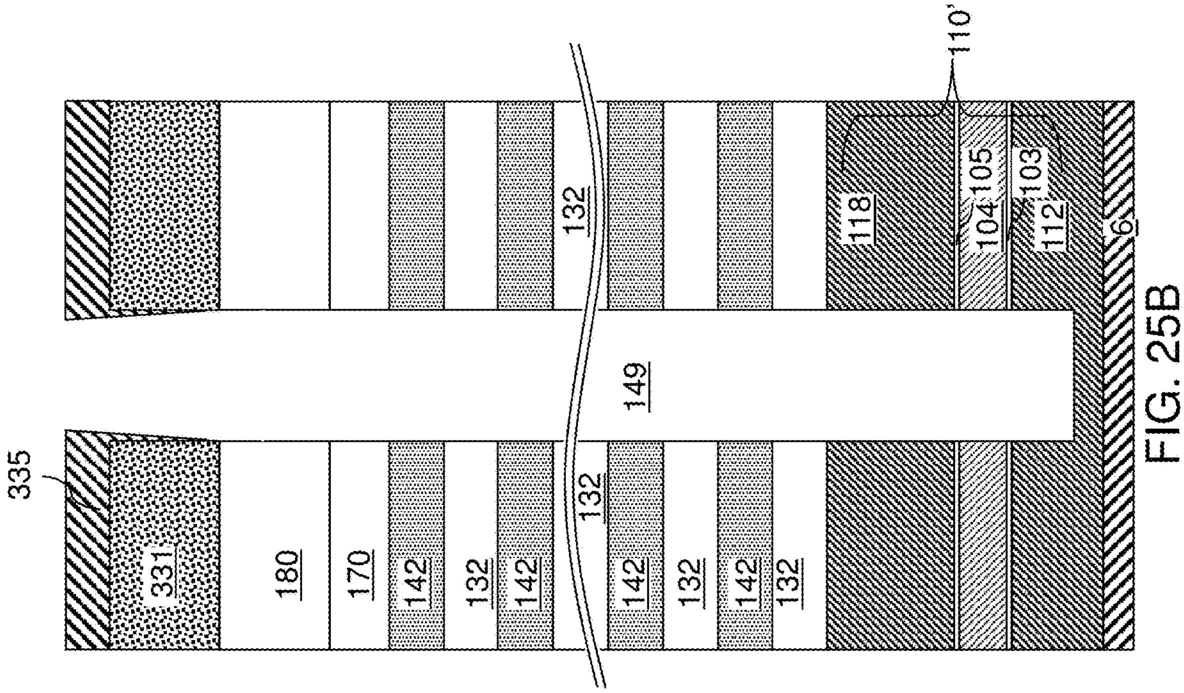
FIGS. 25A-25C are sequential vertical cross-sectional views of a memory opening in a first configuration of the second exemplary structure during the processing steps for formation of a cladding liner, a second anisotropic etch process, and removal of the cladding liner and the patterning film according to the second embodiment of the present disclosure.
Figure 25A:
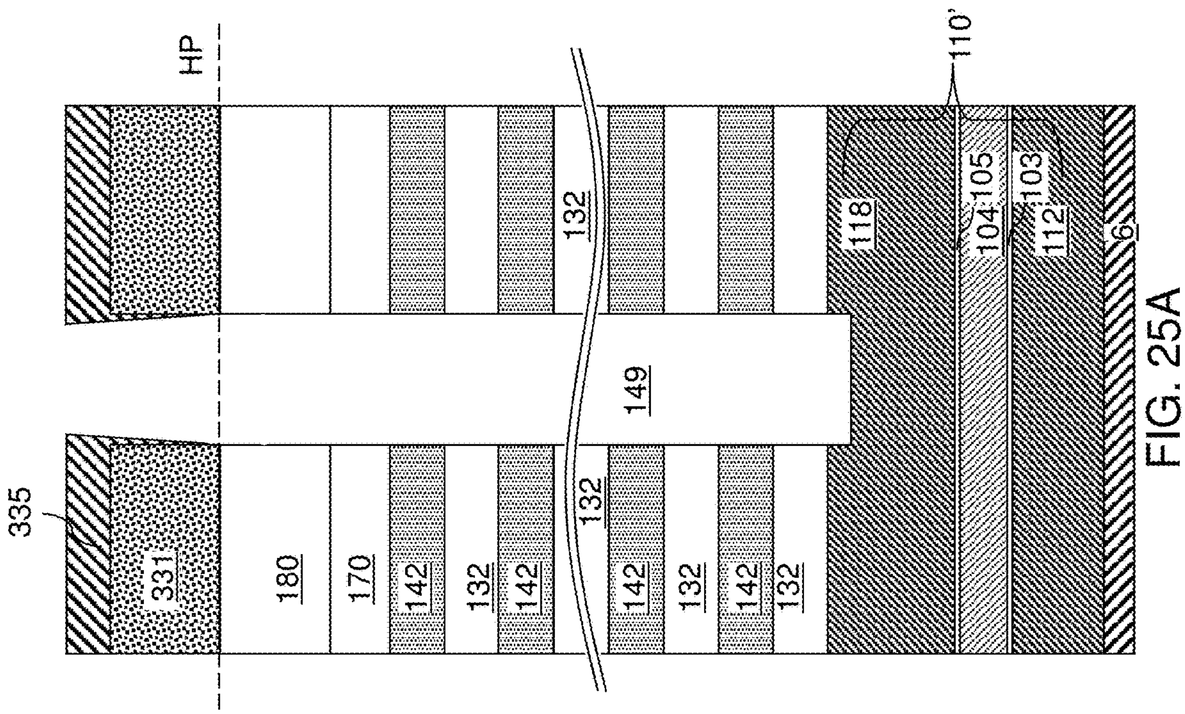
Figure 25D:
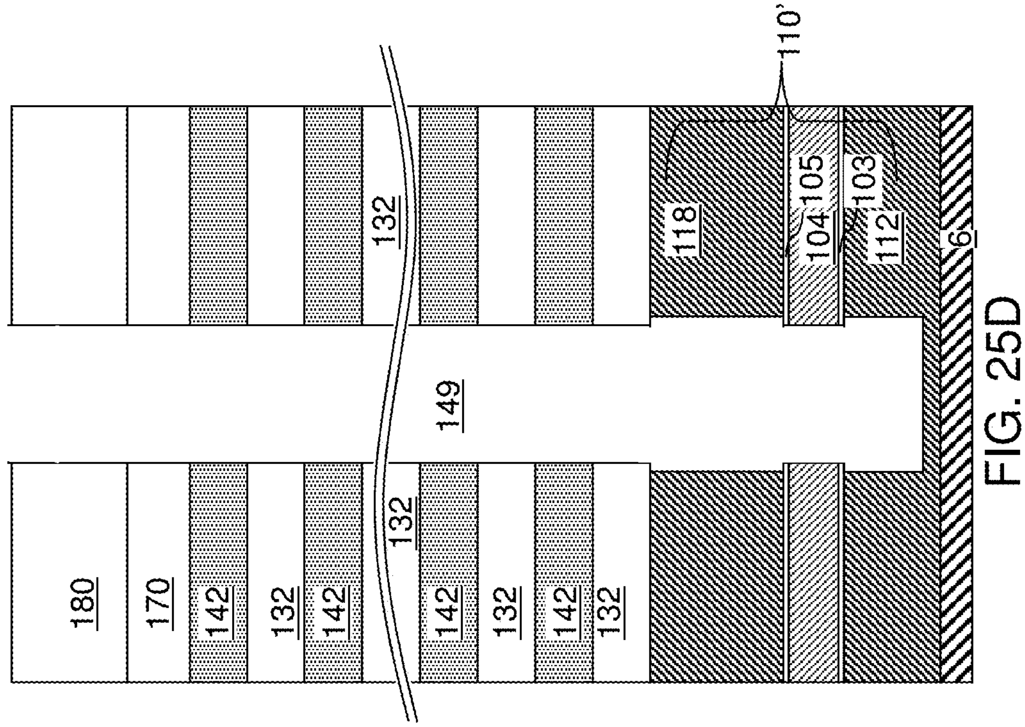
FIG. 25D is an alternative embodiment of the first configuration of a memory opening in the first configuration of the second exemplary structure.
Figure 25C:
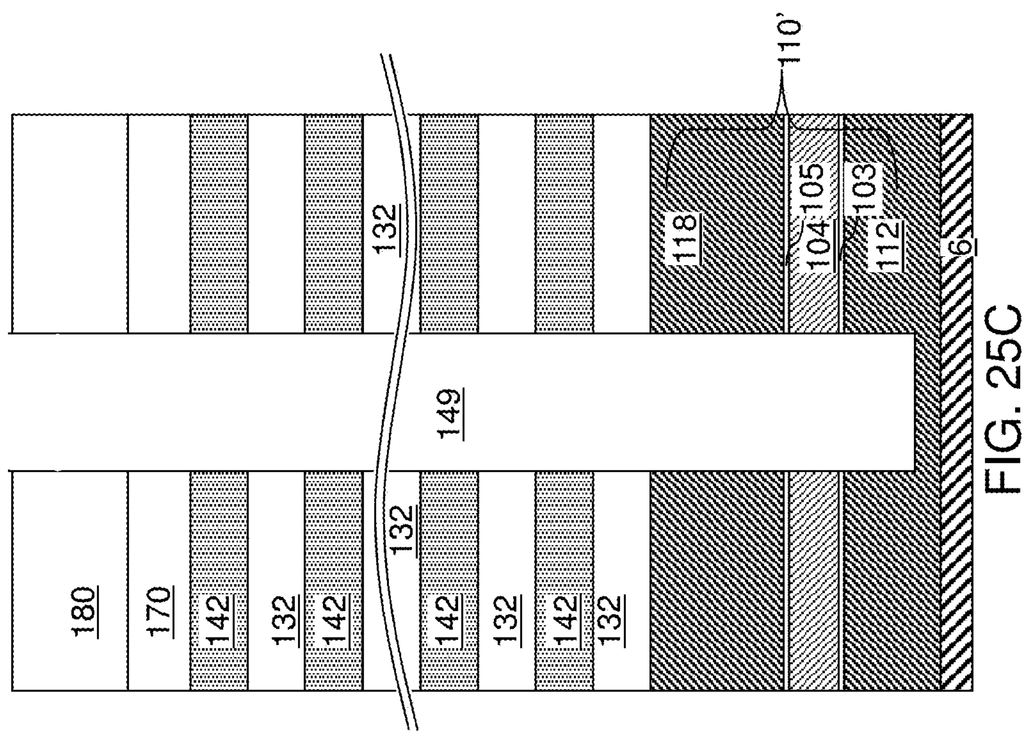

FIGS. 25A-25C are sequential vertical cross-sectional views of a memory opening 149 in a first configuration of the second exemplary structure during the processing steps for formation of a cladding liner 335, a second anisotropic etch process, and removal of the cladding liner 335 and the patterning film 331 according to the second embodiment of the present disclosure.

Referring to FIG. 25A, a cladding liner 335 can be formed on a top surface of the patterning film 331 and sidewalls of the openings in the pattering film 331 by anisotropically depositing a cladding material. According to an embodiment of the present disclosure, the cladding liner 335 consists essentially of an electrically conductive (e.g., metallic) material.

In one embodiment, the cladding liner 335 may be formed by anisotropic (e.g., non-conformal) deposition of a metallic material over the patterning film 331 after the first anisotropic etch process. While the cladding layer 335 shown in FIG. 25A is formed after formation of via openings (149, 129), in an alternative embodiment, the cladding layer 335 may be formed on top surface of the patterning film 331 and sidewalls of the openings in the pattering film 331 after removal of the photoresist layer 337 and before etching of the via openings (149, 129).

In one embodiment, the cladding liner 335 may be deposited by a physical vapor deposition process, such as sputtering, or by a non-conformal atomic layer deposition (ALD) in which a metallic material is deposited anisotropically with directionality such that the metallic material is deposited with a lesser thickness in recessed surfaces that underlie the horizontal plane including the top surface of the patterning film 331. In this case, the thickness of the metallic material of the cladding liner 335 can rapidly decrease with a recess depth as measured from the horizontal plane including the top surface of the patterning film 331. In one embodiment, the aspect ratio of the openings in the patterning film 331 may be at least 1.5, and may be in a range from 2 to 10, such as from 2.5 to 6. The lateral thickness of the portions of the cladding liner 335 located on sidewalls of the patterning film 331 decreases with a vertical distance from a horizontal plane including the top surface of the patterning film 331. In one embodiment, the aspect ratio of the openings in the patterning film 331 and the directionality of the anisotropic deposition process that deposits the cladding liner 335 can be selected such that the lateral thickness of the cladding liner 335 becomes zero above a horizontal plane including a bottom surface of the patterning film 331. In this case, a bottommost portion of a sidewall of the patterning film 331 may be physically exposed around an opening through the patterning film 331.

In one embodiment, the cladding liner 335 may consist essentially of a metal or metal nitride, such as at least one material selected from Ru, Co, Mo, W, TaN, TiN, or WN. The thickness of the horizontally-extending portion of the cladding liner 335 that overlies the patterning film 331 may be in a range from 5 nm to 100 nm, such as from 10 nm to 30 nm, although lesser and greater thicknesses may also be employed.

In one embodiment, the cladding liner 335 comprises a horizontally-extending portion that overlies the top surface of the patterning film 331 and a plurality of vertically-extending tubular portions having a respective upper edge that is adjoined to the horizontally-extending portion. The plurality of vertically-extending tubular portions of the cladding liner 335 can be located on sidewalls of the openings in the patterning film 331, and each of the plurality of vertically-extending tubular portions of the cladding liner 335 may have a variable lateral width that increases with a vertical distance from the upper source-level semiconductor layer 118. In this case, each of the plurality of vertically-extending tubular portions of the cladding liner 335 may have a variable lateral thickness that decreases with a vertical distance downward from the horizontal plane including the top surface of the patterning film 331. In one embodiment, the each of the plurality of vertically-extending tubular portions of the cladding liner 335 may have a respective bottom edge that is located on a respective sidewall of the patterning film 331.

In one embodiment, the cladding liner 335 does not contact any sidewall of the first-tier alternating stack (132, 142). In one embodiment, the cladding liner 335 does not contact any sidewall of the insulating cap layer 170 or the inter-tier dielectric layer 180. In one embodiment, the entirety of the cladding liner 335 may be located above a horizontal plane HP including the bottom surface of the patterning film 331.

Referring to FIG. 25B, a second anisotropic etch process can be performed to etch through the semiconductor material layer that underlies the first-tier alternating stack (132, 142) (i.e., the upper source-level semiconductor layer 118), at least one dielectric material layer underlying the semiconductor material layer (such as a combination of the upper sacrificial liner 105, the source-level sacrificial layer 104, and the lower sacrificial liner 103), and an upper portion of an additional semiconductor layer that underlies the at least one dielectric material layer (such as the lower source-level semiconductor layer 112). In one embodiment, the second anisotropic etch process may comprise a first reactive ion etch process step having an etch chemistry employing $HBr/He/Cl_2/O_2$ or an etch chemistry employing $SF_6/O_2/C_4F_8$ and etches through the upper source-level semiconductor layer 118, a second reactive ion etch process step that employs a combination of $CHF_3$, $CF_4$, $O_2$, and/or $CO_2$ and etches through the upper sacrificial liner 105, the source-level sacrificial layer 104, and the lower sacrificial liner 103, and a third reactive ion etch process step having an etch chemistry employing $HBr/He/Cl_2/O_2$ or an etch chemistry employing $SF_6/O_2/C_4F_8$ and etches through an upper portion of the lower source-level semiconductor layer 112. Each of the first reactive ion etch process step and the third reactive ion etch process step may comprise an overetch step employing $CH_4/O_2$ etch chemistry.

The via openings (149, 129) are vertically extended through the semiconductor material layer (such as the upper source-level semiconductor layer 118) at least to a bottom surface of the semiconductor material layer (such as the upper source-level semiconductor layer 118) by performing the second anisotropic etch process employing the cladding liner 335 as an etch mask. In one embodiment, the via openings (149, 129) are vertically extended through the at least one dielectric material layer underlying the semiconductor material layer (such as a combination of the upper sacrificial liner 105, the source-level sacrificial layer 104, and the lower sacrificial liner 103), and into an upper portion of the additional semiconductor layer that underlies the at least one dielectric material layer (such as the lower source-level semiconductor layer 112).

Without wishing to be bound by a particular theory, it is believed that bowing in a vertical cross-sectional etch profile is caused by scattering of ions from tapered or faceted surfaces of an etch mask layer during an anisotropic etch process. The bowing in a vertical cross-sectional etch profile increase with an increase in the flux of scattered ions until a necking region is formed in an etch mask upon sufficient development of bowing in an upper portion of an etched material layer that underlies the etch mask. The net deposition rate of a polymer material on sidewalls of a via opening is defined by the bowing profile in the etched material layer and in the necking profile in the etch mask layer.

The sputter rate of a hard mask material generally depends on the angle of an incident ion that causes sputtering of the hard mask material, and is typically at a maximum at a non-vertical direction. Typically, the maximum in the sputter rate occurs when the angle of incidence (as measured from the vertical direction) is in a range from 30 degrees to 60 degrees. A delta sputter rate is defined as the difference between the maximum sputter rate (generated when the angle of incidence is, for example, in a range from 30 degrees to 60 degrees) and the minimum sputter rate (which may occur, for example, wherein the angle of incidence is zero). For carbon-based hard mask materials, the ratio of the delta sputter rate to the minimum sputter rate can be much large because the sputter rate varies significantly based on ion impact angle. For example, the ratio of the delta sputter rate to the minimum sputter rate may be greater than 1 or about 1.

According to an embodiment of the present disclosure, the metallic material of the cladding liner 335 decreases the ratio of the delta sputter rate to the minimum sputter rate to a number below 1, such as a number between 0.1 and 0.5. Generally, a metallic material including a metal having a high atomic mass (such as W or Ru) is preferred for the material of the cladding liner 335. A low number for the ratio of the delta sputter rate to the minimum sputter rate allows minimizing the deformation of an etch mask pattern and facilitates retaining the original shape of an etch mask irrespective of the distribution in the ion impact angle during an anisotropic etch process.

According to an aspect of the present disclosure, use of the cladding liner 335 prevents or reduces distortion of the patterning film 331, and prevents or reduces development of bowing in the vertical cross-sectional profile of the via openings (149, 129) at the processing steps of FIG. 25B. The metallic material of the cladding liner 135 can provide high selectivity during the second anisotropic etch process that vertically extends the via openings (149, 129).

In another example, the cladding liner 335 may include tungsten. Generally, tungsten can be etched effectively employing a fluorine-containing etch chemistry which can generate a high volatility etch byproduct including a compound of tungsten and fluorine. It is known that the etch rate of tungsten in an etch chemistry employing $SF_6$ and $NF_3$ is almost independent of the bias voltage variation. This indicates that the mechanism for etching tungsten is chemical for fluorine-based etch chemistries. Thus, an etch chemistry for the semiconductor materials of the upper source-level semiconductor layer 118 and the lower source-level semiconductor layer 112 and an etch chemistry for the upper sacrificial liner 105, the source-level sacrificial layer 104, and the lower sacrificial liner 103 can provide high selectivity to tungsten by avoiding high fluorine content in the etch chemistry.

It should be noted that the case of $CF_4$ as an etchant uses a different etch mechanism since there is a competition between fluorocarbon deposition and tungsten etching by free fluorine radicals. Thus, the second anisotropic etch process may employ a $CF_4/Cl_2$ etch chemistry to effectively etch the materials of the in-process source-level material layers 110' with high selectivity to tungsten in the cladding liner 335. Also, use of $O_2$ during the second anisotropic etch process can lower the etch rate of tungsten.

While the examples of Ru or W as the material of the cladding liner 335 are discussed above, other metallic materials such as Co, Mo, TaN, TiN or WN may also be employed for the cladding liner 335 such that the second anisotropic etch process has high selectivity with respect to the metallic material of the cladding liner 335.

Referring to FIG. 25C, the patterning film 331 can be removed, for example, by ashing or lift-off. The cladding liner 335 located on the patterning film 331 is also lifted off during the lift-off or ashing process. Subsequently, a suitable clean process may be used to remove any residual metallic material, any residual carbon-based material, and/or any residual polymer material from sidewalls of the via openings (149, 129) and from above the inter-tier dielectric layer 180.

FIG. 25D is an alternative embodiment of the first configuration of a memory opening in the first configuration of the second exemplary structure. FIG. 25D illustrates a configuration in which the via openings (149, 129) are formed with a greater width at levels of the upper source-level semiconductor layer 118 and the lower source-level semiconductor layer 112 than at the levels of the upper sacrificial liner 105, the source-level sacrificial layer 104, and the lower sacrificial liner 103 due to the propensity of the second anisotropic etch process to provide more ancillary lateral etching of the semiconductor materials of the upper source-level semiconductor layer 118 and the lower source-level semiconductor layer 112 than the materials of the upper sacrificial liner 105, the source-level sacrificial layer 104, and the lower sacrificial liner 103.

Figure 26A:
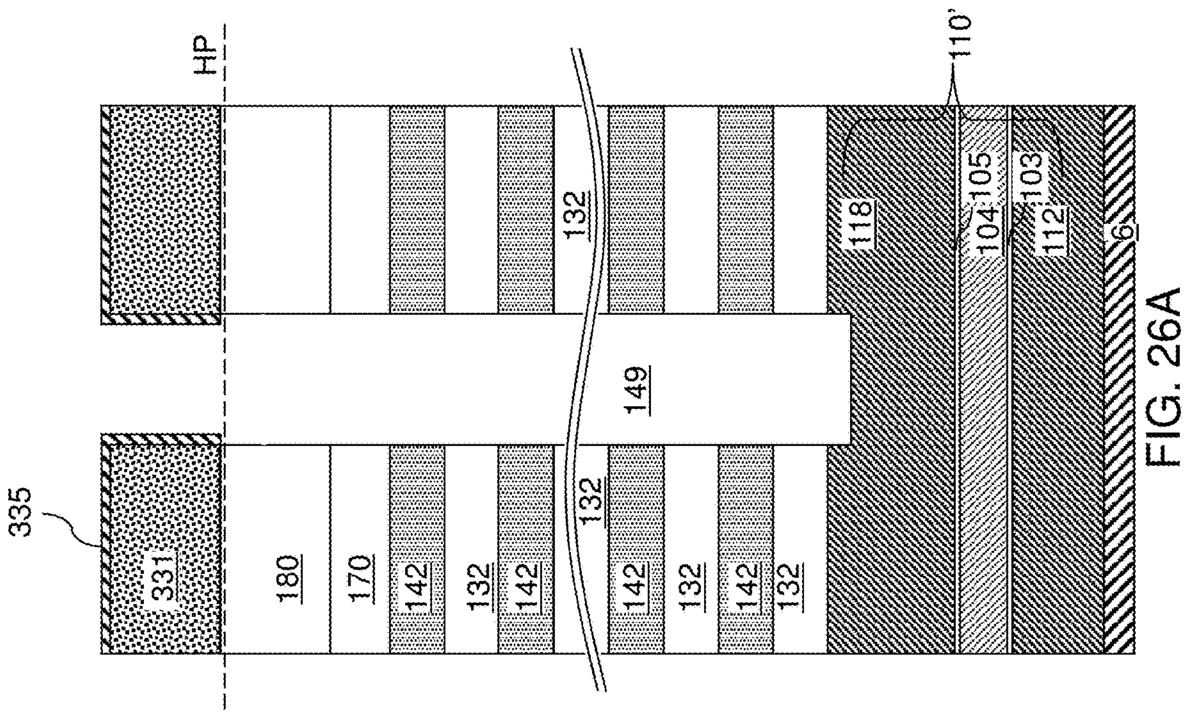
FIGS. 26A-26C are sequential vertical cross-sectional views of a memory opening in a second configuration of the second exemplary structure during the processing steps for formation of a cladding liner, a second anisotropic etch process, and removal of the cladding liner and the patterning film according to the second embodiment of the present disclosure.
Figure 26B:
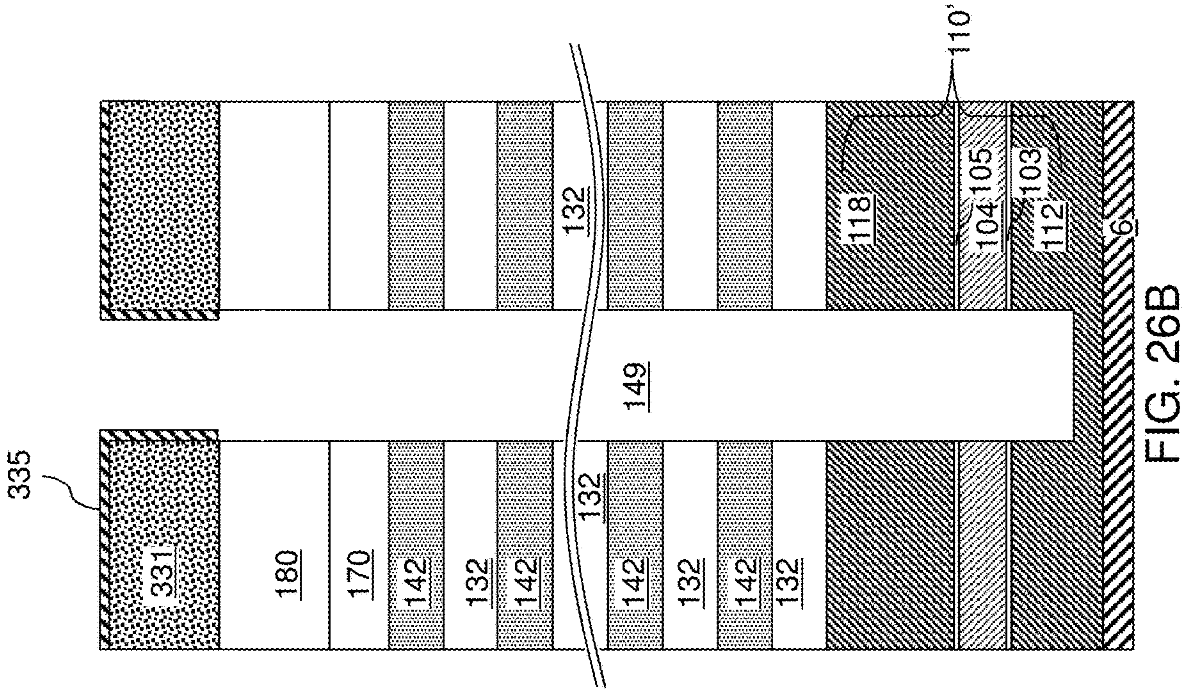
Figure 26D:
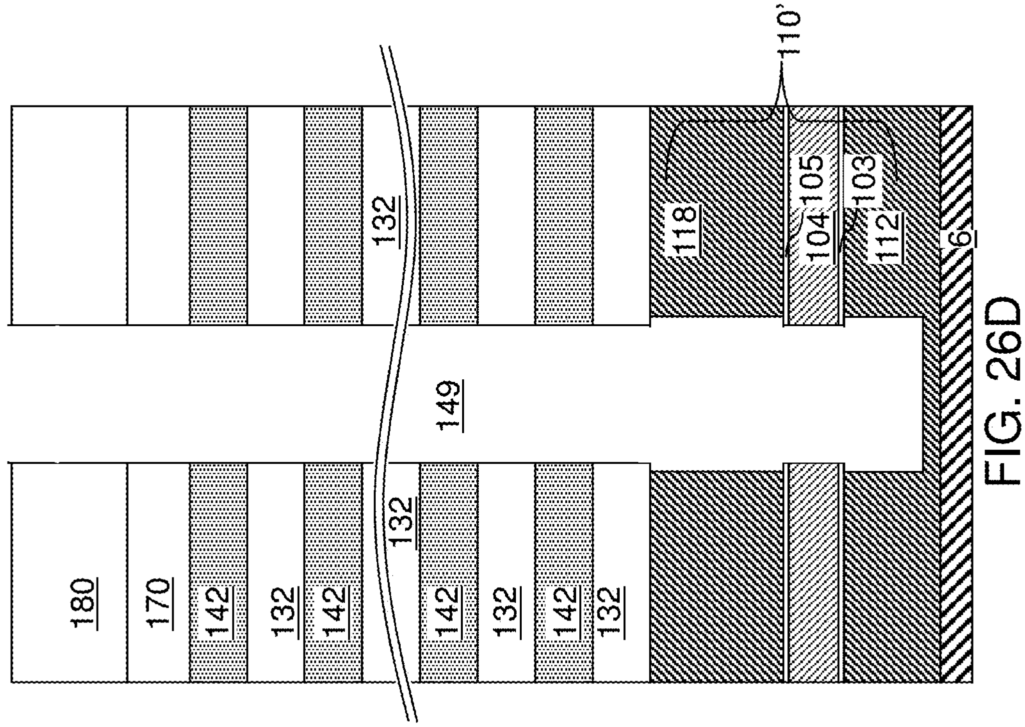
FIG. 26D is an alternative embodiment of the second configuration of a memory opening in the second configuration of the second exemplary structure.
Figure 26C:
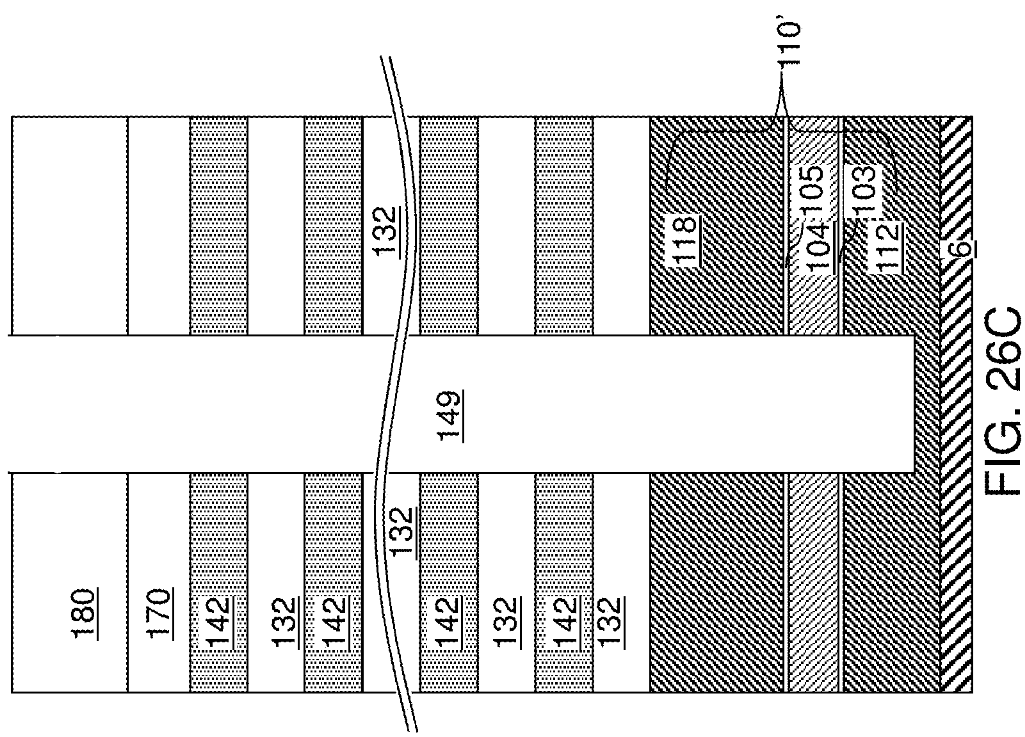

FIGS. 26A-26C are sequential vertical cross-sectional views of a memory opening in a second configuration of the second exemplary structure during the processing steps for formation of a cladding liner 335, a second anisotropic etch process, and removal of the cladding liner 335 and the patterning film 331 according to the second embodiment of the present disclosure.

Referring to FIG. 26A, the second configuration of the second exemplary structure is illustrated, which can be derived from the first configuration of the second exemplary structure illustrated in FIG. 25A by forming the cladding liner 335 employing a selective metallic material deposition process instead of the anisotropic deposition process. The selective metallic material deposition process grows a metallic material from physically exposed surfaces of patterning film 331 while suppressing growth of the metallic material from surfaces of the first-tier alternating stack (132, 132) and from surfaces of the underlying semiconductor material layer (such as the upper source-level semiconductor layer 118).

In one embodiment, the selective metallic material deposition process comprises an atomic layer deposition (ALD) process or a chemical vapor deposition (CVD) process. The deposition chemistry of the selective material deposition process can be selected such that a metallic precursor gas employed for the selective material deposition process decomposes and nucleates on physically exposed surfaces of the patterning film 331 at a significantly higher nucleation rate than a nucleation rate on physically exposed surfaces of the first-tier alternating stack (132, 142) and the upper source-level semiconductor layer 118. An etchant gas, such as $NF_3$, $CF_4$, $Cl_2$, or HCl can be flowed into a process chamber simultaneously with, or alternately with, the flow of the metallic precursor gas to provide an etch rate that is greater than the nucleation rate of the metallic material on the physically exposed surfaces of the first-tier alternating stack (132, 142) and the upper source-level semiconductor layer 118, and is less than the nucleation rate of the metallic material on the physically exposed surfaces of the patterning film 331. Thus, the metallic material can be deposited only on the physically exposed surfaces of the patterning film 331 while growth of the metallic material from the physically exposed surfaces of the first-tier alternating stack (132, 142) and the upper source-level semiconductor layer 118 is suppressed.

In one embodiment, the patterning film 331 comprises amorphous carbon or diamond-like carbon at an atomic percentage in a range from 80% to 100%. In one embodiment, the patterning film 331 may be doped with at least one dopant species to enhance the nucleation rate of the metallic material of the cladding liner 335 during selective deposition of the cladding liner 335. In one embodiment, the patterning film 331 may comprise at least dopant species at an atomic concentration in a range from 0.2% to 20%, the at least one dopant species being selected from boron and tungsten.

In one embodiment, the cladding liner 335 comprises a plurality of vertically-extending tubular portions located on sidewalls of the openings in the patterning film 331, and each of the plurality of vertically-extending tubular portions of the cladding liner 335 has a uniform lateral thickness that is invariant under translation along a vertical direction. In one embodiment, the cladding liner 335 comprises a horizontally-extending portion that overlies the patterning film 331 and having a same vertical thickness and the uniform lateral thickness. In one embodiment, the cladding liner 335 may have a uniform thickness throughout.

In one embodiment, the cladding liner 335 does not contact any sidewall of the first-tier alternating stack (132, 142). In one embodiment, the cladding liner 335 does not contact any sidewall of the insulating cap layer 170. In one embodiment, the entirety of the cladding liner 335 may be located above a horizontal plane HP located at a bottom surface of the patterning film 331.

Generally, the cladding liner 335 in the second configuration of the second exemplary structure may include any metallic material that can be deposited by a selective deposition process. In one embodiment, the cladding liner 335 may consist essentially of at least one material selected from Ru, Co, W or Mo. The thickness of the cladding liner 335 may be in a range from 5 nm to 100 nm, such as from 10 nm to 30 nm, although lesser and greater thicknesses may also be employed.

Referring to FIG. 26B, a second anisotropic etch can be performed in the same manner as in the processing steps of FIG. 25B.

Referring to FIG. 26C, the cladding liner 335 and the patterning film 331 may be removed in the same manner as in the processing steps of FIG. 25C.

FIG. 26D is an alternative embodiment of the second configuration of a memory opening in the second configuration of the second exemplary structure. FIG. 26D illustrates a configuration in which the via openings (149, 129) are formed with a greater width at levels of the upper source-level semiconductor layer 118 and the lower source-level semiconductor layer 112 than at the levels of the upper sacrificial liner 105, the source-level sacrificial layer 104, and the lower sacrificial liner 103 due to the propensity of the second anisotropic etch process to provide more ancillary lateral etching of the semiconductor materials of the upper source-level semiconductor layer 118 and the lower source-level semiconductor layer 112 than the materials of the upper sacrificial liner 105, the source-level sacrificial layer 104, and the lower sacrificial liner 103.

Figure 27B:
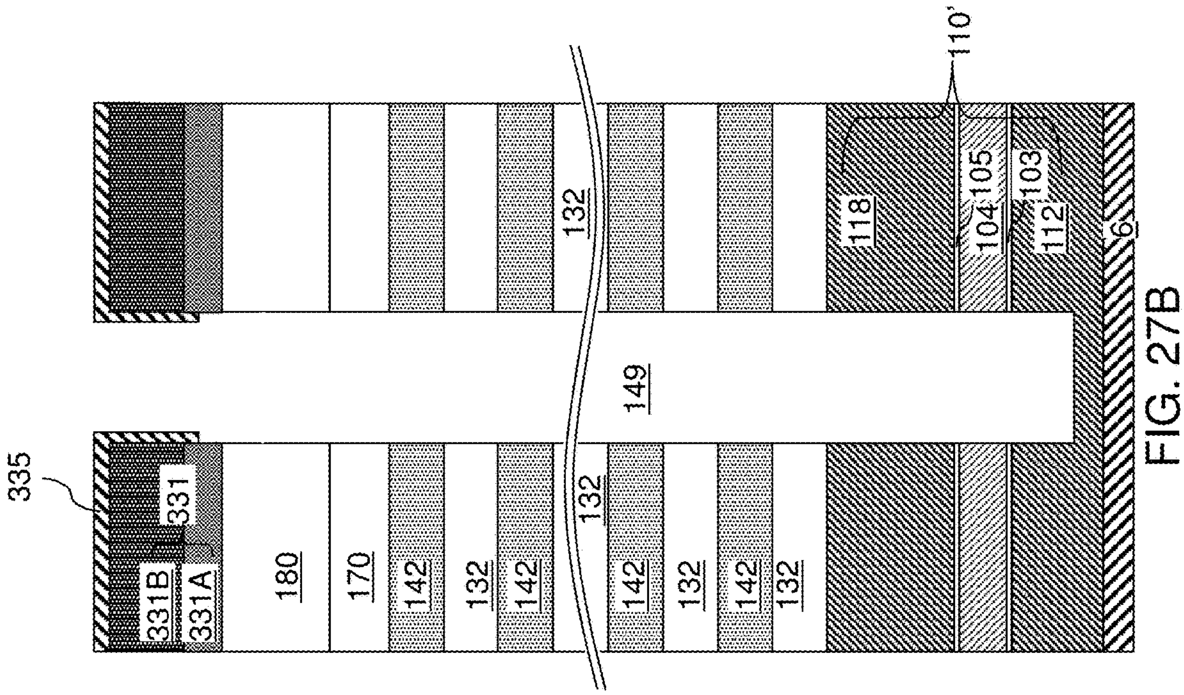
FIGS. 27A-27C are sequential vertical cross-sectional views of a memory opening in a third configuration of the second exemplary structure during the processing steps for formation of a cladding liner, a second anisotropic etch process, and removal of the cladding liner and the patterning film according to the second embodiment of the present disclosure.
Figure 27A:
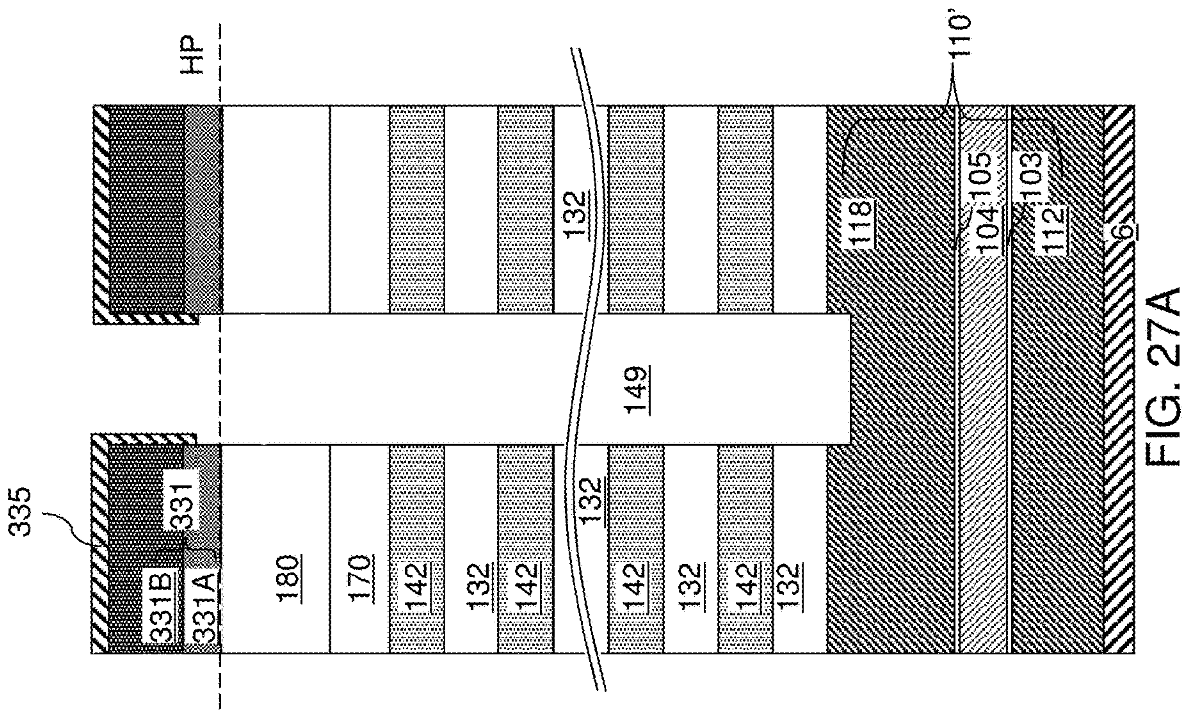
Figure 27D:
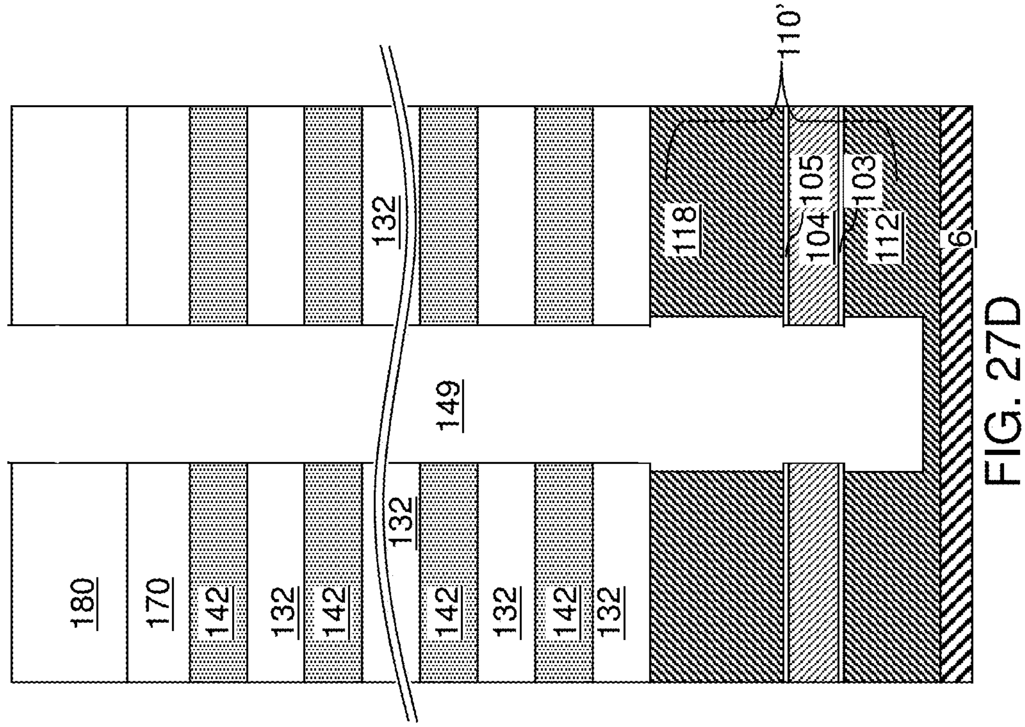
FIG. 27D is an alternative embodiment of the third configuration of a memory opening in the third configuration of the second exemplary structure.
Figure 27C:
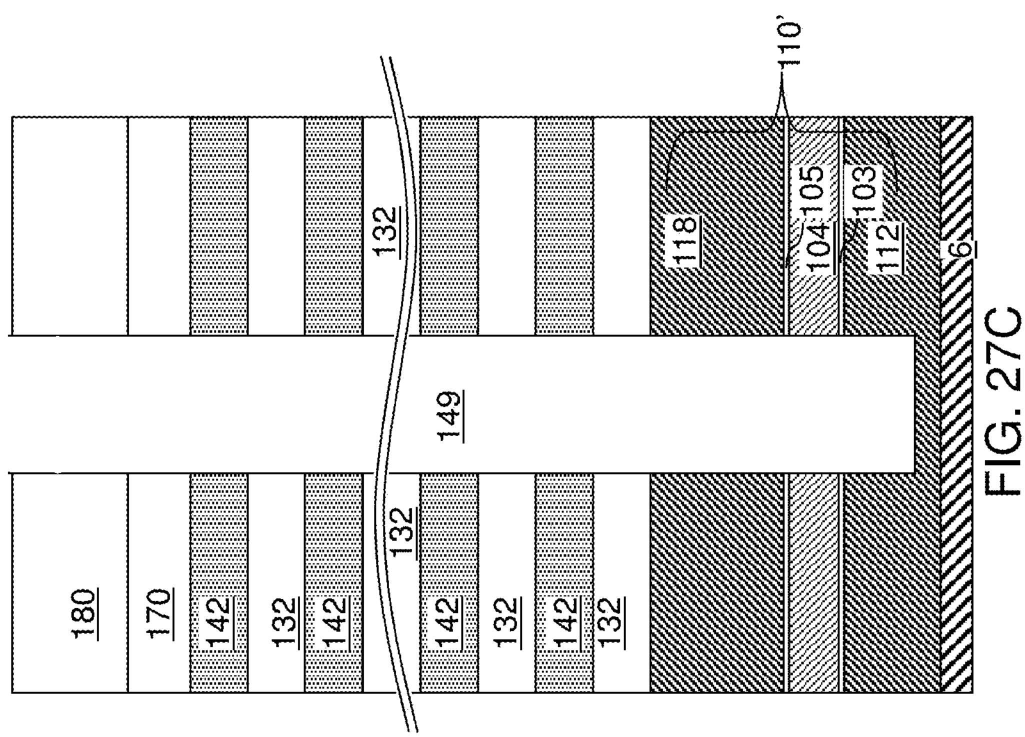

FIGS. 27A-27C are sequential vertical cross-sectional views of a memory opening in a third configuration of the second exemplary structure during the processing steps for formation of a cladding liner 335, a second anisotropic etch process, and removal of the cladding liner 335 and the patterning film 331 according to the second embodiment of the present disclosure.

In the third configuration of the second exemplary structure, the patterning film 331 can be formed as a vertical stack of a lower patterning film layer 331A that comprises carbon atoms at an atomic percentage in a range from 99% to 100%, and an upper patterning film layer 331B that comprises carbon an atomic percentage in a range from 80% to 99.8% and at least dopant species at an atomic concentration in a range from 0.2% to 20%. The at least one dopant species may be selected from boron and/or tungsten. In an illustrative example, the thickness of the lower patterning film layer 331A may be in a range from 60 nm to 400 nm, such as from 100 nm to 200 nm, although lesser and greater thicknesses may also be employed. The thickness of the upper patterning film layer 331B may be in a range from 120 nm to 600 nm, such as from 200 nm to 400 nm, although lesser and greater thicknesses may also be employed.

In the third configuration of the second exemplary structure, the cladding liner 335 can be formed by a selective deposition process that grows a cladding material, such as tungsten, from physically exposed surfaces of the upper patterning film layer 331B while suppressing growth of the cladding material from surfaces of the lower patterning film layer 331A, the first-tier alternating stack (132, 142), and the upper source-level semiconductor layer 118. The dopant species in the upper patterning film layer 331B increases the nucleation rate of the metallic material that is deposited on the physically exposed surfaces of the upper patterning film layer 331B relative to the nucleation rate of the metallic material on the lower patterning film layer 331A during the selective deposition process.

In one embodiment, the cladding liner 335 may comprise tungsten and may have a uniform thickness that is less than a thickness of the lower patterning film layer 331A. The thickness of the cladding liner 335 may be in a range from 5 nm to 100 nm, such as from 10 nm to 30 nm, although lesser and greater thicknesses may also be employed.

In one embodiment, the cladding liner 335 does not contact any sidewall of the first-tier alternating stack (132, 142). In one embodiment, the cladding liner 335 does not contact any sidewall of the insulating cap layer 170 or the inter-tier dielectric layer 180. In one embodiment, the entirety of the cladding liner 335 may be located above a horizontal plane HP located at the bottom surface of the patterning film 331, i.e., the horizontal plane including the bottom surface of the lower patterning film layer 331A.

Referring to FIG. 27B, a second anisotropic etch can be performed in the same manner as in the processing steps of FIG. 25B.

Referring to FIG. 27C, an ashing or lift-off process can be performed to remove the lower patterning film layer 331A after the second anisotropic etch process. The upper patterning film layer 331B and the cladding liner 335 can be removed at this time.

FIG. 27D is an alternative embodiment of the third configuration of a memory opening in the third configuration of the second exemplary structure. FIG. 27D illustrates a configuration in which the via openings (149, 129) are formed with a greater width at levels of the upper source-level semiconductor layer 118 and the lower source-level semiconductor layer 112 than at the levels of the upper sacrificial liner 105, the source-level sacrificial layer 104, and the lower sacrificial liner 103 due to the propensity of the second anisotropic etch process to provide more ancillary lateral etching of the semiconductor materials of the upper source-level semiconductor layer 118 and the lower source-level semiconductor layer 112 than the materials of the upper sacrificial liner 105, the source-level sacrificial layer 104, and the lower sacrificial liner 103.

Figure 28A:
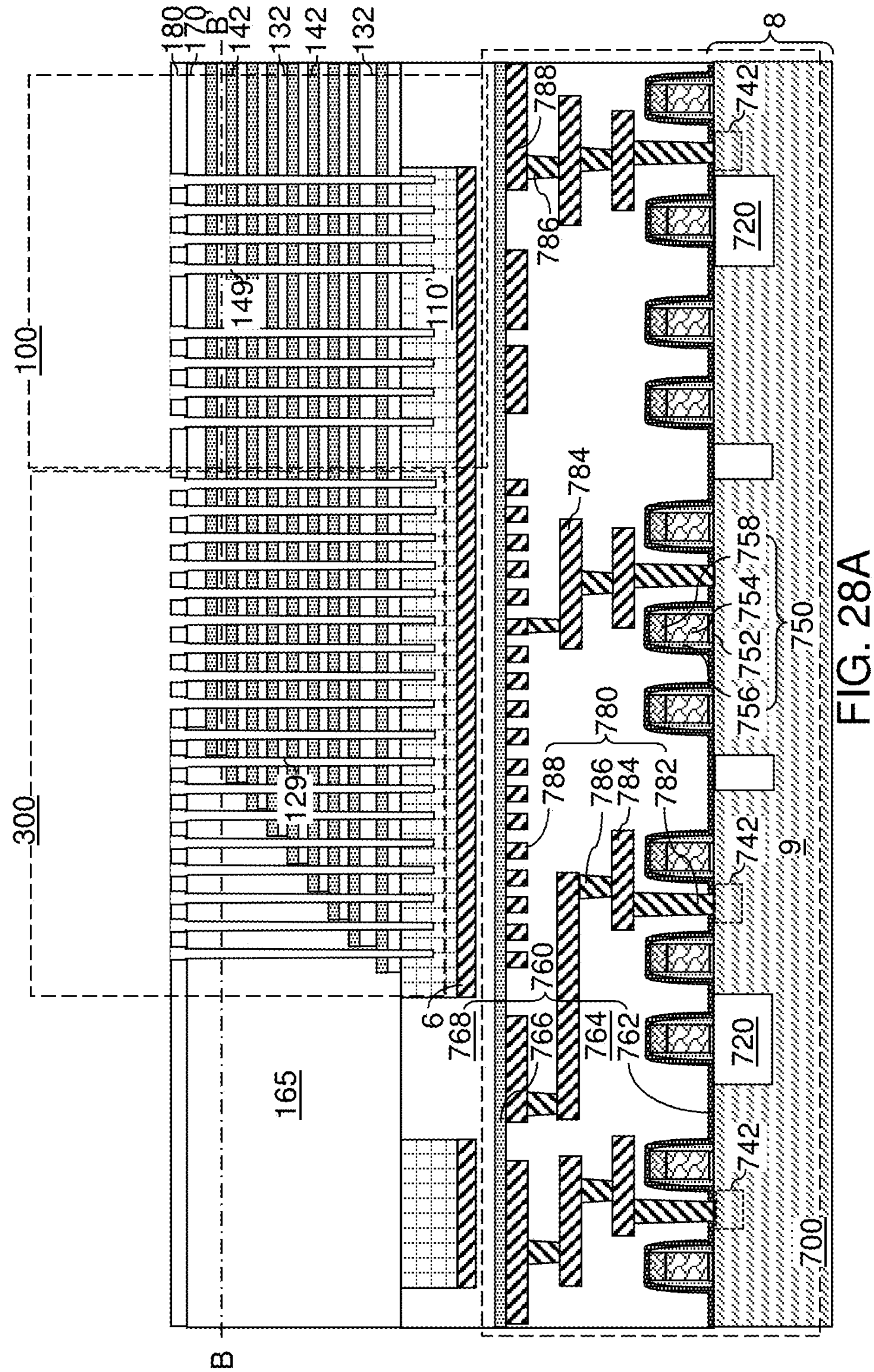
FIG. 28A is a vertical cross-sectional view of the second exemplary structure after formation of first-tier memory openings and first-tier support openings according to the second embodiment of the present disclosure.
Figure 28B:
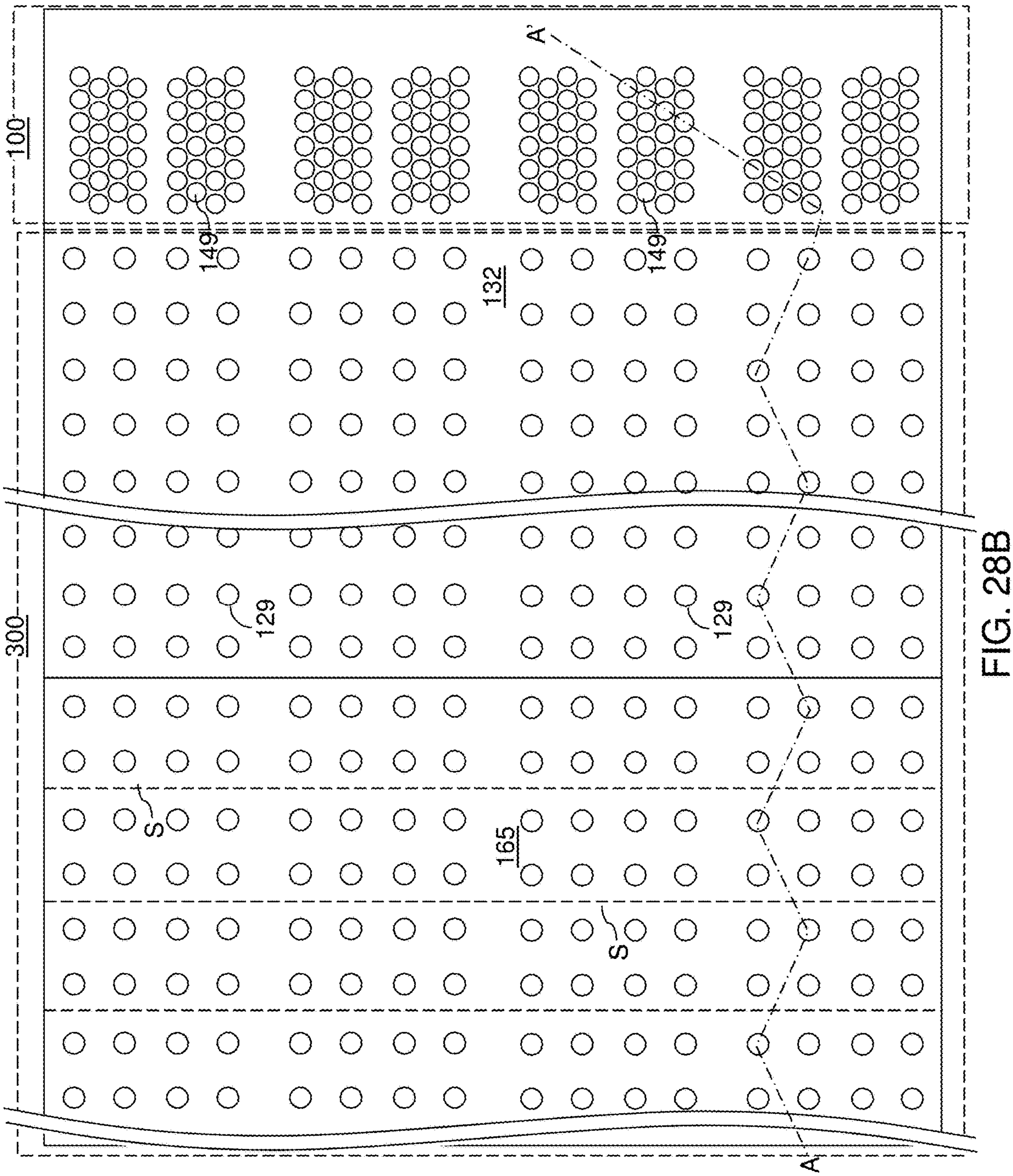
FIG. 28B is a horizontal cross-sectional view of the second exemplary structure of FIG. 28A. The hinged vertical plane A-A' corresponds to the plane of the vertical cross-sectional view of FIG. 28A.

Referring to FIGS. 28A and 28B, the portions of the first-tier memory openings 149 and the first-tier support openings 129 at the level of the inter-tier dielectric layer 180 may be optionally laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 29:
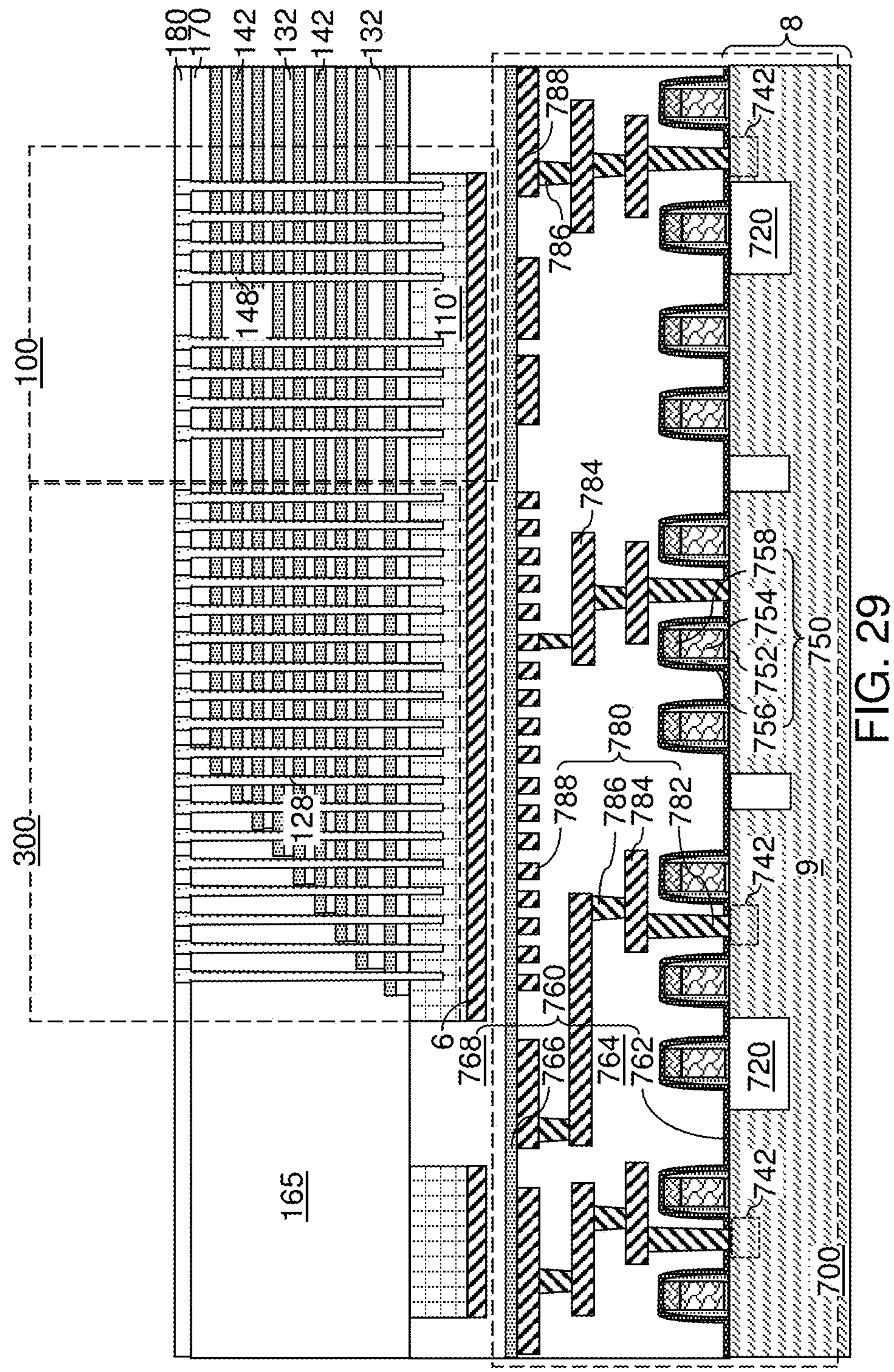
FIG. 29 is a vertical cross-sectional view of the second exemplary structure after formation of various sacrificial fill structures according to the second embodiment of the present disclosure.

Referring to FIG. 29, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 30:
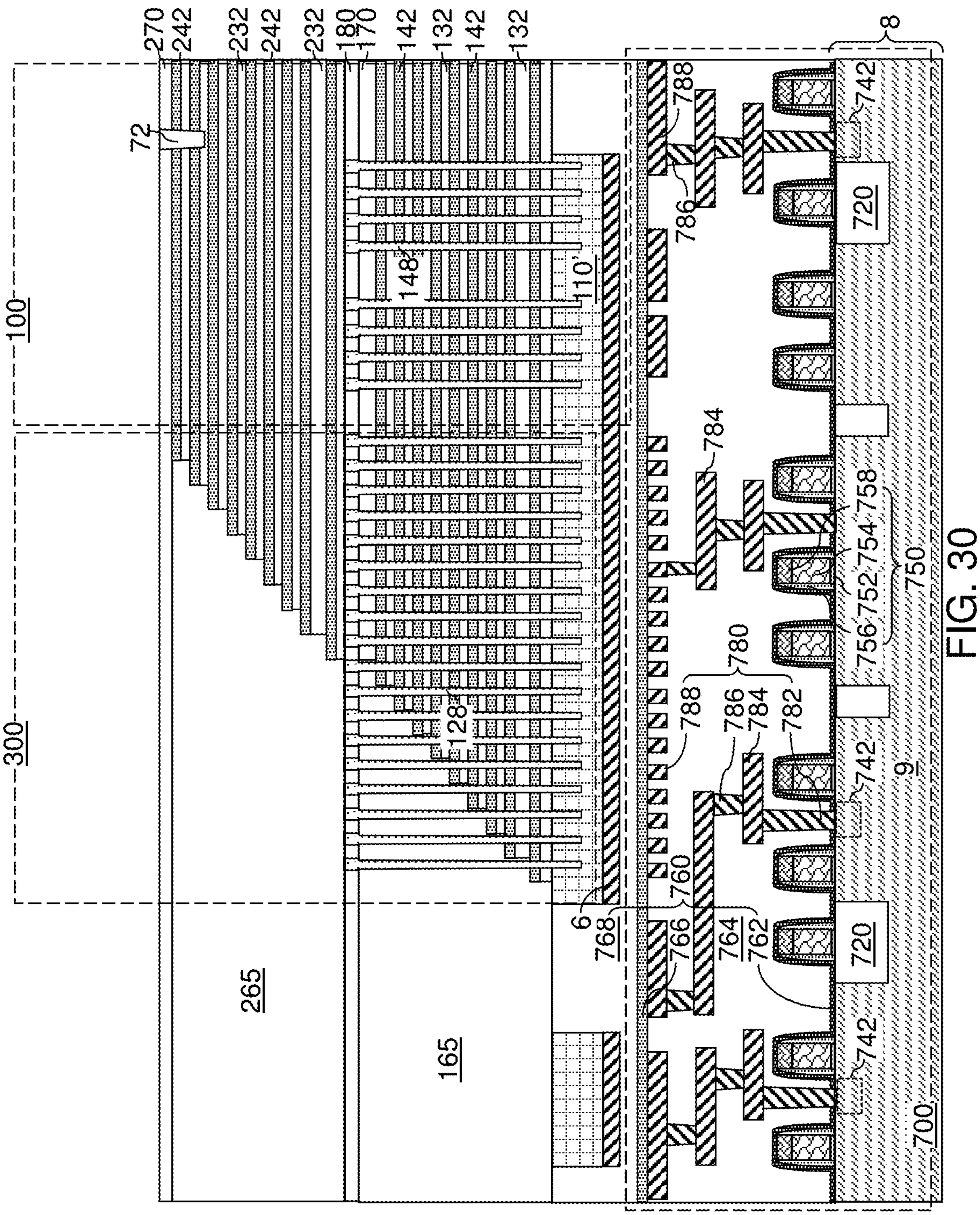
FIG. 30 is a vertical cross-sectional view of the second exemplary structure after formation of a second-tier alternating stack of second insulating layers and second spacer material layers, second stepped surfaces, and a second retro-stepped dielectric material portion according to the second embodiment of the present disclosure.

Referring to FIG. 30, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the contact region 300 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the contact region 300.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 31A:
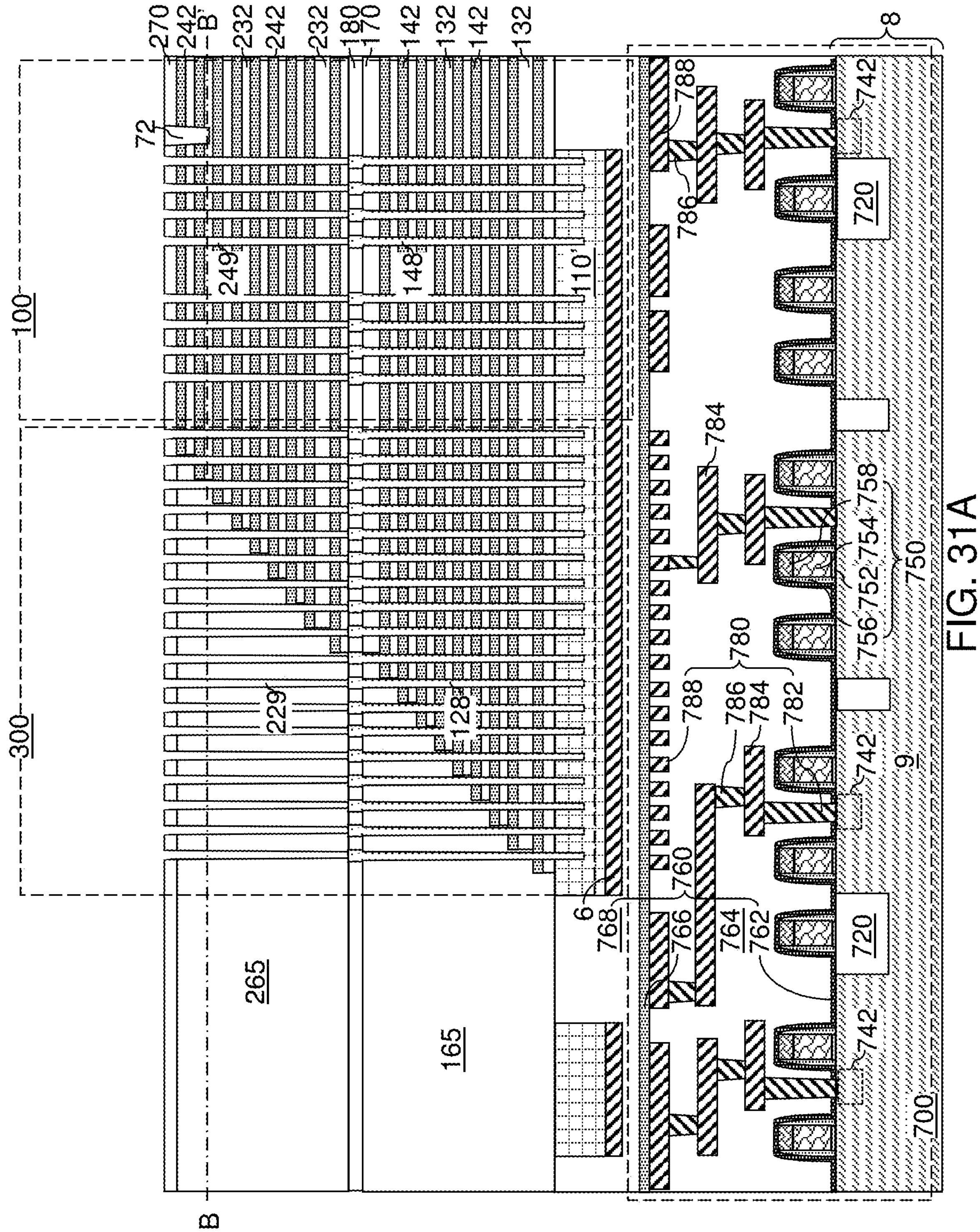
FIG. 31A is a vertical cross-sectional view of the second exemplary structure after formation of second-tier memory openings and second-tier support openings according to the second embodiment of the present disclosure.
Figure 31B:
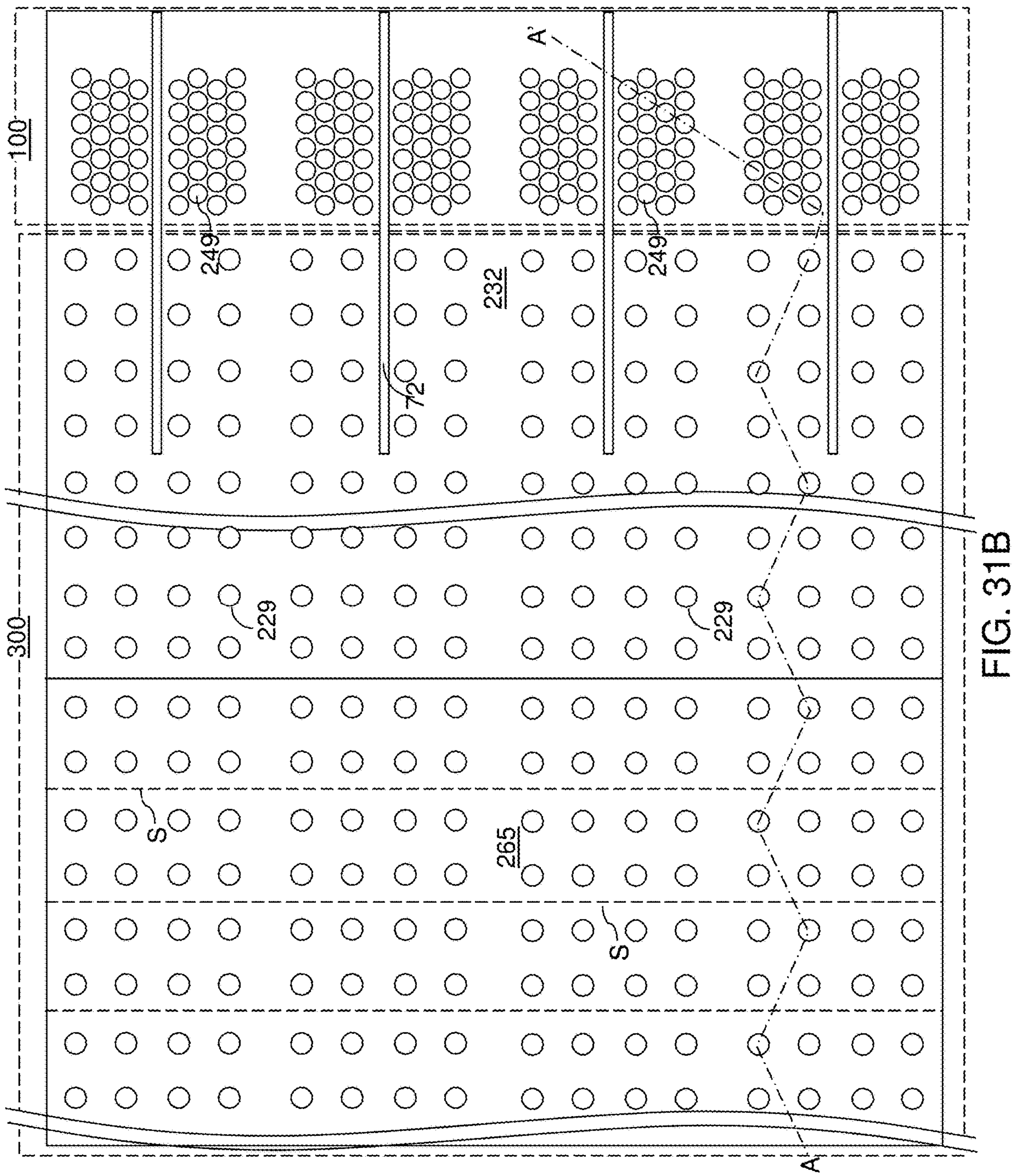
FIG. 31B is a horizontal cross-sectional view of the second exemplary structure along the horizontal plane B-B' of FIG. 31A. The hinged vertical plane A-A' corresponds to the plane of the vertical cross-sectional view of FIG. 31A.

Referring to FIGS. 31A and 31B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 31B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 32:
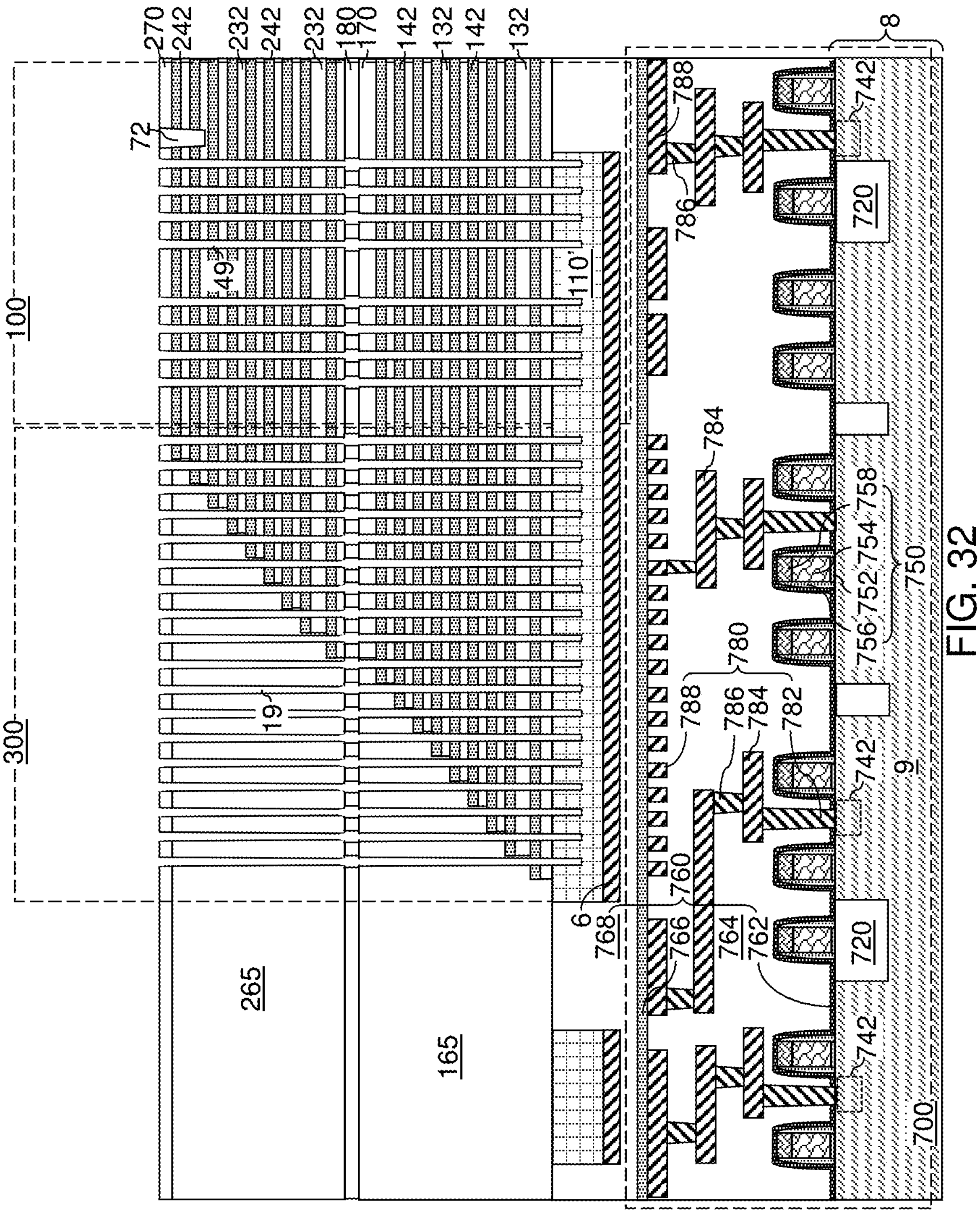
FIG. 32 is a vertical cross-sectional view of the second exemplary structure after formation of inter-tier memory openings and inter-tier support openings according to the second embodiment of the present disclosure.

Referring to FIG. 32, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 33A-33D provide sequential cross-sectional views of a memory opening 49 during formation of a memory opening fill structure. The same structural change occurs in each of the memory openings 49 and the support openings 19.

Figure 33B:
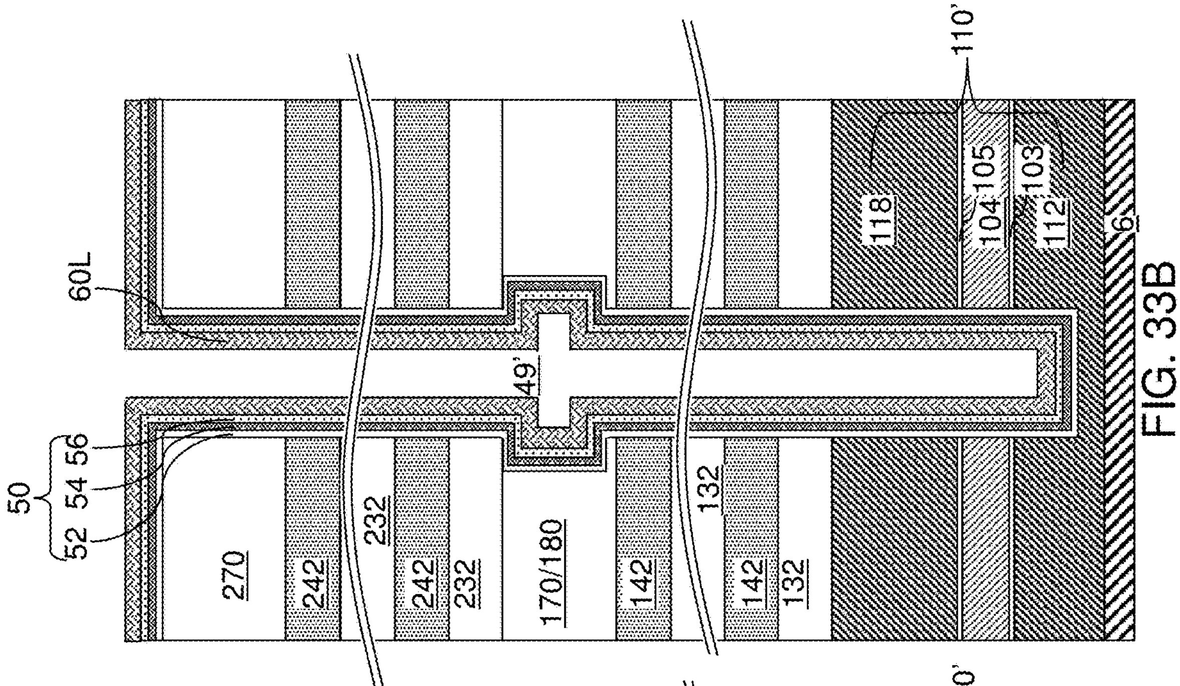
FIGS. 33A-33D illustrate sequential vertical cross-sectional views of a memory opening during formation of a memory opening fill structure according to the second embodiment of the present disclosure.
Figure 33A:
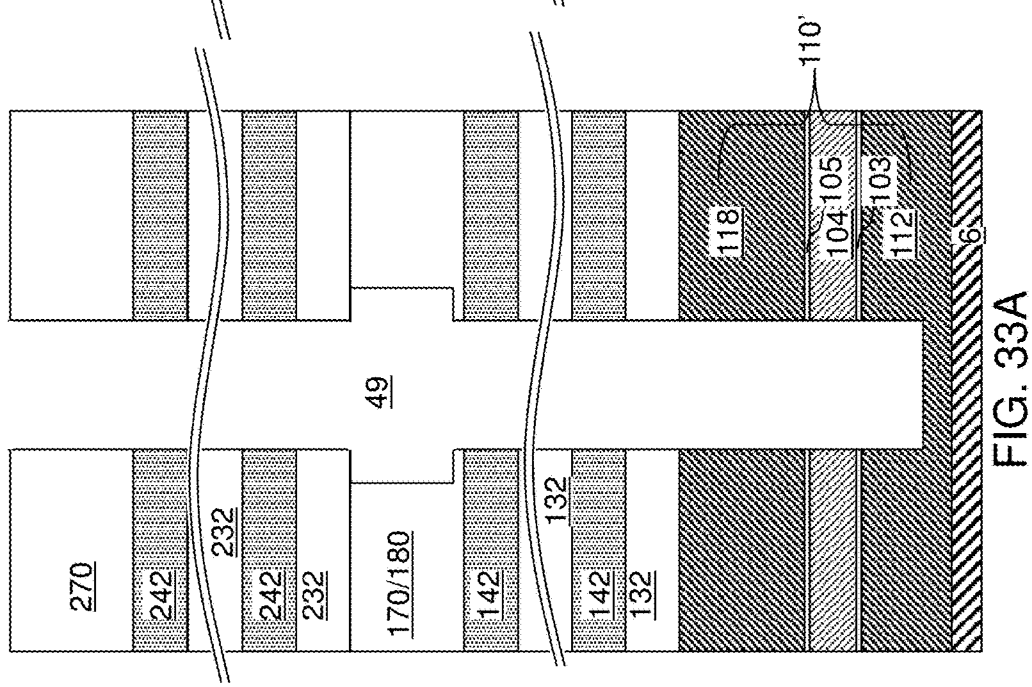

Referring to FIG. 33A, a memory opening 49 in the first exemplary device structure of FIG. 32 is illustrated. The memory opening 49 extends through the first-tier structure and the second-tier structure.

Referring to FIG. 33B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}$/cm$^3$ to $1.0\times10^{18}$/cm$^3$, such as from $1.0\times10^{14}$/cm$^3$ to $1.0\times10^{17}$/cm$^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}$/cm$^3$ to $1.0\times10^{18}$/cm$^3$, such as from $1.0\times10^{14}$/cm$^3$ to $1.0\times10^{17}$/cm$^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figure 33D:
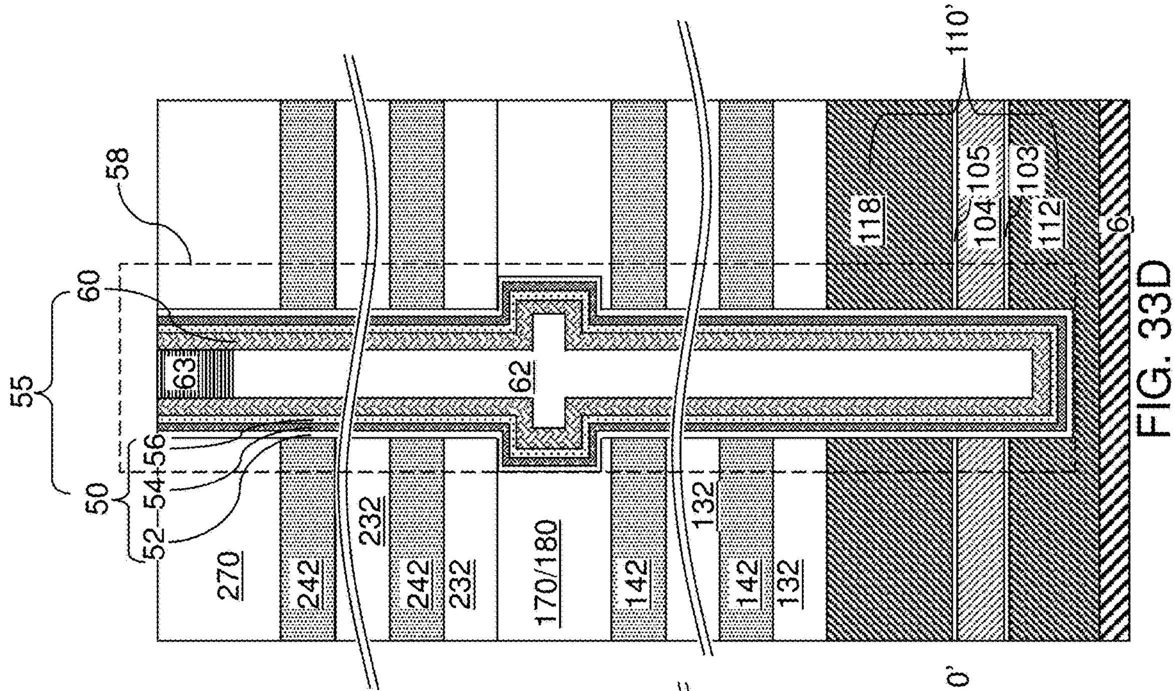
Figure 33C:
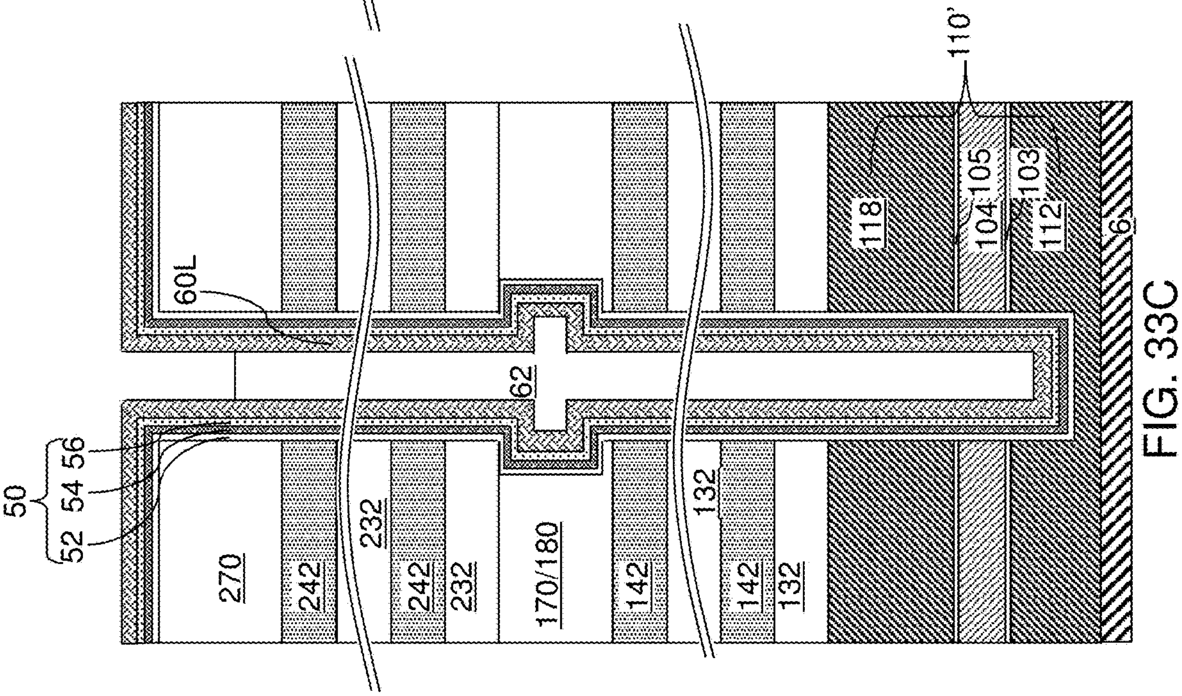

Referring to FIG. 33C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 33D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{18}$/cm$^3$ to $2.0\times10^{21}$/cm$^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 34:
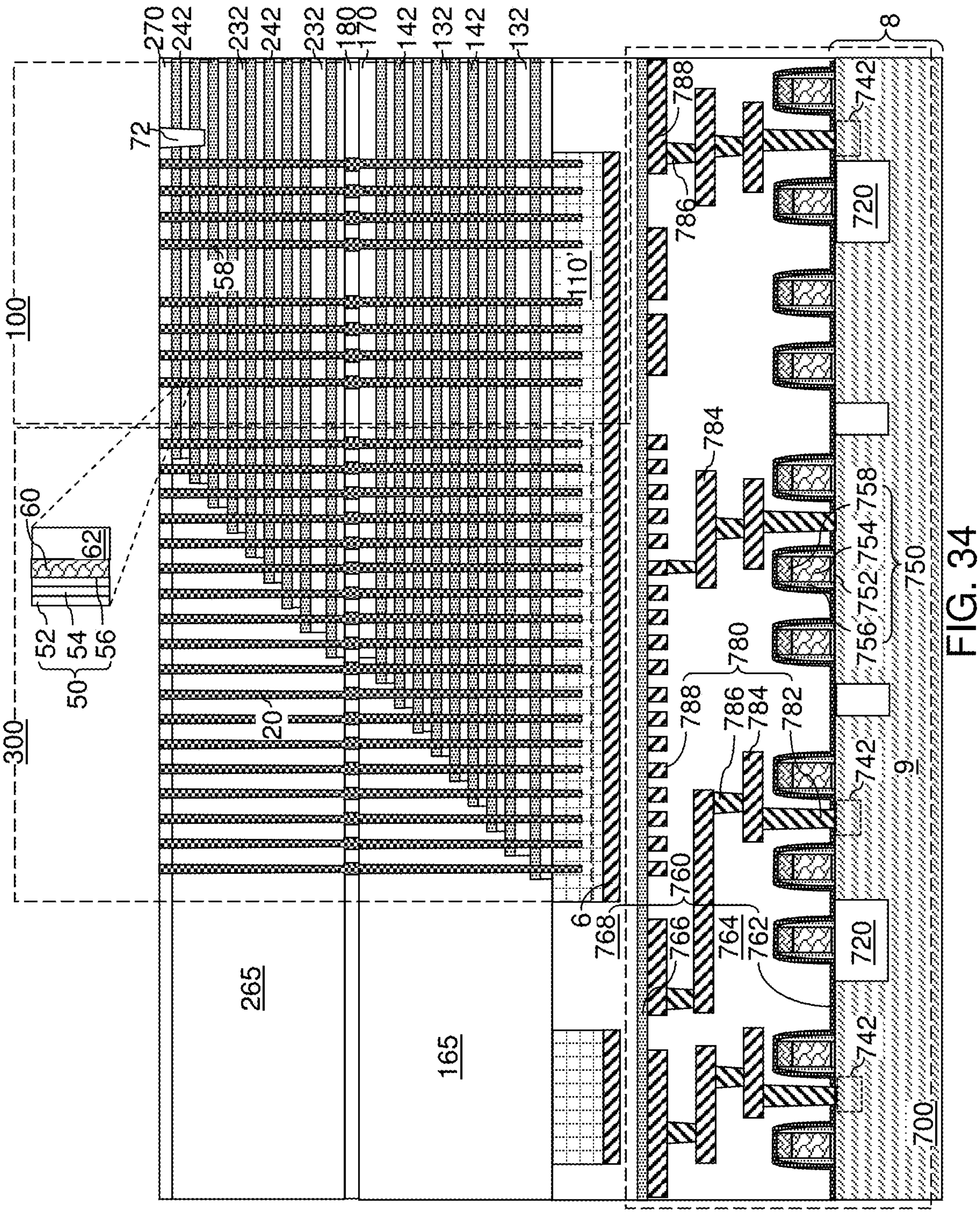
FIG. 34 is a vertical cross-sectional view of the second exemplary structure after formation of memory opening fill structures and support pillar structures according to the second embodiment of the present disclosure.

Referring to FIG. 34, the second exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 35A:
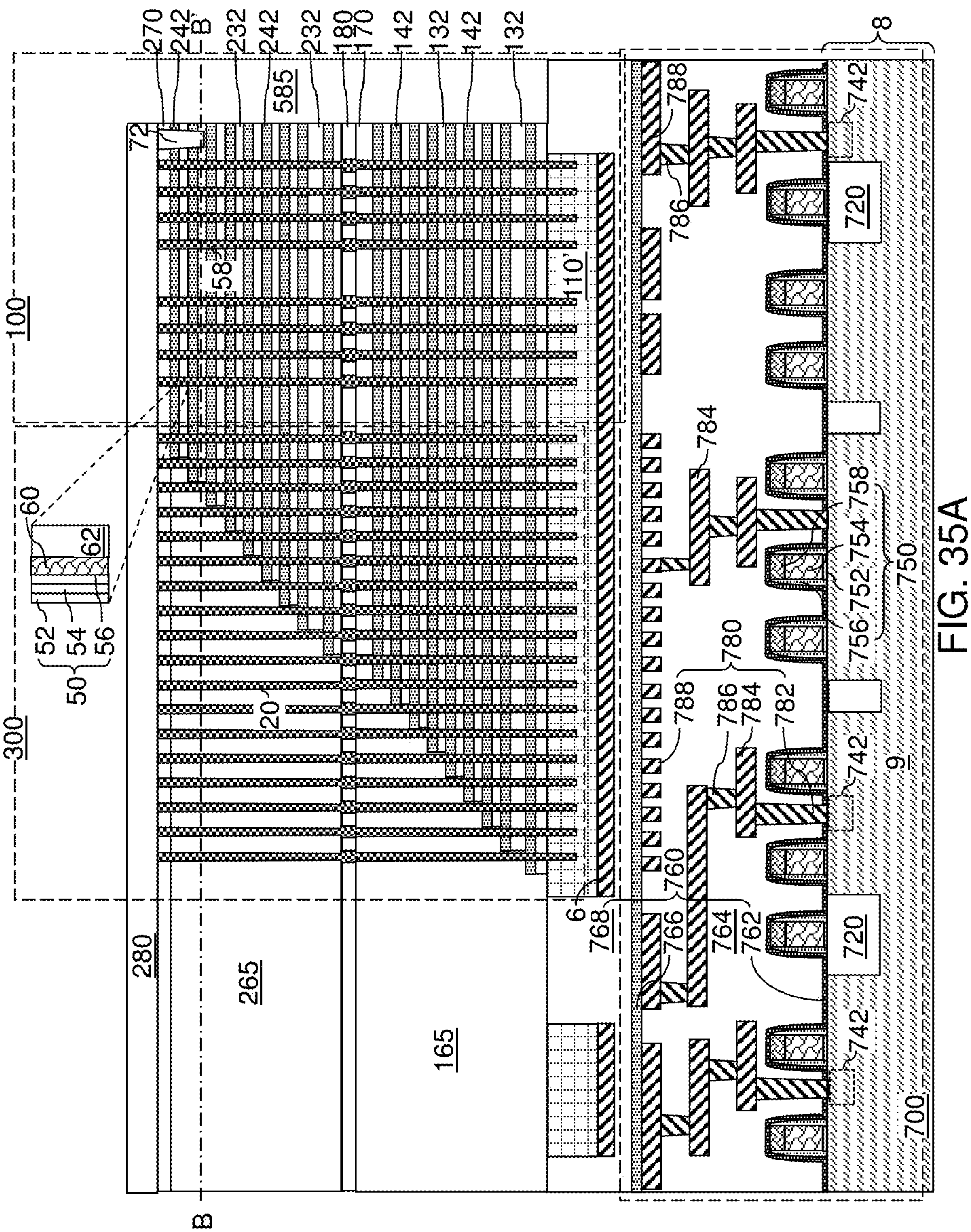
FIG. 35A is a vertical cross-sectional view of the second exemplary structure after formation of pillar cavities according to the second embodiment of the present disclosure.
Figure 35B:
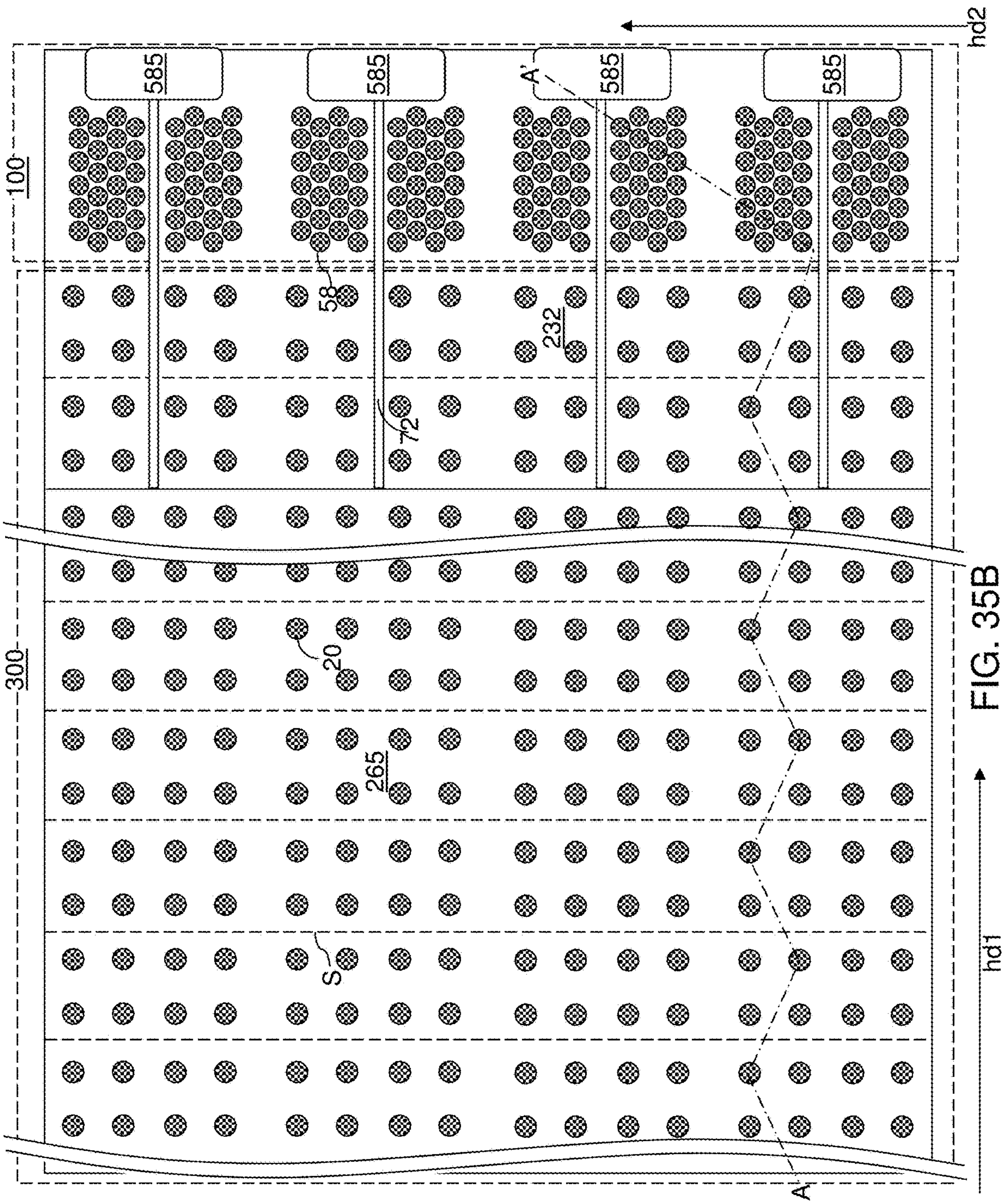
FIG. 35B is a horizontal cross-sectional view of the second exemplary structure along the horizontal plane B-B' of FIG. 35A. The hinged vertical plane A-A' corresponds to the plane of the vertical cross-sectional view of FIG. 35A.

Referring to FIGS. 35A and 35B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 36:
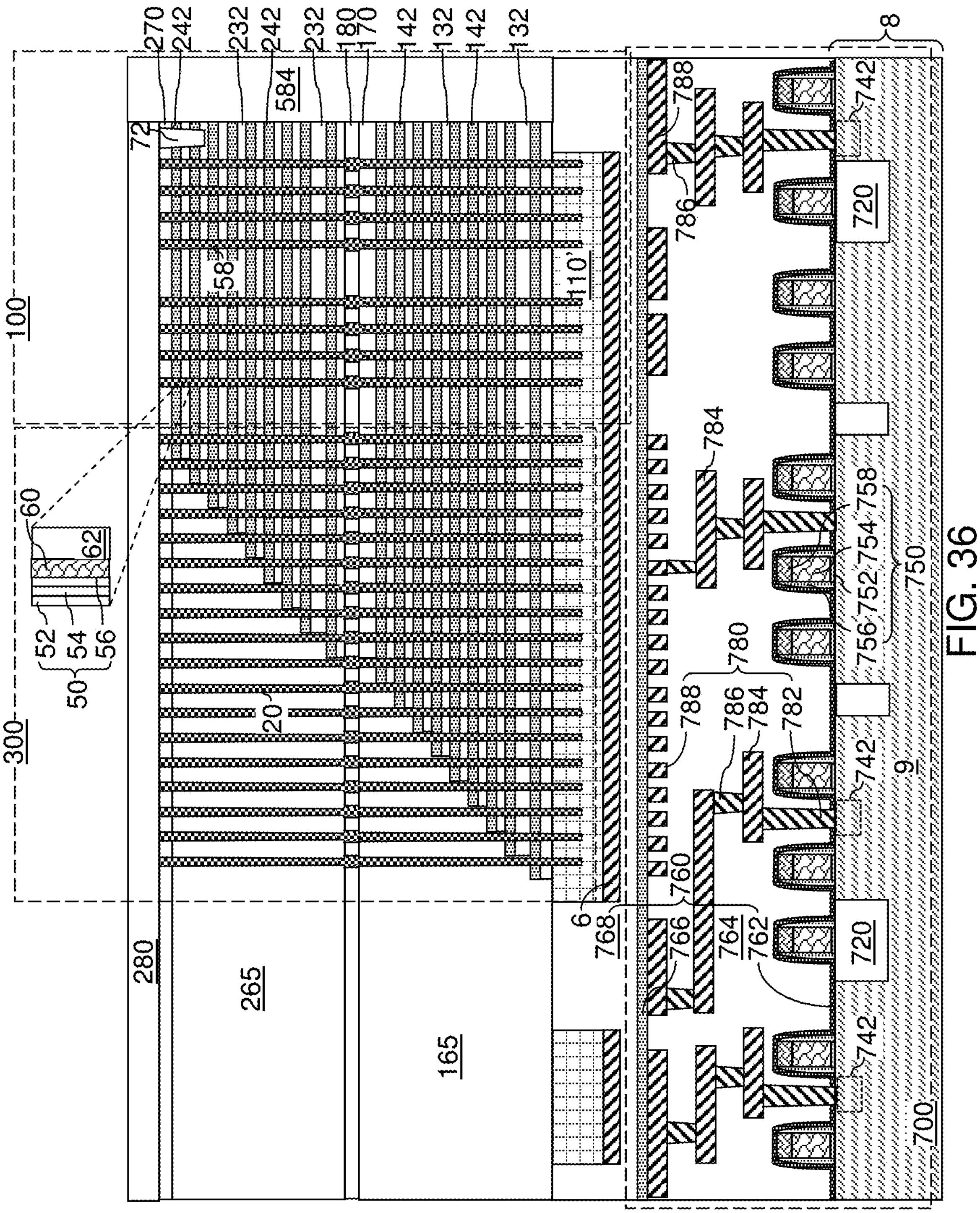
FIG. 36 is a vertical cross-sectional view of the second exemplary structure after formation of dielectric pillar structures according to the second embodiment of the present disclosure.

Referring to FIG. 36, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 37A:
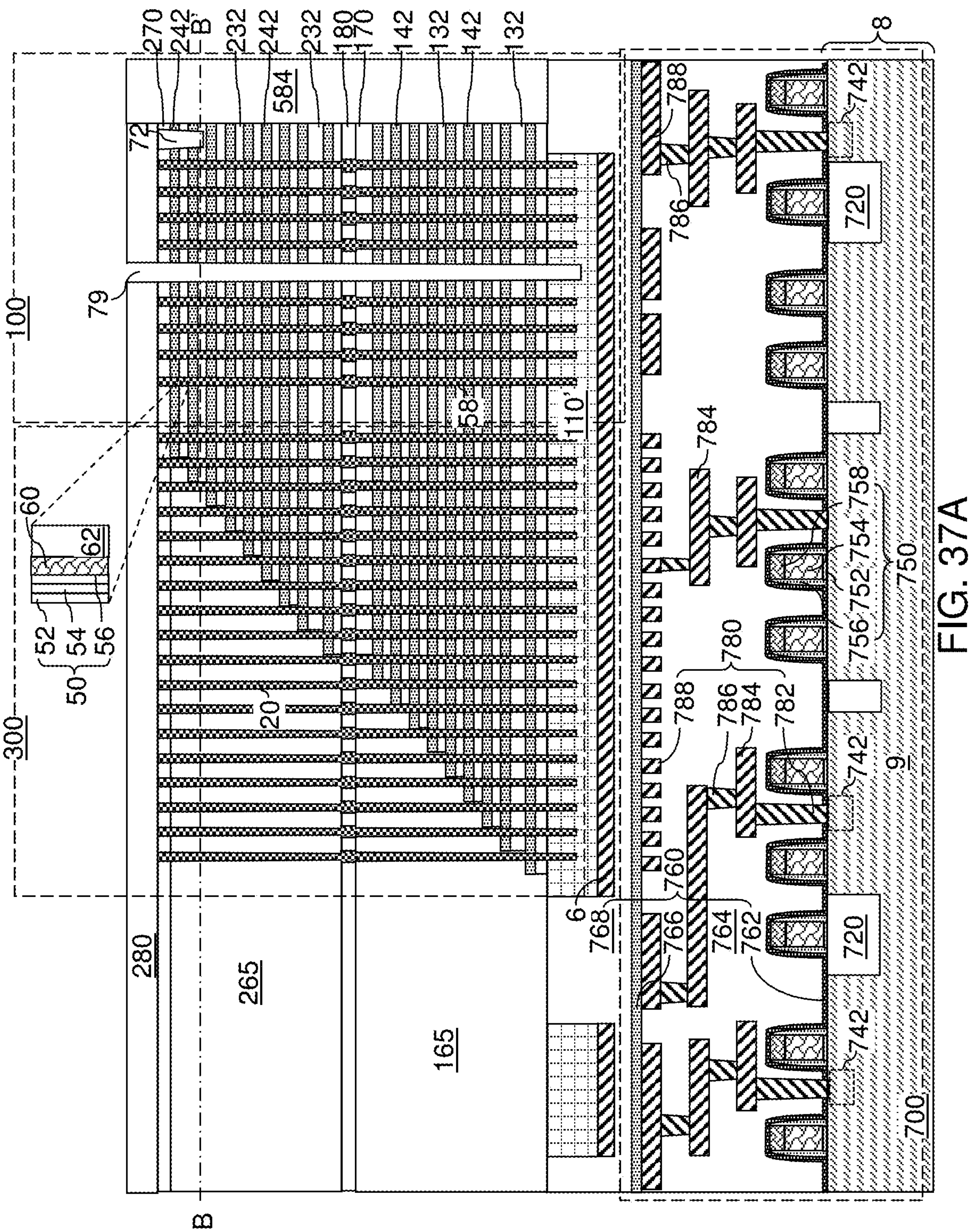
FIG. 37A is a vertical cross-sectional view of the second exemplary structure after formation of a first contact-level dielectric layer and backside trenches according to the second embodiment of the present disclosure.
Figure 37B:
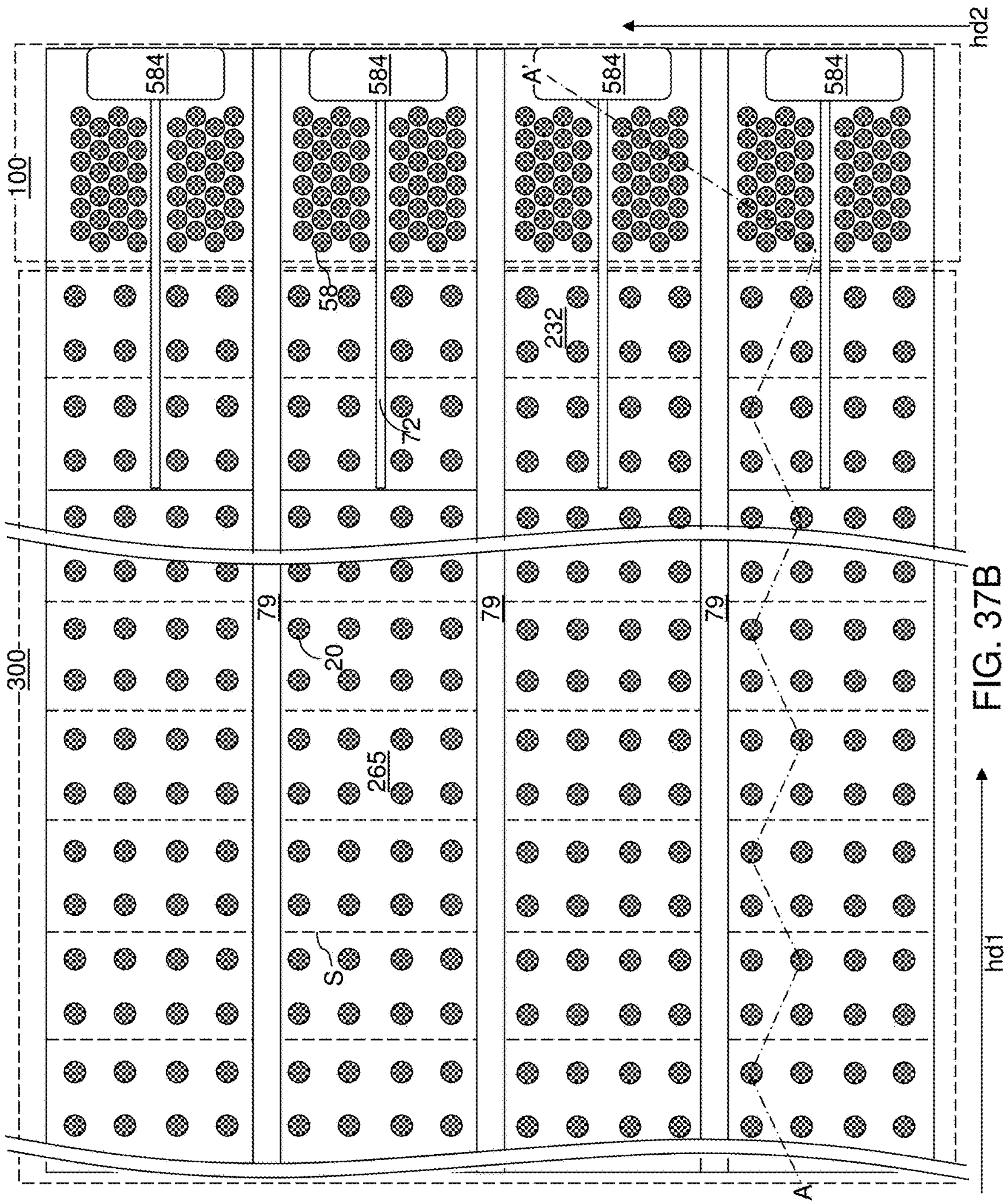
FIG. 37B is a horizontal cross-sectional view of the second exemplary structure along the horizontal plane B-B' of FIG. 37A. The hinged vertical plane A-A' corresponds to the plane of the vertical cross-sectional view of FIG. 37A.

Referring to FIGS. 37A and 37B, a photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 170, 165), and into the in-process source-level material layers 110'. Portions of the first contact-level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 38:
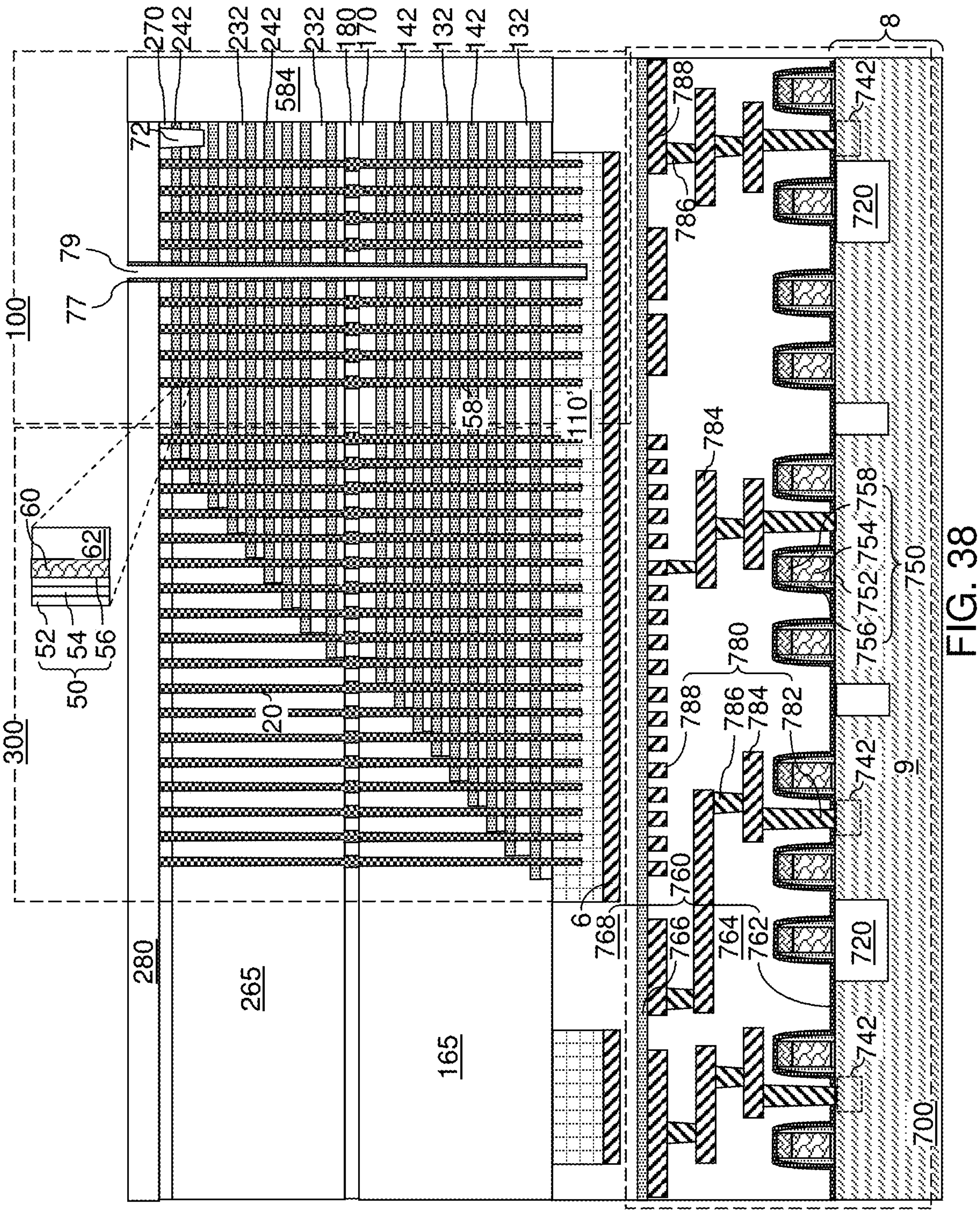
FIG. 38 is a vertical cross-sectional view of the second exemplary structure after formation of backside trench spacers according to the second embodiment of the present disclosure.
Figure 39A:
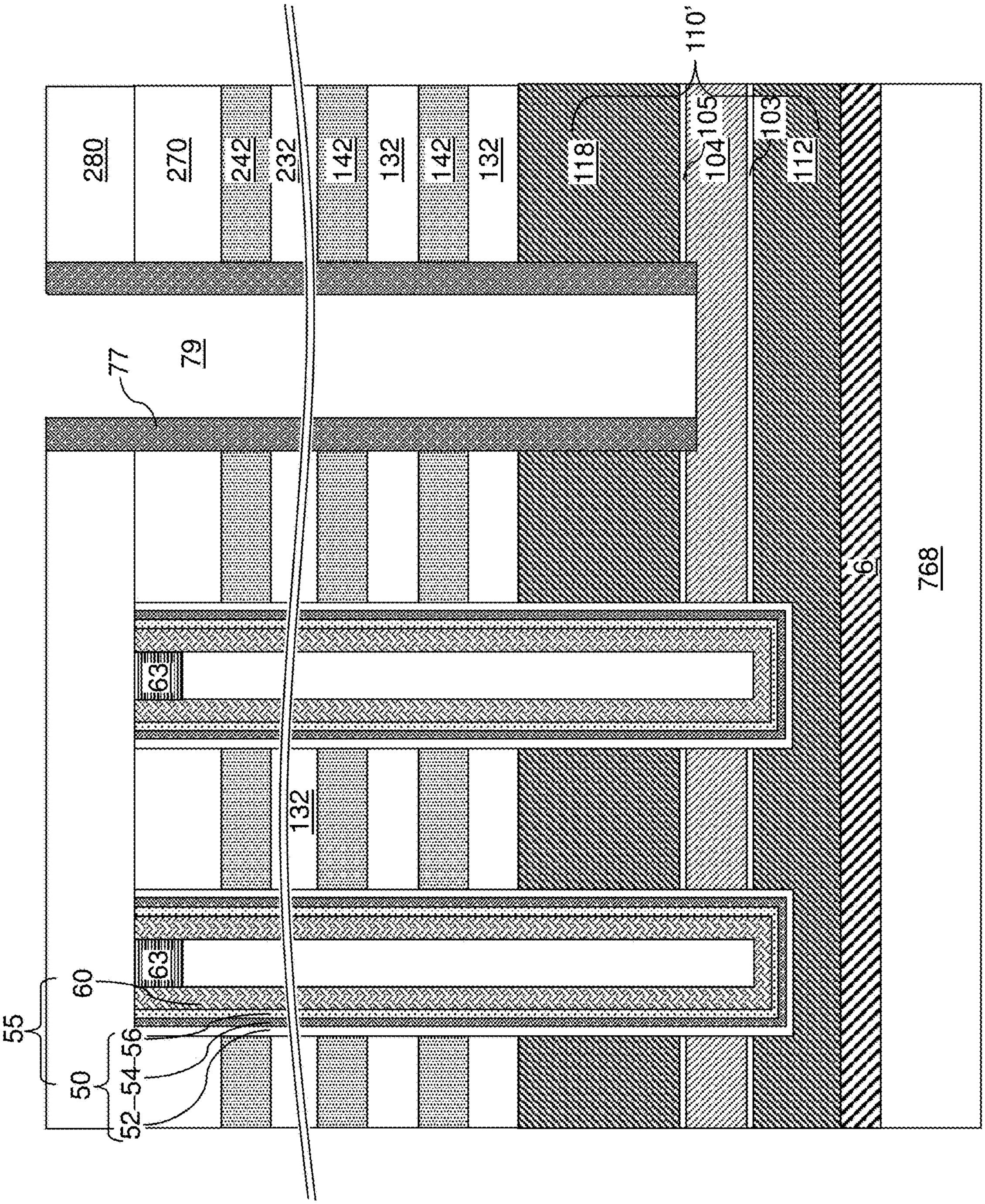
FIGS. 39A-39E illustrate sequential vertical cross-sectional views of memory opening fill structures and a backside trench during formation of source-level material layers according to the second embodiment of the present disclosure.

Referring to FIGS. 38 and 39A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 39B:
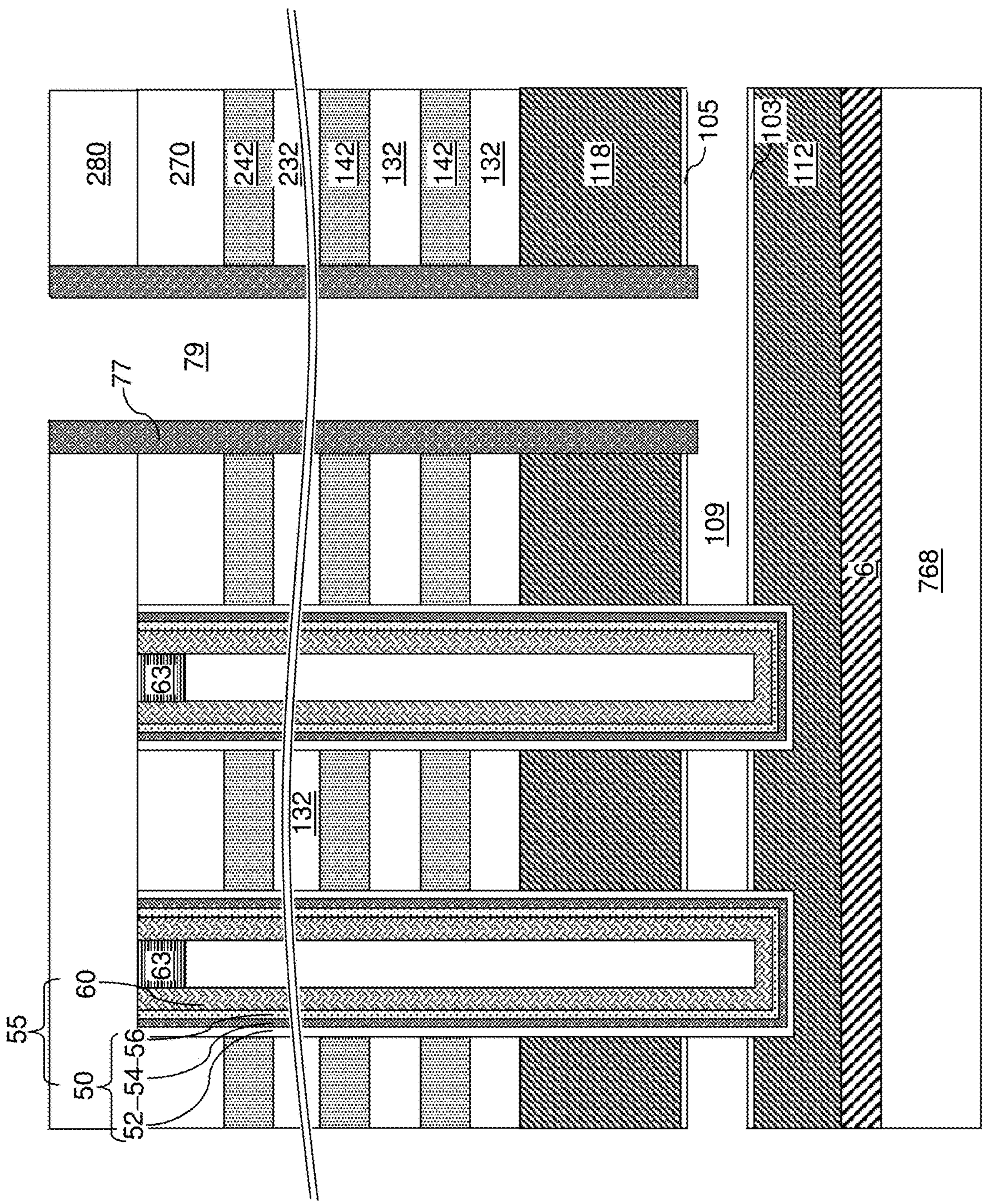

Referring to FIG. 39B, an etchant that etches the material of the source-level sacrificial layer 104 selective to the materials of the first alternating stack (132, 142), the second alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes silicon nitride, and the upper and lower sacrificial liners (105, 103) include silicon oxide, a wet etch process using phosphoric acid may be used to remove the source-level sacrificial layer 104 selective to the backside trench spacers 77 and the upper and lower sacrificial liners (105, 103). A source cavity 109 is formed in the volume from which the source-level sacrificial layer 104 is removed. Each of the memory opening fill structures 58 is physically exposed to the source cavity 109. Specifically, each of the memory opening fill structures 58 includes a sidewall and that are physically exposed to the source cavity 109.

Figure 39C:
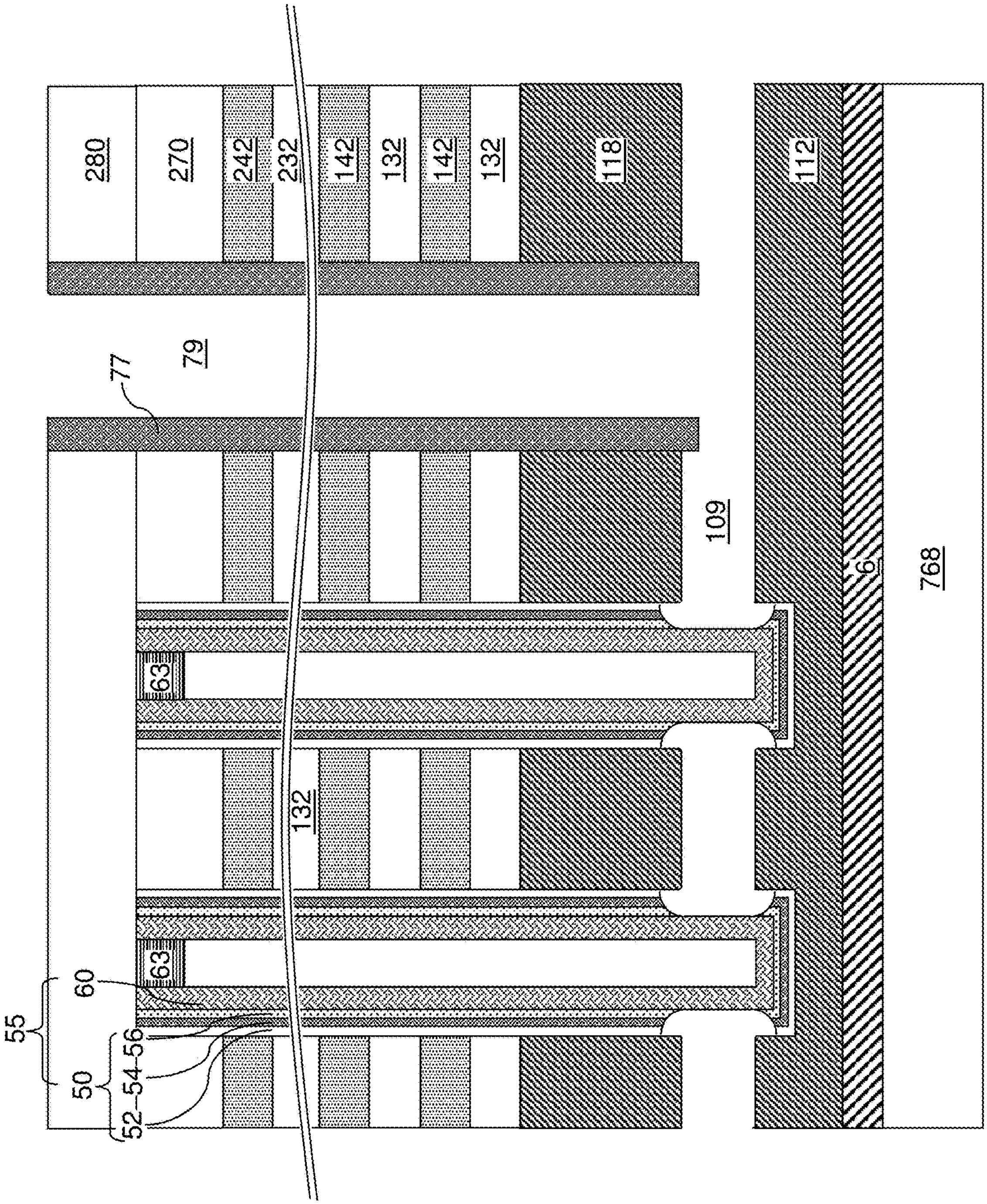

Referring to FIG. 39C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 118 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 118) and the vertical semiconductor channels 60.

Figure 39D:
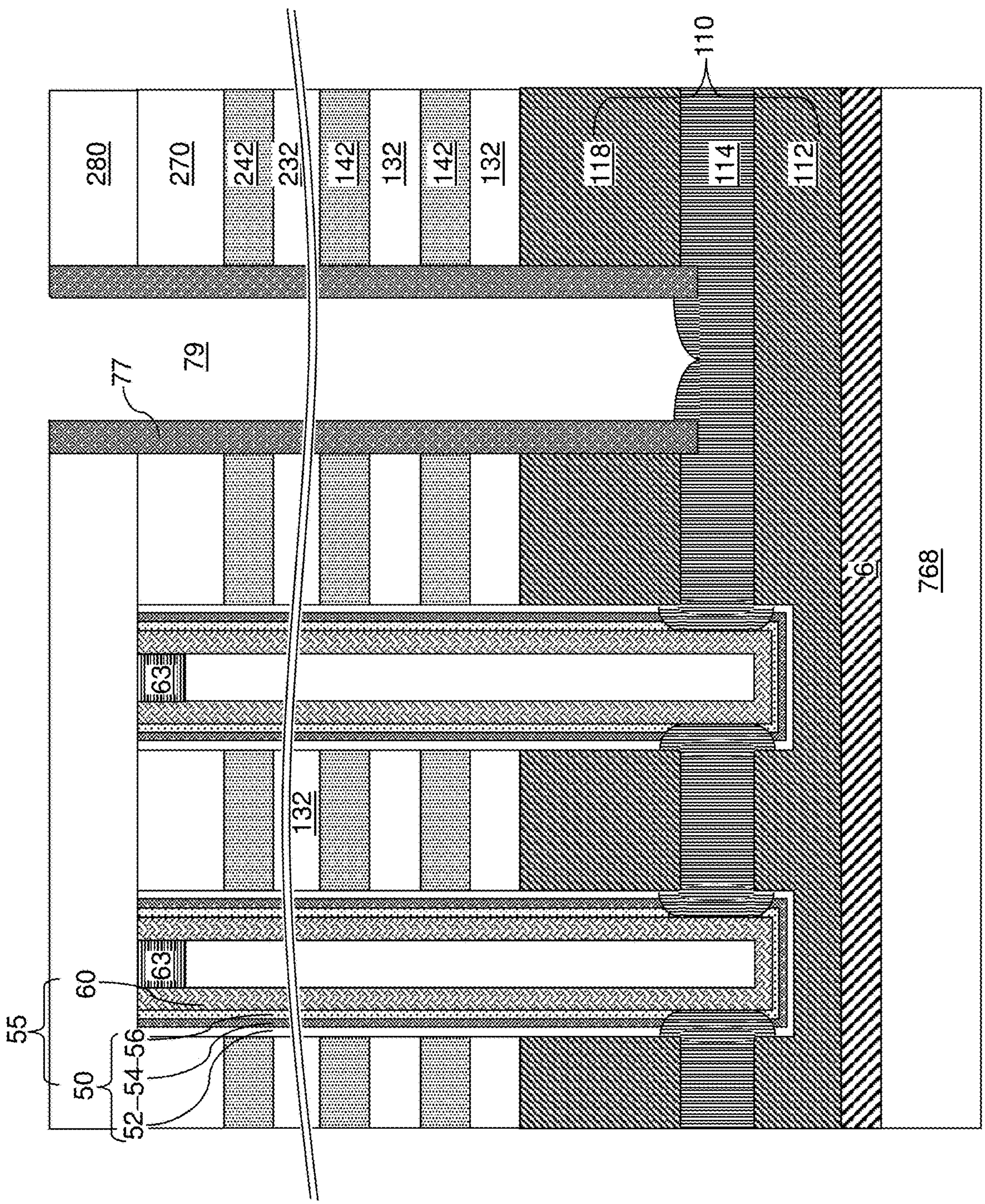

Referring to FIG. 39D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 118 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 118.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the second exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 118 constitutes a buried source layer (112, 114, 118). The buried source layer (112, 114, 118) is also referred to as source-level material layers 110, which replaces the in-process source-level material layers 110'.

Figure 39E:
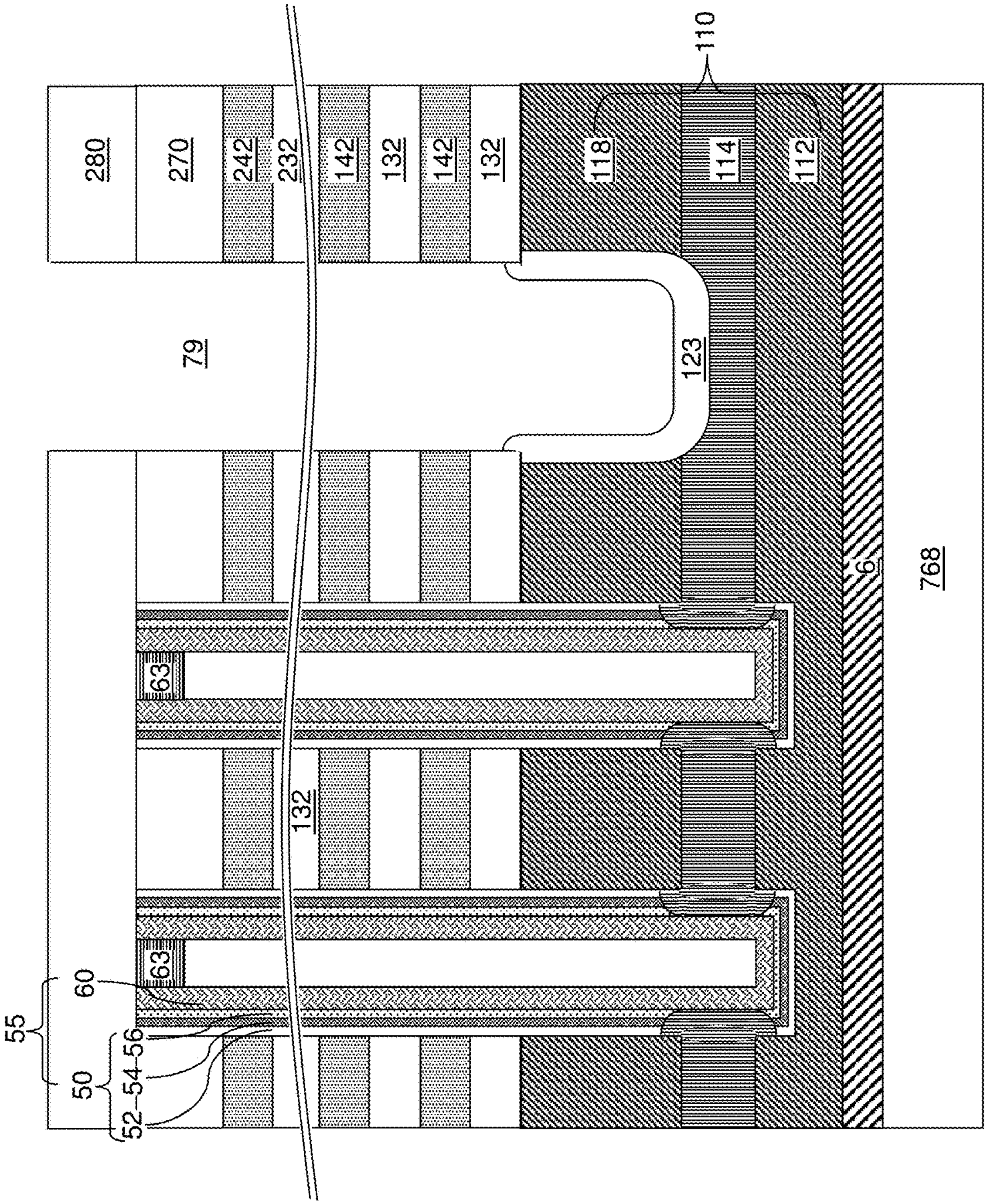
Figure 40:
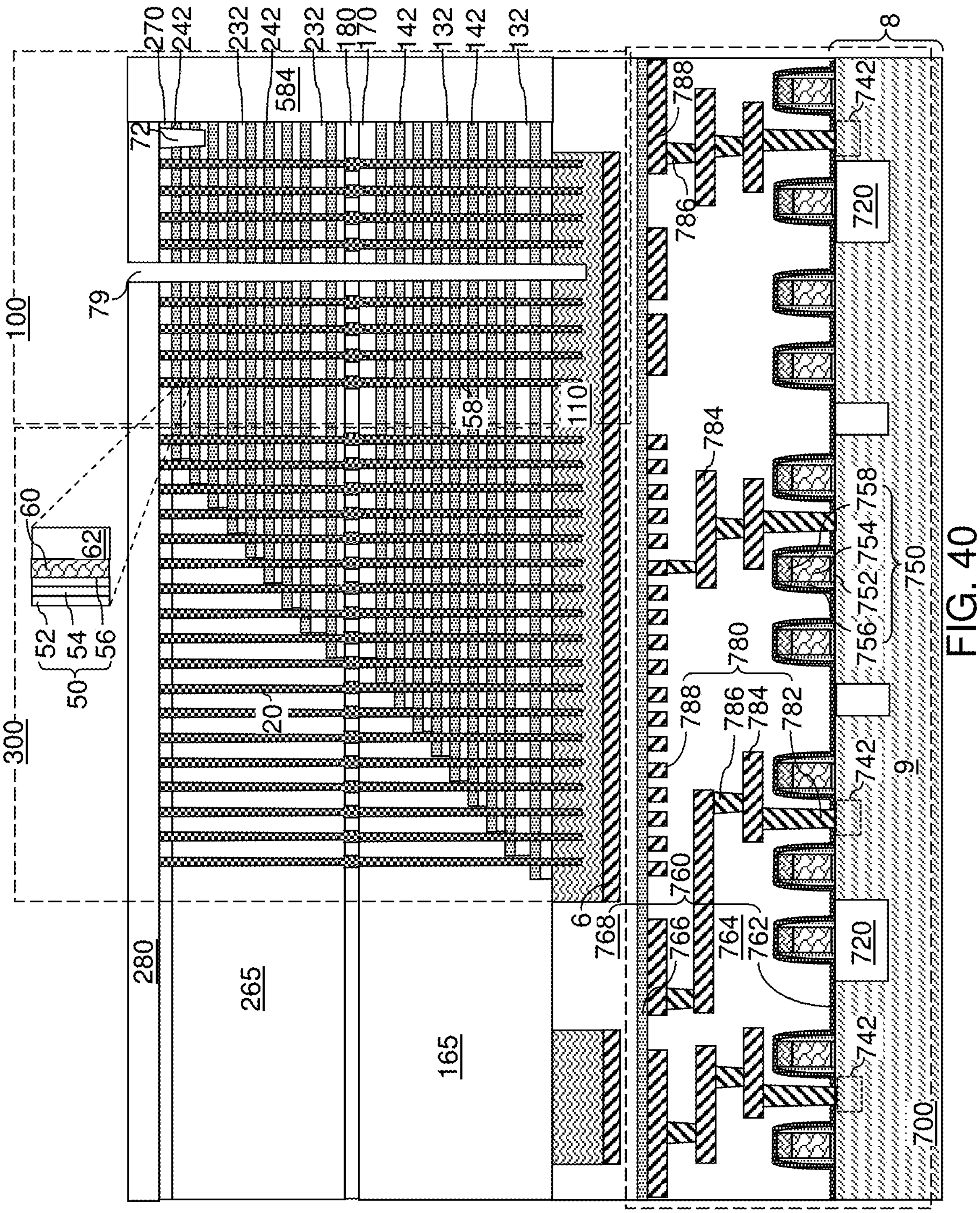
FIG. 40 is a vertical cross-sectional view of the second exemplary structure after formation of source-level material layers according to the second embodiment of the present disclosure.

Referring to FIGS. 39E and 40, the backside trench spacers 77 may be removed selective to the insulating layers (132, 232), the first and second insulating cap layers (170, 270), the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 118 may be converted into dielectric semiconductor oxide plates 123.

Figure 41:
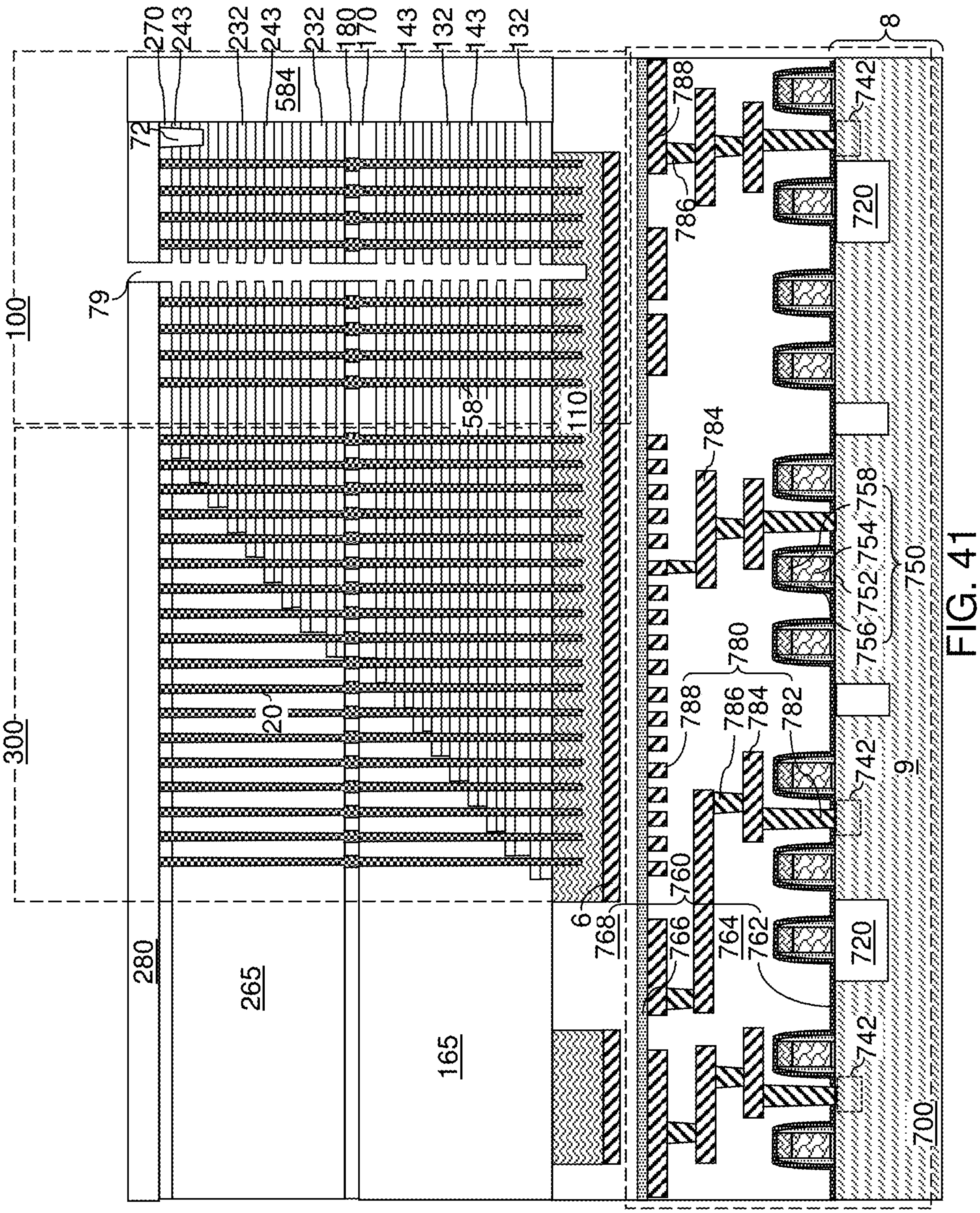
FIG. 41 is a vertical cross-sectional view of the second exemplary structure after formation of backside recesses according to the second embodiment of the present disclosure.

Referring to FIG. 41, the sacrificial material layers (142, 242) are removed selective to the insulating layers (132, 232), the first and second insulating cap layers (170, 270), the first contact-level dielectric layer 280, and the source contact layer 114, and the dielectric semiconductor oxide plates 123. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the second exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 42A:
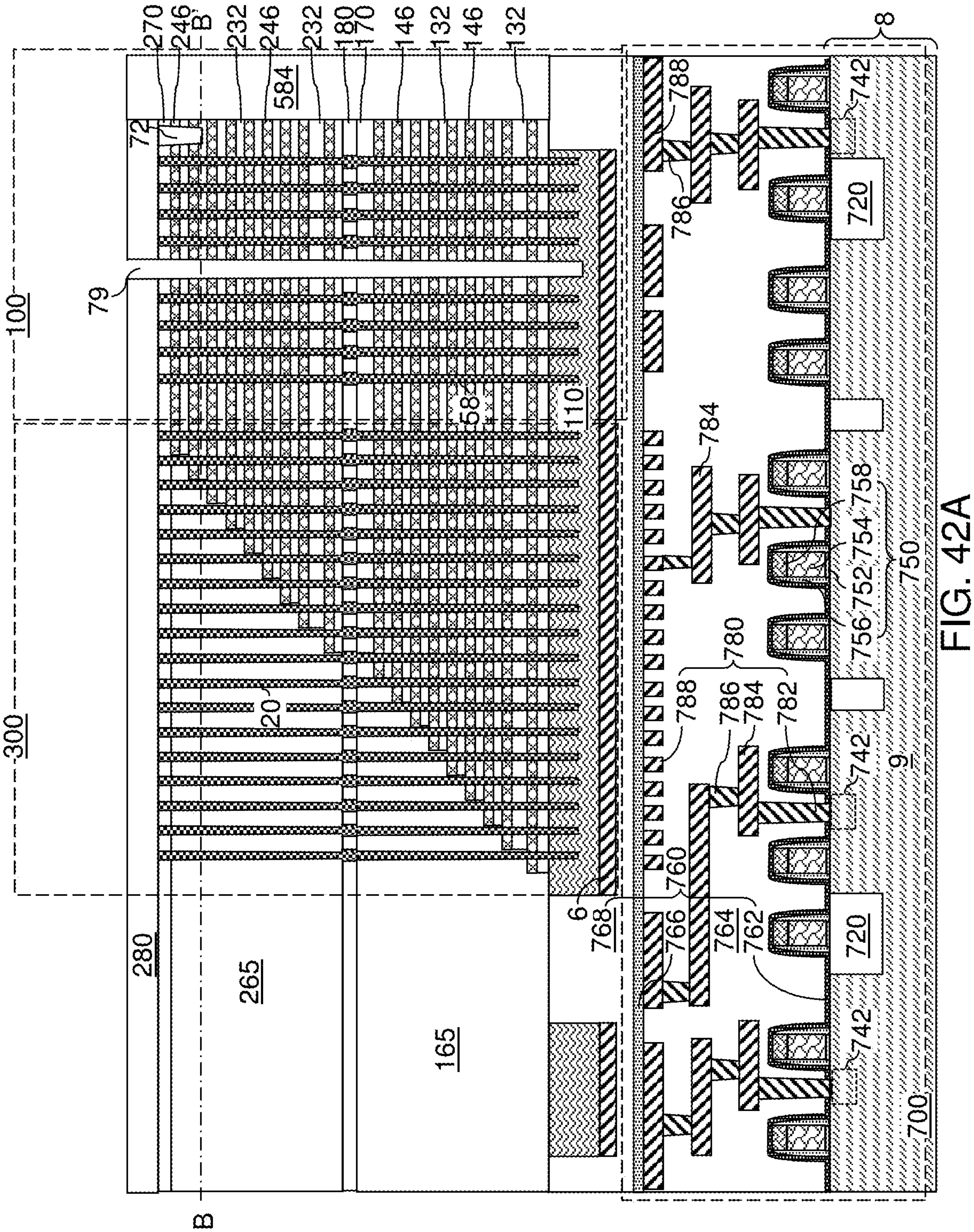
FIG. 42A is a vertical cross-sectional view of the second exemplary structure after formation of electrically conductive layers according to the second embodiment of the present disclosure.
Figure 42B:
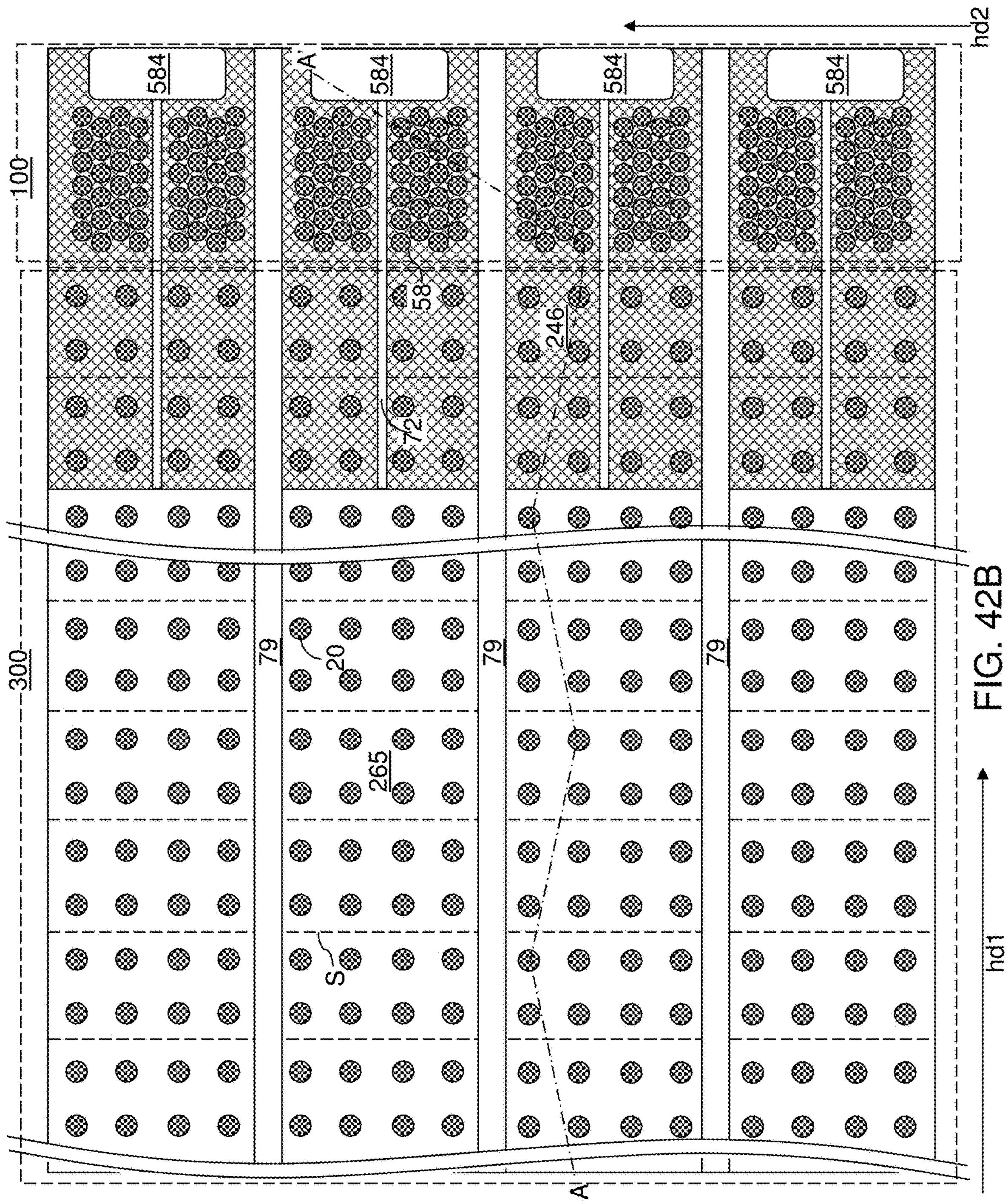
FIG. 42B is a horizontal cross-sectional view of the second exemplary structure along the horizontal plane B-B' of FIG. 42A. The hinged vertical plane A-A' corresponds to the plane of the vertical cross-sectional view of FIG. 42A.

Referring to FIGS. 42A and 42B, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 43A:
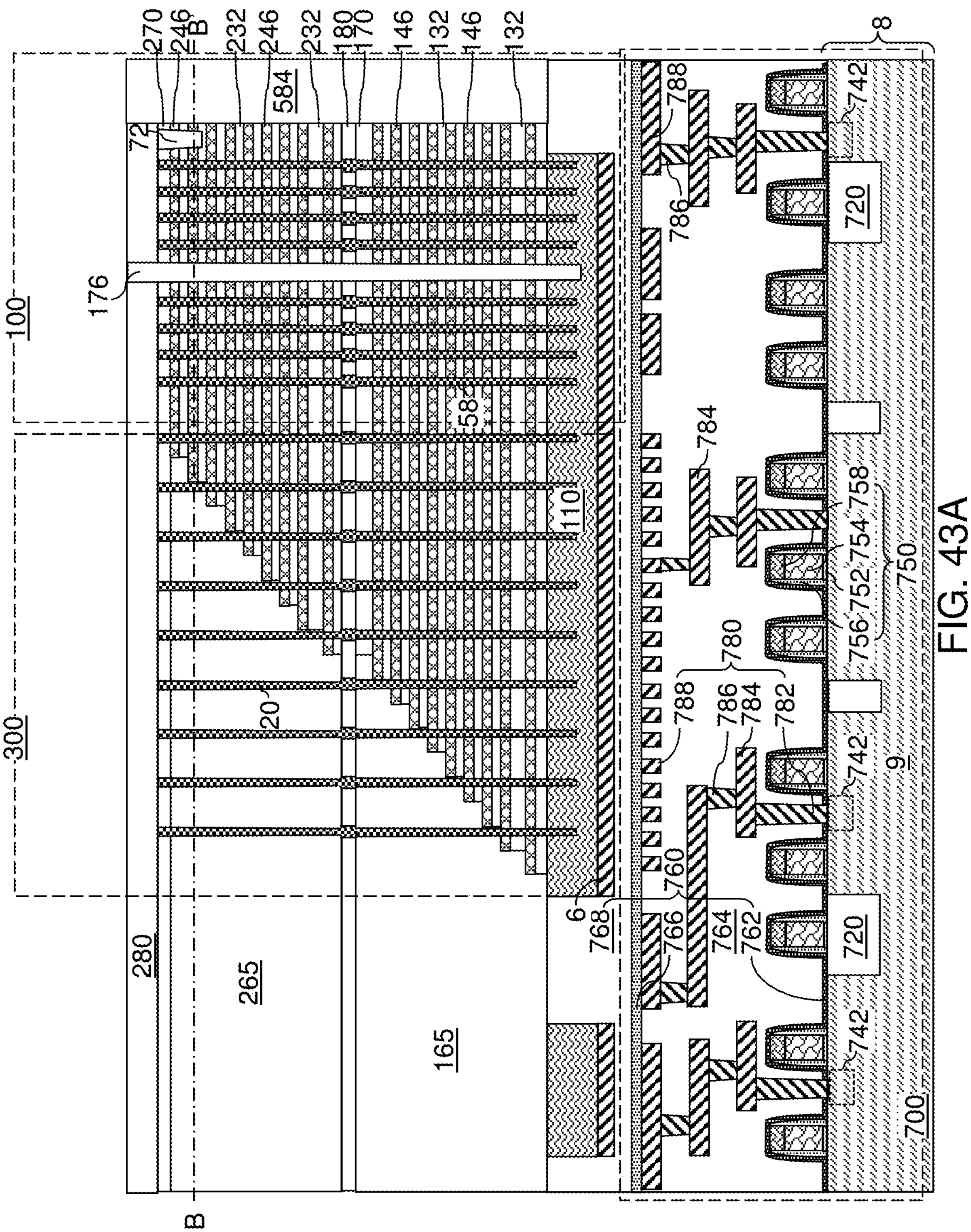
FIG. 43A is a vertical cross-sectional view of the second exemplary structure after formation of backside trench fill structures in the backside trenches according to the second embodiment of the present disclosure.
Figure 43B:
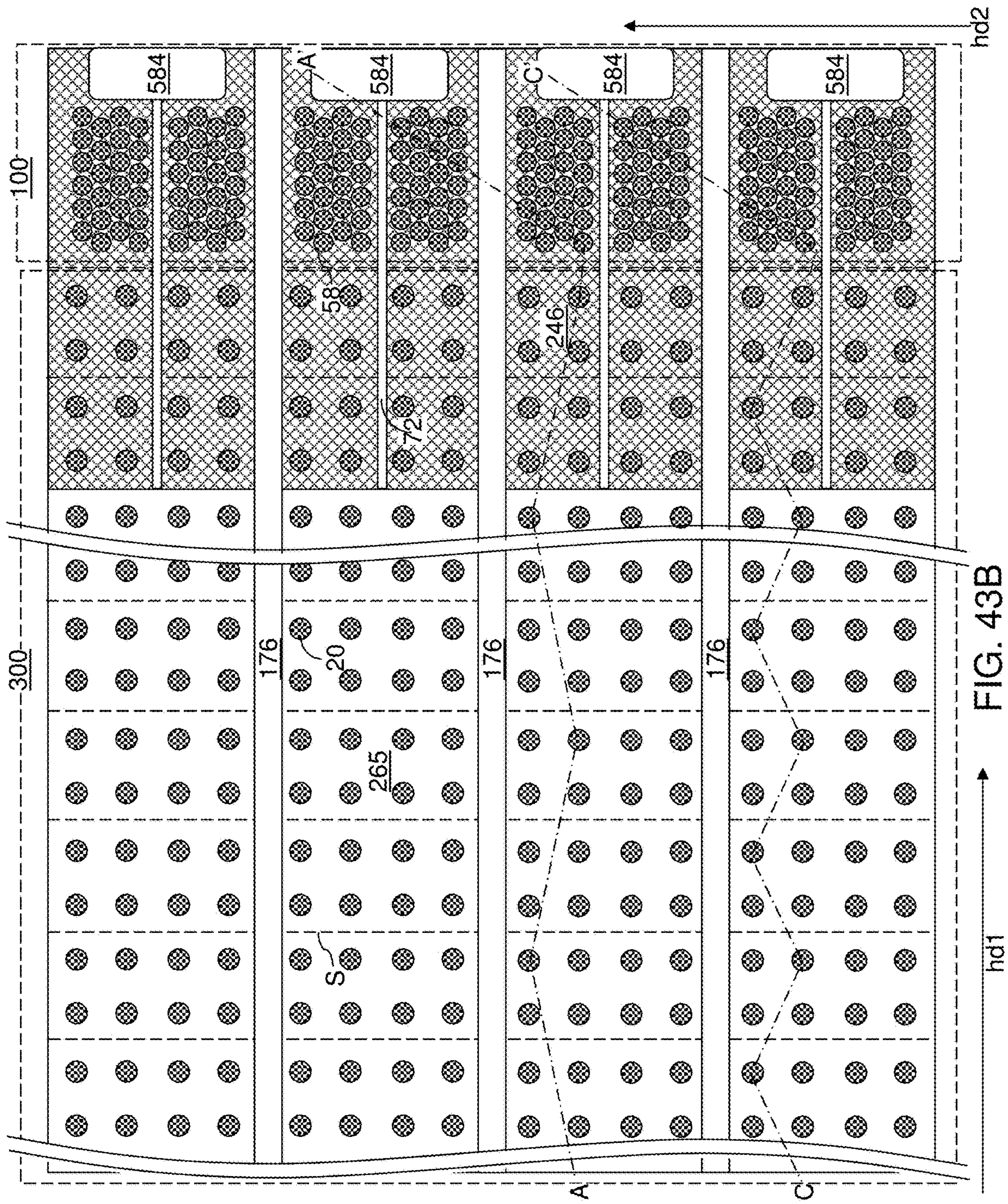
FIG. 43B is a horizontal cross-sectional view of the second exemplary structure along the horizontal plane B-B' of FIG. 43A. The hinged vertical plane A-A' corresponds to the plane of the vertical cross-sectional view of FIG. 43A.
Figure 43C:
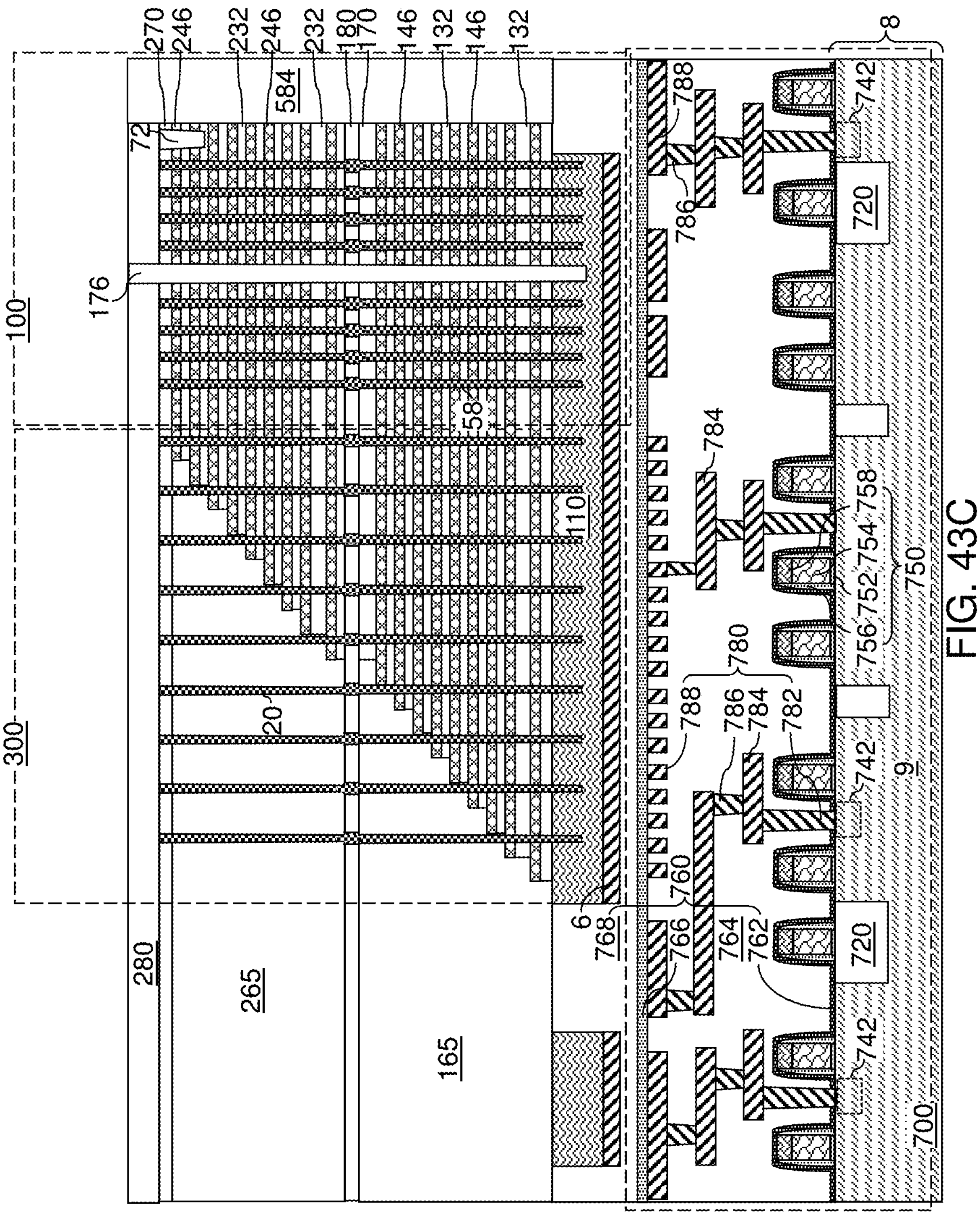
FIG. 43C is a vertical cross-sectional view of the second exemplary structure along the vertical plane C-C' of FIG. 43B.

Referring to FIGS. 43A-43C, a dielectric material layer may be conformally deposited in the backside trenches 79 and over the first contact-level dielectric layer 280 by a conformal deposition process. The dielectric material layer may include, for example, silicon oxide. The dielectric material may be planarized by CMP or etch back to form dielectric wall structures 176 in the respective backside trenches 79.

Figure 44A:
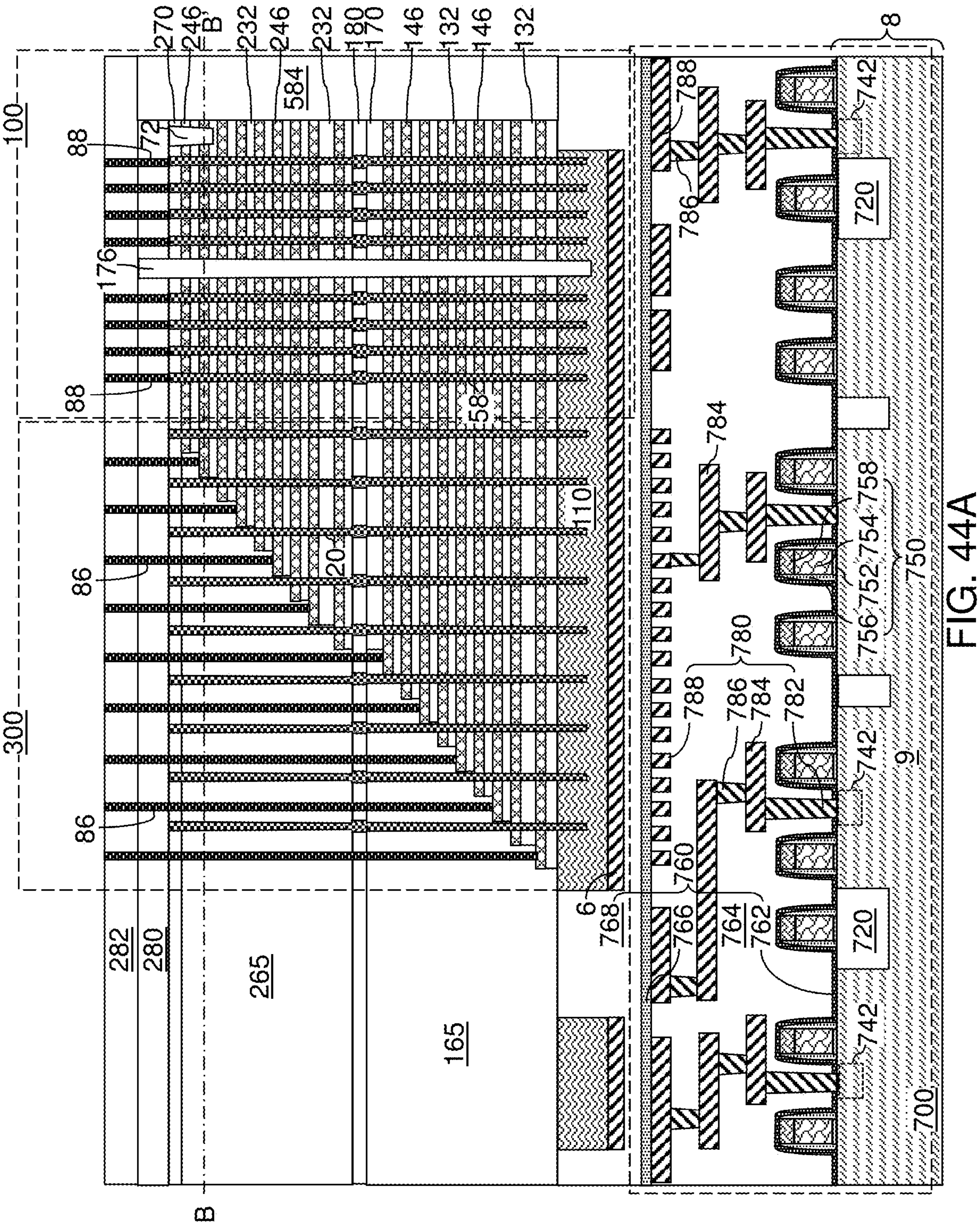
FIG. 44A is a vertical cross-sectional view of the second exemplary structure after formation of a second contact-level dielectric layer and various contact via structures according to the second embodiment of the present disclosure.
Figure 44B:
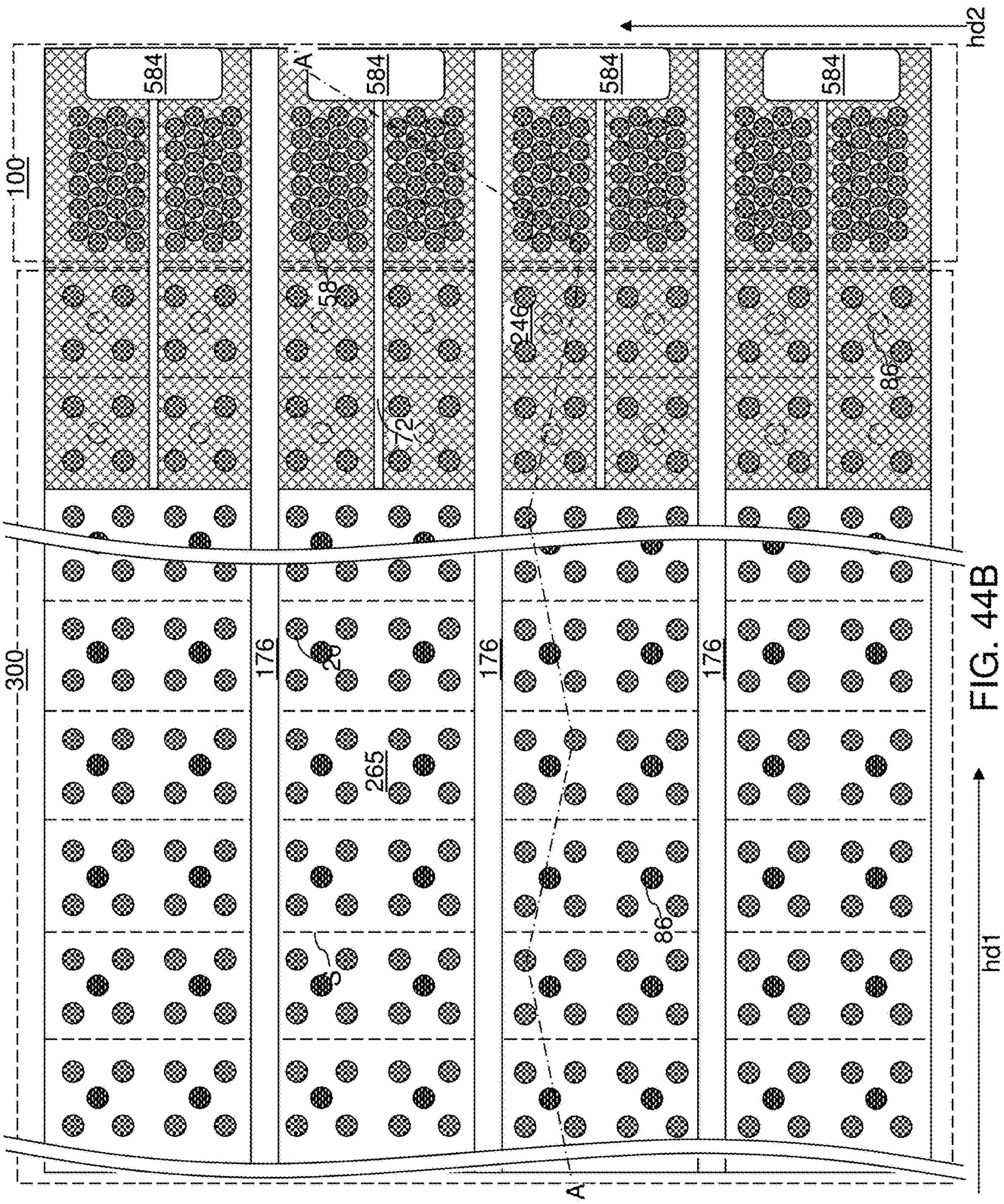
FIG. 44B is a horizontal cross-sectional view of the second exemplary structure along the vertical plane B-B' of FIG. 44A. The hinged vertical plane A-A' corresponds to the plane of the vertical cross-sectional view of FIG. 44A.

Referring to FIGS. 44A and 44B, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the contact region 300. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146, 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 45:
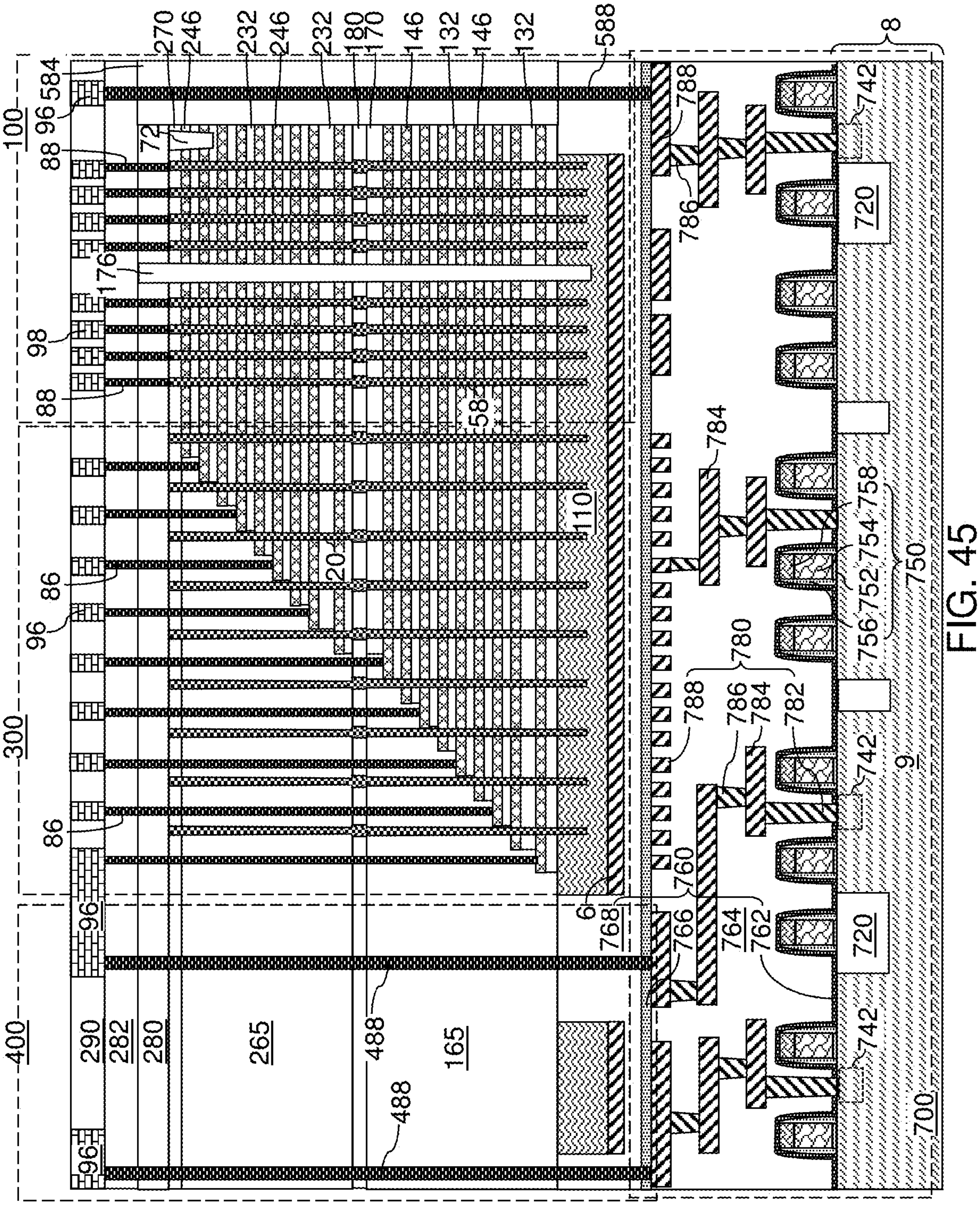
FIG. 45 is a vertical cross-sectional view of the second exemplary structure after formation of through-memory-level via structures and upper metal line structures according to the second embodiment of the present disclosure.

Referring to FIG. 45, peripheral-region via cavities may be formed through the second and first contact-level dielectric layers (282, 280), the second and first retro-stepped dielectric material portions (265, 165), and the drain-side dielectric layers 768 to top surfaces of a first subset of the lower-level metal interconnect structure 780 in the peripheral device region 400. Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

The various embodiments of the present disclosure can be employed to provide a straight etch profile for first-tier memory openings 149 and first-tier support openings 129 while reducing or eliminating bowing at an upper portion of the first-tier memory openings 149 and first-tier support openings 129.

FIGS. 46A-46D are sequential vertical cross-sectional views of a memory opening in a first configuration of a third exemplary structure during the processing steps for patterning a hard mask layer, formation of a cladding liner, and an anisotropic etch process according to a third embodiment of the present disclosure.

Figure 46B:
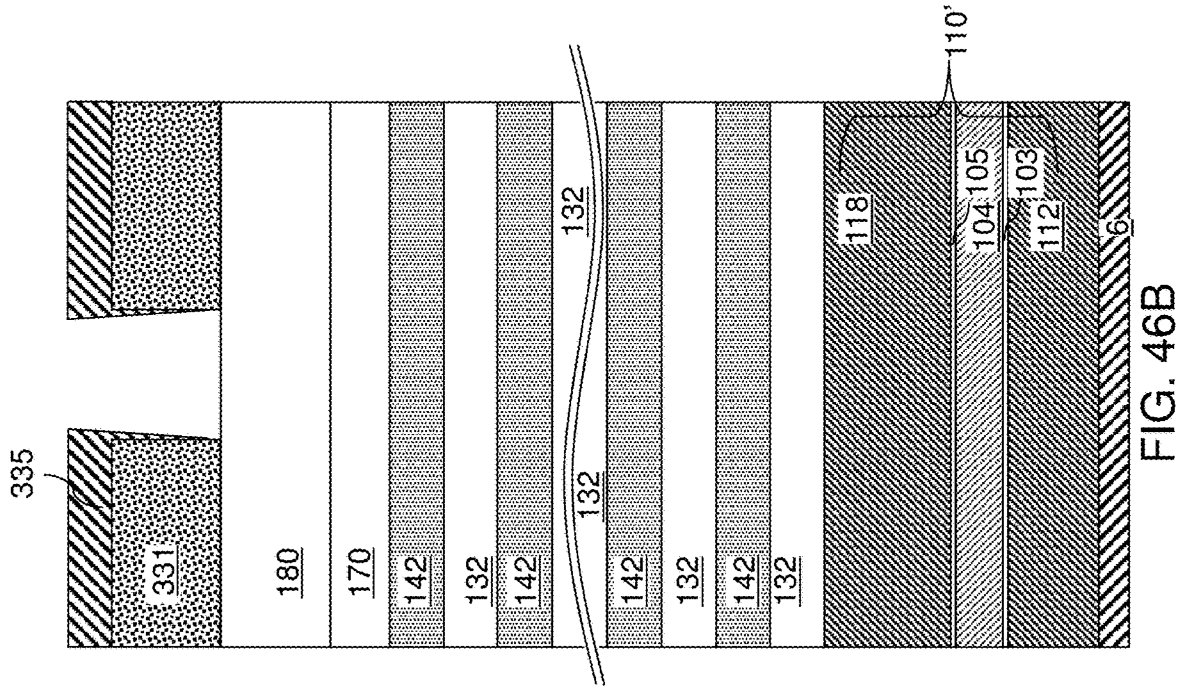
FIGS. 46A-46D are sequential vertical cross-sectional views of a memory opening in a first configuration of a third exemplary structure during the processing steps for patterning a patterning film, formation of a cladding liner, and an anisotropic etch process according to a third embodiment of the present disclosure.
Figure 46A:
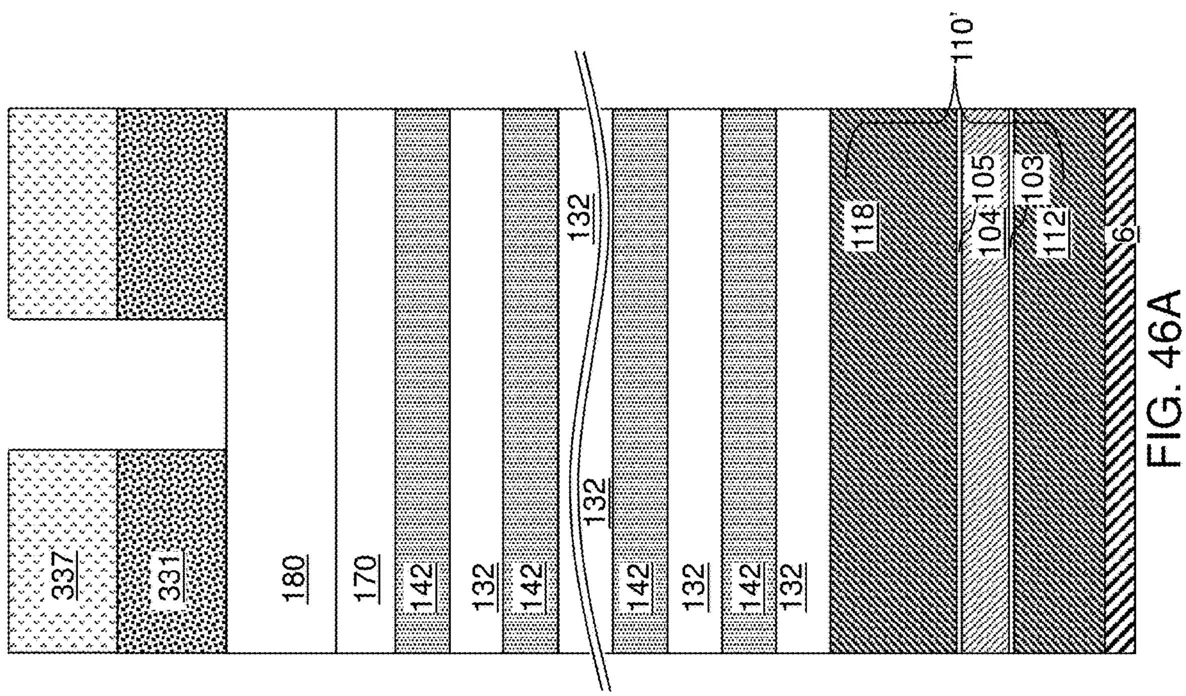

Referring to FIG. 46A, the third exemplary structure according to the third embodiment of the present disclosure can be the same as the second exemplary structure of FIGS. 23A-23C. Generally, an alternating stack of first material layers and second material layers (such as the first insulating layers 132 and the first sacrificial material layers 142) can be formed over a substrate 8, and a hard mask layer can be formed over the alternating stack. For example, the hard mask layer comprises, and/or consists essentially of, a carbon-based patterning film 331 hard mask layer comprising at least 60% of carbon in atomic concentration. Alternatively, other hard mask materials described above may be used to form the hard mask layer. A photoresist layer 337 can be applied and patterned over the patterning film 331 in the same manner as in the processing steps of FIGS. 23A-23C. Openings are formed in the photoresist layer 337 by lithographic exposure and development, and cavities (i.e., openings) 332 can be formed in the patterning film 331 by performing a first anisotropic etch process that transfers the pattern of the openings in the photoresist layer 337 through the patterning film 331. The photoresist layer 337 can be subsequently removed, for example, by ashing or by dissolution is an organic solvent.

Referring to FIG. 46B, a cladding liner 335 can be formed on a top surface of the patterning film 331 and sidewalls of the cavities 332 in the pattering film 331 by anisotropically depositing a cladding material. According to an embodiment of the present disclosure, the cladding liner 335 consists essentially of an electrically conductive (e.g., metallic) material, such as tungsten, ruthenium, cobalt, molybdenum, titanium nitride, etc. In this third embodiment, the cladding liner 335 is formed after patterning the patterning film 331 but prior to forming the openings 149 in the alternating stack (132, 142).

In one embodiment, the cladding liner 335 may be formed by anisotropic (e.g., non-conformal) deposition of a metallic material over the patterning film 331 after the first anisotropic etch process. The cladding layer 335 may be formed on top surface of the patterning film 331 and sidewalls of the cavities 332 in the pattering film 331 while a top surface of the inter-tier dielectric layer 180 is physically exposed at the bottom of each cavity 332 in the patterning film 331. Generally, the cladding liner 335 can be formed on sidewalls of the cavities 332 in the patterning film 331 and on the top surface of the patterning film 331.

In another embodiment, the cladding liner 335 can be deposited by a selective deposition process that grows the material of the cladding liner 335 from physically exposed surfaces of the patterning film 331 without growth of the material of the cladding liner from physically exposed surfaces of a dielectric material layer (such as the inter-tier dielectric layer 180) underlying the cavities in the patterning film 331. The selective deposition process grows the cladding material (i.e., the material of the cladding liner 335) from physically exposed surfaces of the patterning film 331 without growth of the cladding material from physically exposed surfaces of the inter-tier dielectric layer 180. In this case, the cladding material may be any material that allows selective deposition on the material of the patterning film 331 without growth from surfaces of the inter-tier dielectric layer 180. Thus, the cladding liner 335 is deposited conformally on the physically exposed surfaces of the patterning film 331, and is not deposited on the physically exposed surfaces of the inter-tier dielectric layer 180.

In one embodiment, the cladding liner 335 comprises, and/or consists essentially of, an inorganic material selected from amorphous carbon, diamond-like carbon, amorphous silicon, polycrystalline silicon, silicon carbide, or boron nitride. For example, silicon carbide may be selectively formed on the patterning film 331 by selectively depositing a silicon layer (e.g., crystalline silicon layer) on the patterning film 331, followed by annealing the silicon layer at a sufficiently high temperature (e.g., at 600 degrees Celsius or higher, such as 600 to 800 degrees Celsius) to react the silicon layer with the patterning film 331 to selectively form a conformal silicon carbide cladding liner 335 on the patterning film 331. In another embodiment, the cladding liner 335 comprises, and/or consists essentially of, a metallic (i.e., electrically conductive metal or metal alloy) material that can be selectively deposited on surfaces of the patterning film 331. Metallic materials that can be selectively deposited on surfaces of the patterning film 331 include, but are not limited to, TiN, Ru, Co or Mo. For example, Ru can be selectively deposited by ALD on the patterning film 331. In another embodiment, the cladding liner 335 comprises, and/or consists essentially of, silicon oxide. The cladding liner 335 may be deposited by a conformal selective deposition process such as a chemical vapor deposition (CVD) process and/or an atomic layer deposition (ALD) process. The thickness of the portion of the cladding liner 335 overlying the top surface of the patterning film 331 may be in a range from 1 nm to 40 nm, such as from 2 nm to 20 nm, although lesser and greater thicknesses may also be employed.

In another embodiment, the cladding liner 335 may be deposited by a non-conformal deposition process that deposits the material of the cladding liner 335 anisotropically with a variable thickness that decreases with a vertical distance from a horizontal plane including the top surface of the patterning film 331. In one embodiment, the cladding liner 335 may be deposited by a physical vapor deposition process, such as sputtering, or by a non-conformal atomic layer deposition (ALD) in which a metallic material is deposited anisotropically with directionality such that the metallic material is deposited with a lesser thickness in recessed surfaces that underlie the horizontal plane including the top surface of the patterning film 331. In this case, the thickness of the metallic material of the cladding liner 335 can rapidly decrease with a recess depth of the cavity 332 as measured from the horizontal plane including the top surface of the patterning film 331. In one embodiment, the aspect ratio of the cavities 332 in the patterning film 331 may be at least 1.5, and may be in a range from 2 to 10, such as from 2.5 to 6. The lateral thickness of the portions of the cladding liner 335 located on sidewalls of the patterning film 331 decreases with a vertical distance from a horizontal plane including the top surface of the patterning film 331. In one embodiment, the aspect ratio of the cavities 332 in the patterning film 331 and the directionality of the anisotropic deposition process that deposits the cladding liner 335 can be selected such that the lateral thickness of the cladding liner 335 becomes zero above a horizontal plane including a bottom surface of the patterning film 331. In this case, a bottommost portion of a sidewall of the patterning film 331 may be physically exposed around an opening through the patterning film 331.

In this embodiment, the cladding liner 335 may consist essentially of a metal or metal nitride, such as at least one material selected from Ru, Co, Mo, W, TaN, TiN, or WN. The thickness of the horizontally-extending portion of the cladding liner 335 that overlies the patterning film 331 may be in a range from 5 nm to 100 nm, such as from 10 nm to 30 nm, although lesser and greater thicknesses may also be employed.

In one embodiment, the cladding liner 335 comprises a horizontally-extending portion that overlies the top surface of the patterning film 331 and a plurality of vertically-extending tubular portions having a respective upper edge that is adjoined to the horizontally-extending portion. The plurality of vertically-extending tubular portions of the cladding liner 335 can be located on sidewalls of the cavities (i.e., openings) 332 in the patterning film 331, and each of the plurality of vertically-extending tubular portions of the cladding liner 335 may have a variable lateral width that increases with a vertical distance from the upper source-level semiconductor layer 118. In this case, each of the plurality of vertically-extending tubular portions of the cladding liner 335 may have a variable lateral thickness that decreases with a vertical distance downward from the horizontal plane including the top surface of the patterning film 331. In one embodiment, the each of the plurality of vertically-extending tubular portions of the cladding liner 335 may have a respective bottom edge that is located on a respective sidewall of the patterning film 331 in the respective cavity 332.

In one embodiment, the cladding liner 335 is not present on the physically exposed surface portions of the inter-tier dielectric layer 180 in the cavities 332. In another embodiment, a thin layer of the cladding liner 335 may be formed on the physically exposed surface portions of the inter-tier dielectric layer 180, and an isotropic etch process may be performed to remove any portion of the cladding liner 335 that is deposited on the physically exposed surface portions of the inter-tier dielectric layer 180. The isotropic etch process may comprise a wet etch process, or a dry etch process such as a chemical dry etch process.

Figure 46D:
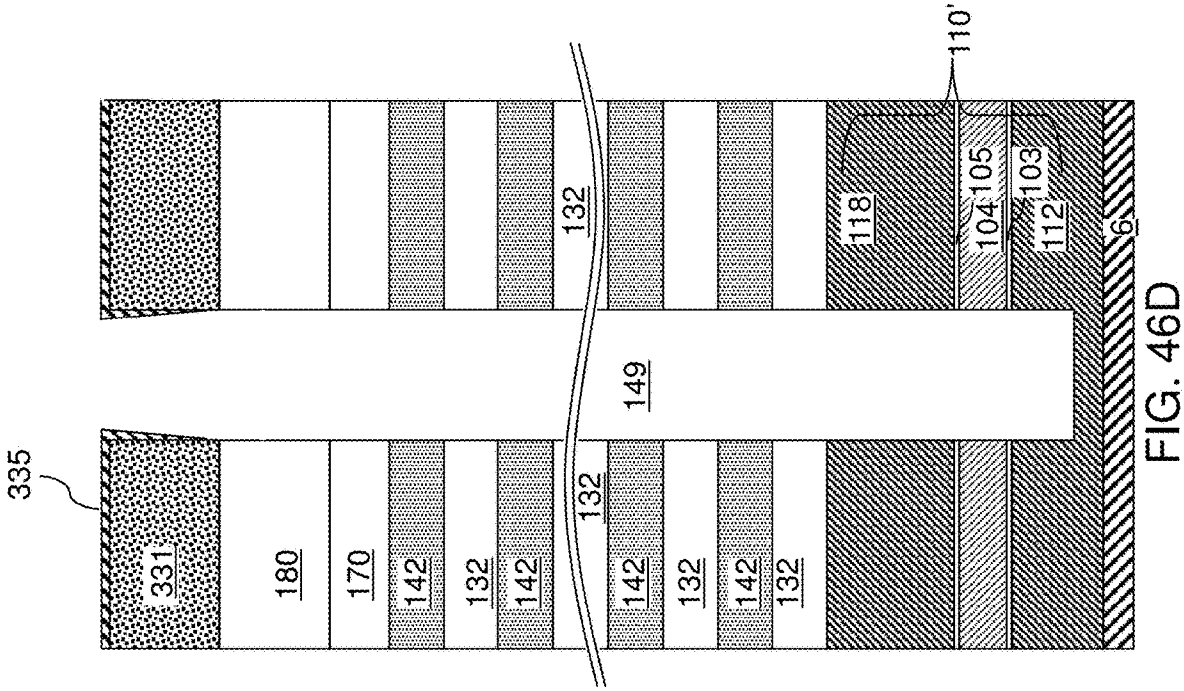
Figure 46C:
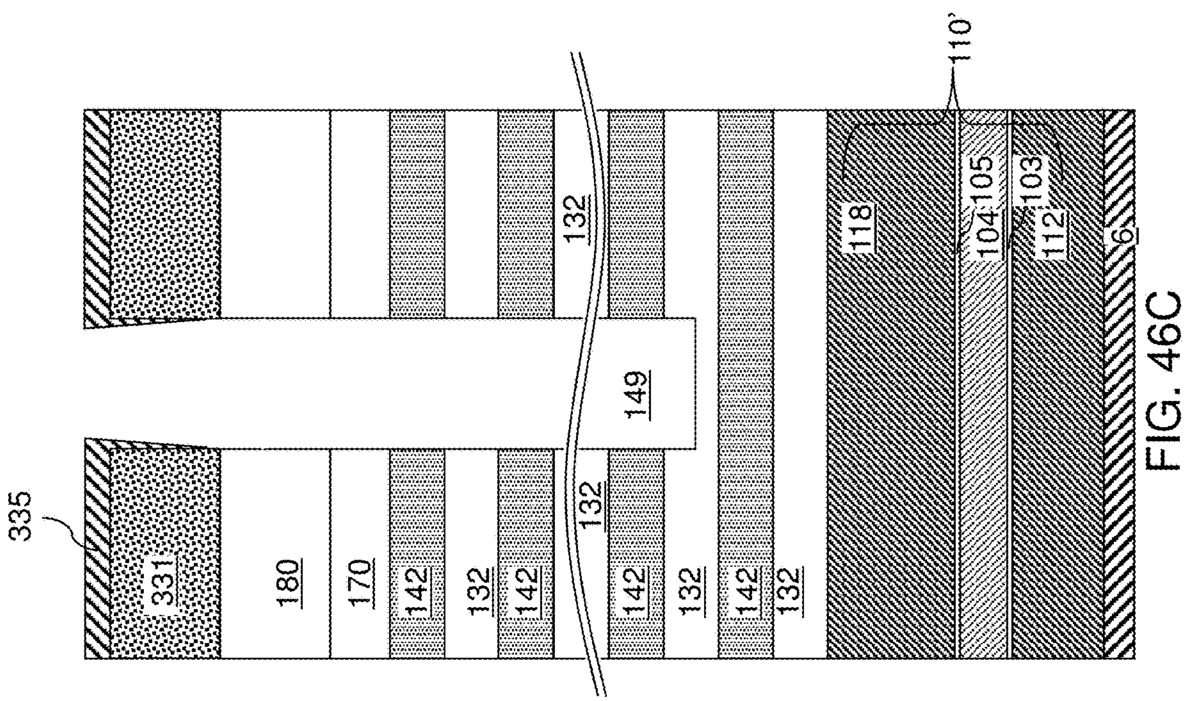

Referring to FIG. 46C, a second anisotropic etch process can be performed to transfer the pattern of the openings (i.e., cavities) in the patterning film 331 and the cladding liner 335 through the first-tier alternating stack (132, 142). The third exemplary structure illustrated in FIG. 46C corresponds to a time point during the second anisotropic etch process at which the bottom surfaces of the via openings, such as the first-tier memory openings 149, vertically extend through an upper subset of the layers in the first-tier alternating stack (132, 142) and a lower subset of the layers in the first-tier alternating stack (132, 142) has not yet been etched through. The chemistry of the second anisotropic etch process can be selected such that the materials of the first-tier alternating stack (132, 142) and the first retro-stepped dielectric material portion 165 are etched selective to the material of the upper source-level semiconductor layer 118. For example, if the first insulating layers 132 comprise silicon oxide, the first sacrificial material layers 142 comprise silicon nitride, and the first retro-stepped dielectric material portion 165 comprise silicon oxide, the second anisotropic etch process may have an etch chemistry employing a mixture of $CF_4$, $O_2$, optionally Ar, and optionally $C_4F_8$ and/or $CF_2Br_2$. The pattern of the openings can be transferred through the first-tier alternating stack (132, 142) by the second anisotropic etch process.

In one embodiment, the materials of the first-tier alternating stack (132, 142) are etched concurrently with the material of the first retro-stepped dielectric material portion 165 during the second anisotropic etch process. The chemistry of the initial etch step may alternate to optimize etching of the first and second materials in the first-tier alternating stack (132, 142) while providing a comparable average etch rate to the material of the first retro-stepped dielectric material portion 165. The sidewalls of the various first-tier openings (149, 129) may be substantially vertical, or may be tapered.

Referring to FIG. 46D, the second anisotropic etch process is continued until the via openings extend through each layer within the first-tier alternating stack (132, 142) and the in-process source-level material layers 110' underneath each opening in the patterning film 331. Generally, via openings (such as the first-tier memory openings 149 and the first-tier support openings 119) may be formed through an alternating stack of first material layers and second material layers by performing an anisotropic etch process that transfers a pattern of the cavities in the patterning film 331 through each layer within the alternating stack employing a combination of the cladding liner 335 and the patterning film 331 as an etch mask. The second anisotropic etch process can include multiple etch steps having different etch chemistries optimized for sequentially etching the various layers within the first-tier alternating stack (132, 142) and the in-process source-level material layers 110'. Generally, the etch chemistries described above with reference to the processing steps of FIGS. 25B-25D, 26B-26D, or 27B-27D may be employed to etch the various layers of the in-process source-level material layers 110'.

In one embodiment, the entirety of the top surface of the patterning film 331 may be covered by a remaining portion of the cladding liner 335 after the second anisotropic etch process as illustrated in FIG. 46D.

Figure 47:
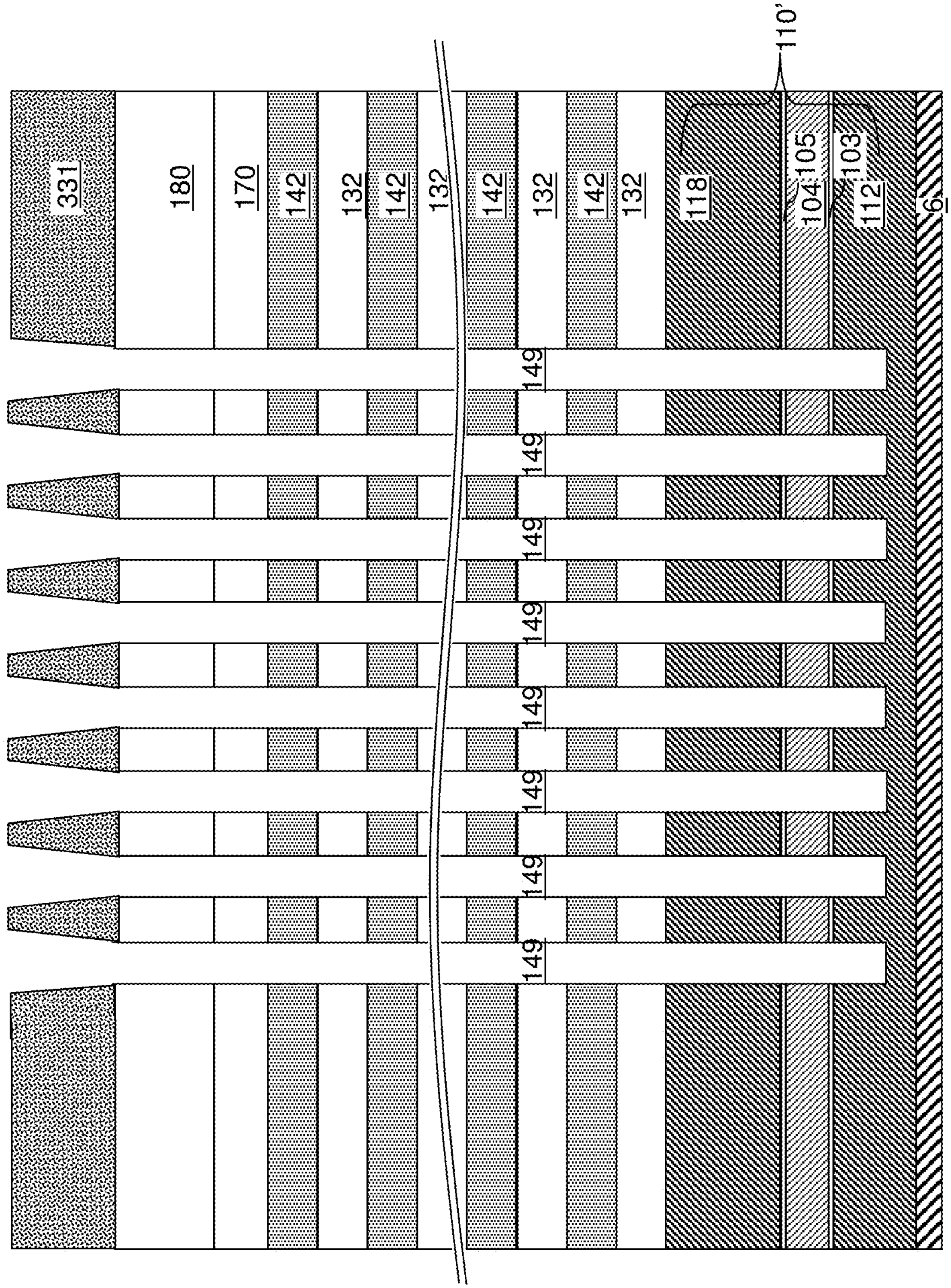
FIG. 47 is a vertical cross-sectional view of a region of the first configuration of the third exemplary structure after formation of memory openings according to the third embodiment of the present disclosure.

Referring to FIG. 47, the cladding liner 335 can be removed by selective etching. In this case, the top surface of the patterning film 331 may be planar. Alternatively, the cladding liner 335 can be consumed at a terminal portion of the second anisotropic etch process, and collateral etching of the patterning film 331 may be insubstantial. In this case, the top surface of the patterning film 331 may be substantially planar.

Elimination or minimization of the loss of the material of the patterning film 331 provides a uniform vertical cross-sectional profile for the portions of the patterning film 331 that overlie the region of the via openings (such as the first-tier memory openings 149 and the first-tier support openings 119) in underlying material layers. In this case, the uniform vertical-cross-sectional profile of the portions of the patterning film 331 overlying the region of the via openings provides uniform vertical cross-sectional profiles with reduced bowing for the via openings through the underlying material layers. For example, the first-tier memory openings 149 can be formed with the same vertical cross-sectional profile or similar vertical cross-sectional profile. By reducing the bowing and/or other variations in lateral dimensions of the first-tier memory openings 149, portions of the memory stack structures 55 formed in the first-tier memory openings 149 can have uniform structural characteristics, and thus, can have uniform electrical characteristics.

The patterning film 331 can then be removed by ashing and/or by selective etching.

The methods of the processing steps of FIGS. 46A-46D and 47 can be employed to pattern a second-tier structure including a second-tier alternating stack of second insulating layers 232 and second sacrificial material layers 242. In this case, second-tier memory openings can be formed with the same vertical cross-sectional profile or similar vertical cross-sectional profile. By reducing the variations in lateral dimensions of the second-tier memory openings, portions of the memory stack structures 55 formed in the second-tier memory openings can have uniform structural characteristics, and thus, can have uniform electrical characteristics.

Subsequently, the processing steps of FIGS. 28A-45 can be performed to form a three-dimensional memory device illustrated in FIG. 45. Generally, a memory film 50 and a vertical semiconductor channel 60 may be formed in each respective via opening, and the second material layers may be replaced with electrically conductive word lines to form the three-dimensional memory device.

Figure 48B:
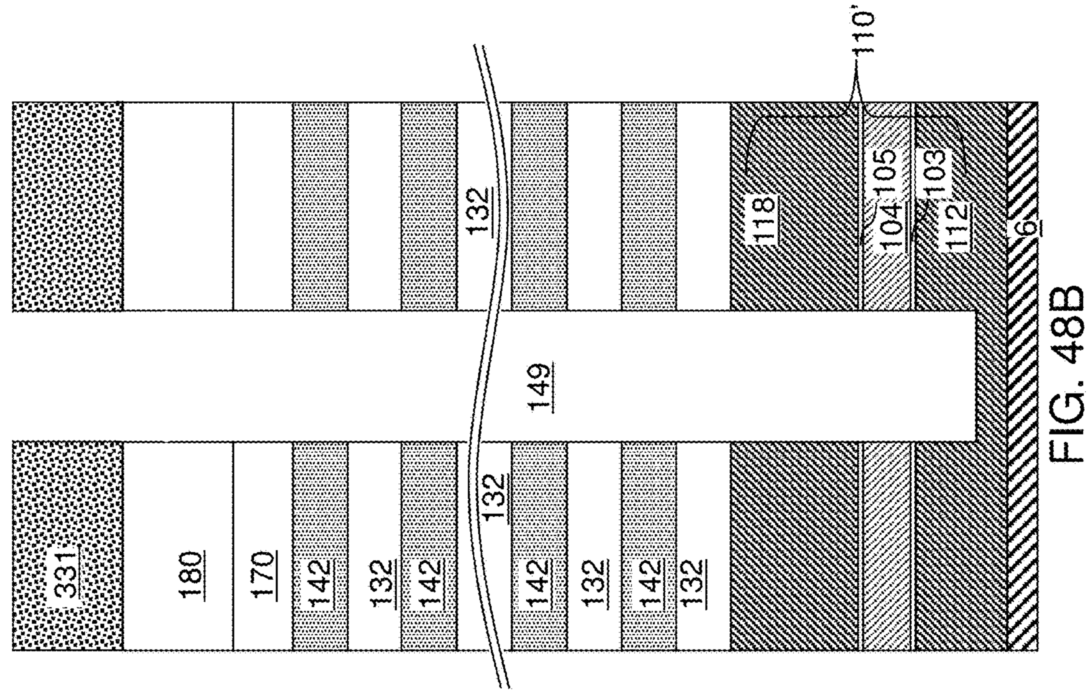
FIGS. 48A and 48B are sequential vertical cross-sectional views of a memory opening in a second configuration of the third exemplary structure during an anisotropic etch process according to a third embodiment of the present disclosure.
Figure 48A:
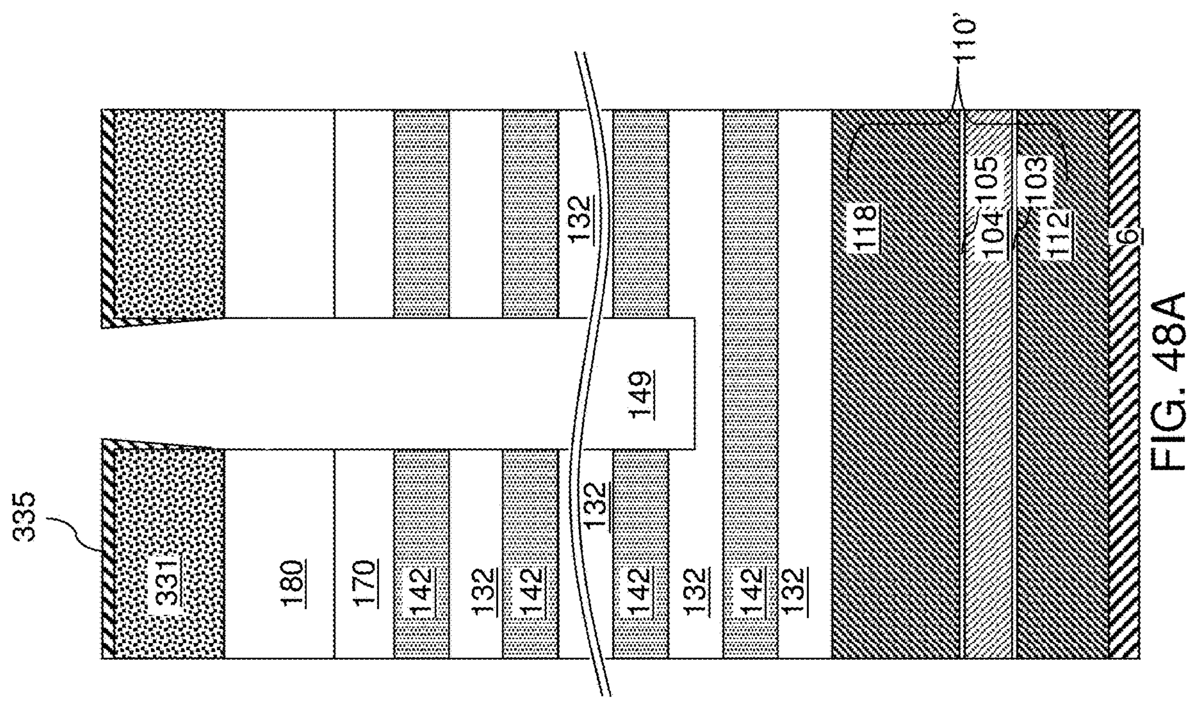

FIGS. 48A and 48B are sequential vertical cross-sectional views of a memory opening in a second configuration of the third exemplary structure during the second anisotropic etch process, which corresponds to the processing steps of FIGS. 46C and 46D. In this case, the cladding liner 335 can be collaterally etched during the second anisotropic etch process, and the top surface of the patterning film 331 can be physically exposed prior to the end of the second anisotropic etch process.

Figure 49:
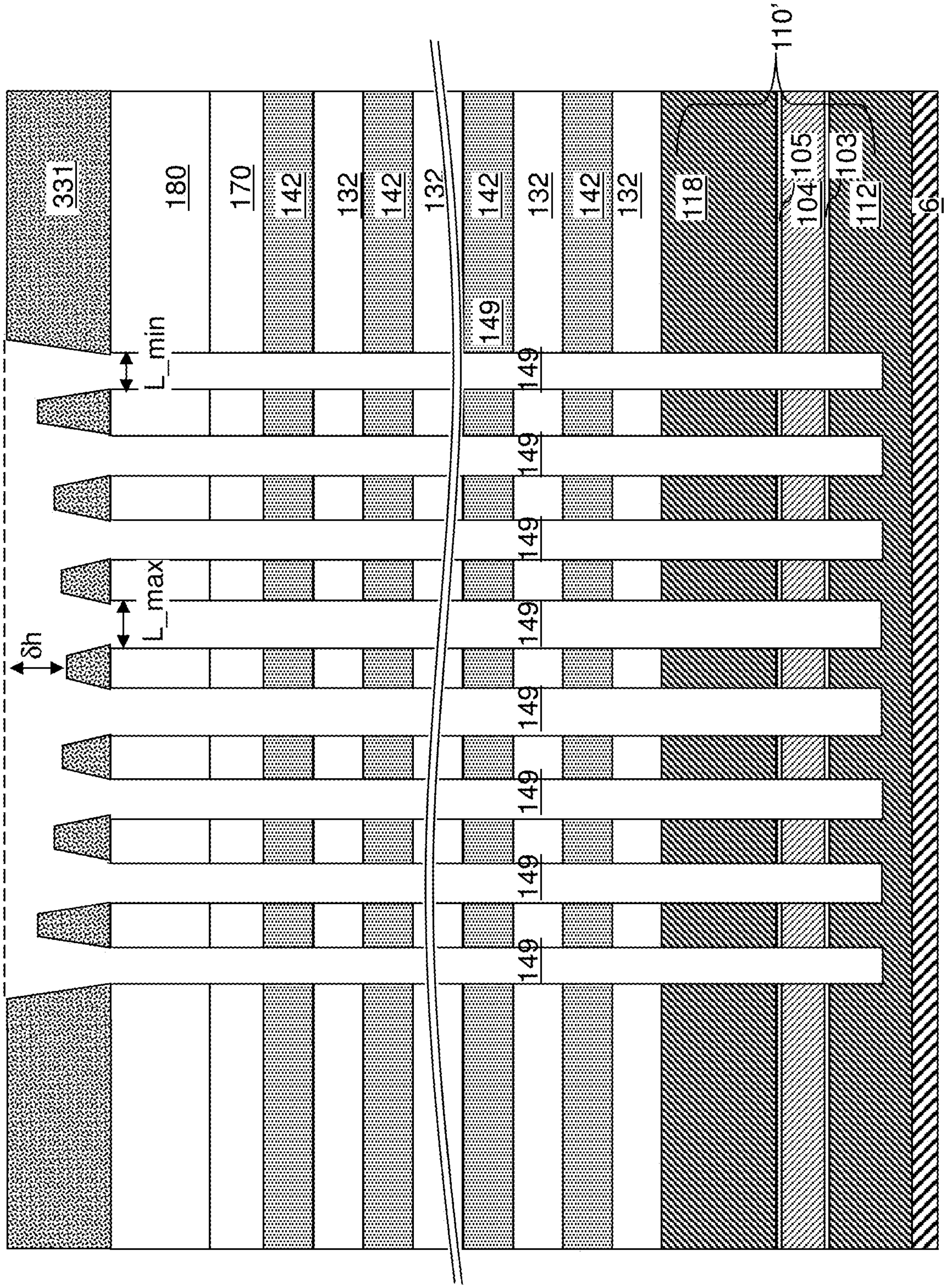
FIG. 49 is a vertical cross-sectional view of a region of the second configuration of the third exemplary structure after formation of memory openings according to the third embodiment of the present disclosure.

Referring to FIG. 49, a region of the second configuration of the third exemplary structure is illustrated after the second anisotropic etch process. In case the top surface of the patterning film 331 is physically exposed prior to the end of the second anisotropic etch process, the top surface of the patterning film 331 can be vertically recessed by different vertical recess distances depending on the pattern factor of the cavities in the patterning film 331, i.e., depending on the local fraction of the areas of the cavities in the patterning film 331 relative to a unit area of the patterning film 331 having a size of a lateral scale of movement of the etchant ions employed during the second anisotropic etch process. The maximum differential δh between the least recessed portion of the top surface of the patterning film 331 and the most recessed portion of the top surface of the patterning film 331 is illustrated in FIG. 49. However, the bowing of the memory openings 149 is still reduced even with the recessed portion of the top surface of the patterning film 331.

FIGS. 50A-50G are sequential vertical cross-sectional views of a region of a memory opening in a third configuration of the third exemplary structure during formation of the memory opening according to the third embodiment of the present disclosure.

Figure 50B:
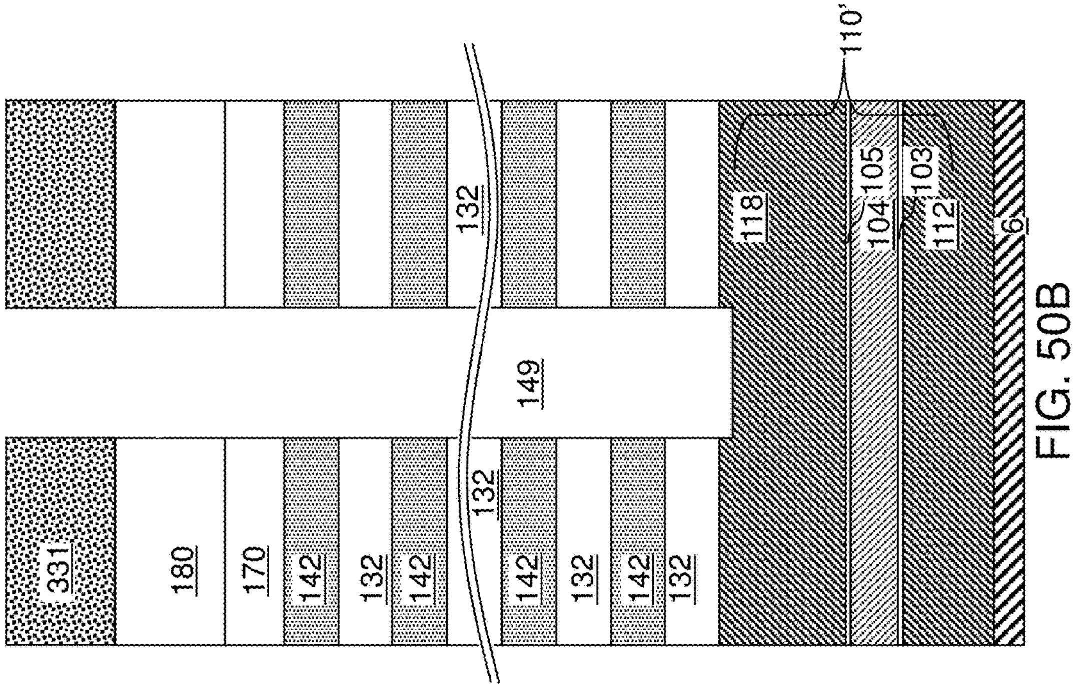
FIGS. 50A-50G are sequential vertical cross-sectional views of a region of a memory opening in a third configuration of the third exemplary structure during formation of the memory opening according to the third embodiment of the present disclosure.
Figure 50A:
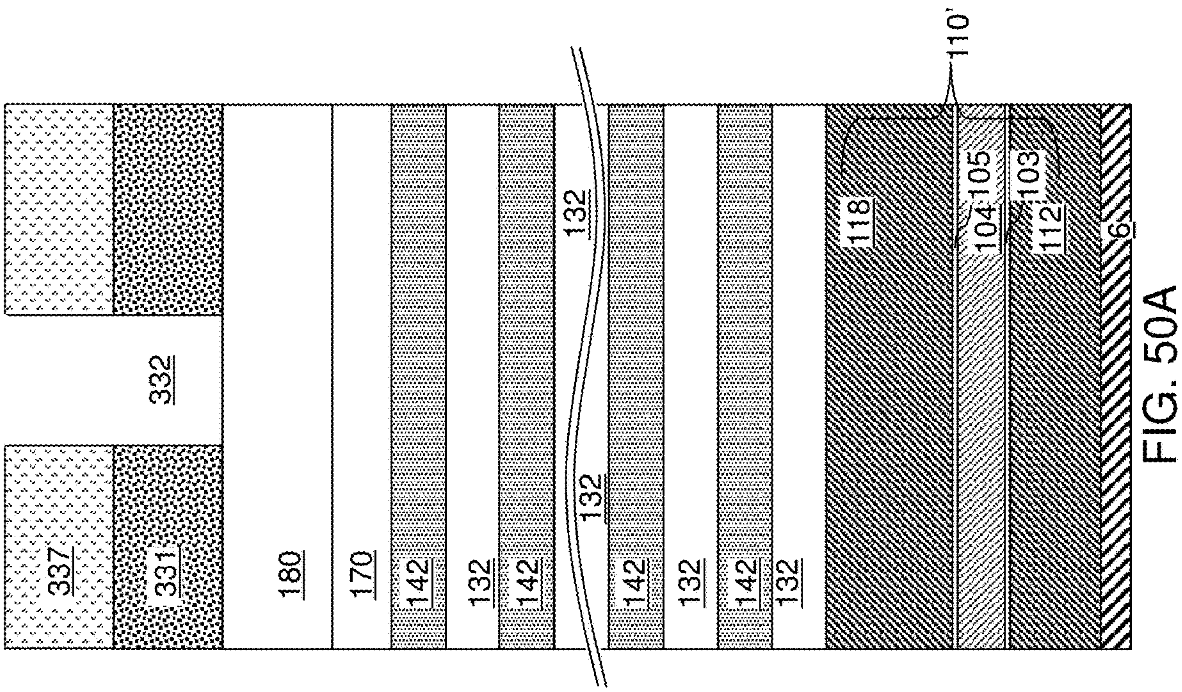

Referring to FIG. 50A, the third configuration of the third exemplary structure can be the same as the second exemplary structure of FIGS. 23A-23C and/or the third exemplary structure illustrated in FIG. 46A. Generally, a set of material layers comprising at least one source-level semiconductor layer (112, 118) over a substrate 8. In one embodiment, the set of material layers may comprise in-process source-level material layers 110' as described above. An alternating stack of first material layers and second material layers (such as the first insulating layers 132 and the first sacrificial material layers 142) can be formed over a substrate 8, and a hard mask layer can be formed over the alternating stack. For example, the hard mask layer comprises, and/or consists essentially of, a carbon-based patterning film 331 hard mask layer comprising at least 60% of carbon in atomic concentration. Alternatively, other hard mask materials described above may be used to form the hard mask layer. A photoresist layer 337 can be applied and patterned over the patterning film 331 in the same manner as in the processing steps of FIGS. 23A-23C. Openings are formed in the photoresist layer 337 by lithographic exposure and development, and cavities (i.e., openings) 332 can be formed in the patterning film 331 by performing a first anisotropic etch process that transfers the pattern of the openings in the photoresist layer 337 through the patterning film 331. Generally, a pattern of cavities 332 can be formed in the hard mask layer 331 by patterning the hard mask layer 331. The photoresist layer 337 can be subsequently removed, for example, by ashing or by dissolution is an organic solvent.

Referring to FIG. 50B, a second anisotropic etch process can be performed to transfer the pattern of the openings (i.e., cavities) in the patterning film 331 through the first-tier alternating stack (132, 142). The patterning film 331 is employed as an etch mask for the second anisotropic etch process. Optionally, a cladding liner (not shown) such as a cladding liner 335 described above may be formed and employed as an additional etch mask for the second anisotropic etch process. In this case, any of the previously described embodiments for forming and utilizing a cladding liner may be employed. Via openings, such as the first-tier memory openings 149, are formed underneath the pattern of cavities 332 in the photoresist layer 337 through first-tier alternating stack (132, 142). The chemistry of the second anisotropic etch process can be selected such that the materials of the first-tier alternating stack (132, 142) and the first retro-stepped dielectric material portion 165 are etched selective to the material of the upper source-level semiconductor layer 118. For example, if the first insulating layers 132 comprise silicon oxide, the first sacrificial material layers 142 comprise silicon nitride, and the first retro-stepped dielectric material portion 165 comprise silicon oxide, the second anisotropic etch process may have an etch chemistry employing a mixture of $CF_4$, $O_2$, optionally Ar, and optionally $C_4F_8$ and/or $CF_2Br_2$. Generally, the pattern of the openings (i.e., the cavities 332) in the hard mask layer 331 can be transferred through the first-tier alternating stack (132, 142) by the second anisotropic etch process. A surface of the upper source-level semiconductor layer 118 can be physically exposed at the bottom of one or more via openings through the first-tier alternating stack (132, 142) and/or the first retro-stepped dielectric material portion 165 (such as the first-tier memory openings 149).

In one embodiment, the materials of the first-tier alternating stack (132, 142) are etched concurrently with the material of the first retro-stepped dielectric material portion 165 during the second anisotropic etch process. The chemistry of the initial etch step may alternate to optimize etching of the first and second materials in the first-tier alternating stack (132, 142) while providing a comparable average etch rate to the material of the first retro-stepped dielectric material portion 165. The sidewalls of the various first-tier openings (149, 129) may be substantially vertical, or may be tapered. Generally, via openings (such as the various first-tier openings (149, 129)) can be formed through an alternating stack of first material layers and second material layers by performing an anisotropic etch process (such as the second anisotropic etch process) that transfers the pattern of the cavities 332 in the hard mask layer 331 through the alternating stack (132, 142). In case a cladding liner (such as a cladding liner 335 described above is employed), such a cladding liner may be consumed during the second anisotropic etch process, or a residual portion of such a cladding liner (not shown) may remain on the hard mask layer 331.

Figure 50D:
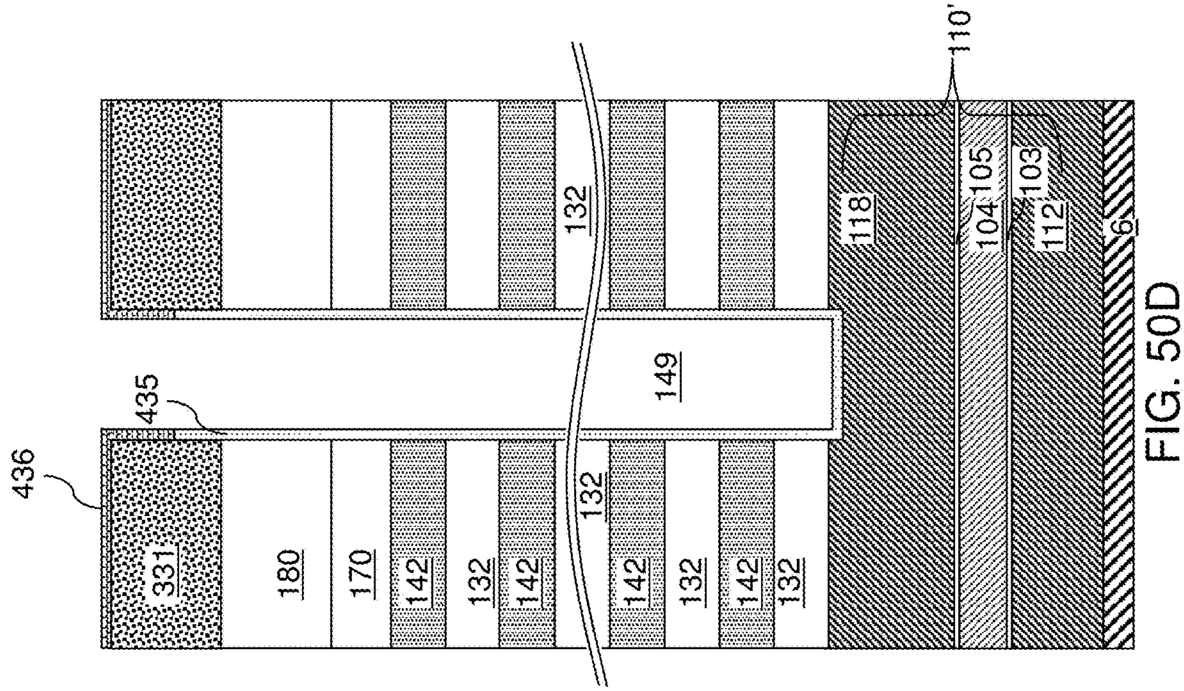
Figure 50C:
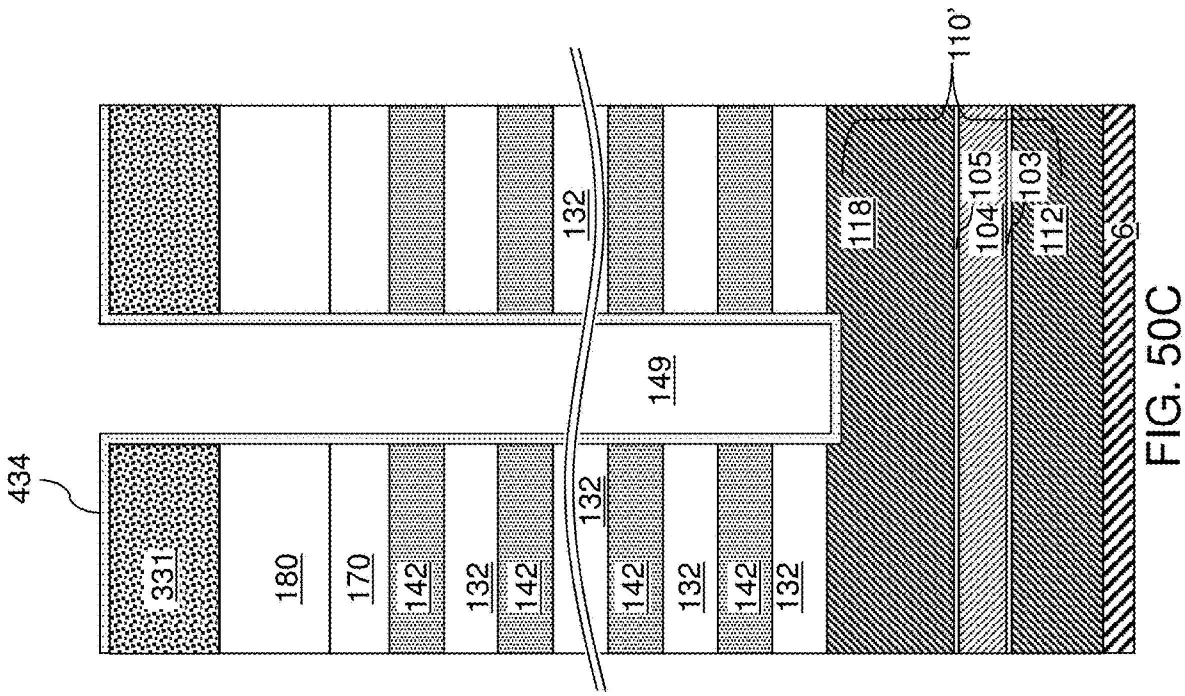

Referring to FIG. 50C, a cladding liner 434 can be formed on sidewalls of the cavities in the hard mask layer 331 and on a top surface of the hard mask layer 331. In one embodiment, the cladding liner 434 can be conformally deposited on sidewalls of the via openings (such as the various first-tier openings (149, 129)) through the first-tier alternating stack (132, 142), and on bottom surfaces of the various first-tier openings (149, 129).

In one embodiment, the cladding liner 434 can be formed by depositing an aluminum oxide material. In one embodiment, the aluminum oxide material that is deposited to form the cladding liner 434 comprises and/or consists essentially of an amorphous aluminum oxide material. In one embodiment, the cladding liner 434 may be formed by conformally depositing an amorphous aluminum oxide material on sidewalls of the first-tier alternating stack (132, 142) around the via openings (such as the various first-tier openings (149, 129)), on sidewalls of the cavities in the hard mask layer 331, and on a top surface of the hard mask layer 331. In one embodiment, the cladding liner 434 may be deposited by a conformal deposition process, such as an atomic layer deposition (ALD) process. The thickness of the cladding liner 434 may be in a range from 1 nm to 30 nm, such as from 2 nm to 15 nm, although lesser and greater thicknesses may also be employed.

Referring to FIG. 50D, an upper portion of the amorphous aluminum oxide material in the cladding liner 434 can be converted into a polycrystalline aluminum oxide material portion 436. In one embodiment, the upper portion of the amorphous aluminum oxide material that is converted into the polycrystalline aluminum oxide material portion 436 comprises a horizontally-extending portion of the amorphous aluminum oxide material located above a horizontal plane including a top surface of the hard mask layer 331, and a plurality of tubular portions of the amorphous aluminum oxide material that are in contact with upper segments of cylindrical sidewalls of the cavities in the hard mask layer 331. Lower portions of the amorphous aluminum oxide material in the cladding liner 434 that remain amorphous after formation of the polycrystalline aluminum oxide material portion 436 comprise amorphous aluminum oxide material portions 435. Interfaces between the polycrystalline aluminum oxide material portion 436 and the amorphous aluminum oxide material portions 435 may be formed on sidewalls of the hard mask layer 331. The combination of the polycrystalline aluminum oxide material portion 436 and the amorphous aluminum oxide material portions 435 comprises the aluminum oxide cladding liner (435, 436).

In one embodiment, the upper portion of the amorphous aluminum oxide material in contact with the top surface of the hard mask layer 331 can be converted into the polycrystalline aluminum oxide material portion 436 by performing a laser anneal process. The laser anneal process can selectively irradiate an upper horizontally-extending portion of the amorphous aluminum oxide material located on the top surface of the hard mask layer 331 without irradiating the lower portions of the amorphous aluminum oxide material in contact with the sidewalls of the first-tier alternating stack around the via openings (such as the various first-tier openings (149, 129)).

In one embodiment, the angle of incidence of the laser beam that impinges on the horizontally-extending portion of the amorphous aluminum oxide material located on the top surface of the hard mask layer 331 (as measured from the vertical direction that is perpendicular to the top surface of the hard mask layer 331) can be greater than the arctangent of the ratio of the width of each cavity (opening) in the hard mask layer 331 to the thickness of the hard mask layer 331. In this case, the laser beam does not impinge on any surface located below the horizontal plane including the bottom surface of the hard mask layer 331. In one embodiment, the angle of incidence of the laser beam that impinges on the horizontally-extending portion of the amorphous aluminum oxide material located on the top surface of the hard mask layer 331 is in a range from 60 degrees to 89.9 degrees, such as from 70 degrees to 89 degrees and/or from 75 degrees to 88 degrees) with respect to the vertical direction that is perpendicular to the top surface of the hard mask layer 331.

Generally, an upper portion of the amorphous aluminum oxide material in contact with a top surface of the hard mask layer 331 can be converted into the polycrystalline aluminum oxide material portion 436 while lower portions of the amorphous aluminum oxide material in contact with the sidewalls of the first-tier alternating stack (132, 142) around the via openings (such as the various first-tier openings (149, 129)) remain amorphous.

Figure 50F:
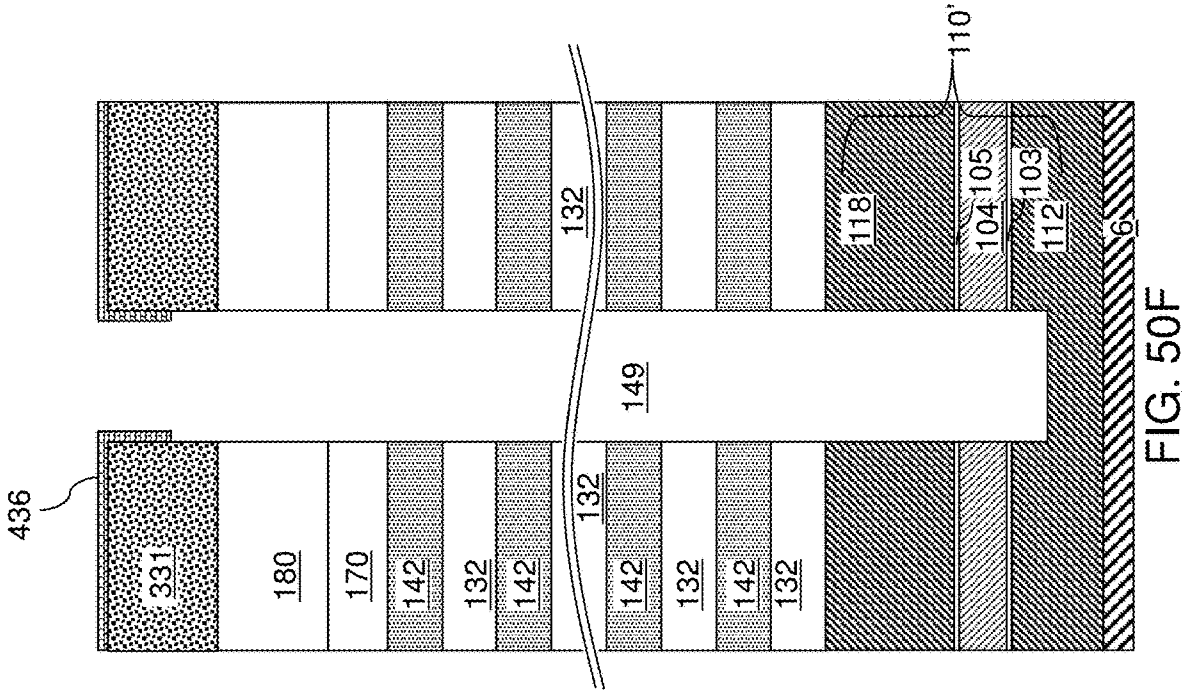
Figure 50E:
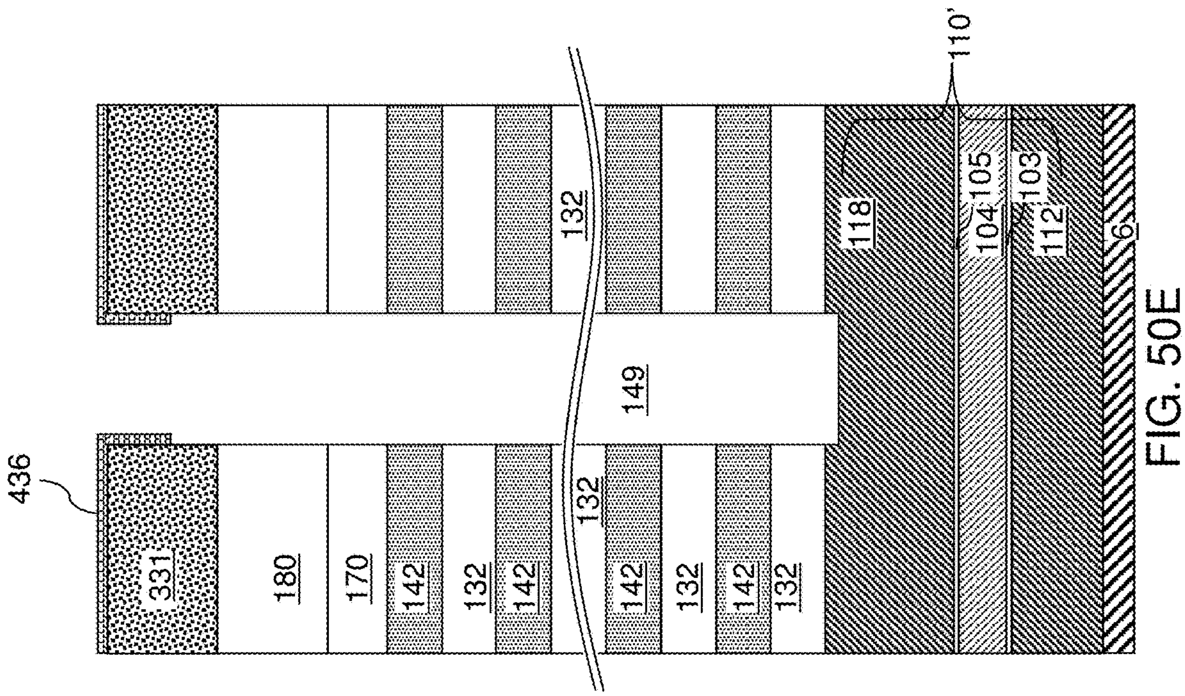

Referring to FIG. 50E, the lower amorphous aluminum oxide material portions 435 (which are the amorphous portions of the cladding liner (435, 436)) can be removed selective to polycrystalline aluminum oxide material portion 436 and selective to the first-tier alternating stack (132, 142) by performing a selective etch process. The selective etch process comprises a crystallinity-selective etch chemistry that etches an amorphous aluminum oxide material selectively to polycrystalline aluminum oxide material. In one embodiment, the selective etch process may comprise an atomic layer etch (ALE) process. In this case, a thermal ALE process using HF, $SF_4$ and/or $XeF_2$ as a fluorination reactant and trimethylaluminum (TMA) and/or dimethylaluminum chloride (DMAC) as a metal precursor ligand exchange reactant, etches aluminum atoms and oxygen atoms from the amorphous aluminum oxide material, and does not etch polycrystalline aluminum oxide material. This selective amorphous aluminum oxide etching method is described in J. A. Murdzek, et al., Journal of Vacuum Science & Technology, A 39, 042602 (2021), incorporated herein by reference in its entirety. This thermal ALE method may be conducted at an elevated temperature (e.g., about 300 degrees Celsius) using fluorination and ligand-exchange reactions. The fluorination reaction converts the aluminum oxide to an aluminum fluoride. The ligand-exchange reaction then removes the aluminum fluoride by forming volatile products.

The number of cycles in the ALE process can be selected such that the entirety of the amorphous aluminum oxide material portions 435 is removed while the polycrystalline aluminum oxide material portion 436 remain on the hard mask layer 331. A semiconductor surface such as a surface of the upper source-level semiconductor layer 118 can be physically exposed at the bottom of each via opening (such as each of the various first-tier openings (149, 129)).

Referring to FIG. 50F, the via openings (such as the various first-tier openings (149, 129)) can be vertically extended through at least one source-level semiconductor layer (such as the upper source-level semiconductor layer 118) by performing an additional anisotropic etch process employing a combination of the cladding liner 436 (which is the polycrystalline aluminum oxide material portion 436 at this processing step) and the hard mask layer 331 as an etch mask.

In one embodiment, a set of material layers located underneath the first-tier alternating stack (132, 142) may comprise a source-level semiconductor layer such as an upper source-level semiconductor layer 118, a source-level sacrificial layer 104 located underneath the upper source-level semiconductor layer 118, and an additional source-level semiconductor layer (such as a lower source-level semiconductor layer 112) located underneath the source-level sacrificial layer 104. In one embodiment, the set of material layers located underneath the first-tier alternating stack (132, 142) may comprise the in-process source-level material layers 110' described above.

The chemistry of the additional anisotropic etch process can be selected to sequentially etch through the various material layers of the in-process source-level material layers 110'. In one embodiment, the additional anisotropic etch process vertically extends the via openings through the source-level sacrificial layer (such as the upper source-level semiconductor layer 118) and into an upper portion of the additional source-level semiconductor layer (such as the lower source-level semiconductor layer 112). For example, the chemistry of the additional anisotropic etch process can be selected to sequentially etch through the upper source-level semiconductor layer 118, the upper sacrificial liner 105, the source-level sacrificial layer 104, and the lower sacrificial liner 103, and to etch into an upper portion of the lower source-level semiconductor layer 112.

Figure 50G:
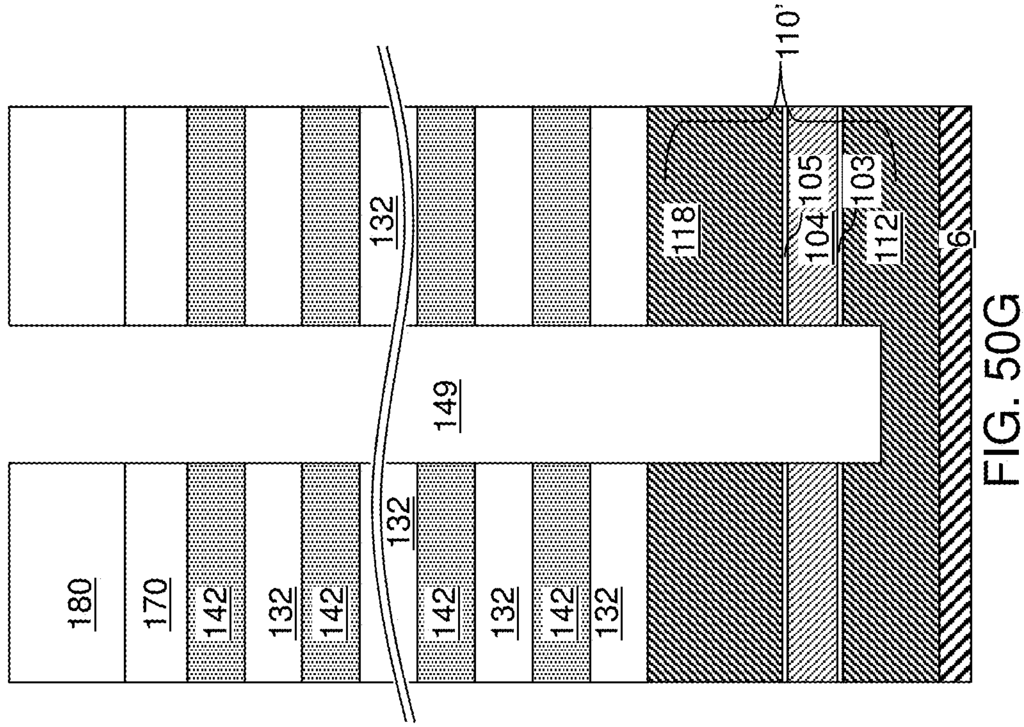

Referring to FIG. 50G, the hard mask layer 331 may be removed after the additional anisotropic etch process. For example, a carbon based hard mask layer 331 can be removed by ashing. The cladding liner 436 (i.e., the polycrystalline aluminum oxide material portion 436) may be collaterally removed during the additional anisotropic etch process, or may be removed (e.g., lifted off) during the removal (e.g., ashing) of the hard mask layer 331.

Subsequently, the various processing steps described above may be performed such as the processing steps described with reference to FIGS. 29A-45 or the processing steps described with reference to FIGS. 11B-19B.

Generally, memory opening fill structures 58 can be formed in the via openings after removing the hard mask layer 331. Each of the memory opening fill structures 58 comprises a respective vertical semiconductor channel 60 and a respective vertical stack of memory elements (e.g., portions of the memory film 50). In one embodiment, the source-level sacrificial layer 104 may be replaced with a source contact layer 114. The second material layers (such as the first sacrificial material layers 142) may be replaced with electrically conductive layers (such as first electrically conductive layers 146) after formation of the memory opening fill structures 58.

FIGS. 51A-51E are sequential vertical cross-sectional views of a region of a memory opening in a fourth configuration of the third exemplary structure during formation of the memory opening according to the third embodiment of the present disclosure.

Figure 51B:
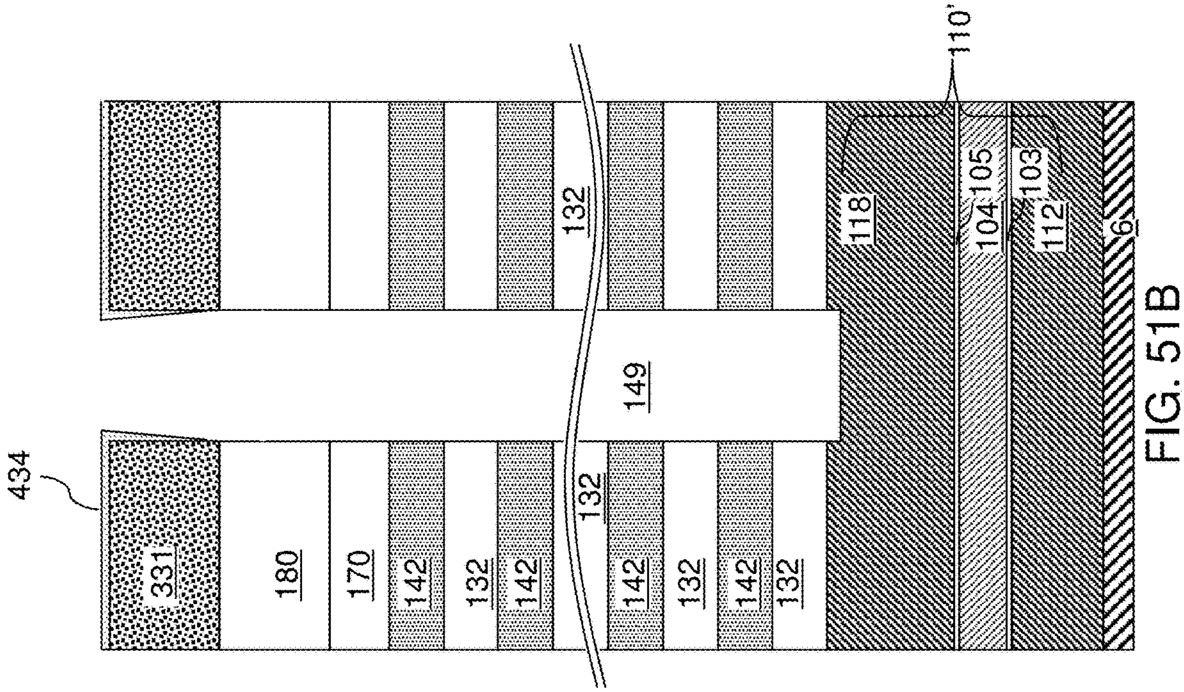
FIGS. 51A-51E are sequential vertical cross-sectional views of a region of a memory opening in a fourth configuration of the third exemplary structure during formation of the memory opening according to the third embodiment of the present disclosure.
Figure 51A:
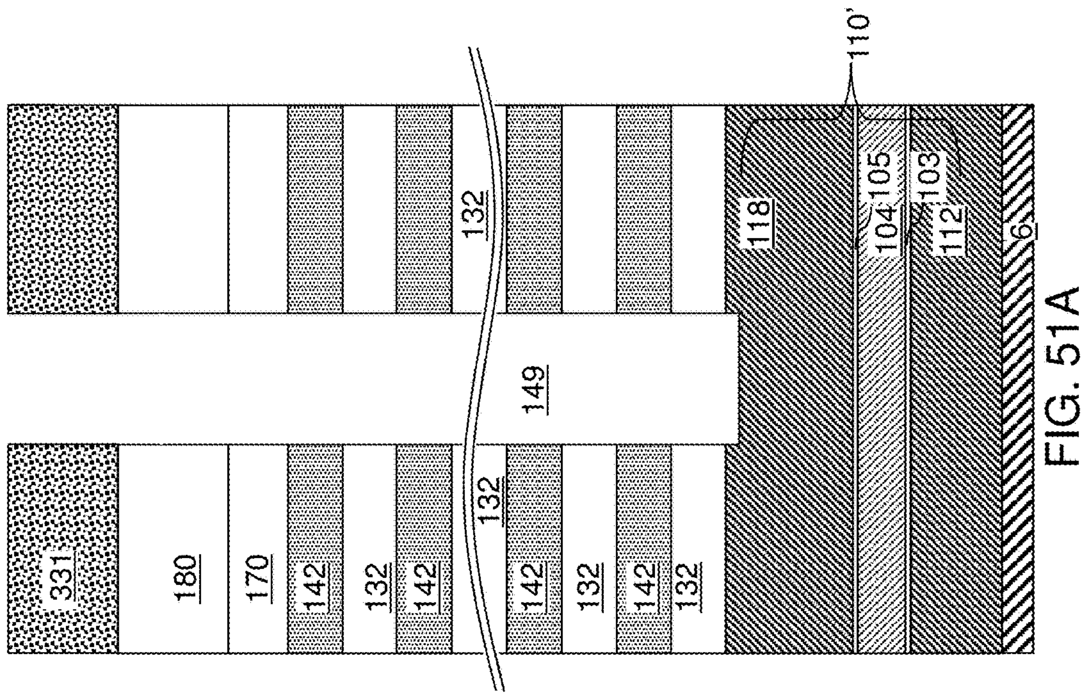

Referring to FIG. 51A, the fourth configuration of the third exemplary structure may be the same as the third configuration of the third exemplary structure illustrated in FIG. 50B.

Referring to FIG. 51B, a cladding liner 434 can be formed. In this case, the cladding liner 434 may be formed by non-conformally depositing an amorphous aluminum oxide material on a top surface of the hard mask layer 331 and on sidewalls of the cavities in the hard mask layer 331 without depositing the cladding liner 434 on sidewalls of the alternating stack (132, 142) exposed in the via openings (129, 149). According to an aspect of the present disclosure, the cladding liner 434 can be deposited by an anisotropic non-conformal deposition process, such as a physical vapor deposition process (e.g., sputtering). In one embodiment, the non-conformal deposition process can deposit the amorphous aluminum oxide material with a high degree of directionality such that that thickness of the deposited amorphous aluminum oxide material decreases rapidly with a vertical distance from the horizontal plane including the top surface of the hard mask layer 331. In one embodiment, the deposited aluminum oxide material forms a continuous material layer (which is the cladding liner 434) above the horizontal plane including the bottom surface of the hard mask layer 331, and is either not deposited at all below the bottom surface of the hard mask layer 331 or does not form a continuous material layer underneath the horizontal plane including the bottom surface of the hard mask layer 331. In other words, if any amorphous aluminum oxide material is deposited on the sidewalls of the via openings (such as the various first-tier openings (149, 129)) through the first-tier alternating stack (132, 142), then it forms a discrete nanocluster of atoms and does not form a continuous material layer. The thickness of the horizontally-extending portion of the cladding liner 434 overlying the top surface of the hard mask layer 331 may have a thickness in a range from 1 nm to 30 nm, such as from 2 nm to 15 nm, although lesser and greater thicknesses may also be employed.

Figure 51D:
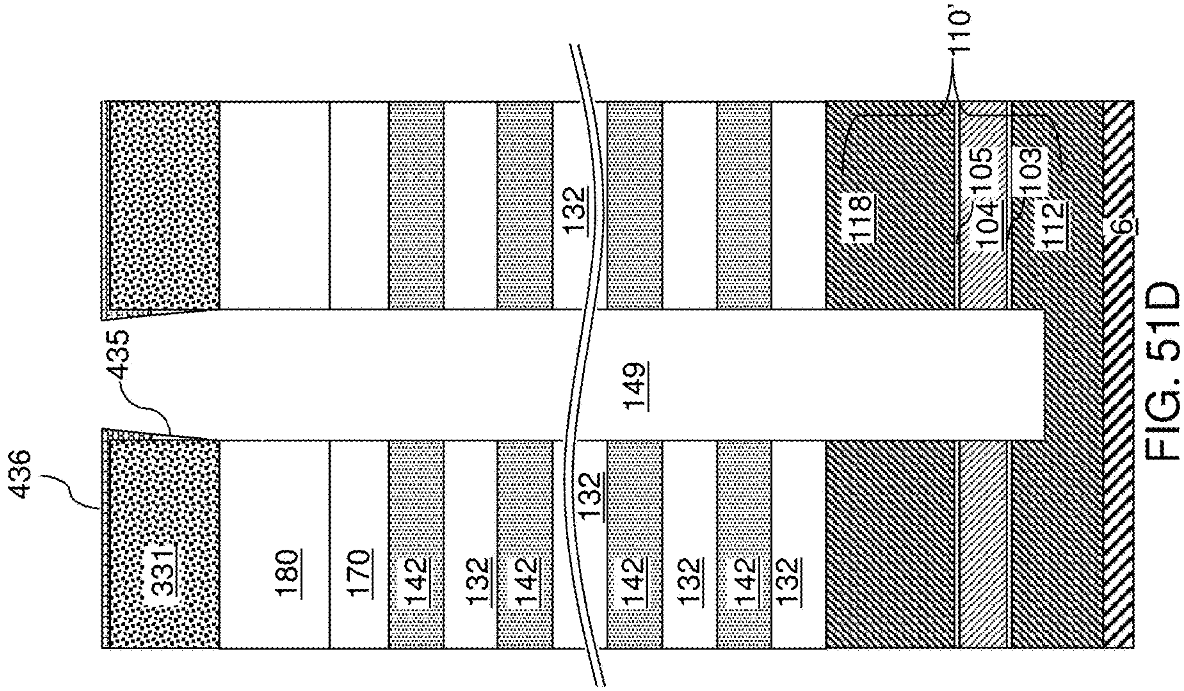
Figure 51C:
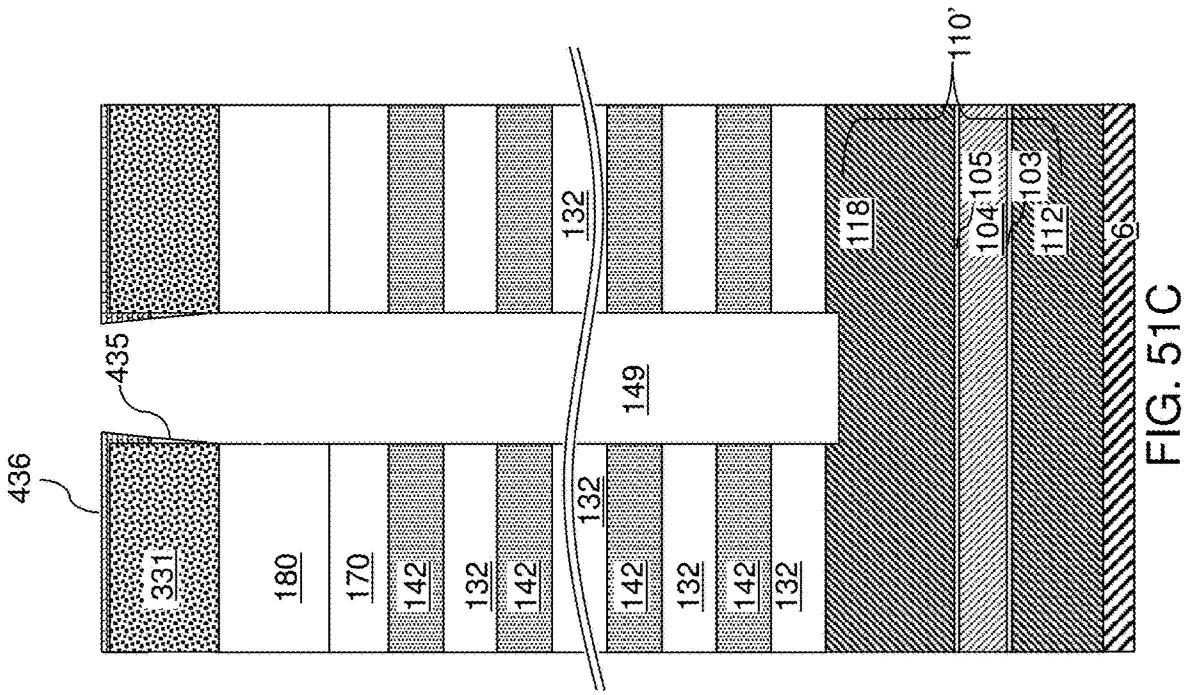

Referring to FIG. 51C, the upper portion of the amorphous aluminum oxide material in contact with a top surface of the hard mask layer 331 can be converted into a polycrystalline aluminum oxide material portion 436 while portions of the amorphous aluminum oxide material in contact with lower segments of the sidewalls of the cavities in the hard mask layer 331 remain amorphous. In one embodiment, the upper portion of the amorphous aluminum oxide material that is converted into the polycrystalline aluminum oxide material portion 436 comprises a horizontally-extending portion of the amorphous aluminum oxide material located above a horizontal plane including a top surface of the hard mask layer 331, and a plurality of tubular portions of the amorphous aluminum oxide material that are in contact with upper segments of cylindrical sidewalls of the cavities in the hard mask layer 331. Lower portions of the amorphous aluminum oxide material in the cladding liner 434 that remain amorphous after formation of the polycrystalline aluminum oxide material portion 436 comprise amorphous aluminum oxide material portions 435. Interfaces between the polycrystalline aluminum oxide material portion 436 and the amorphous aluminum oxide material portions 435 may be formed on sidewalls of the hard mask layer 331. The combination of the polycrystalline aluminum oxide material portion 436 and the amorphous aluminum oxide material portions 435 comprises the cladding liner (435, 436).

In one embodiment, the upper portion of the amorphous aluminum oxide material in contact with the top surface of the hard mask layer 331 can be converted into the polycrystalline aluminum oxide material portion 436 by performing a laser anneal process. The laser anneal process can selectively irradiates a horizontally-extending portion of the amorphous aluminum oxide material located on the top surface of the hard mask layer 331 without irradiating the lower portions of the amorphous aluminum oxide material in contact with lower segments of the sidewalls of the cavities in the hard mask layer 331.

In one embodiment, the angle of incidence of the laser beam that impinges on the horizontally-extending portion of the amorphous aluminum oxide material located on the top surface of the hard mask layer 331 (as measured from the vertical direction that is perpendicular to the top surface of the hard mask layer 331) can be greater than the arctangent of the ratio of the width of each cavity (opening) in the hard mask layer 331 to the thickness of the hard mask layer 331. In one embodiment, the angle of incidence of the laser beam that impinges on the horizontally-extending portion of the amorphous aluminum oxide material located on the top surface of the hard mask layer 331 is in a range from 60 degrees to 89.9 degrees, such as from 70 degrees to 89 degrees and/or from 75 degrees to 88 degrees) with respect to the vertical direction that is perpendicular to the top surface of the hard mask layer 331.

Generally, the upper portion of the amorphous aluminum oxide material in contact with a top surface of the hard mask layer 331 can be converted into the polycrystalline aluminum oxide material portion 436 while lower portions of the amorphous aluminum oxide material in contact with lower segments of the sidewalls of the cavities in the hard mask layer 331 remain amorphous.

Referring to FIG. 51D, an additional anisotropic etch process can be performed to vertically extend the via openings (such as the various first-tier openings (149, 129)) through at least one source-level semiconductor layer (such as the upper source-level semiconductor layer 118). For example, the processing steps of FIG. 50F may be performed.

Figure 51E:
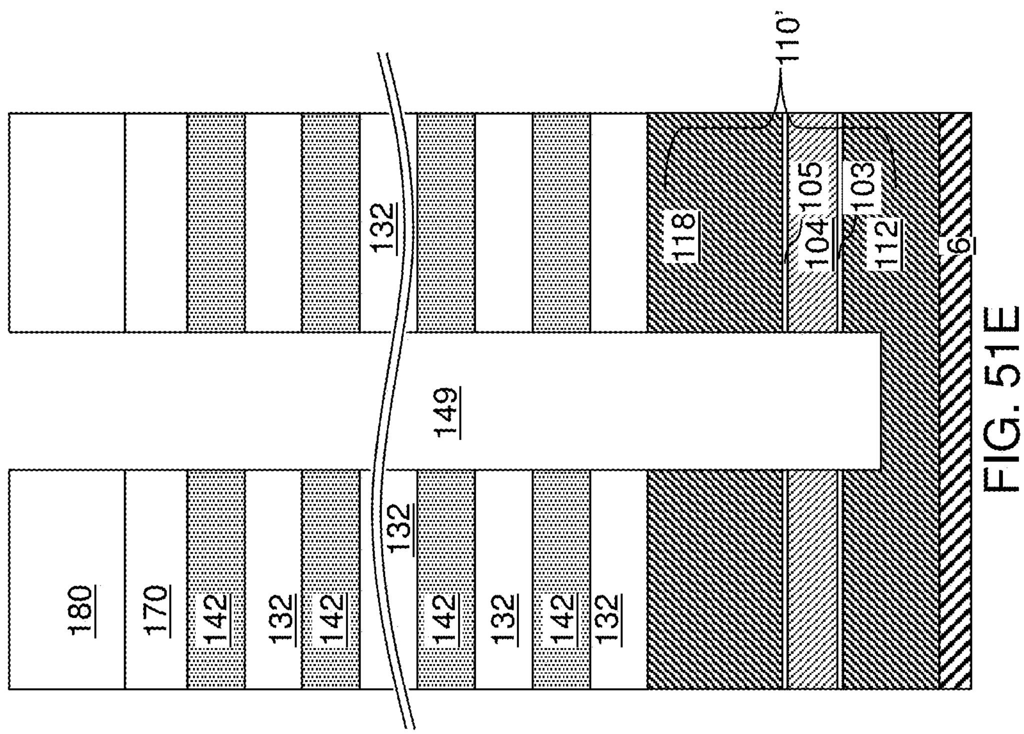

Referring to FIG. 51E, the hard mask layer 331 may be removed after the additional anisotropic etch process. The cladding liner (435, 436) may be collaterally removed during the additional anisotropic etch process, or may be removed (e.g., lifted-off) during removal (e.g., ashing) of the hard mask layer 331. In one embodiment, the amorphous aluminum oxide material portions 435 may be removed during the additional anisotropic etch process, and the polycrystalline aluminum oxide material portion 436 may be removed during, or after, the additional anisotropic etch process.

Subsequently, the various processing steps described above may be performed such as the processing steps described with reference to FIGS. 29A-45 or the processing steps described with reference to FIGS. 11B-19B.

Figure 52A:
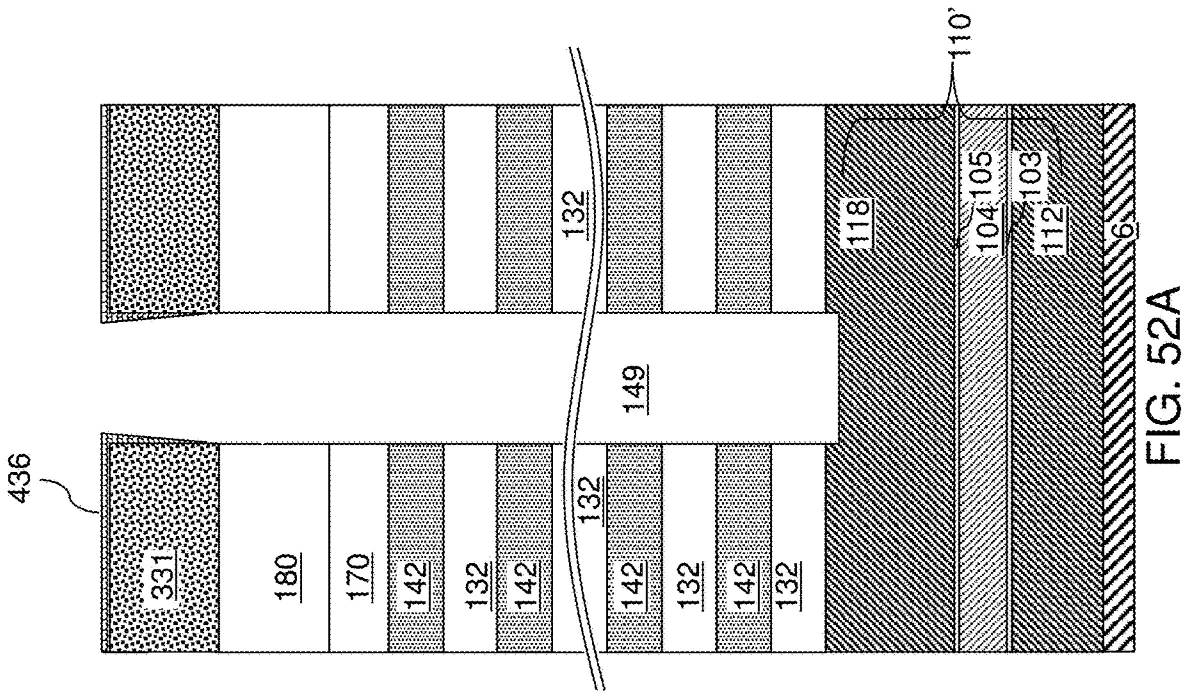
FIGS. 52A-52C are sequential vertical cross-sectional views of a region of a memory opening in a fifth configuration of the third exemplary structure during formation of the memory opening according to the third embodiment of the present disclosure.
Figure 52B:
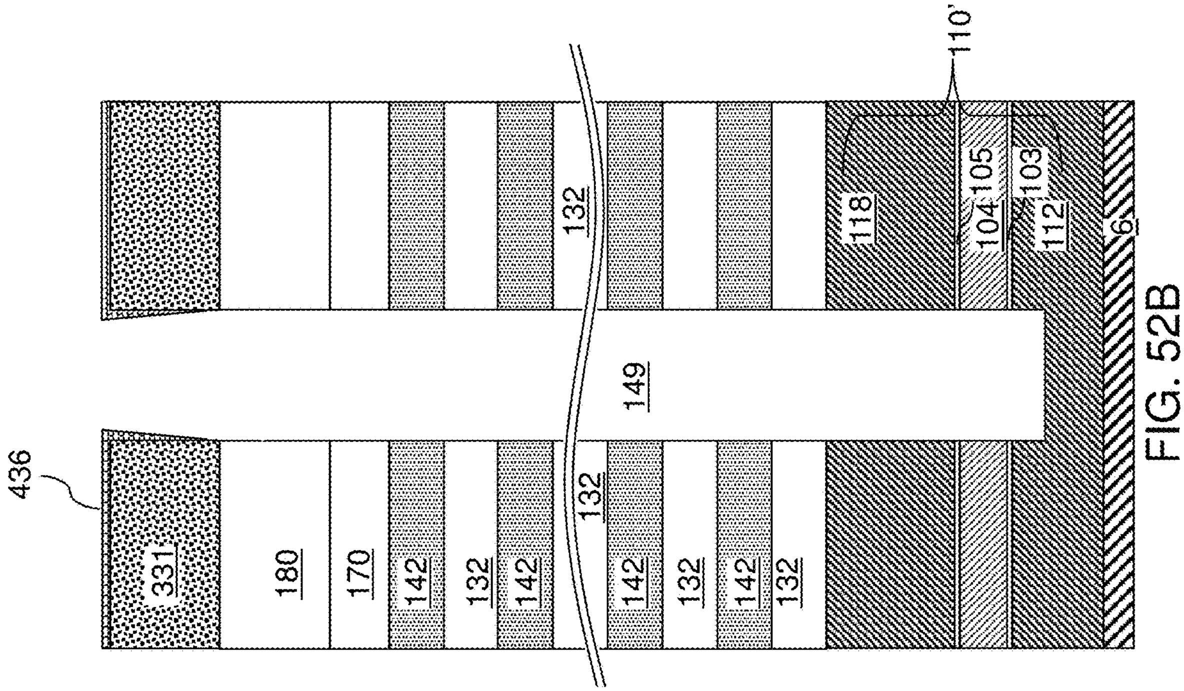
Figure 52C:
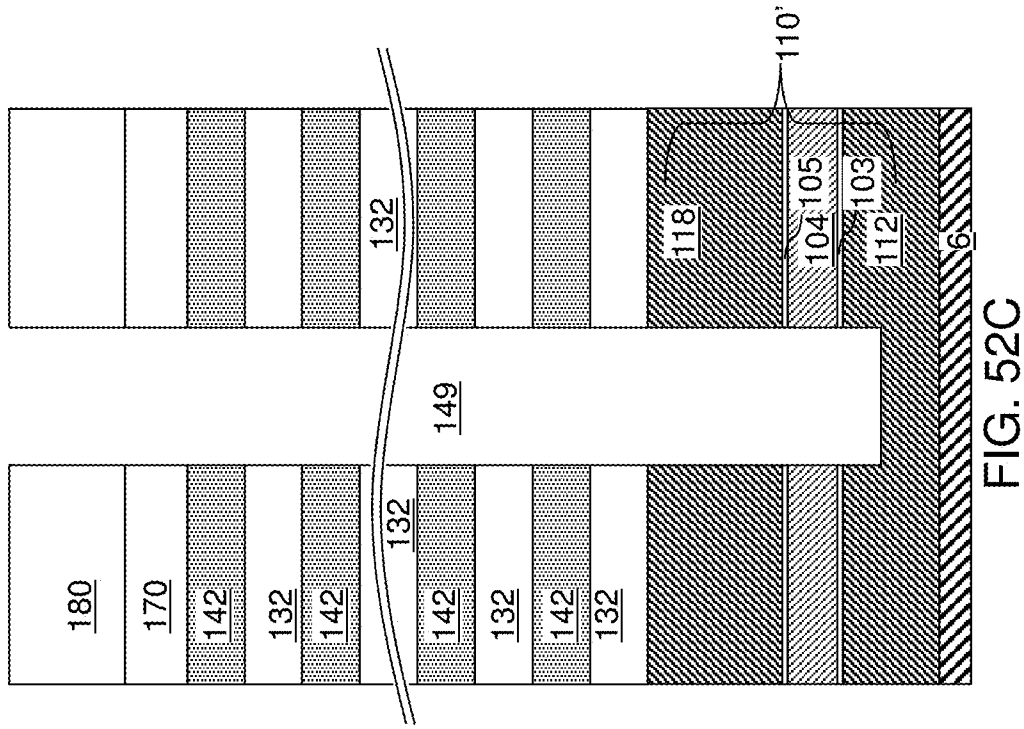

FIGS. 52A-52C are sequential vertical cross-sectional views of a region of a memory opening in a fifth configuration of the third exemplary structure during formation of the memory opening according to the third embodiment of the present disclosure.

Referring to FIG. 52A, the fifth configuration of the third exemplary structure may be the same as the fourth configuration of the third exemplary structure illustrated in FIG. 51B by performing an anneal process that converts the entirety of the cladding liner 434 into a polycrystalline aluminum oxide material portion 436. In other words, the entirety of the amorphous aluminum oxide material in the cladding liner 434 is converted into the polycrystalline aluminum oxide material portion 436, which is a polycrystalline aluminum oxide material layer. Thus, the polycrystalline aluminum oxide material portion 436 constitutes a cladding liner after the anneal process.

In one embodiment, converting the entirety of the amorphous aluminum oxide material into the polycrystalline aluminum oxide material layer comprises performing a rapid thermal anneal process in which the first-tier alternating stack (132, 142), the hard mask layer 331, and the amorphous aluminum oxide material of the cladding liner 434 are annealed at an elevated temperature at which the amorphous aluminum oxide material is converted into the polycrystalline aluminum oxide material layer. In one embodiment, the elevated temperature may be in a range from 700 degrees Celsius to 1,100 degrees Celsius, such as from 800 degrees Celsius to 1,000 degrees Celsius. In one embodiment, the rapid thermal anneal (RTA) process may be employed in which the duration of the peak temperature is in a range from 1 second to 20 seconds.

Referring to FIG. 52B, an additional anisotropic etch process can be performed to vertically extend the via openings (such as the various first-tier openings (149, 129)) through at least one source-level semiconductor layer (such as the upper source-level semiconductor layer 118). For example, the processing steps of FIG. 50F may be performed.

Referring to FIG. 52C, the hard mask layer 331 may be removed after the additional anisotropic etch process. The cladding liner 436 may be collaterally removed during the additional anisotropic etch process, or may be removed (e.g., lifted-off) during the removal (e.g., ashing) of the hard mask layer 331. In one embodiment, the cladding liner 436 may be removed during, or after, the additional anisotropic etch process.

Subsequently, the various processing steps described above may be performed such as the processing steps described with reference to FIGS. 29A-45 or the processing steps described with reference to FIGS. 11B-19B.

Figure 53B:
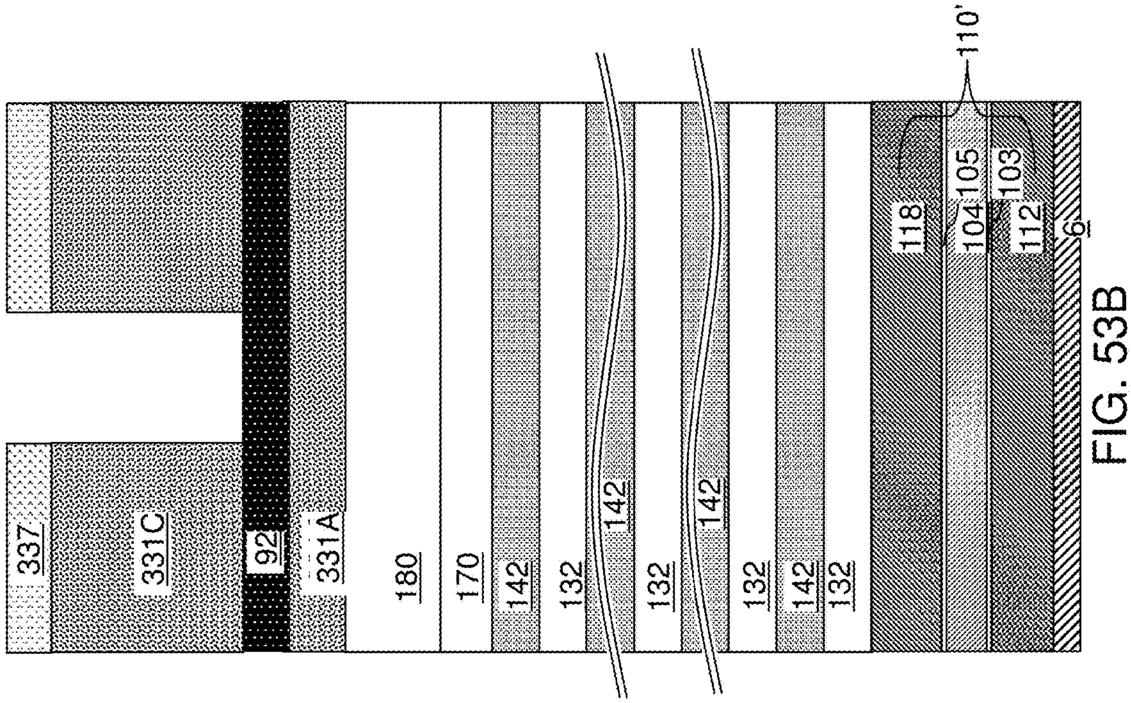
FIGS. 53A-53G are sequential vertical cross-sectional view of a region of a memory opening in a first configuration of a fourth exemplary structure during formation of the memory opening according to a fourth embodiment of the present disclosure.
Figure 53A:
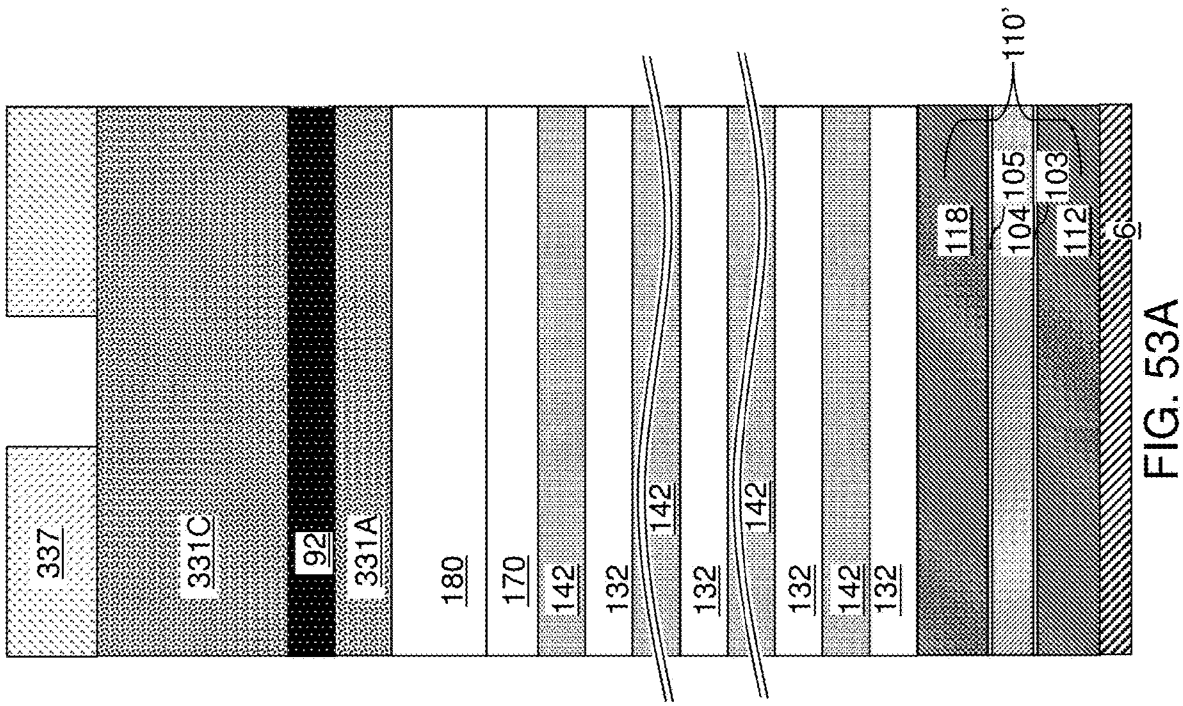

FIGS. 53A-53G are sequential vertical cross-sectional view of a region of a memory opening in a first configuration of a fourth exemplary structure during formation of a memory opening 49 or a first-tier memory opening 149 according to a fourth embodiment of the present disclosure. Generally, the first configuration of the fourth exemplary structure may be derived from any of the previously described exemplary structures having an insulating cap layer 70 or an inter-tier dielectric layer 180 as a topmost material layer, such as the first exemplary structure illustrated in FIG. 3 or the second exemplary structure illustrated in FIG. 22, by forming a composite hard mask layer (331A, 92, 331C) and a patterned photoresist layer 337 thereabove. While FIG. 53A is derived from the second exemplary structure illustrated in FIG. 22 by forming the composite hard mask layer (331A, 92, 331C) and the patterned photoresist layer 337 thereupon, embodiments are expressly contemplated herein in which the composite hard mask layer (331A, 92, 331C) and the patterned photoresist layer 337 are formed on a top surface of the insulating cap layer 70 in the first exemplary structure of FIG. 3.

Generally, an alternating stack (132, 142) of first material layers (such as first insulating layers 132) and second material layers (such as first sacrificial material layers 142) can be formed over a substrate 8. The composite hard mask layer (331A, 92, 331C) can be formed over the alternating stack (132, 142). The composite hard mask layer (331A, 92, 331C) comprises a layer stack including a lower patterning film 331A, a first cladding material layer 92 overlying the lower patterning film 331A, and an upper patterning film 331C overlying the first cladding material layer 92.

Each of the lower patterning film 331A and the upper patterning film 331C may independently comprise any material that may be employed for any of the previously described patterning films such as the patterning film 331 described above with reference to FIGS. 23A-23C. In some embodiments, the lower patterning film 331A comprises a first carbon-based material including carbon at a first atomic percentage in a range from 75% to 100%, and the upper patterning film 331C comprises a second carbon-based material including carbon at a second atomic percentage in a range from 75% to 100%. The lower patterning film 331A and/or the upper patterning film 331C may comprise doped carbon, such as boron and/or tungsten doped carbon. Each of the lower patterning film 331A and the upper patterning film 331C may be deposited by a respective chemical vapor deposition process. The total thickness of the composite hard mask layer (331A, 92, 331C) may be in a range from 1,000 nm to 5,000 nm, such as from 1,200 nm to 3,000 nm, although lesser and greater thicknesses may also be employed. The thickness of the lower patterning film 331A may be in a range from 700 nm to 2,000 nm, such as from 900 nm to 1,500 nm, although lesser and greater thicknesses may also be employed. The thickness of the upper patterning film 331C may be in a range from 700 nm to 3,000 nm, such as from 1,000 nm to 2,000 nm, although lesser and greater thicknesses may also be employed.

According to an aspect of the present disclosure, the first cladding material layer 92 comprises a material that can provide higher etch resistance than the upper patterning film 331C during a subsequent first anisotropic etch process that employs the upper patterning film 331C as an etch mask. Further, the material in the first cladding material layer 92 may provide higher etch resistance than the material of the lower patterning film 331A during a subsequent second anisotropic etch process that employs a combination of the first cladding material layer 92 and the lower patterning film 331A as an etch mask.

The first cladding material layer 92 may comprise a layer stack of multiple material layers or a single material layer. In one embodiment illustrated in FIG. 53A, the first cladding material layer 92 may comprise a single material layer.

In one embodiment, the first cladding material layer 92 comprises a metal layer comprising at least one transition metal element, such as tungsten, titanium, tantalum, niobium, molybdenum, or ruthenium. In one embodiment, the metal layer may consist essentially of tungsten, titanium, tantalum, or molybdenum. The thickness of the metal layer may be in a range from 20 nm to 200 nm, such as from 40 nm to 100 nm, although lesser and greater thicknesses may also be employed.

In one embodiment, the first cladding material layer 92 may comprise, and/or may consist essentially of, a conductive metallic compound material selected from a metallic nitride material and a metallic carbide material. Exemplary metallic nitride materials comprise WN, TiN, TaN, or MoN. In this embodiment, the first cladding material layer 92 may be deposited by physical vapor deposition process. Exemplary metallic carbide materials comprise WC, TiC, or TaC. The thickness of the first cladding material layer 92 may be in a range from 20 nm to 200 nm, such as from 40 nm to 100 nm, although lesser and greater thicknesses may also be employed.

In one embodiment, the first cladding material layer 92 may comprise, and/or may consist essentially of, a non-metallic material. In one embodiment, the non-metallic material may comprise, and/or may consist essentially of, a semiconductor material, which may be an elemental semiconductor material such as silicon or germanium; an alloy of at least two elemental semiconductor materials; or a compound semiconductor material. In one embodiment, the non-metallic material may comprise, and/or may consist essentially of, a wide band-gap semiconductor material such as silicon carbide, aluminum nitride or boron nitride. In one embodiment, the non-metallic material may comprise, and/or may consist essentially of, a dielectric metal oxide material having a dielectric constant greater than 7.9. For example, the non-metallic material may comprise, and/or may consist essentially of, aluminum oxide, titanium oxide, tantalum oxide, hafnium oxide, yttrium oxide, lanthanum, oxide, etc. The thickness of the first cladding material layer 92 may be in a range from 20 nm to 200 nm, such as from 40 nm to 100 nm, although lesser and greater thicknesses may also be employed.

Generally, the first cladding material layer 92 comprises a material that can provide higher etch resistivity than the material of the upper patterning film 331C. The material in the first cladding material layer 92 may provide higher etch resistivity than the material of the lower patterning film 331A.

The patterned photoresist layer 337 can be formed by applying a photoresist material layer and lithographically patterning the photoresist material layer. The pattern in the patterned photoresist layer 337 may be the same as the pattern of the first-tier memory openings 149 and the first-tier support openings 129 described with reference to FIGS. 23A-23C, the pattern of the memory openings 49 and the support openings 19 described with reference to FIGS. 5A-10D, or any pattern of openings to be transferred through an underlying stack of first material layers and second material layers. Generally, the patterned photoresist layer 337 includes a set of openings therethrough, and is formed over the composite hard mask layer (331A, 92, 331C).

Referring to FIG. 53B, a hard-mask-open anisotropic etch process can be performed to transfer the pattern of the openings in the patterned photoresist layer 337 through the composite hard mask layer (331A, 92, 331C). The hard-mask-open anisotropic etch process can comprise a first hard-mask-open anisotropic etch step that transfers the pattern in the patterned photoresist layer 337 through the upper patterning film 331C and stops on the first cladding material layer 92, which functions as an etch stop. The patterned photoresist layer 337 may be partly consumed during the first hard-mask-opening anisotropic etch step.

Figure 53D:
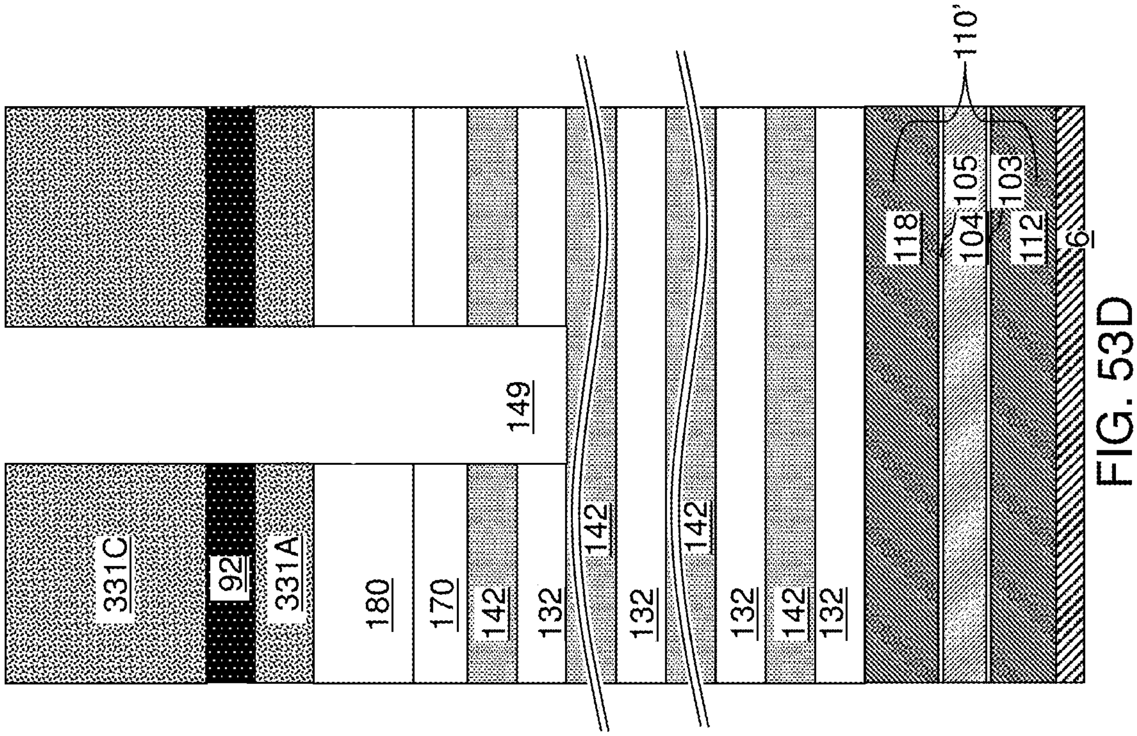
Figure 53C:
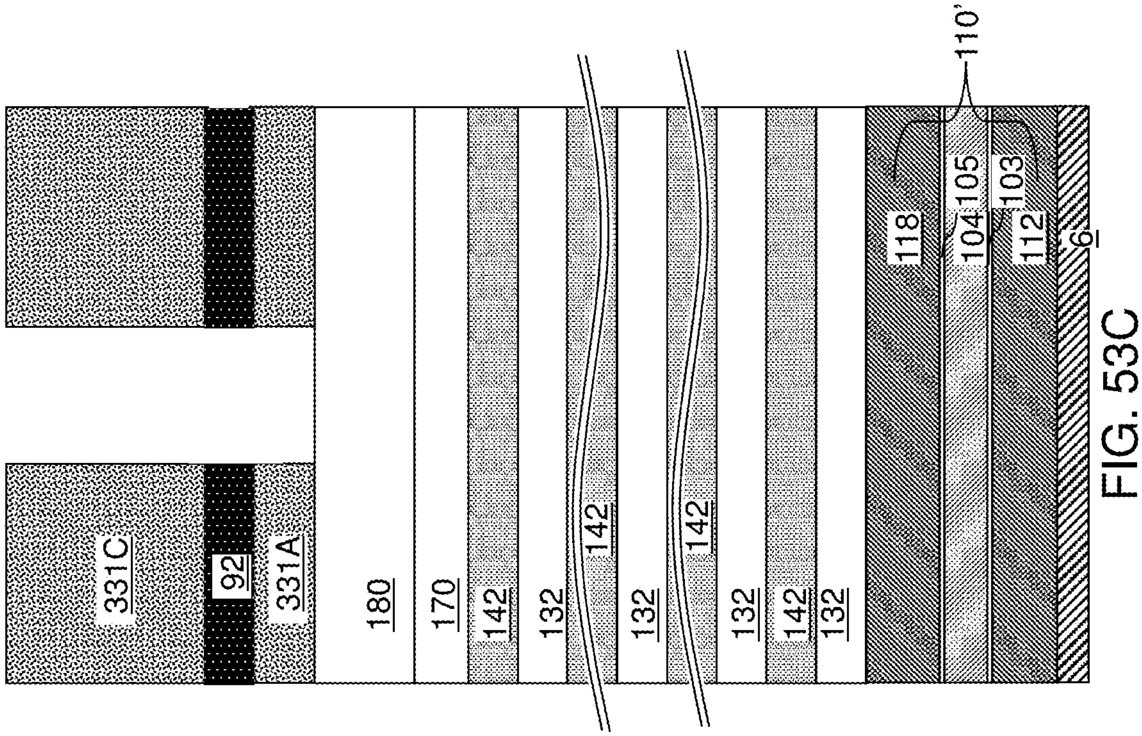

Referring to FIG. 53C, a second hard-mask-open anisotropic etch step may be performed to transfer the pattern in the patterned photoresist layer 337 through the first cladding material layer 92. Subsequently, a third hard-mask-open anisotropic etch step may be performed to transfer the pattern in the patterned photoresist layer 337 though the lower patterning film 331A. A top surface of an underlying material layer (such as a top surface of an inter-tier dielectric layer 180) can be physically exposed at the bottom of each opening through the composite hard mask layer (331A, 92, 331B). The patterned photoresist layer 337 may be collaterally consumed during the hard-mask-open anisotropic etch process. Generally, the composite hard mask layer (331A, 92, 331C) can be patterned by transferring a pattern in the patterned photoresist layer 337 through the composite hard mask layer (331A, 92, 331C), which can be effected by performing the hard-mask-open anisotropic etch process.

Referring to FIG. 53D, via openings (such as first-tier memory openings 149 and/or first-tier support openings 129, or memory openings 49 and/or support openings 19) can be formed through an upper region of the alternating stack (132, 142) by performing an anisotropic etch process. The anisotropic etch process has an etch chemistry that etches the material of the first material layers (such as the first insulating layers 132) and the second material layers (such as the first sacrificial material layers 142) selective to the material of the upper patterning film 331C. The anisotropic etch process transfers a pattern of the cavities (i.e., openings) in the composite hard mask layer (331A, 92, 331C) through the alternating stack (132, 142). The upper patterning film 331C is employed as a first etch mask at least during an initial phase of the anisotropic etch process.

Figure 53F:
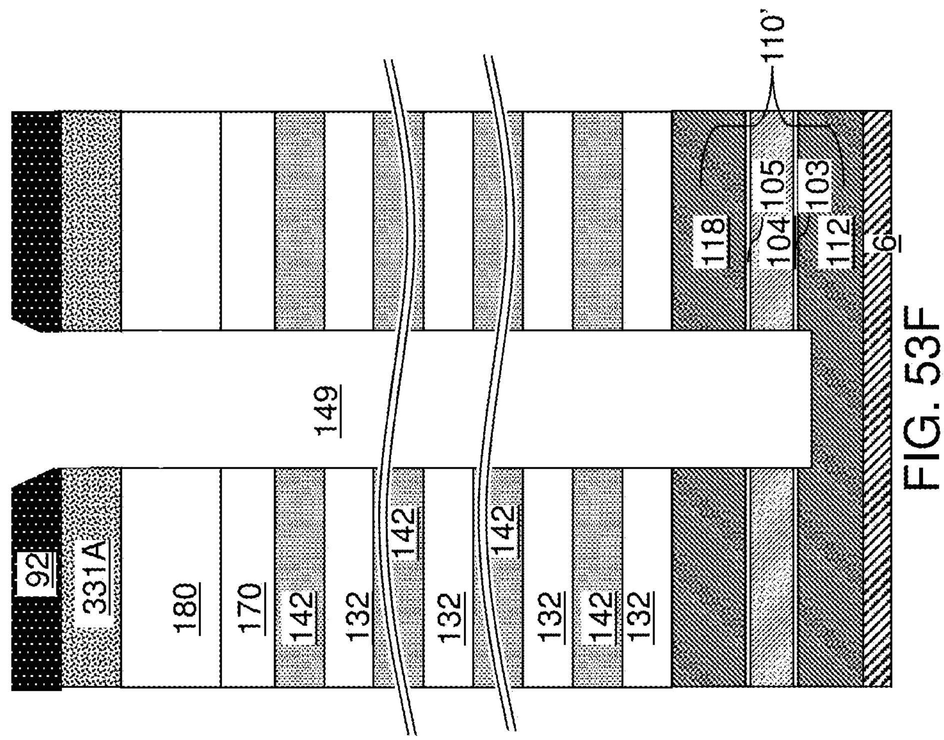
Figure 53E:
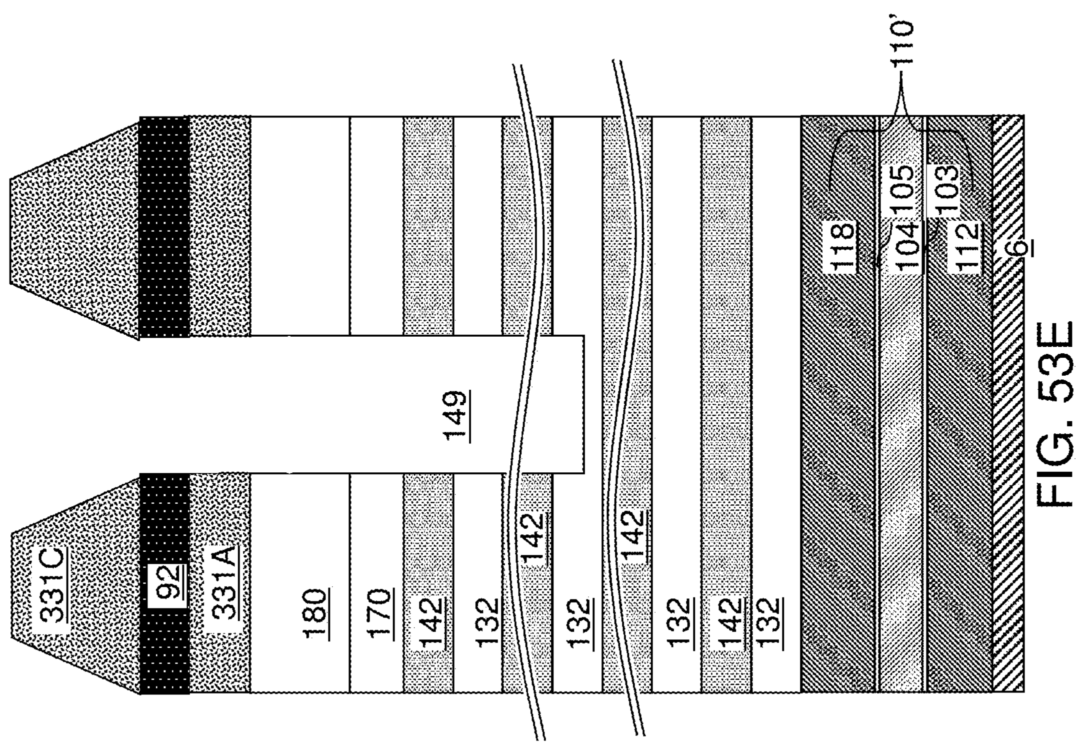

Referring to FIG. 53E, the anisotropic etch process is continued to vertically extend the via openings (such as first-tier memory openings 149 and/or first-tier support openings 129, or memory openings 49 and/or support openings 19) from the upper region of the alternating stack (132, 142) toward a middle region of the alternating stack (132, 142), i.e., through underlying layers within the alternating stack (132, 142). As the anisotropic etch process progresses, the via openings are vertically extended downward, while the material of the upper patterning film 331C is collaterally consumed (i.e., eroded) at a consumption rate (as measured in nm/minute) that is lower than the etch rate of the alternating stack (132, 142) by the selectivity of the anisotropic etch process. The selectivity of the anisotropic etch process may be typically in a range from 3 to 30, such as from 6 to 15, although lower and higher values for the selectivity may also be employed. The material of the upper patterning film 331C also becomes faceted (e.g., tapered).

According to an aspect of the present disclosure, the first cladding material layer 92 has higher etch resistance than the upper patterning film 331C during the anisotropic etch process. Thus, the first cladding material layer 92 preferably has an even lower consumption (i.e., erosion) rate than the upper patterning film 331C during the anisotropic etch process. This reduces the faceting of the first cladding material layer 92 and the lower patterning film 331A. Thus, the overall composite hard mask layer (331A, 92, 331C) faceting is reduced, which reduces the bow of the memory openings.

Referring to FIG. 53F, the entire upper patterning film 331C may be completely consumed and a top surface of the first cladding material layer 92 may be physically exposed. In one embodiment, the first cladding material layer 92 may also become faceted (e.g., the faceting from the upper patterning film 331C is transferred to the first cladding material layer 92). However, the thickness of the lower patterning film 331A is preferably greater than a critical mask height. The critical mask height is a height at which the mask height is insufficient to prevent the bow of the memory openings. For example, the thickness of the lower patterning film 331A may be at least 700 nm, such as at least 900 nm, for example 1000 nm to 1500 nm, which is greater than the critical mask height. Therefore, even if the first cladding material layer 92 becomes faceted, the bow of the memory openings is significantly reduced or prevented.

In one embodiment, in-process source-level material layers 110' including at least one source-level semiconductor material layer can be located underneath the alternating stack (132, 142). The at least one source-level semiconductor material layer may comprise, for example, a lower source-level semiconductor layer 112 and/or an upper source-level semiconductor layer 118 and/or a source-level sacrificial layer 104 (in case the source-level sacrificial layer 104 includes a semiconductor material). In this case, the anisotropic etch may extend the first-tier memory openings 149 or the memory openings 49 through the upper source-level semiconductor layer 118, at least partially through the source-level sacrificial layer 104 and optionally partially through the lower source-level semiconductor layer 112.

Figure 53H:
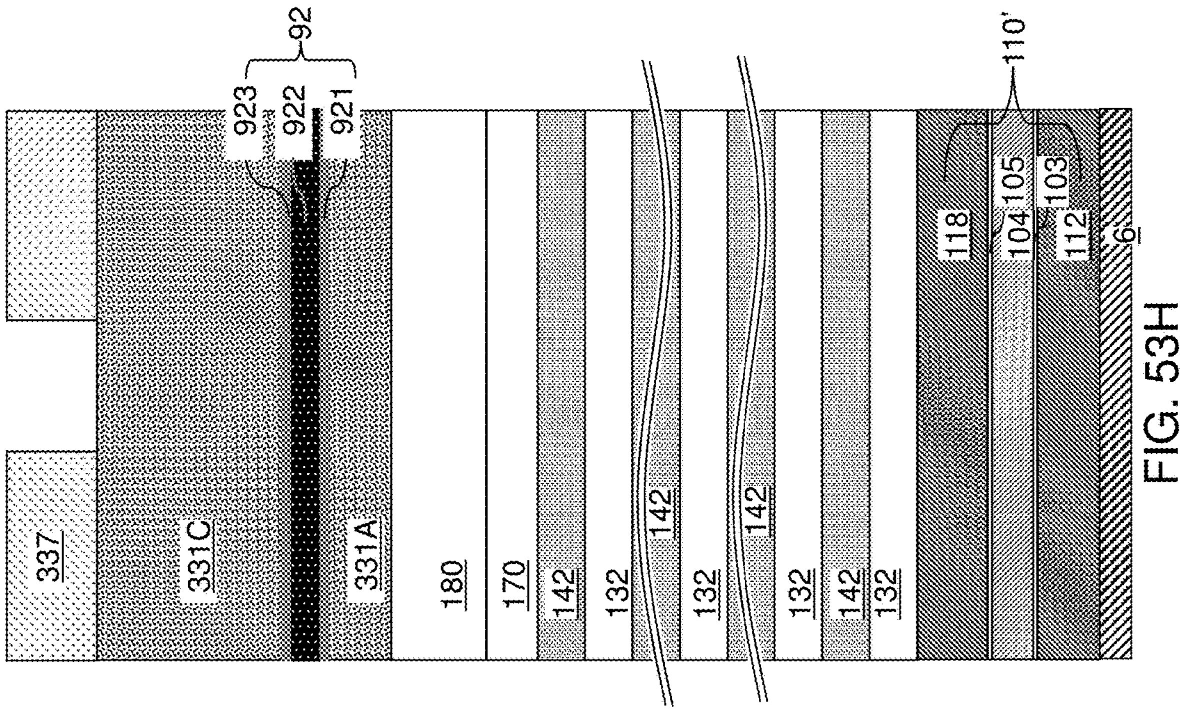
FIG. 53H is a vertical cross-sectional view of a region of a memory opening in an alternative first configuration of the fourth exemplary structure according to the fourth embodiment of the present disclosure.
Figure 53G:
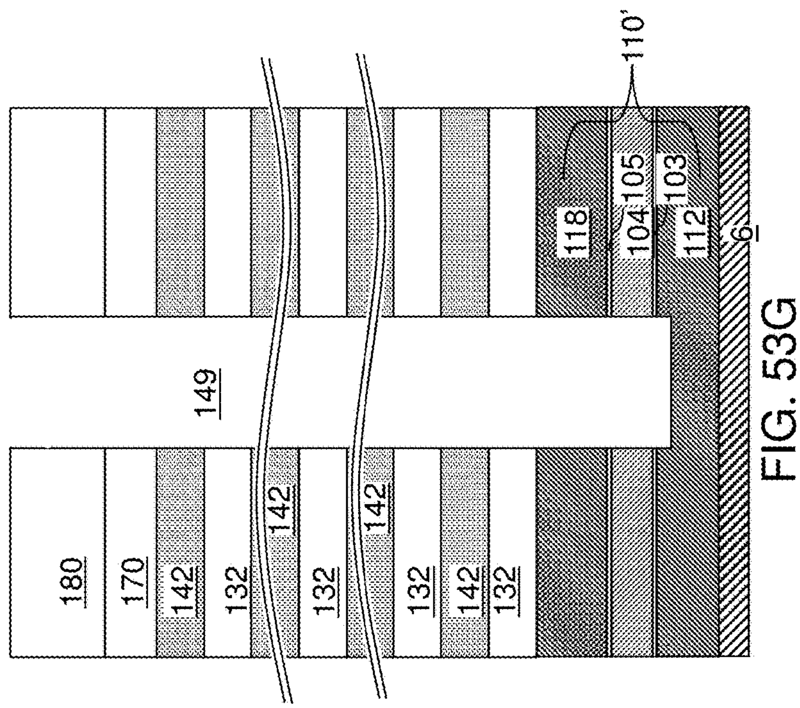

Referring to FIG. 53G, remaining portions of the composite hard mask layer (331A, 92, 331C), such as the remaining portions of the lower patterning film 331A, may be removed after the second anisotropic etch process, for example, by ashing.

In an alternative embodiment illustrated in FIG. 53H, the first cladding material layer 92 comprises a layer stack of multiple material layers. The first cladding material layer 92 may comprise a bottom adhesion liner 921 and/or a top adhesion liner 923 and a metal layer 922 located between the adhesion liners (921, 923). If employed, the bottom adhesion liner 921 can be deposited directly on a top surface of the lower patterning film 331A, and the top adhesion liner 923 can be deposited on a top surface of the metal layer 922. If employed, each of the bottom adhesion liner 921 and the top adhesion liner 923 may comprise a respective material selected from a boron-carbon alloy material, a boron-nitrogen alloy material, a metallic nitride material including a conductive nitride of a transition metal element, and a metallic carbide material including a carbide of a transition metal element. In one embodiment, one or both of the bottom adhesion liner 921 and the top adhesion liner 923 may comprise a boron-carbon alloy material containing boron atoms at an atomic concentration greater than 10% and/or greater than 30%, and containing carbon atoms at an atomic concentration greater than 30% and/or greater than 50%. In one embodiment, one or both of the bottom adhesion liner 921 and the top adhesion liner 923 may comprise a boron-nitrogen alloy material containing boron atoms at an atomic concentration greater than 30% and containing carbon atoms at an atomic concentration greater than 30% (such as stoichiometric boron nitride BN). In one embodiment, one or both of the bottom adhesion liner 921 and the top adhesion liner 923 may comprise a metallic nitride material such as WN, TiN, TaN, or MoN. Each of the bottom adhesion liner 921 and the top adhesion liner 923, if present, may be formed by a respective physical vapor deposition process or by a respective chemical vapor deposition process, and may have a respective thickness in a range from 1 nm to 30 nm, such as from 3 nm to 15 nm, although lesser and greater thicknesses may also be employed. Generally, in case the first cladding material layer 92 comprises the metal layer 922, then the first cladding material layer 92 may, or may not, comprise a bottom adhesion liner 921 and/or a top adhesion liner 923.

Subsequently, the processing steps described above with reference to FIGS. 29-45 or with reference to FIGS. 11A-19B may be performed. Generally, memory opening fill structures 58 may be formed in the via openings (which may be first-tier memory openings 149 and/or first-tier support openings 129, or memory openings 49 and/or support openings 19) after removing the composite hard mask layer (331A, 92, 331C). Each of the memory opening fill structures 58 comprises a respective vertical semiconductor channel 60 and a respective vertical stack of memory elements (such as portions of a charge storage layer 54 located at levels of the sacrificial material layers (42, 142)). As described above, the second material layers (such as first sacrificial material layers 142 or sacrificial material layers 42) can be replaced with electrically conductive layers (146, 246) after formation of the memory opening fill structures 58.

The etch methods of the present embodiment may also be employed to form various second-tier openings (249, 229) at the processing steps of FIGS. 31A and 31B.

FIGS. 54A-54G are sequential vertical cross-sectional view of a region of a memory opening in a second configuration of the fourth exemplary structure during formation of the memory opening according to the fourth embodiment of the present disclosure.

The second configuration of the fourth exemplary structure can be derived from the first configuration of the fourth exemplary structure illustrated in FIG. 53A by modifying the composite hard mask layer (331A, 92, 331C) of the first configuration of the fourth exemplary structure. Specifically, the composite hard mask layer (331A, 92, 331C) of the first configuration of the fourth exemplary structure can be modified to insert an intermediate patterning film 331B and a second cladding material layer 94 between the first cladding material layer 92 and the upper patterning film 331C.

The intermediate patterning film 331B can be formed over and directly on a top surface of the first cladding material layer 92. The intermediate patterning film 331B can include any patterning material that may be employed for the lower patterning film 331A or for the upper patterning film 331C. The material of the intermediate patterning film 331B may be the same as, or may be different from, the material of the lower patterning film 331A and/or the material of the upper patterning film 331C. The thickness of the intermediate patterning film 331B may be in a range from 100 nm to 2,000 nm, such as from 300 nm to 1,000 nm, although lesser and greater thicknesses may also be employed.

Figure 54A:
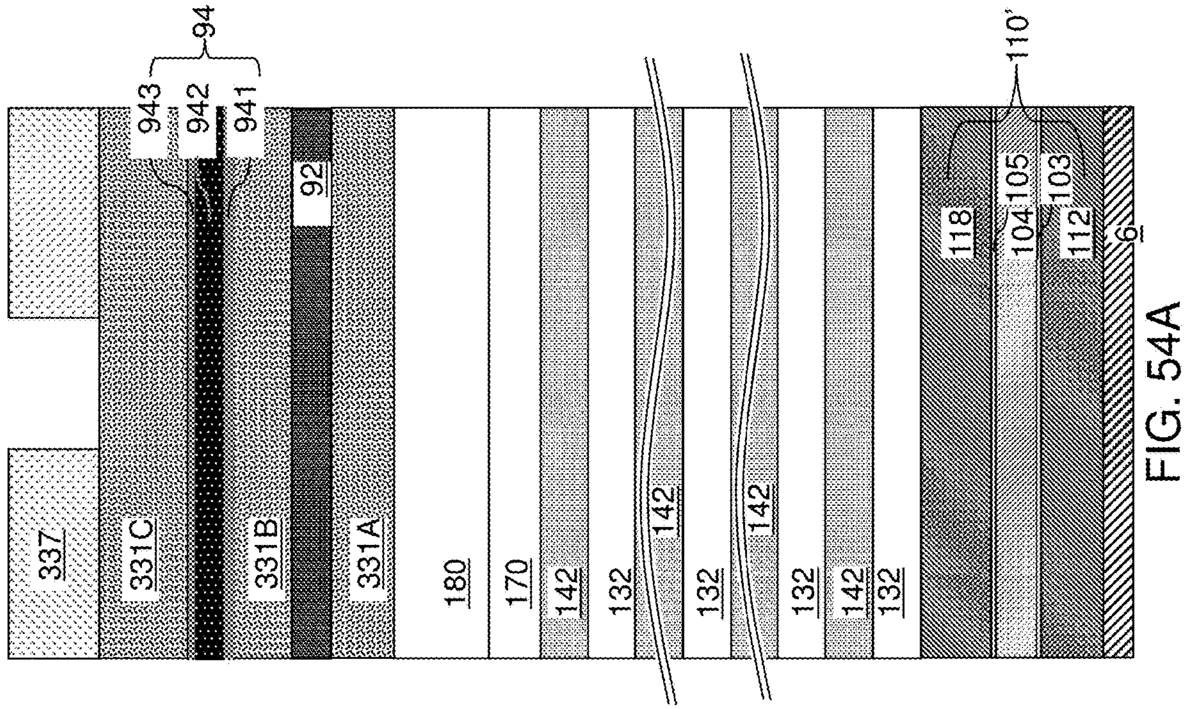
FIGS. 54A-54G are sequential vertical cross-sectional view of a region of a memory opening in a second configuration of the fourth exemplary structure during formation of the memory opening according to the fourth embodiment of the present disclosure.
Figure 54B:
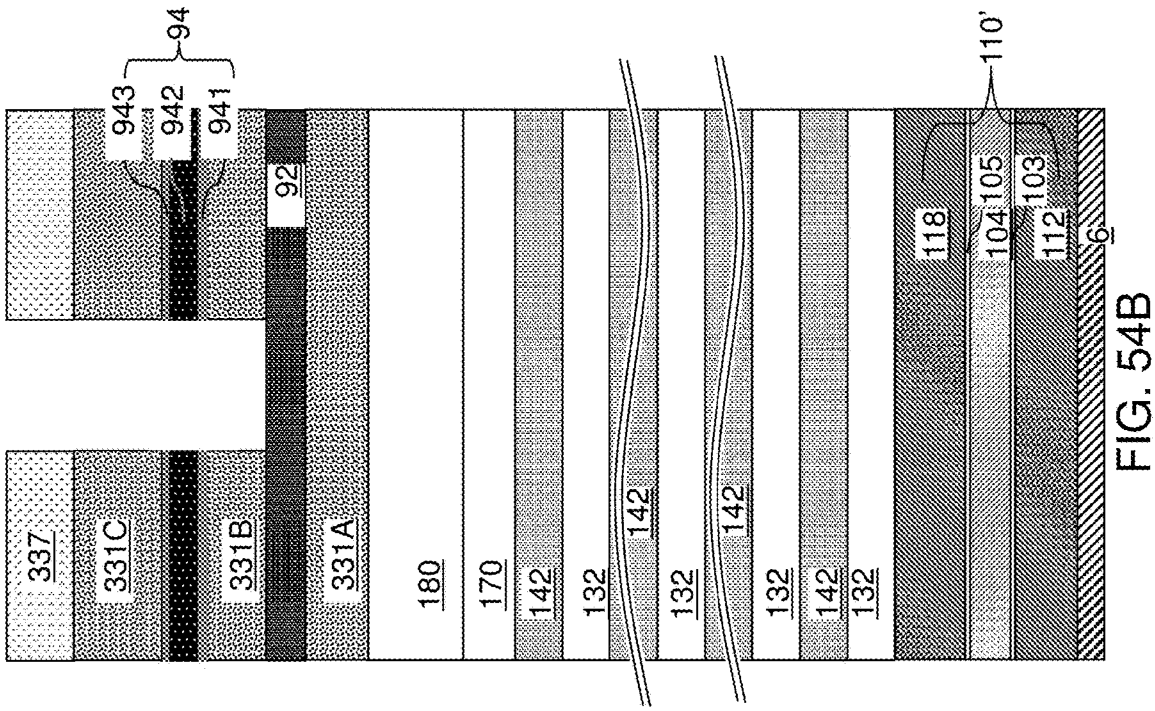

The second cladding material layer 94 can be formed over, and directly on a top surface of the intermediate patterning film 331B. Any material composition and/or any material stack that may be employed for the first cladding material layer 92 may be employed for the second cladding material layer 94. Generally, the second cladding material layer 94 may be the same as any of the embodiments of the first cladding material layer 92 described above. While FIG. 54A illustrates an embodiment in which the first cladding material layer 92 is composed of a single material layer and the second cladding material layer 94 includes a bottom adhesion liner 941, a metal layer 942, and the top adhesion liner 943, each of the first cladding material layer 92 and the second cladding material layer 94 illustrated in FIG. 54A may be independently selected from any of the configurations for the first cladding material layer 92 described with reference to FIG. 53A or 53H.

Generally, each of the first cladding material layer 92 and the second cladding material layer 94 comprises a respective cladding material that can be selected from a metal that consists essentially of at least one transition metal element, a conductive metallic compound material selected from a metallic nitride material and a metallic carbide material, a semiconductor material, and a dielectric metal oxide material having a dielectric constant greater than 7.9. In one embodiment, the first cladding material layer 92 and the second cladding material layer 94 may have different material compositions.

Referring to FIG. MB, a hard-mask-open anisotropic etch process can be subsequently performed to transfer the pattern in the patterned photoresist layer 337 through the composite hard mask layer (331A, 92, 331B, 94, 331C). The upper patterning film 331C, the second cladding material layer 94, and the intermediate patterning film 331B can be sequentially etched through during the hard-mask-open anisotropic etch process.

Referring to FIG. MC, the hard-mask-open anisotropic etch process can be continued to transfer the pattern in the patterned photoresist layer 337 through the first cladding material layer 92 and the lower patterning film 331A. In one embodiment, the patterned photoresist layer 337 may be collaterally removed from above the composite hard mask layer (331A, 92, 331B, 94, 331C) by the end of the hard-mask-open anisotropic etch process.

Figure 54D:
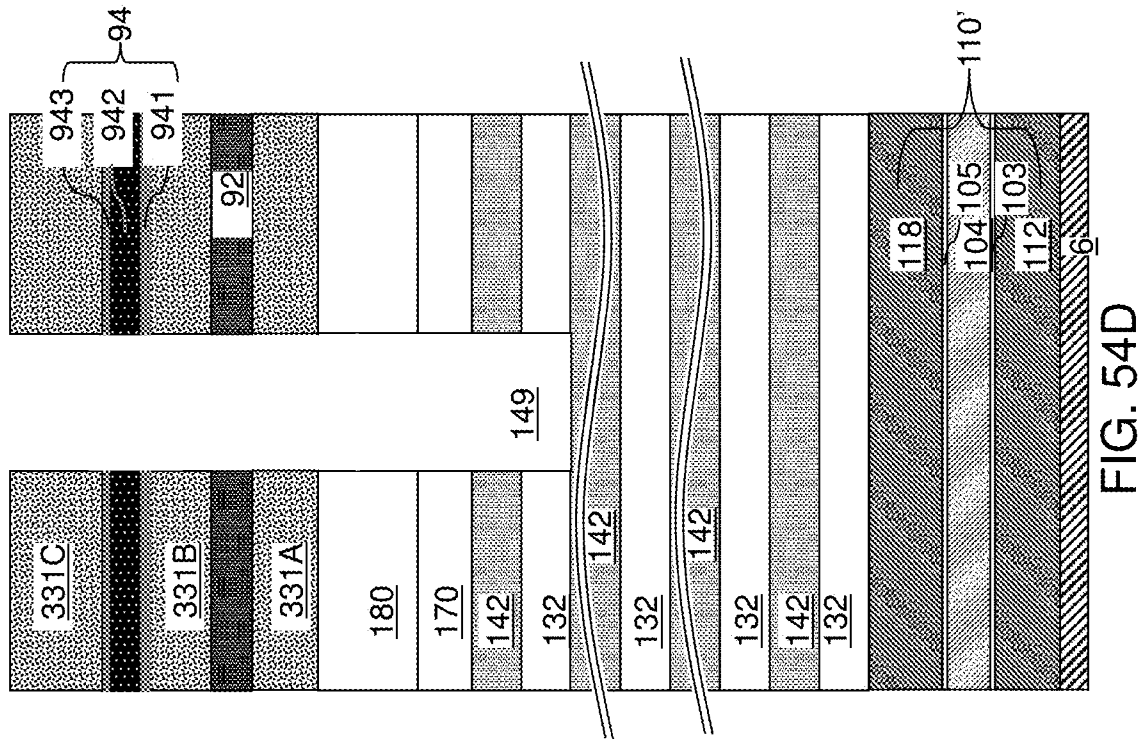
Figure 54C:
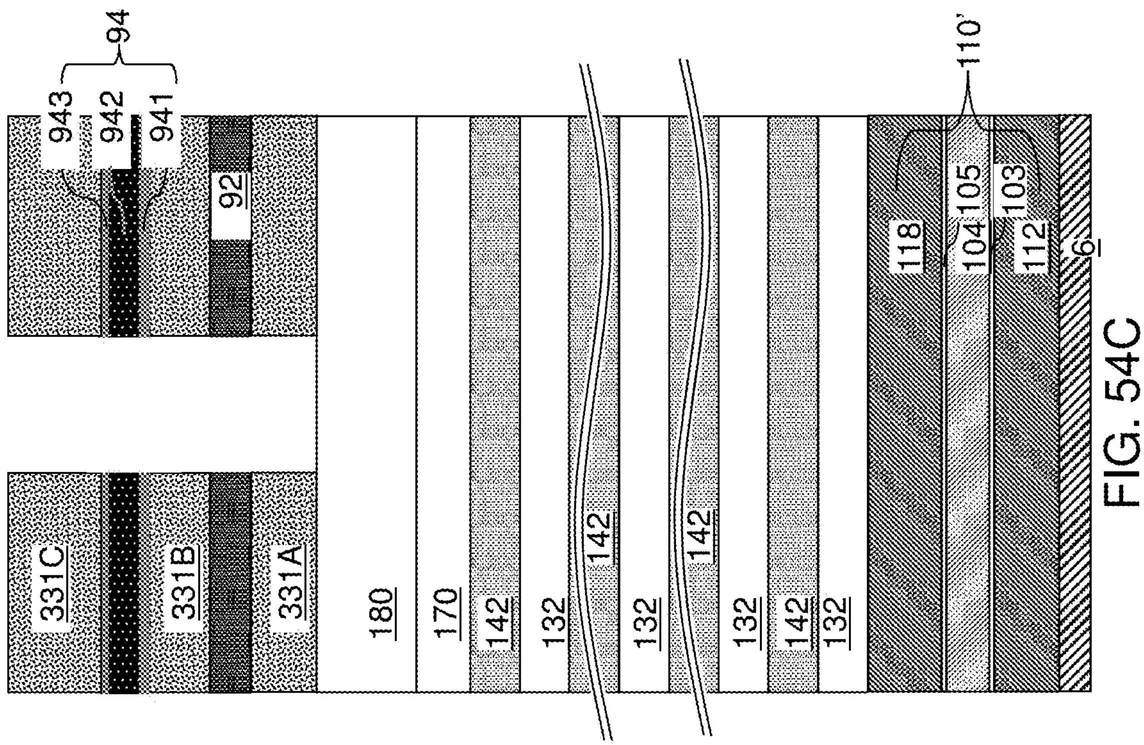

Referring to FIG. 54D, via openings (such as first-tier memory openings 149 and/or first-tier support openings 129, or memory openings 49 and/or support openings 19) can be formed through an upper region of the alternating stack (132, 142) by performing the anisotropic etch process described above. The upper patterning film 331C is employed as a first etch mask at least during an initial phase of the anisotropic etch process.

Figure 54F:
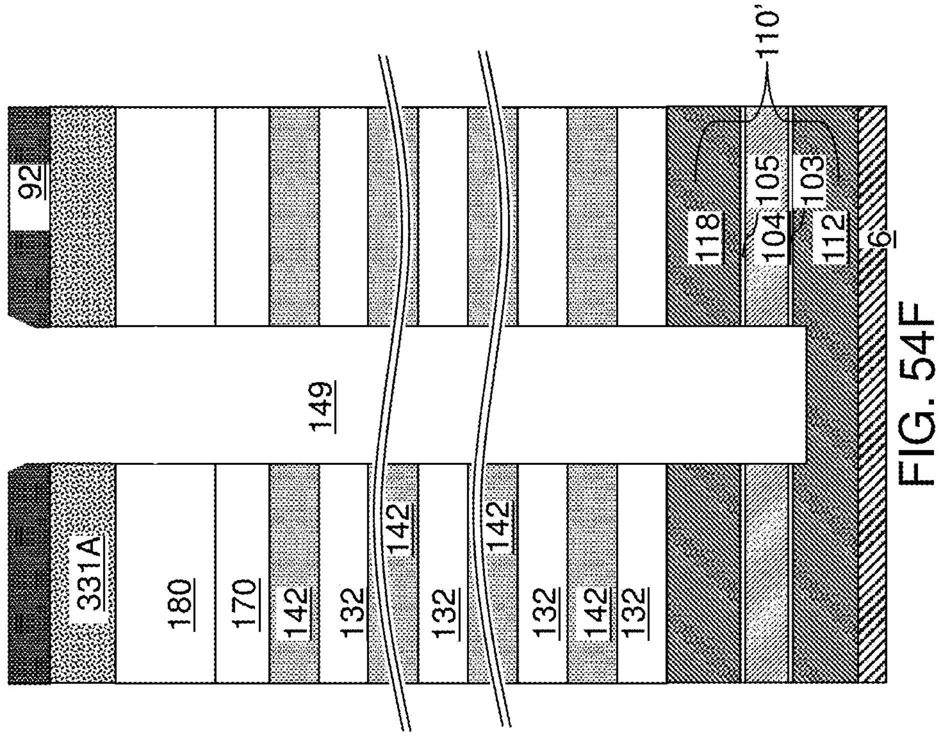
Figure 54E:
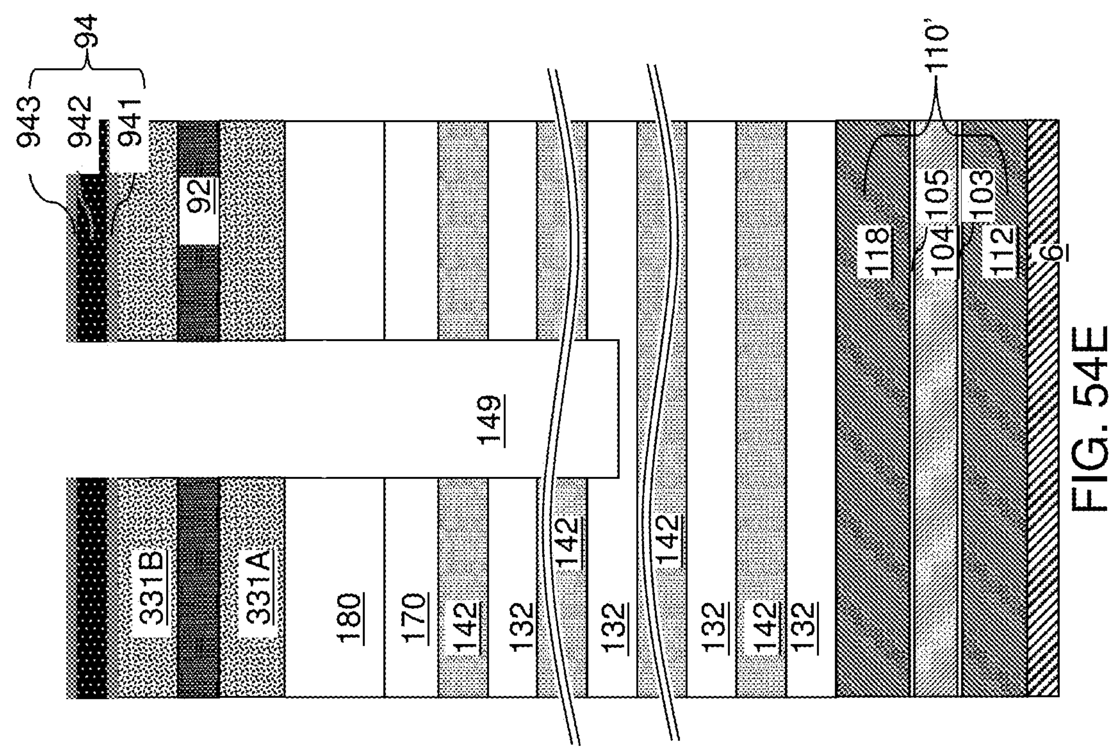

Referring to FIG. 54E, the anisotropic etch process is continued to vertically extend the via openings (such as first-tier memory openings 149 and/or first-tier support openings 129, or memory openings 49 and/or support openings 19) from the upper region of the alternating stack (132, 142) toward a middle region of the alternating stack (132, 142), i.e., through underlying layers within the alternating stack (132, 142). As the anisotropic etch process progresses, the via openings are vertically extended downward, while the material of the upper patterning film 331C is collaterally consumed at a consumption rate (as measured in nm/minute) that is lower than the etch rate of the alternating stack (132, 142) by the selectivity of the first anisotropic etch process, as described above.

Referring to FIG. 54F, the upper composite hard mask layers (e.g., layers 331C, 94 and 331B) may be consumed by the etch process, and the top surface of the first cladding material layer 92 can be physically exposed, as described above with respect to FIG. 53F.

Referring to FIG. MG, remaining portions of the composite hard mask layer (331A, 92, 331C), such as the remaining portions of the lower patterning film 331A, may be removed after the second anisotropic etch process, for example, by ashing. Subsequently, the processing steps described above with reference to FIGS. 29-45 or with reference to FIGS. 11A-19B may be performed. The etch methods of the fourth embodiment of the present disclosure may also be employed to form various second-tier openings (249, 229) at the processing steps of FIGS. 31A and 31B.

As discussed above, each of the first cladding material layer 92 and the second cladding material layer 94 may independently comprise a single material layer or a stack of multiple material layers.

Figure 55A:
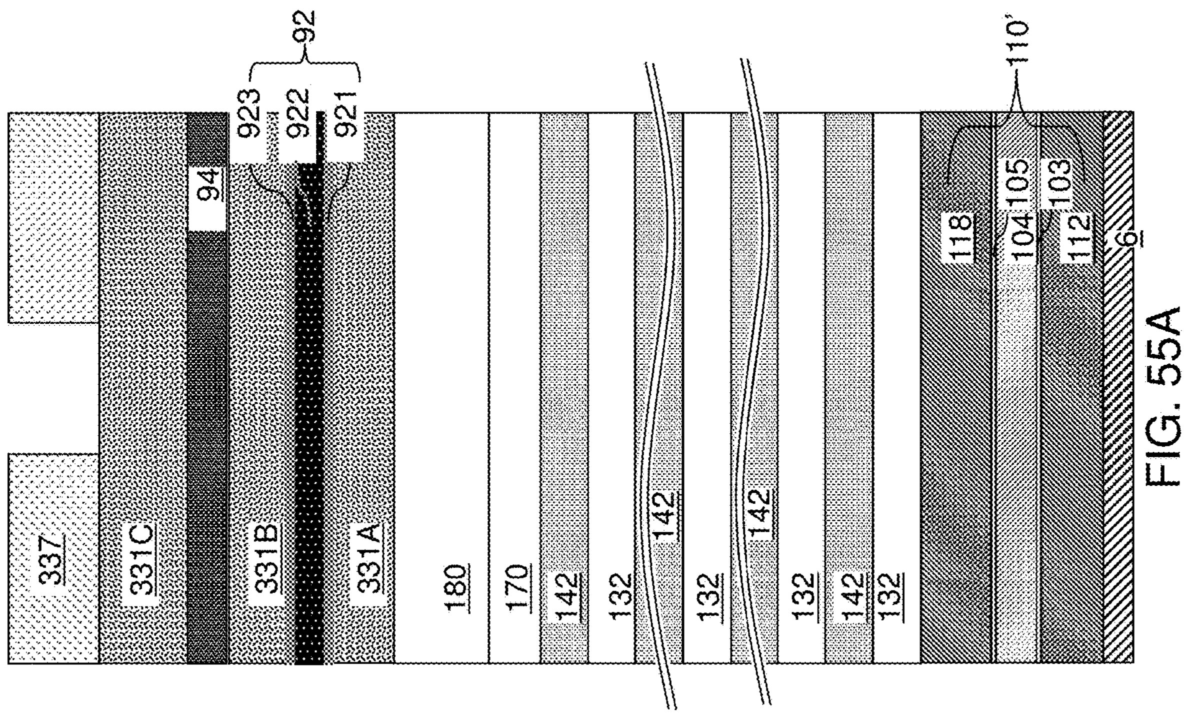
FIG. 55A-55C are vertical cross-sectional views of a region of a memory opening in alternative embodiments of the second configuration of the fourth exemplary structure after application and patterning of a photoresist layer according to the fourth embodiment of the present disclosure.
Figure 55B:
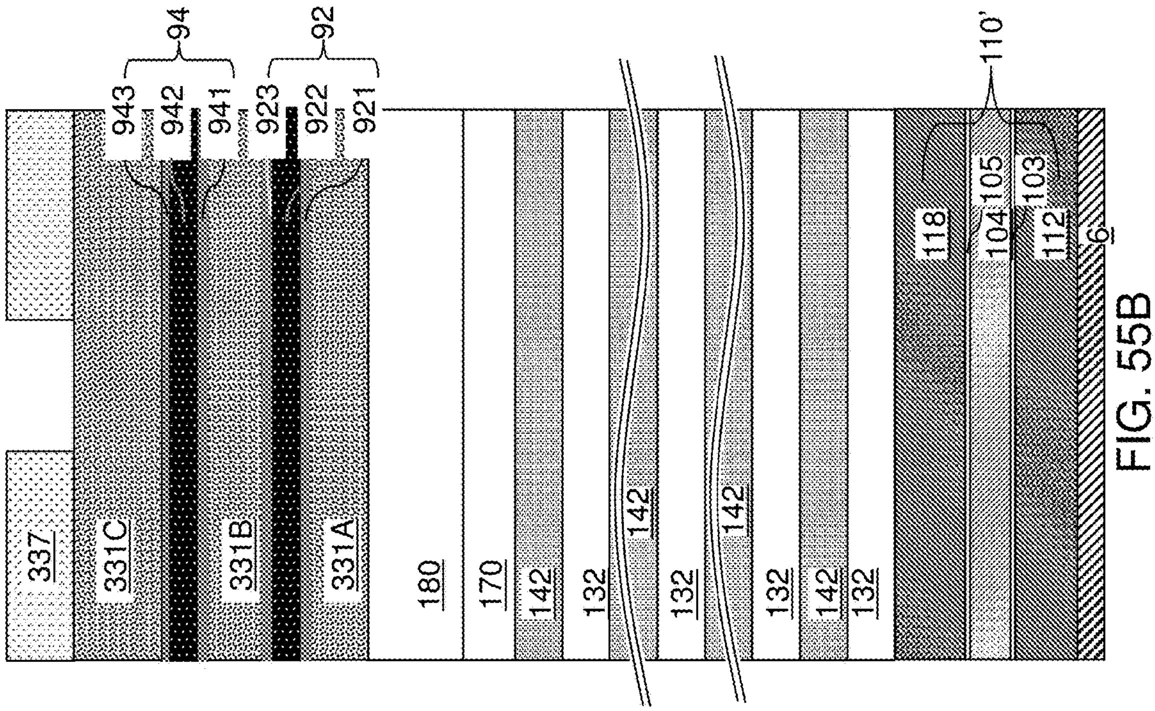
Figure 55C:
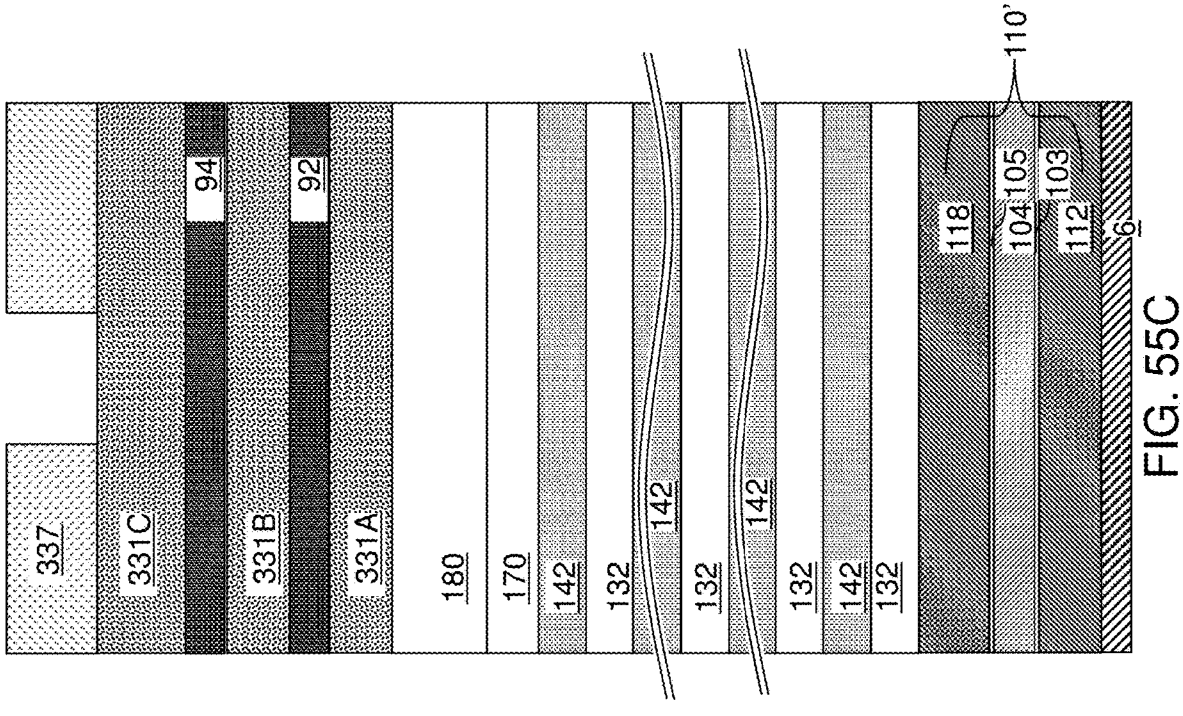

FIGS. 55A-55C are vertical cross-sectional views of a region of a memory opening in alternative embodiments of the second configuration of the fourth exemplary structure after application and patterning of a photoresist layer according to the fourth embodiment of the present disclosure. In the embodiment illustrated in FIG. 55A, the first cladding material layer 92 comprises a layer stack of multiple material layers such as a bottom adhesion liner 921, a metal layer 922, and a top adhesion liner 923, and the second cladding material layer 92 consists of a single material layer.

In the embodiment illustrated in FIG. 55B, the first cladding material layer 92 comprises a layer stack of multiple material layers such as a bottom adhesion liner 921, a metal layer 922, and a top adhesion liner 923, and the second cladding material layer 92 comprises a layer stack of multiple material layers such as a bottom adhesion liner 941, a metal layer 942, and a top adhesion liner 943. In the embodiment illustrated in FIG. 55C, the first cladding material layer 92 consists of a single material layer, and the second cladding material layer 94 consists of another single material layer. Further, embodiments are contemplated herein in which three or more cladding material layers are vertically interlaced with four or more patterning films.

Figure 56B:
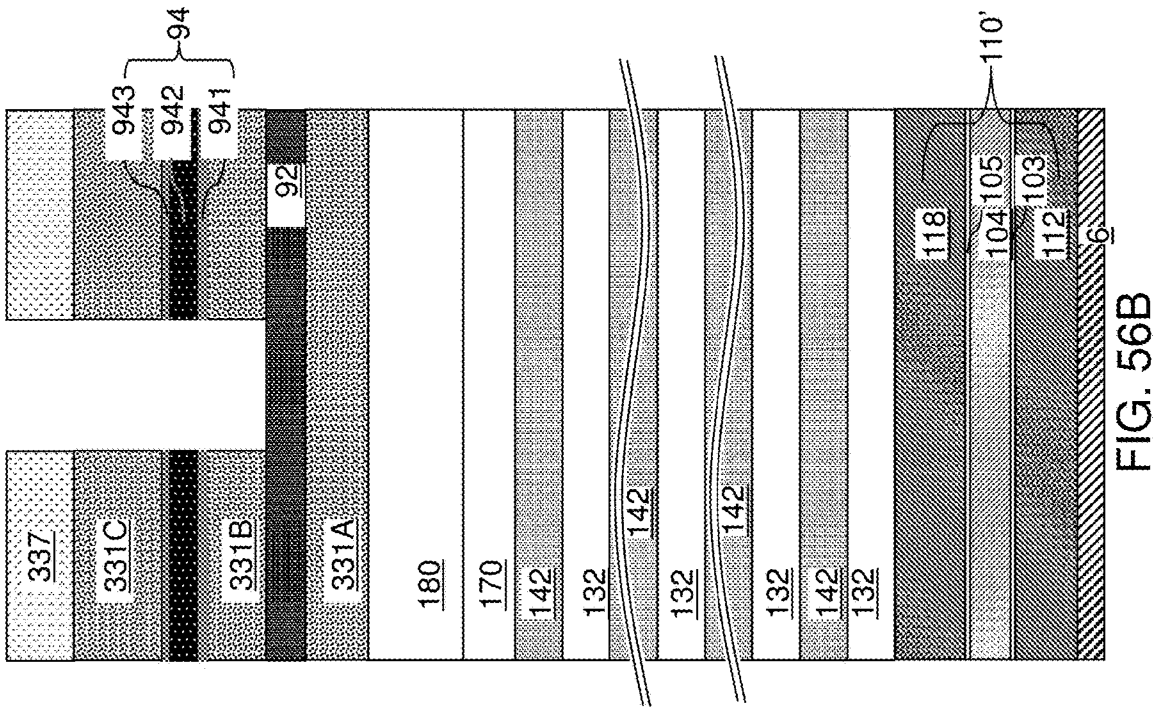
FIGS. 56A-56H are sequential vertical cross-sectional views of a region of a memory opening in a third configuration of the fourth exemplary structure during formation of the memory opening according to the fourth embodiment of the present disclosure.
Figure 56A:
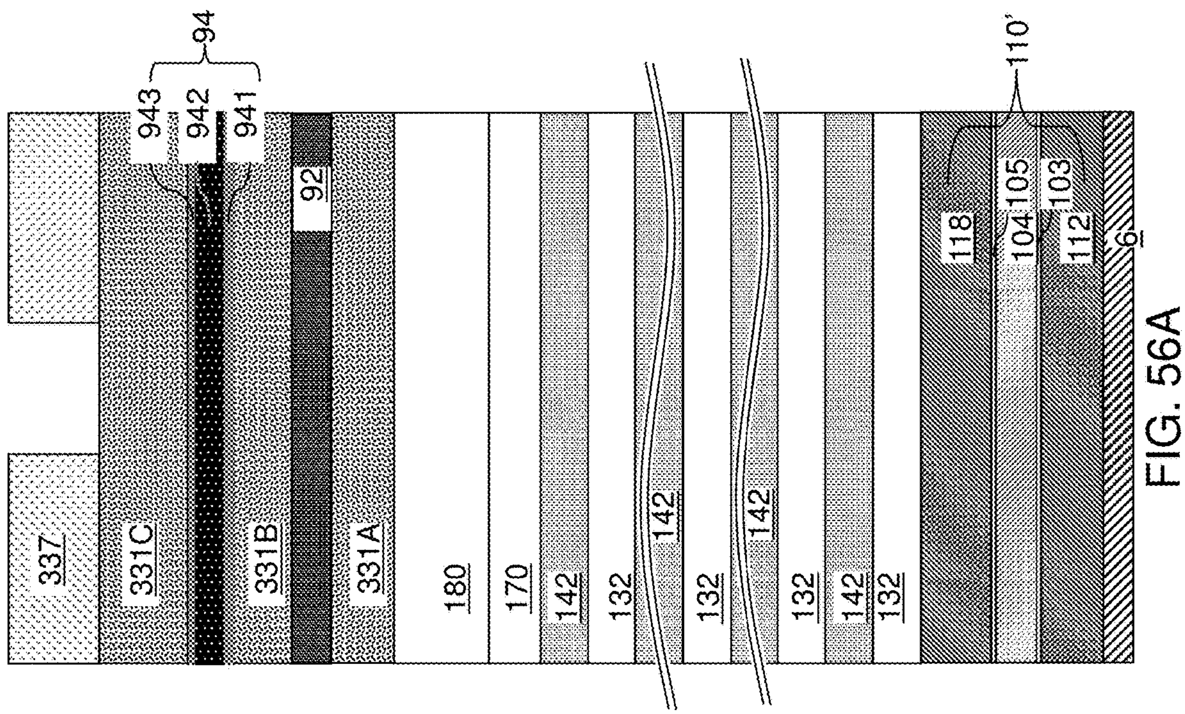
Figure 56D:
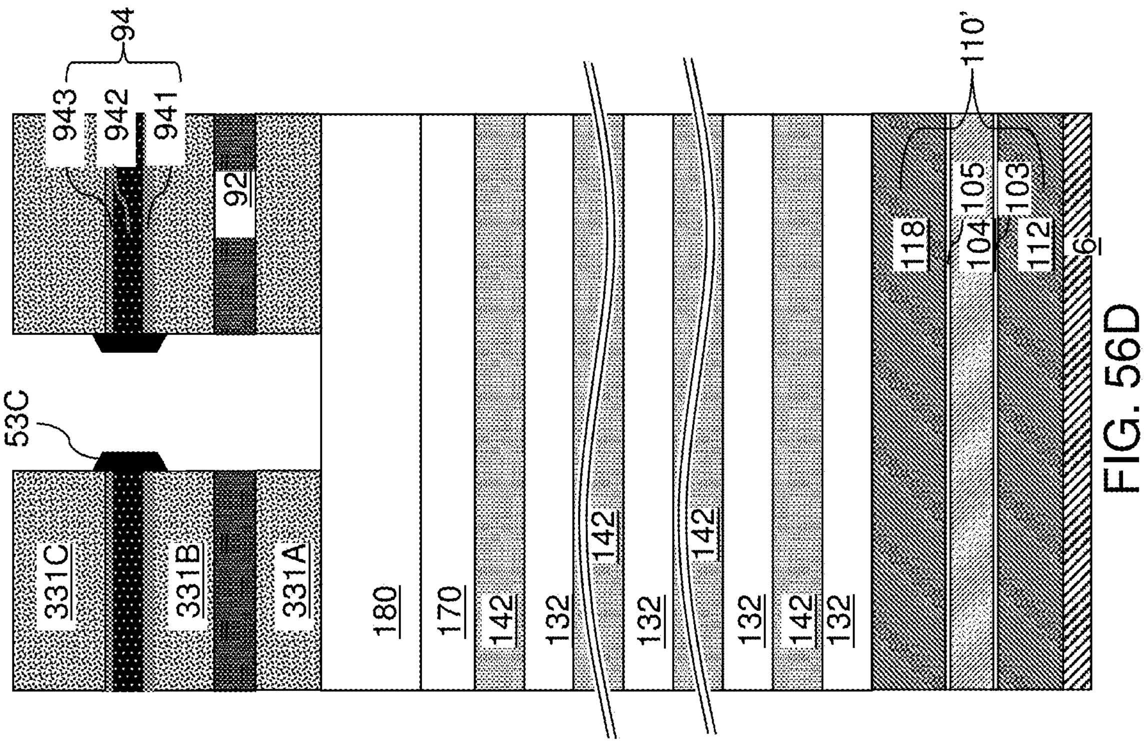
Figure 56C:
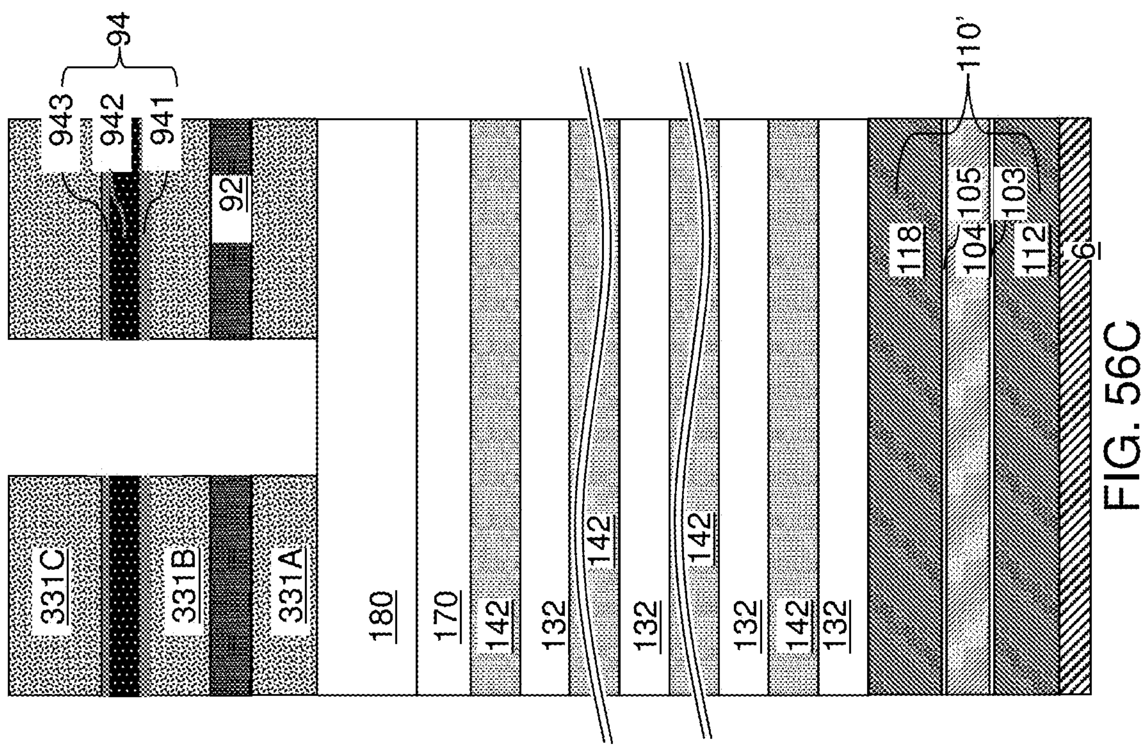

FIGS. 56A-56H are sequential vertical cross-sectional view of a region of a memory opening in a third configuration of the fourth exemplary structure during formation of the memory opening according to the fourth embodiment of the present disclosure. The third configuration of the fourth exemplary structure as illustrated in FIG. 56A can be the same as the second configuration of the fourth exemplary structure illustrated in FIG. 54A. The third configuration of the fourth exemplary structure as illustrated in FIG. 56B can be the same as the second configuration of the fourth exemplary structure illustrated in FIG. 54B. The third configuration of the fourth exemplary structure as illustrated in FIG. 56C can be the same as the second configuration of the fourth exemplary structure illustrated in FIG. 54C. Generally, a patterned photoresist layer 337 including a set of openings therethrough can be formed over a composite hard mask layer (331A, 92, 331B, 94, 331C), and the composite hard mask layer (331A, 92, 331B, 94, 331C) can be patterned by transferring a pattern in the patterned photoresist layer 337 through the composite hard mask layer (331A, 92, 331B, 94, 331C) by performing a hard-mask-open anisotropic etch process.

Referring to FIG. 56D, a selective cladding material deposition process can be performed to grow an additional cladding material after the hard-mask-open anisotropic etch process. During the selective cladding material deposition process, the additional cladding material grows from sidewalls of openings through the first cladding material layer 92 and/or from sidewalls of openings through the second cladding material layer 94, and does not grow from surfaces of the lower patterning film 331A, from surfaces of the upper patterning film 331C, from surfaces of the intermediate patterning film 331B, or from surfaces of the alternating stack (132, 142). In the example illustrated in FIG. 56D, the additional cladding material grows from sidewalls of openings through the second cladding material layer 94, and does not grow from surfaces of the lower patterning film 331A, from surfaces of the upper patterning film 331C, from surfaces of the intermediate patterning film 331B, or from sidewalls of openings through first cladding material layer 92. Generally, the additional cladding material grows from sidewalls of openings through one or more cladding material layers (92, 94). A tubular cladding structure 53C can be formed on each physically exposed sidewalls of the second cladding material layer 94.

Generally, the additional cladding material that grows from the physically exposed sidewalls of the second cladding material layer 94 may comprise any cladding material that can be selectively grown from the surfaces of the second cladding material layer 94 while suppressing growth from the physically exposed surfaces of the lower patterning film 331A, the intermediate patterning film 331B, and the upper patterning film 331C. In one embodiment, the additional cladding material may comprise a material that may be employed for the first cladding material layer 92 or for the second cladding material layer 94 as discussed above. In one embodiment, the additional cladding material may comprise a material that can provide higher etch resistance than the upper patterning film 331C and/or than the lower patterning film 331A during subsequent anisotropic etch processes.

In one embodiment, the tubular cladding structures 53C may comprise at least one transition metal element such as tungsten, titanium, tantalum, niobium, molybdenum, or ruthenium. The lateral thickness of each tubular cladding structure 53C may be in a range from 2 nm to 50 nm, such as from 4 nm to 25 nm, although lesser and greater lateral thicknesses may also be employed. The selective deposition process that forms the tubular cladding structures 53C may comprise an atomic layer deposition process or a chemical vapor deposition process. In some embodiment, an etchant can be flowed simultaneously with a reactant to provide selective growth of the additional cladding material. In an illustrative example, a tungsten deposition process that flows only tungsten hexafluoride gas without any nucleation-assist gas proceeds only on metallic surfaces or semiconductor surfaces, and does not proceed on dielectric surfaces.

Figure 56F:
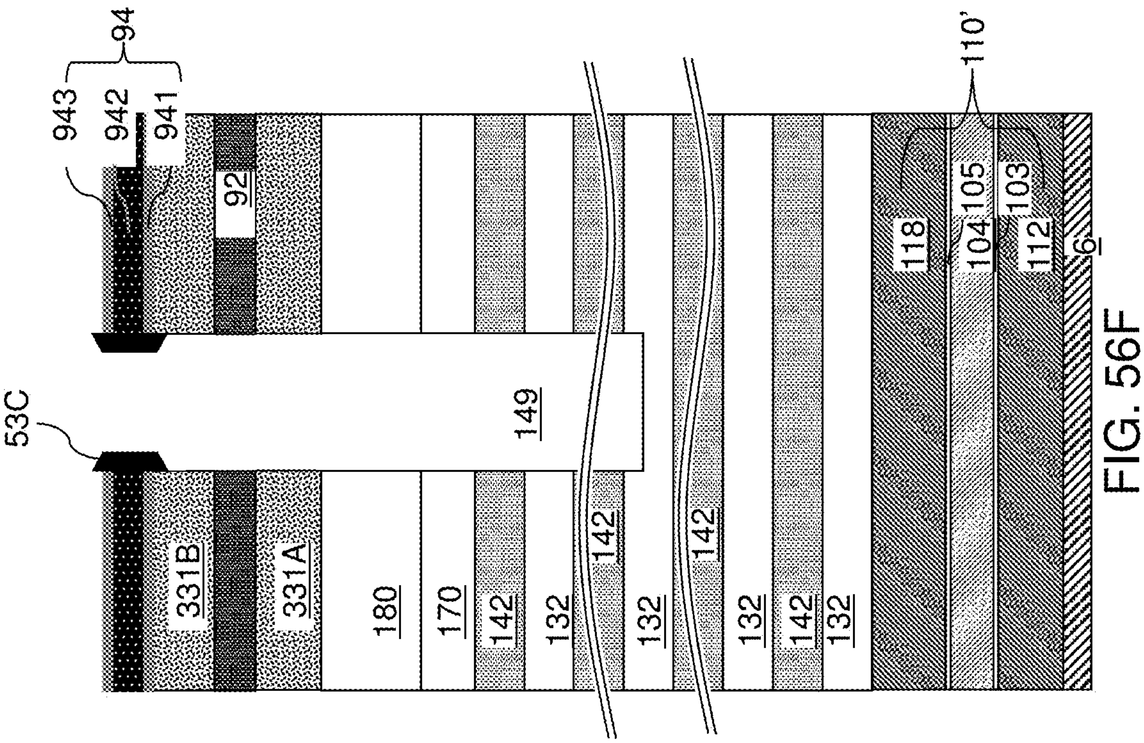
Figure 56E:
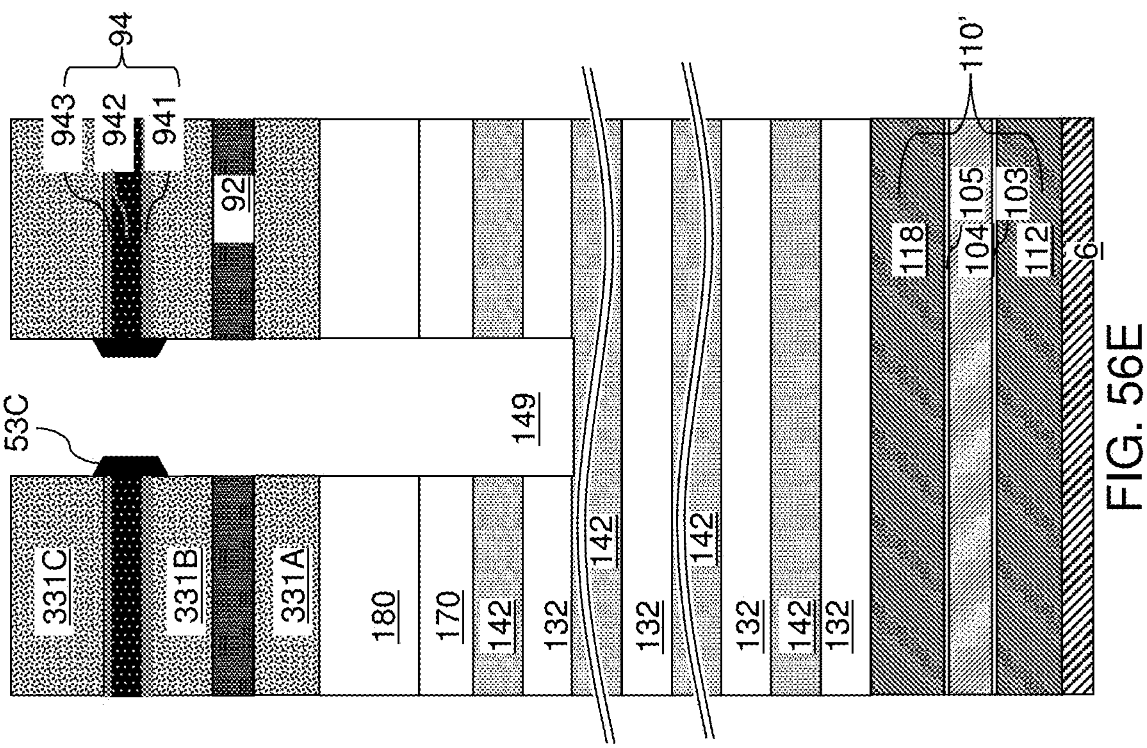

Referring to FIG. 56E, the anisotropic etch process can be performed. For example, the anisotropic etch process may have the same etch chemistry as the anisotropic etch process described with reference to FIG. 54D. In one embodiment, the tubular cladding structures 53C function as an additional mask structure during the first anisotropic etch process to reduce or prevent faceting or erosion of the second cladding material layer 94 during the anisotropic etch process.

The third configuration of the fourth exemplary structure as illustrated in FIG. 56F can be the same as the second configuration of the fourth exemplary structure illustrated in FIG. 54E.

Figure 56G:
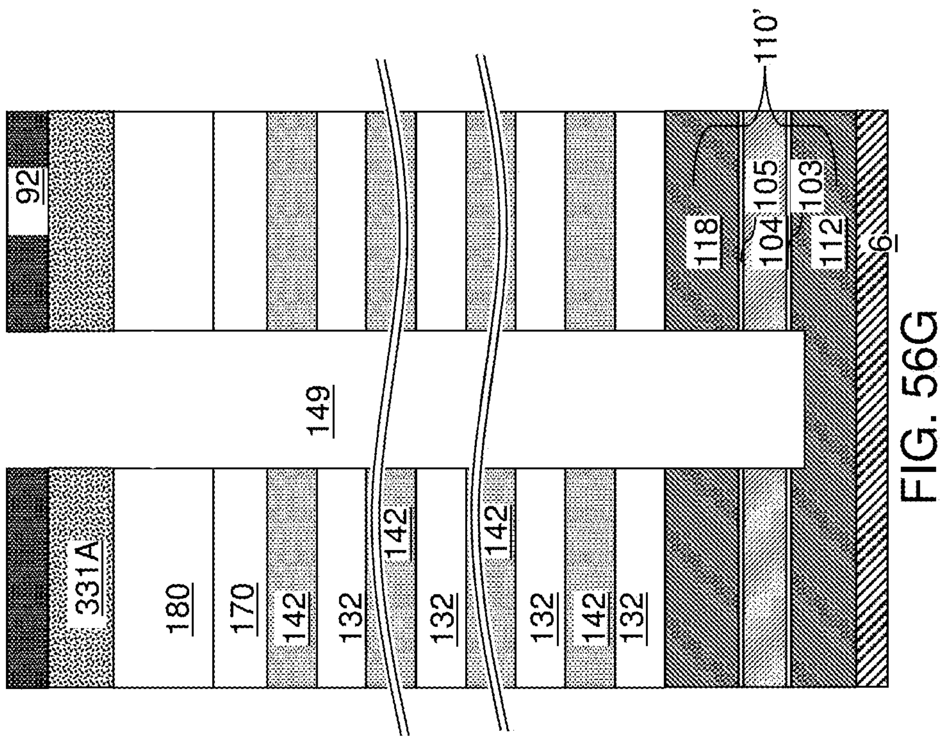

The third configuration of the fourth exemplary structure as illustrated in FIG. 56G can be the same as the second configuration of the fourth exemplary structure illustrated in FIG. 54F. However, the faceting of the first cladding material layer 92 during the anisotropic etch process may also be reduced or eliminated due to the presence of the tubular cladding structures 53C in FIG. 56G, due to the reduced widening of the memory opening 149.

Figure 54G:
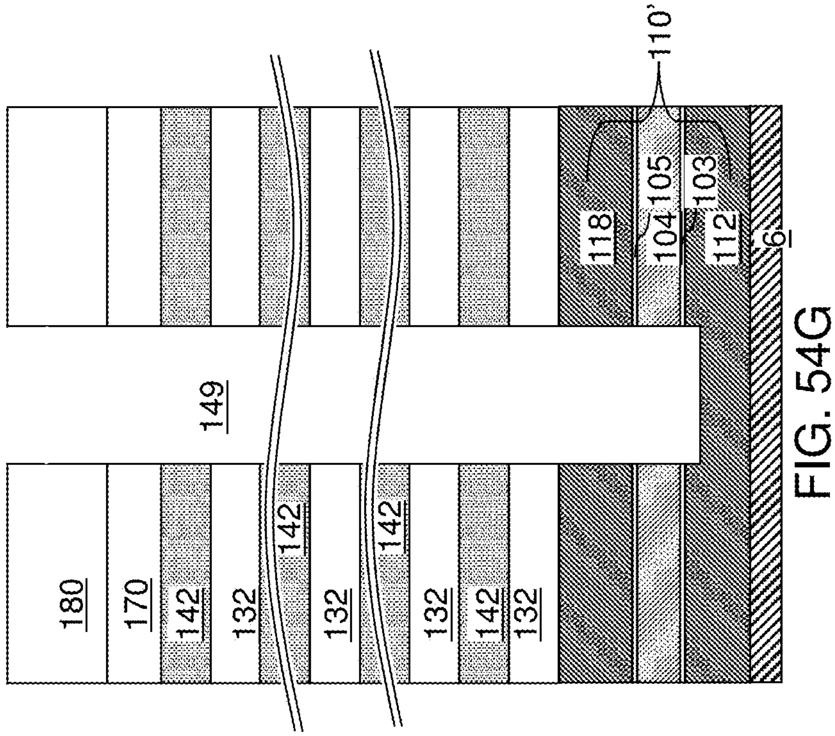
Figure 56H:
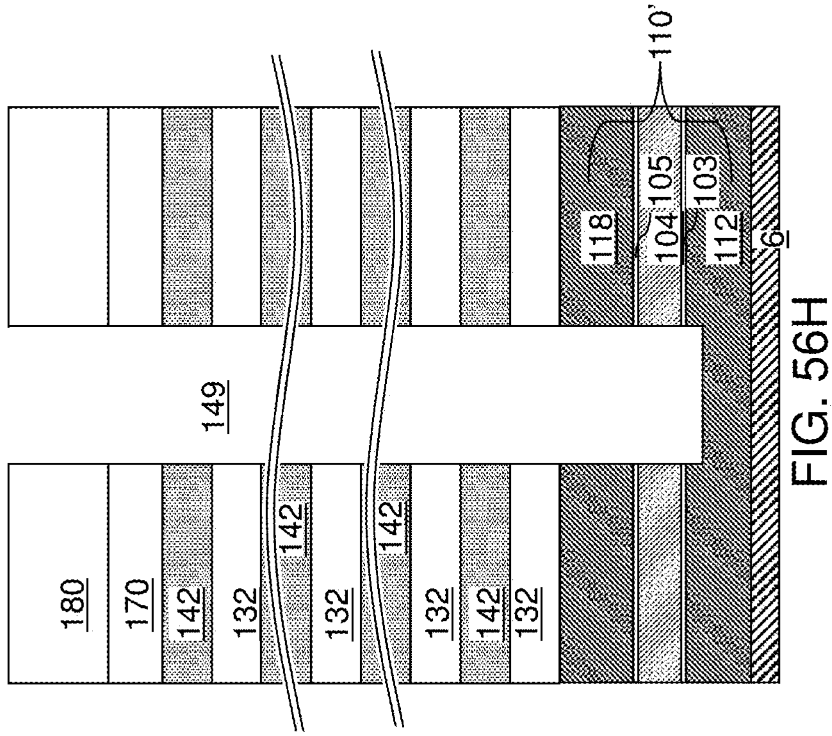

The third configuration of the fourth exemplary structure as illustrated in FIG. 56H can be the same as the second configuration of the fourth exemplary structure illustrated in FIG. 54G. Subsequently, the processing steps described above with reference to FIGS. 29-45 or with reference to FIGS. 11A-19B may be performed. The etch methods of the present disclosure may also be employed to form various second-tier openings (249, 229) at the processing steps of FIGS. 31A and 31B.

FIGS. 57A-57H are sequential vertical cross-sectional view of a region of a memory opening in a fourth configuration of the fourth exemplary structure during formation of the memory opening according to the fourth embodiment of the present disclosure.

Figure 57B:
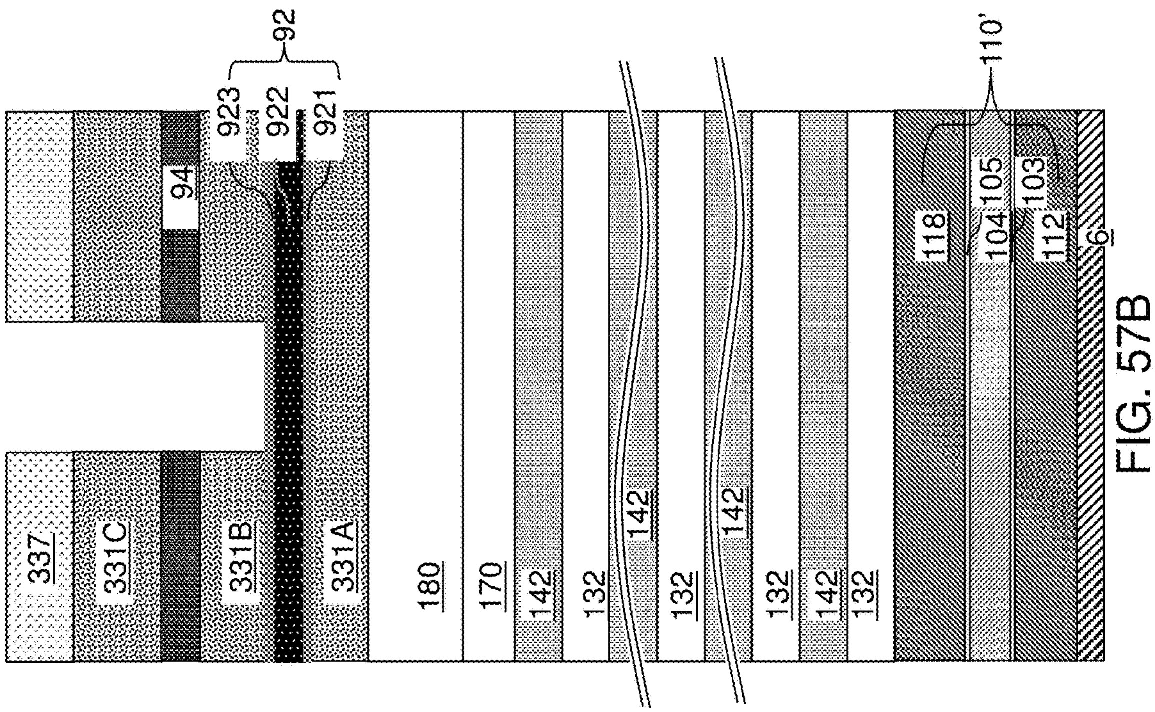
FIGS. 57A-57H are sequential vertical cross-sectional views of a region of a memory opening in a fourth configuration of the fourth exemplary structure during formation of the memory opening according to the fourth embodiment of the present disclosure.
Figure 57A:
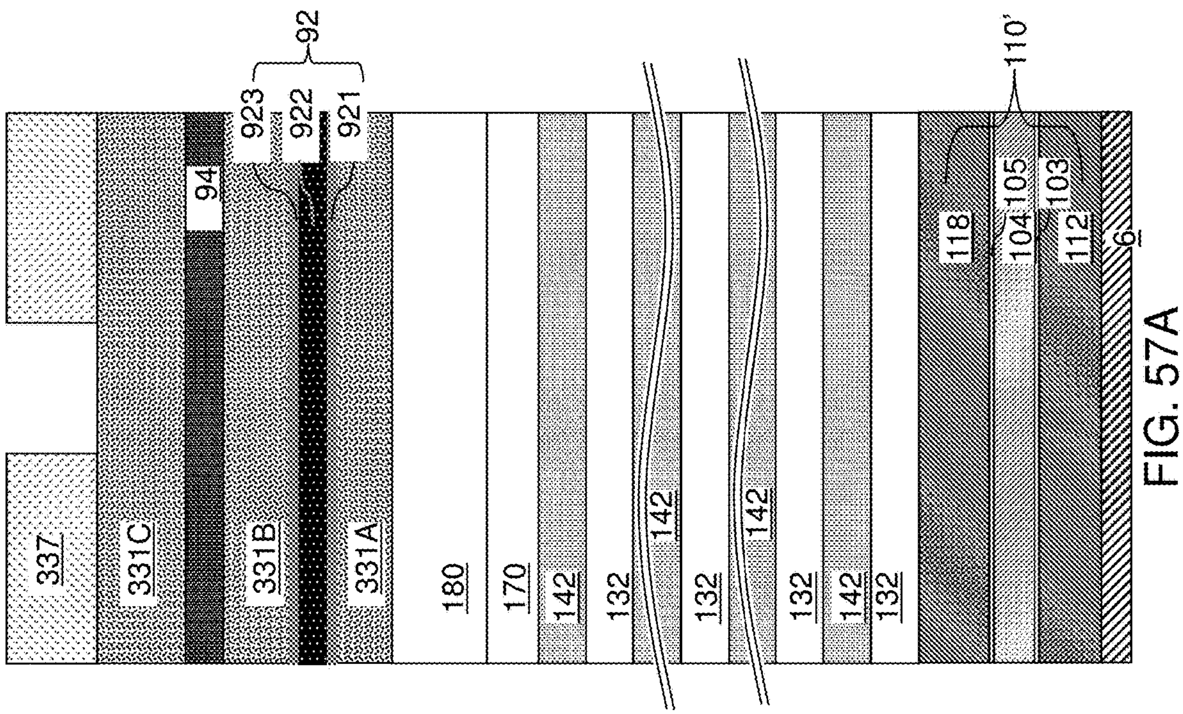

Referring to FIG. 57, the fourth configuration of the fourth exemplary structure as illustrated in FIG. 57A may be the same as, or may be derived from, any of the second configurations of the fourth exemplary structure described above with an additional limitation that the materials of the first cladding material layer 92 and the second cladding material layer 94 are selected such that an additional cladding material can subsequently grow from surfaces of the material of the first cladding material layer 92 while suppressing growth from surfaces of the material of the second cladding material layer 94 and while suppressing growth from surfaces of the patterning films (331A, 331B, 331C).

Referring to FIG. 57B, the processing steps of FIG. 56B can be performed to transfer the pattern in the patterned photoresist layer 337 through the upper patterning film 331C, the second cladding material layer 94, and the intermediate patterning film 331B.

Figure 57D:
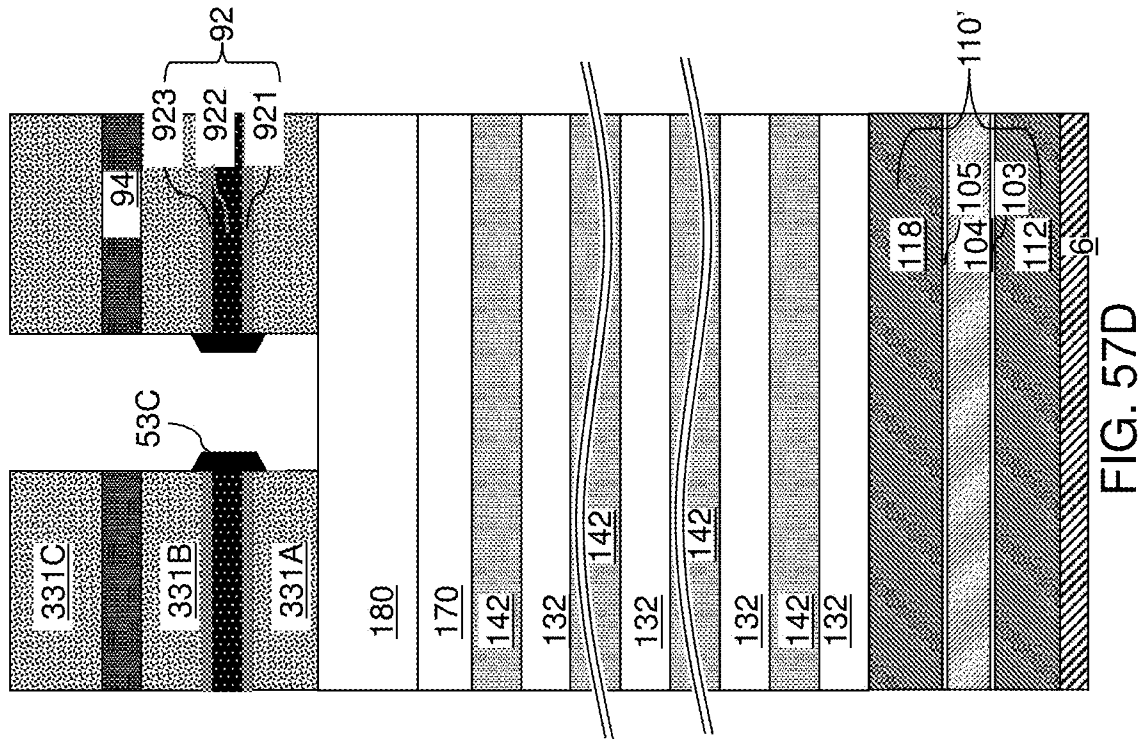
Figure 57C:
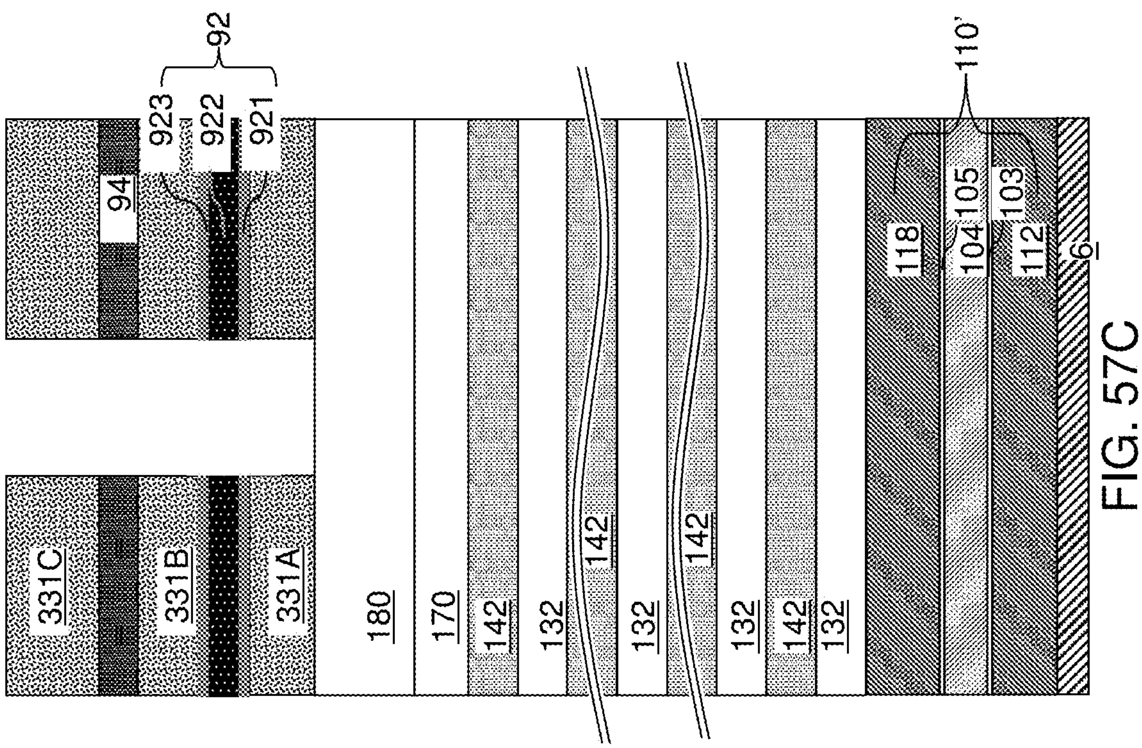

Referring to FIG. 57C, the processing steps of FIG. 56C can be performed to transfer the pattern in the patterned photoresist layer 337 through the first cladding material layer 92 and the lower patterning film 331A.

Referring to FIG. 57D, a selective cladding material deposition process can be performed to grow an additional cladding material after the hard-mask-open anisotropic etch process. During the selective cladding material deposition process, the additional cladding material grows from sidewalls of openings through the first cladding material layer 92 and/or from sidewalls of openings through the second cladding material layer 94, and does not grow from surfaces of the lower patterning film 331A, from surfaces of the upper patterning film 331C, from surfaces of the intermediate patterning film 331B, or from surfaces of the alternating stack (132, 142). In the example illustrated in FIG. 57D, the additional cladding material grows from sidewalls of openings through the first cladding material layer 92, and does not grow from surfaces of the lower patterning film 331A, from surfaces of the upper patterning film 331C, from surfaces of the intermediate patterning film 331B, from sidewalls of openings through second cladding material layer 94, or from surfaces of the alternating stack (132, 142). Generally, the additional cladding material grows from sidewalls of openings through one or more cladding material layers (92, 94). A tubular cladding structure 53C can be formed on each physically exposed sidewalls of the first cladding material layer 92.

Figure 57F:
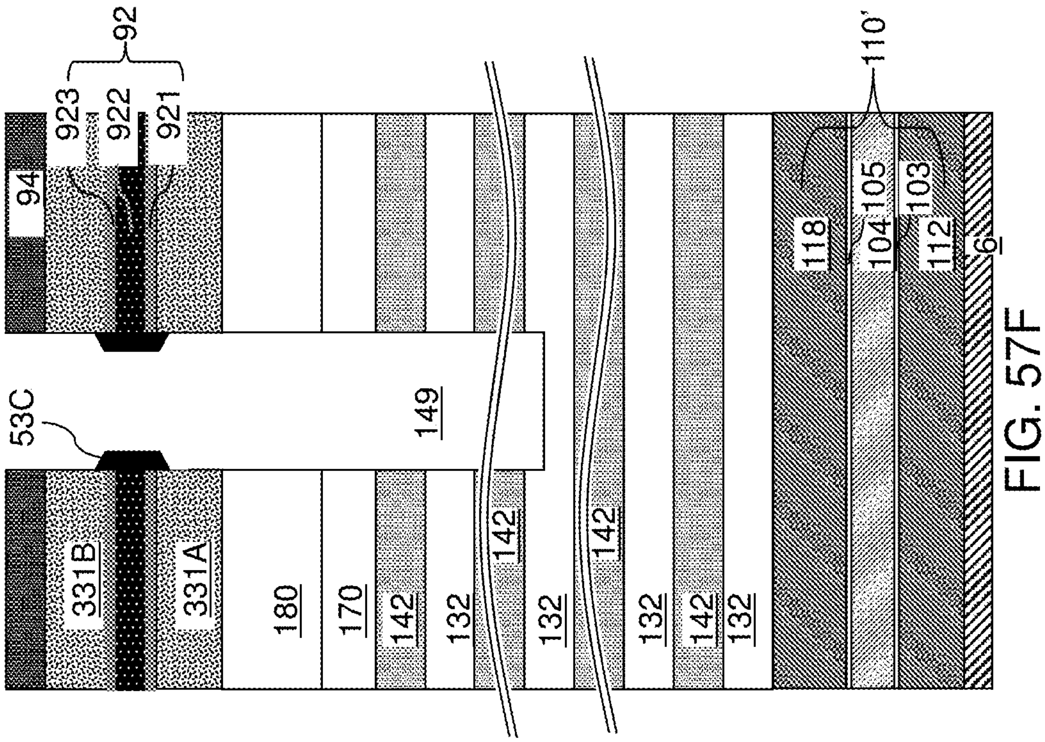
Figure 57E:
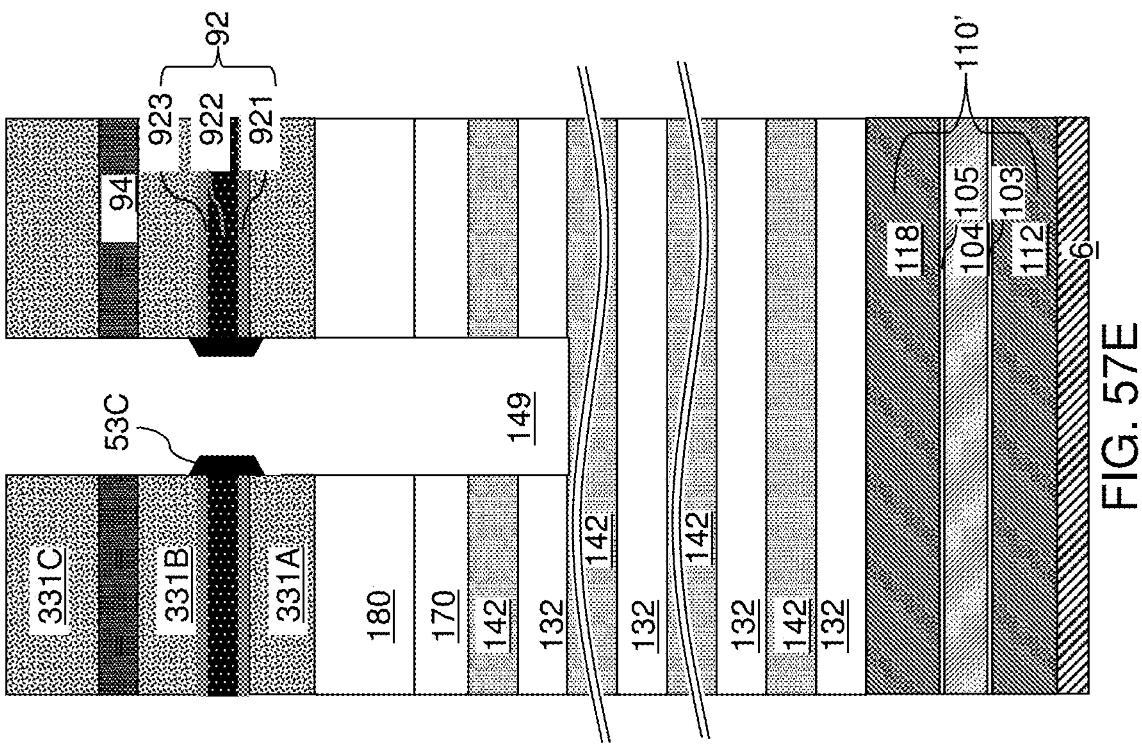

Referring to FIG. 57E, the anisotropic etch process can be performed. For example, the anisotropic etch process may have the same etch chemistry as the first anisotropic etch process described with reference to FIG. 54D. In one embodiment, the tubular cladding structures 53C function as an additional mask structure during the anisotropic etch process to reduce or prevent erosion of the first cladding material layer 92.

Figure 57G:
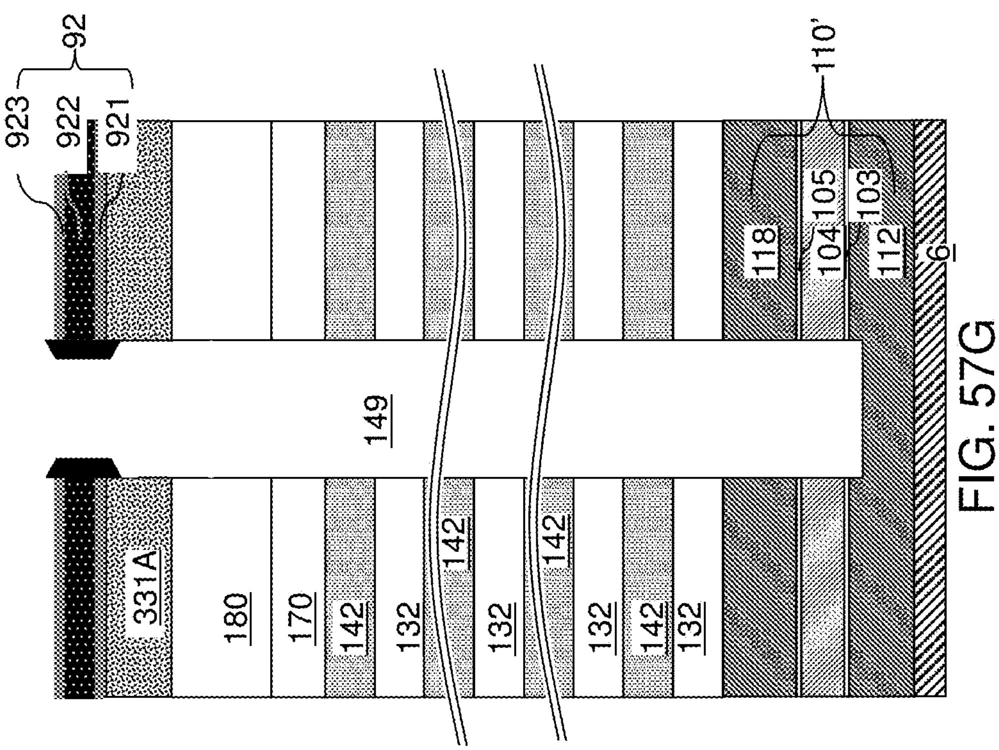
Figure 57H:
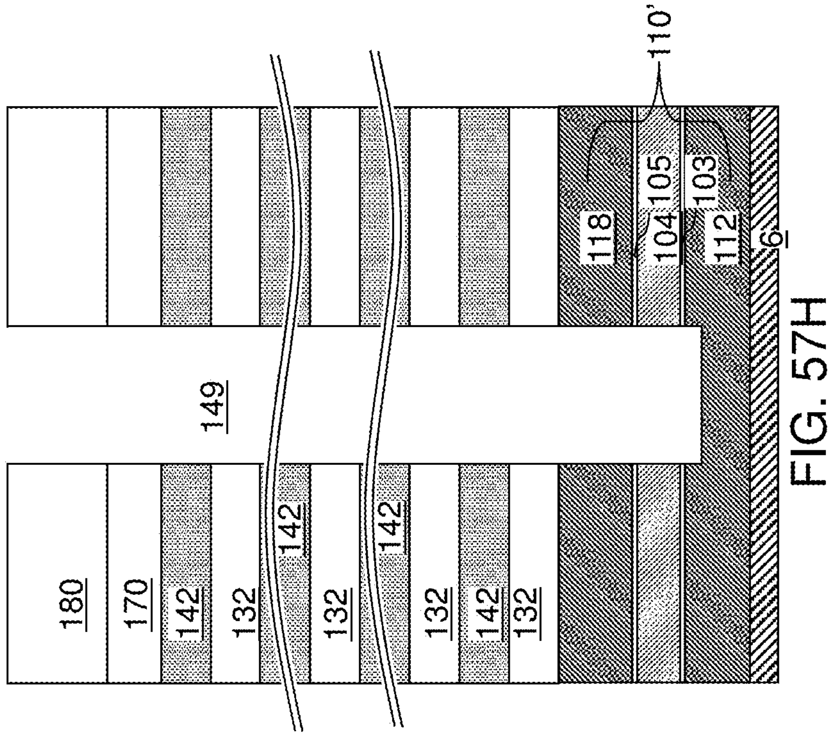

Referring to FIGS. 57F to 57H, the respective steps of FIGS. 56F to 56H can be performed. Subsequently, the processing steps described above with reference to FIGS. 29-45 or with reference to FIGS. 11A-19B may be performed. The etch methods of the present disclosure may also be employed to form various second-tier openings (249, 229) at the processing steps of FIGS. 31A and 31B.

FIGS. 58A-58H are sequential vertical cross-sectional view of a region of a memory opening in a fifth configuration of the fourth exemplary structure during formation of the memory opening according to the fourth embodiment of the present disclosure.

Figure 58B:
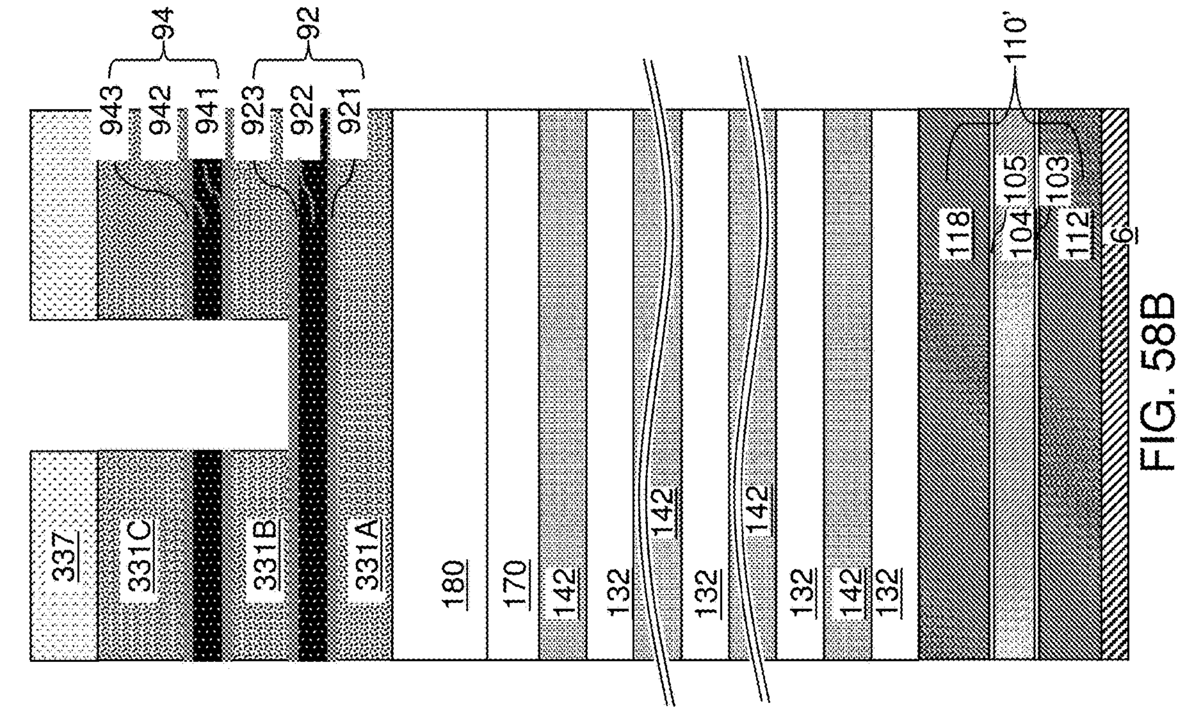
FIGS. 58A-58H are sequential vertical cross-sectional views of a region of a memory opening in a fifth configuration of the fourth exemplary structure during formation of the memory opening according to the fourth embodiment of the present disclosure.
Figure 58A:
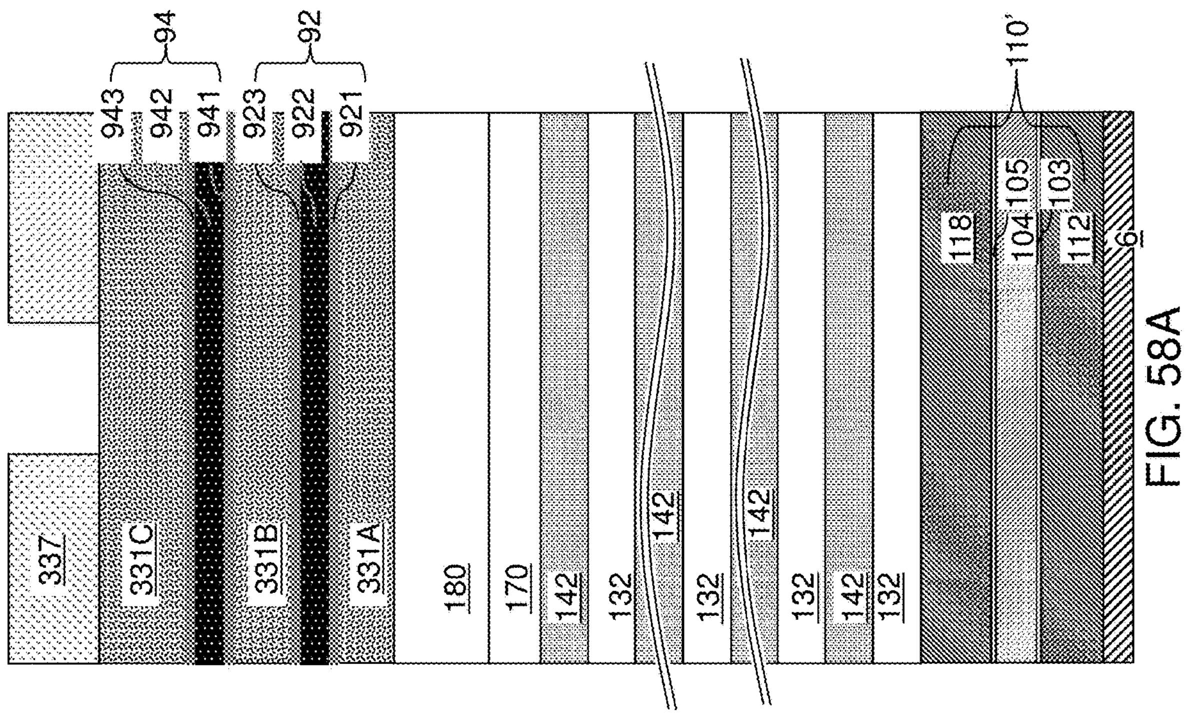

Referring to FIG. 58, the fifth configuration of the fourth exemplary structure as illustrated in FIG. 58A may be the same as, or may be derived from, any of the second configurations of the fourth exemplary structure described above with an additional limitation that the materials of the first cladding material layer 92 and the second cladding material layer 94 are selected such that an additional cladding material can subsequently grow from surfaces of the material of the first cladding material layer 92 and from surfaces of the material of the second cladding material layer 94 while suppressing growth from surfaces of the patterning films (331A, 331B, 331C).

Referring to FIG. 58B, the processing steps of FIG. 56B can be performed to transfer the pattern in the patterned photoresist layer 337 through the upper patterning film 331C, the second cladding material layer 94, and the intermediate patterning film 331B.

Figure 58D:
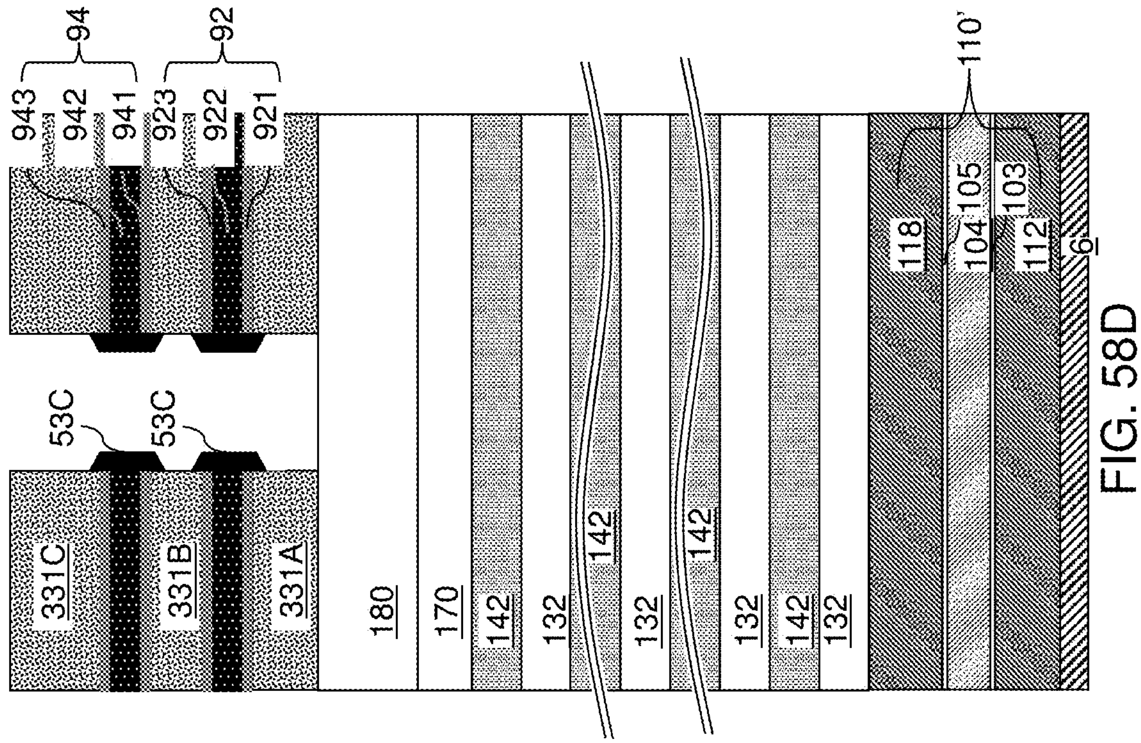
Figure 58C:
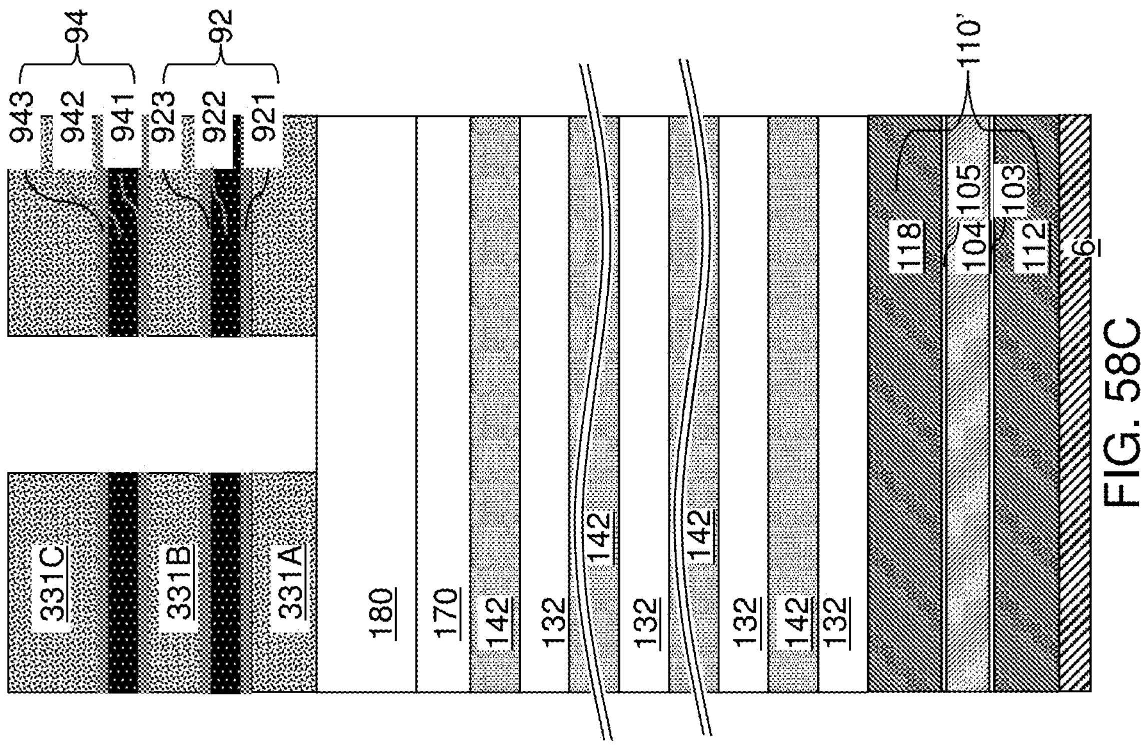
Figure 58F:
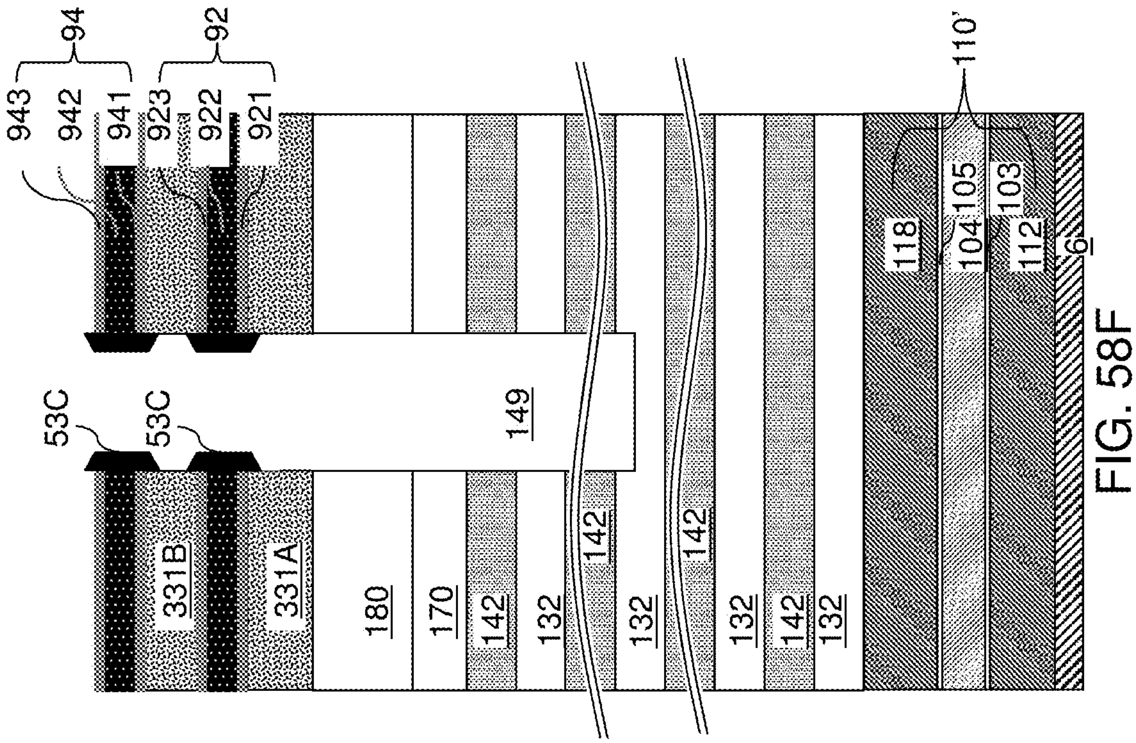
Figure 58E:
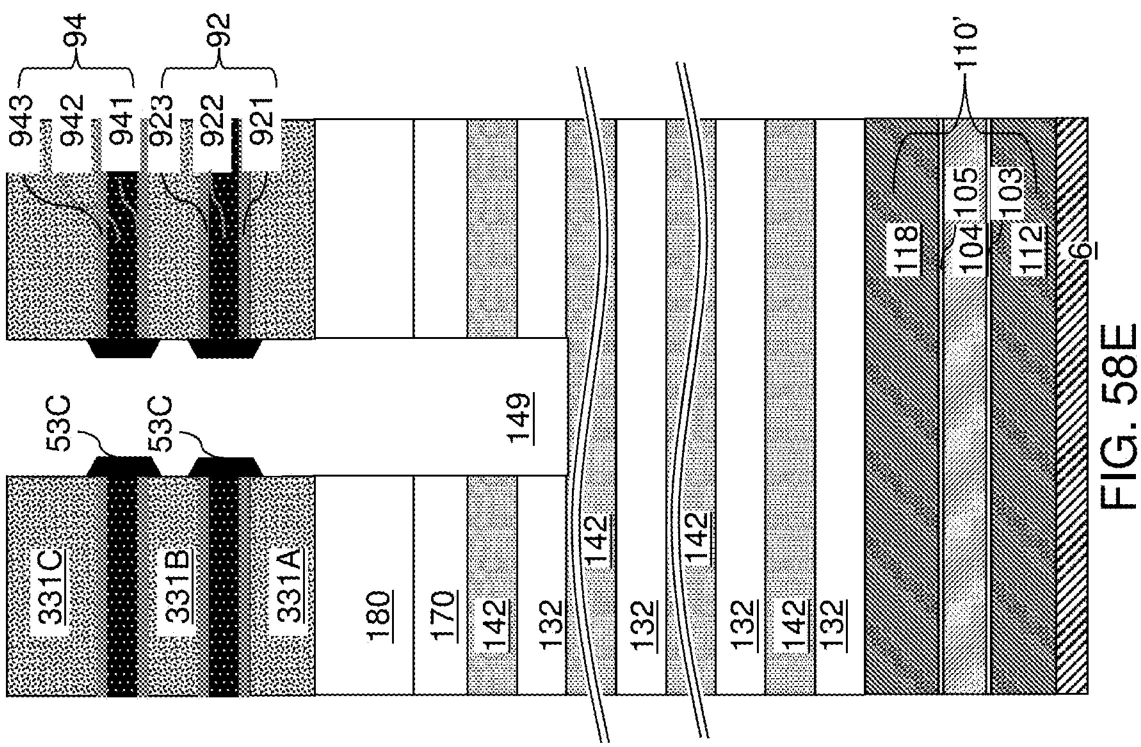
Figure 58H:
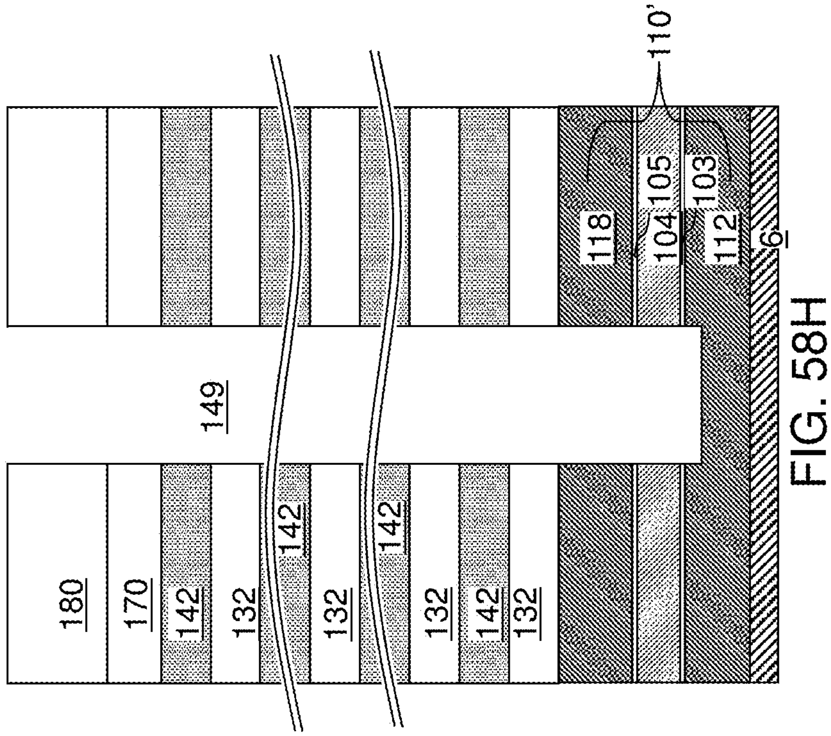
Figure 58G:
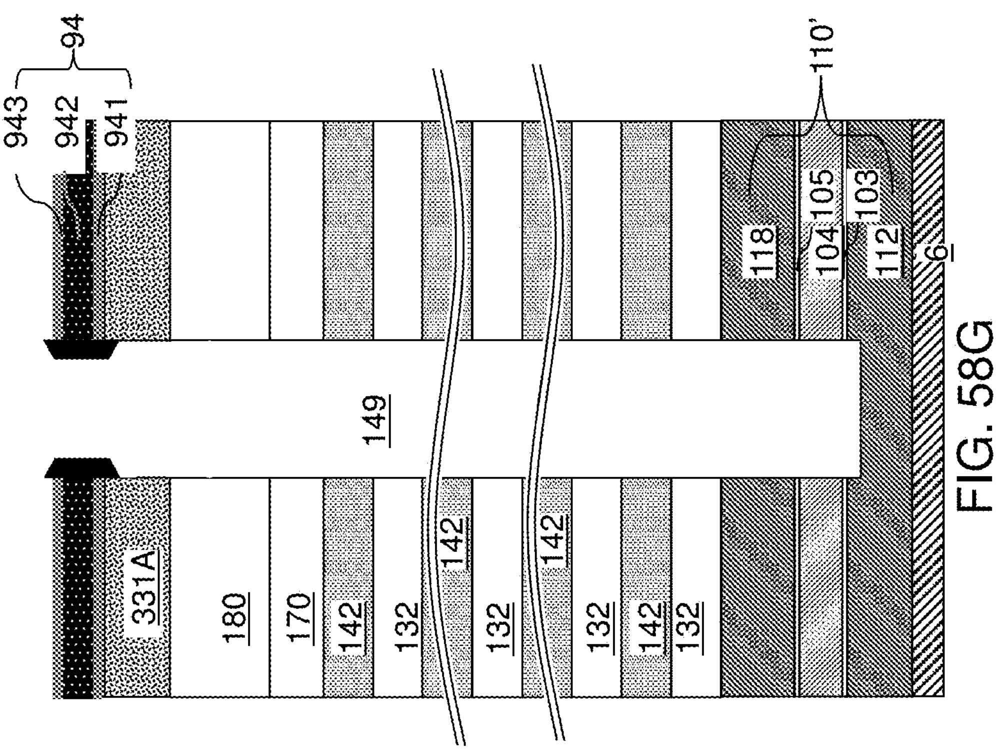

Referring to FIG. 58C, the processing steps of FIG. 56C can be performed to transfer the pattern in the patterned photoresist layer 337 through the first cladding material layer 92 and the lower patterning film 331A.

Referring to FIG. 58D, a selective cladding material deposition process can be performed to grow an additional cladding material after the hard-mask-open anisotropic etch process. During the selective cladding material deposition process, the additional cladding material grows from sidewalls of openings through the first cladding material layer 92 and from sidewalls of openings through the second cladding material layer 94, and does not grow from surfaces of the lower patterning film 331A, from surfaces of the upper patterning film 331C, from surfaces of the intermediate patterning film 331B, or from surfaces of the alternating stack (132, 142). The tubular cladding structure 53C can be formed on each physically exposed sidewalls of the first cladding material layer 92 and the second cladding material layer 94.

Referring to FIGS. 58E to 58H, the respective steps of FIGS. 56E to 56H can be performed. Subsequently, the processing steps described above with reference to FIGS. 29-45 or with reference to FIGS. 11A-19B may be performed. The etch methods of the present disclosure may also be employed to form various second-tier openings (249, 229) at the processing steps of FIGS. 31A and 31B.

FIGS. 59A-59H are sequential vertical cross-sectional view of a region of a memory opening in a sixth configuration of the fourth exemplary structure during formation of the memory opening according to the fourth embodiment of the present disclosure.

Figure 59B:
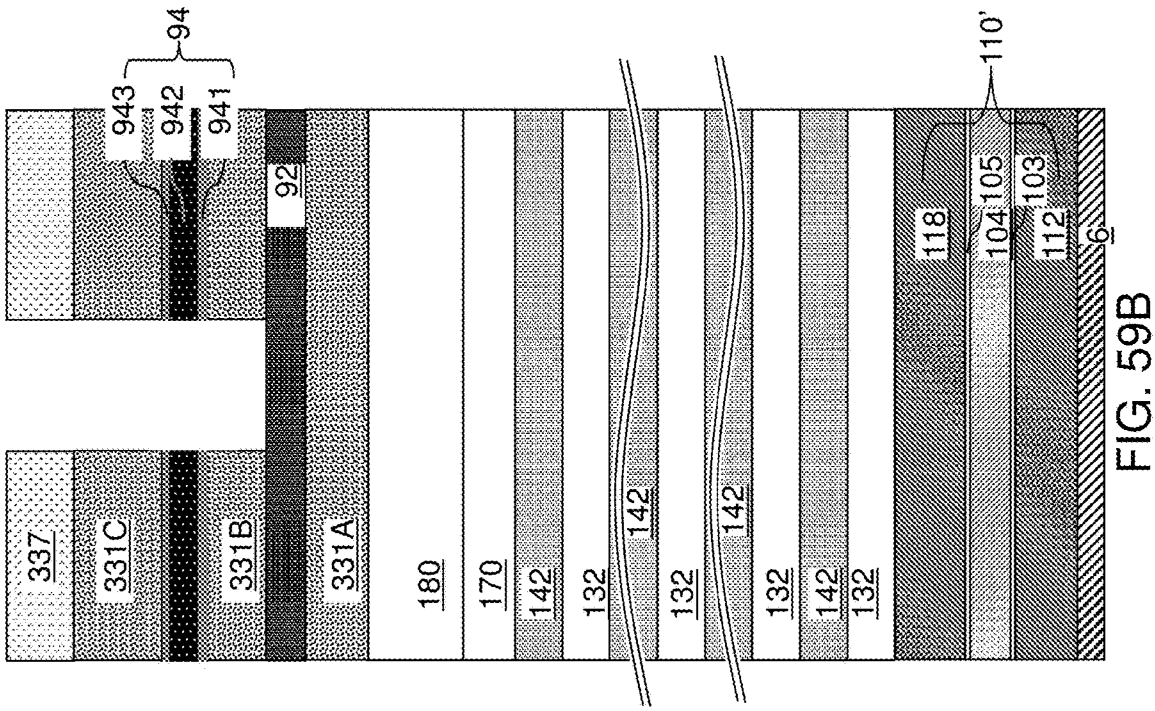
FIGS. 59A-59H are sequential vertical cross-sectional views of a region of a memory opening in a sixth configuration of the fourth exemplary structure during formation of the memory opening according to the fourth embodiment of the present disclosure.
Figure 59A:
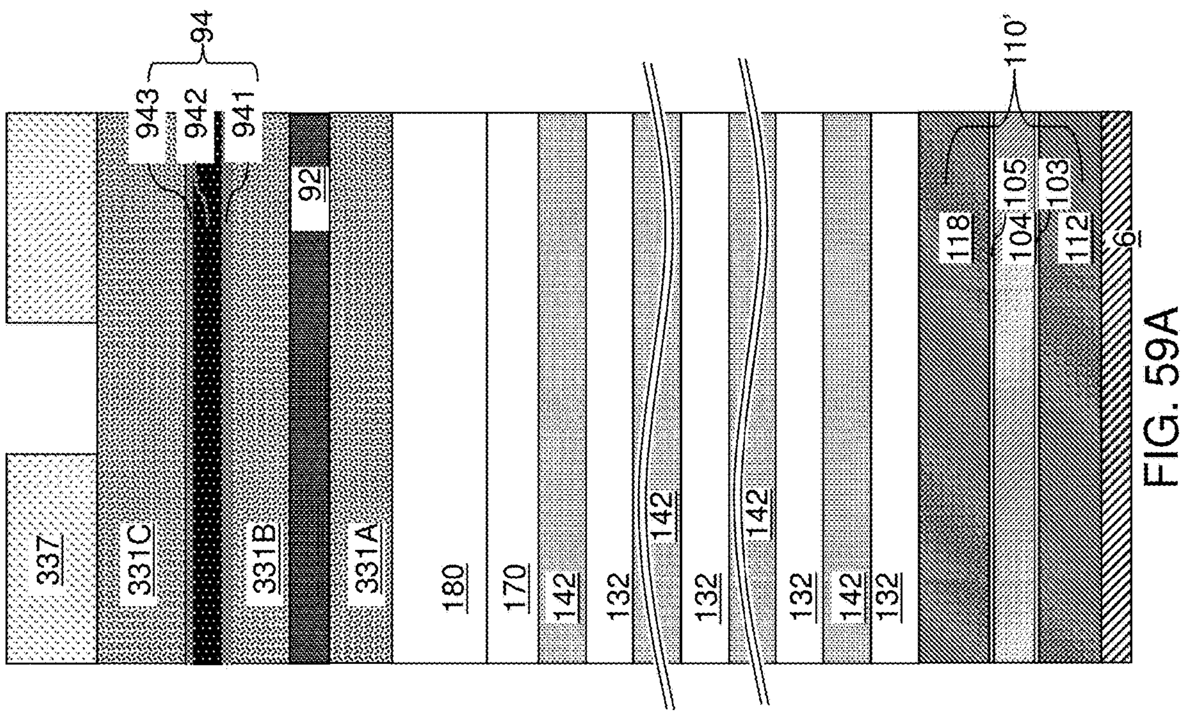

Referring to FIG. 59A, the sixth configuration of the fourth exemplary structure may be the same as the third configuration of the fourth exemplary structure illustrated in FIG. 56A.

Referring to FIG. 59B, the sixth configuration of the fourth exemplary structure may be the same as the third configuration of the fourth exemplary structure illustrated in FIG. 56B.

Figure 59C:
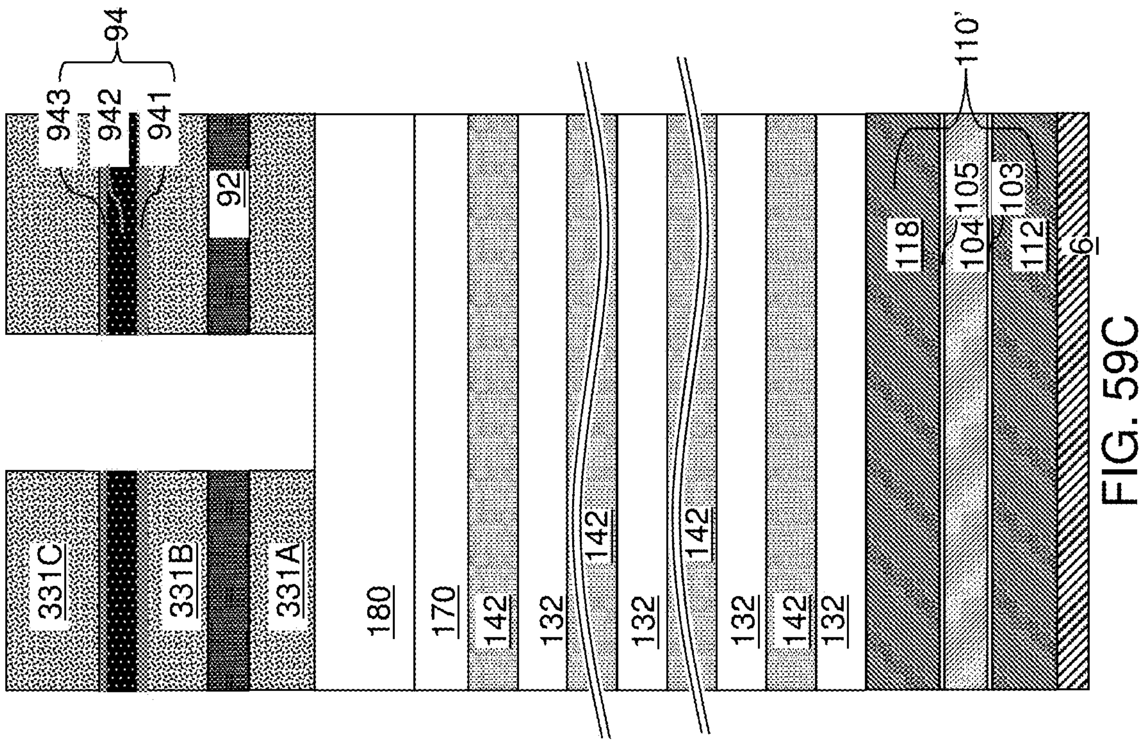

Referring to FIG. 59C, the sixth configuration of the fourth exemplary structure may be the same as the third configuration of the fourth exemplary structure illustrated in FIG. 56C.

Figure 59D:
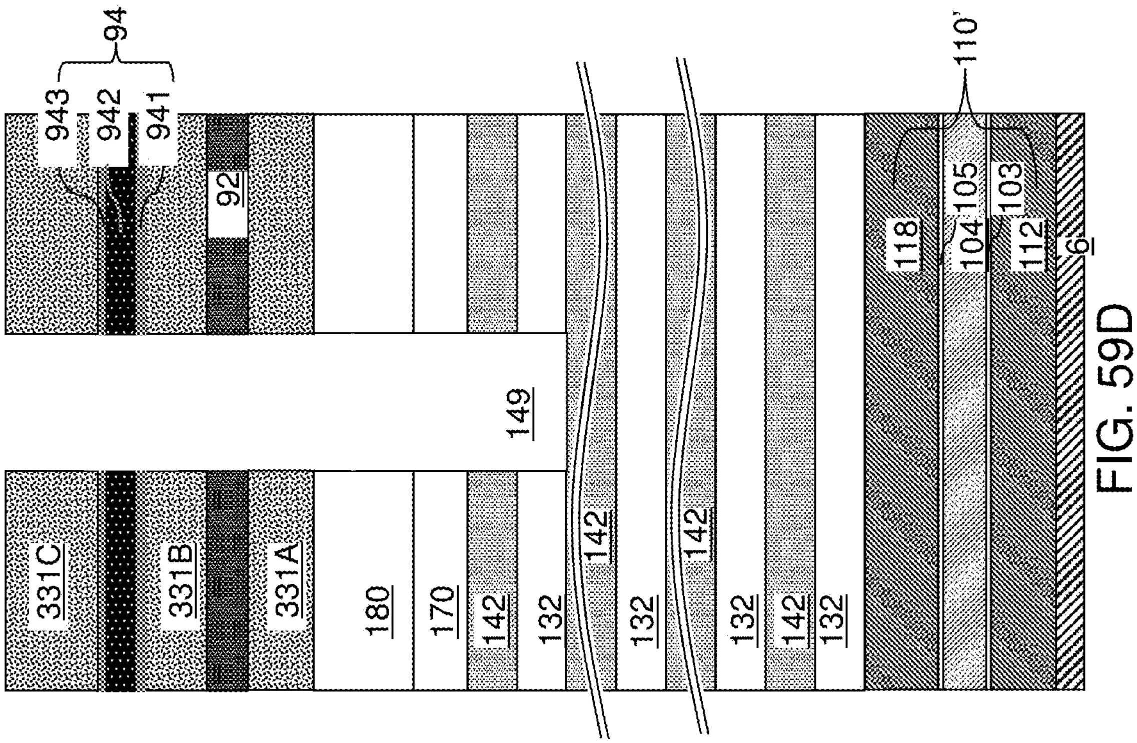

Referring to FIG. 59D, via openings (such as first-tier memory openings 149 and/or first-tier support openings 129, or memory openings 49 and/or support openings 19) can be formed through an upper region of the alternating stack (132, 142) by performing the anisotropic etch process. The upper patterning film 331C is employed as a first etch mask at least during the initial phase of the anisotropic etch process.

Figure 59F:
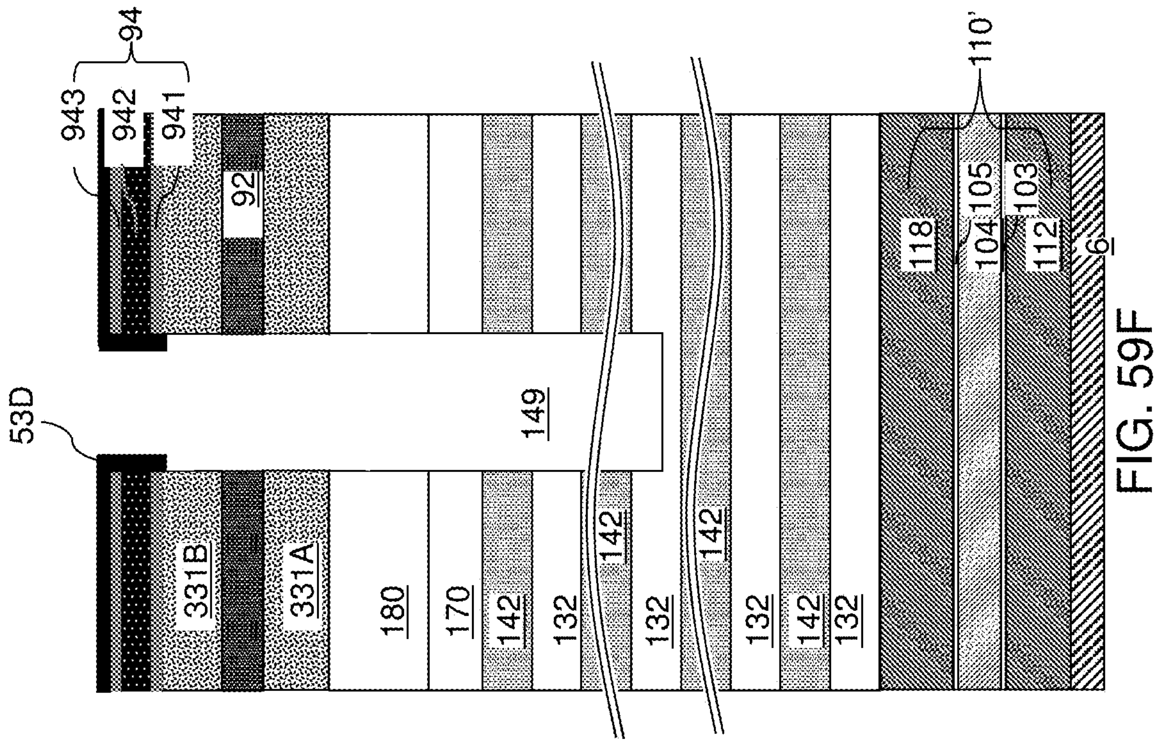
Figure 59E:
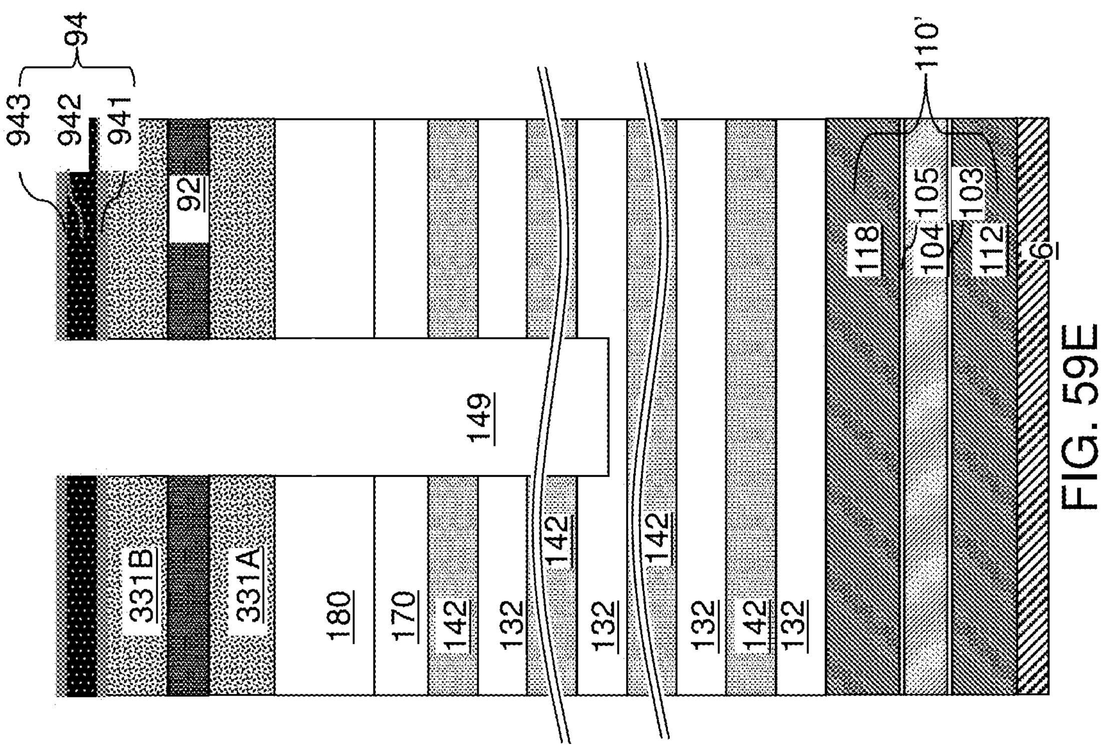

Referring to FIG. 59E, the anisotropic etch process is continued to vertically extend the via openings (such as first-tier memory openings 149 and/or first-tier support openings 129, or memory openings 49 and/or support openings 19) from the upper region of the alternating stack (132, 142) toward a middle region of the alternating stack (132, 142), i.e., through underlying layers within the alternating stack (132, 142). As the anisotropic etch process progresses, the via openings are vertically extended downward, while the material of the upper patterning film 331C is collaterally consumed (i.e., eroded). A top surface of the second cladding material layer 94 can be physically exposed at this point in the anisotropic etch process.

Referring to FIG. 59F, the anisotropic etch process (e.g., a first anisotropic etch process) is terminated and a selective cladding material deposition process can be performed to grow an additional cladding material after the top surface of the second cladding material layer 94 is physically exposed. The additional cladding material can grows from the top surface and sidewalls of the second cladding material layer 94, and does not grow from surfaces of the lower patterning film 331A, from surfaces of the intermediate patterning film 331B, or from surfaces of the alternating stack (132, 142). The deposited additional cladding material can form an additional cladding material layer 53D including a horizontally-extending portion that overlies the second cladding material layer 94, and vertically-extending tubular portions that contact a sidewall of a respective opening in the second cladding material layer 94.

In one embodiment, the selective cladding material deposition process grows the additional cladding material grows from physically exposed surfaces of the second cladding material layer 94, and suppresses growth of the additional cladding material from surfaces of the lower patterning film 331A, from surfaces of the upper patterning film 331C, from surfaces of the intermediate patterning film 331B, or from surfaces of the alternating stack (132, 142). As discussed above, ordinal are herein employed to merely identify similar elements, and the second cladding material layer 94 may be referred to as a first cladding material layer in the Claims of the instant application.

Generally, the additional cladding material that grows from the physically exposed sidewalls of the second cladding material layer 94 may comprise any cladding material that can be selectively grown from the surfaces of the second cladding material layer 94 while suppressing growth from the physically exposed surfaces of the lower patterning film 331A, the intermediate patterning film 331B, and the alternating stack (132, 142). In one embodiment, the additional cladding material may comprise a material that may be employed for the first cladding material layer 92 or for the second cladding material layer 94 in previously described embodiments. In one embodiment, the additional cladding material may comprise a material that can provide higher etch resistance than the intermediate patterning film 331B and/or than the lower patterning film 331A during subsequent anisotropic etch processes.

In one embodiment, the additional cladding material layer 53D may comprise at least one transition metal element such as tungsten, titanium, tantalum, niobium, molybdenum, or ruthenium. The vertical thickness of the horizontally-extending portion of the additional cladding material layer 53D may be in a range from 2 nm to 100 nm, such as from 4 nm to 60 nm, although lesser and greater lateral thicknesses may also be employed. The selective deposition process that forms the additional cladding material layer 53D may comprise an atomic layer deposition process or a chemical vapor deposition process. In some embodiments, an etchant can be flowed simultaneously with a reactant to provide selective growth of the additional cladding material. In an illustrative example, a tungsten deposition process that flows only tungsten hexafluoride gas without any nucleation-assist gas proceeds only on metallic surfaces or semiconductor surfaces, and does not proceed on dielectric surfaces.

In an alternative embodiment, the additional cladding material layer 53D may be formed by a highly non-conformal deposition process such as a physical vapor deposition employing a high degree of collimation, such that the additional cladding material layer 53D is deposited on the top surface of the second cladding material layer 94. However, the additional cladding material layer 53D does not extend into the vias below the masking layers.

Subsequently, a second anisotropic etch process can be performed. For example, the second anisotropic etch process may have the same etch chemistry as the additional anisotropic etch process described with reference to FIG. 54E. The additional cladding material layer 53D may function as an additional etch mask structure during an initial phase of the second anisotropic etch process until the additional cladding material layer 53D is collaterally consumed during the second anisotropic etch process. The additional cladding material layer 53D, the second cladding material layer 94, and the intermediate patterning film 331B may be collaterally consumed during the second anisotropic etch process, and a top surface of the first cladding material layer 92 may be physically exposed at the end of the intermediate anisotropic etch process.

Figure 59G:
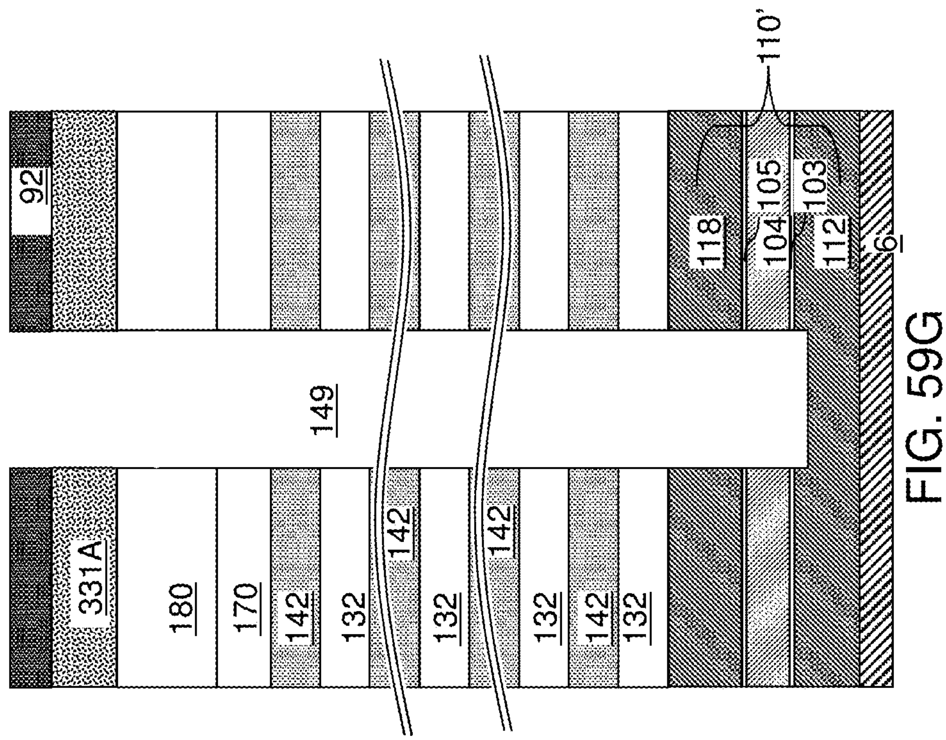
Figure 59H:
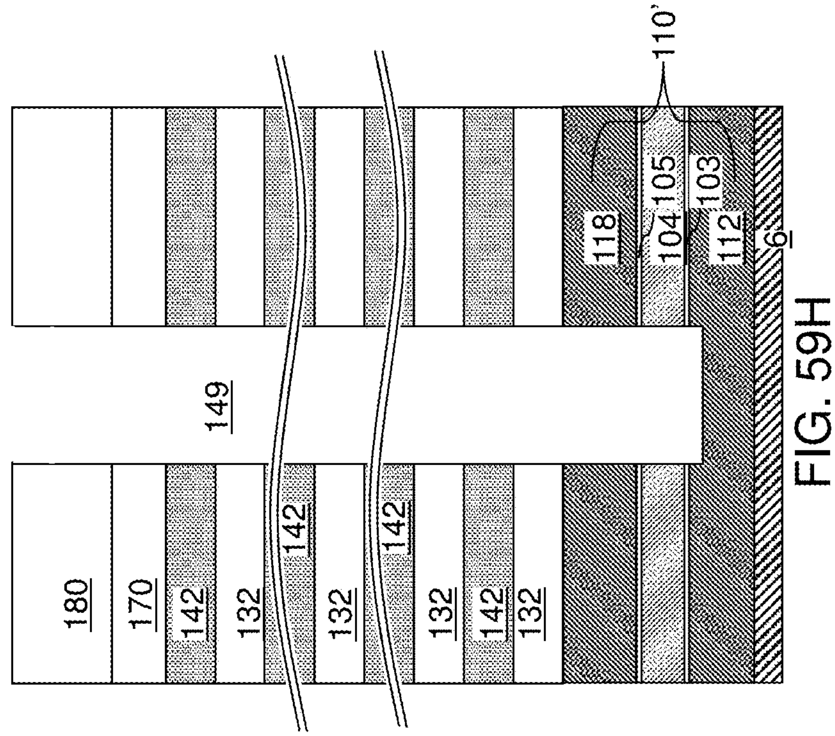
Figure 60B:
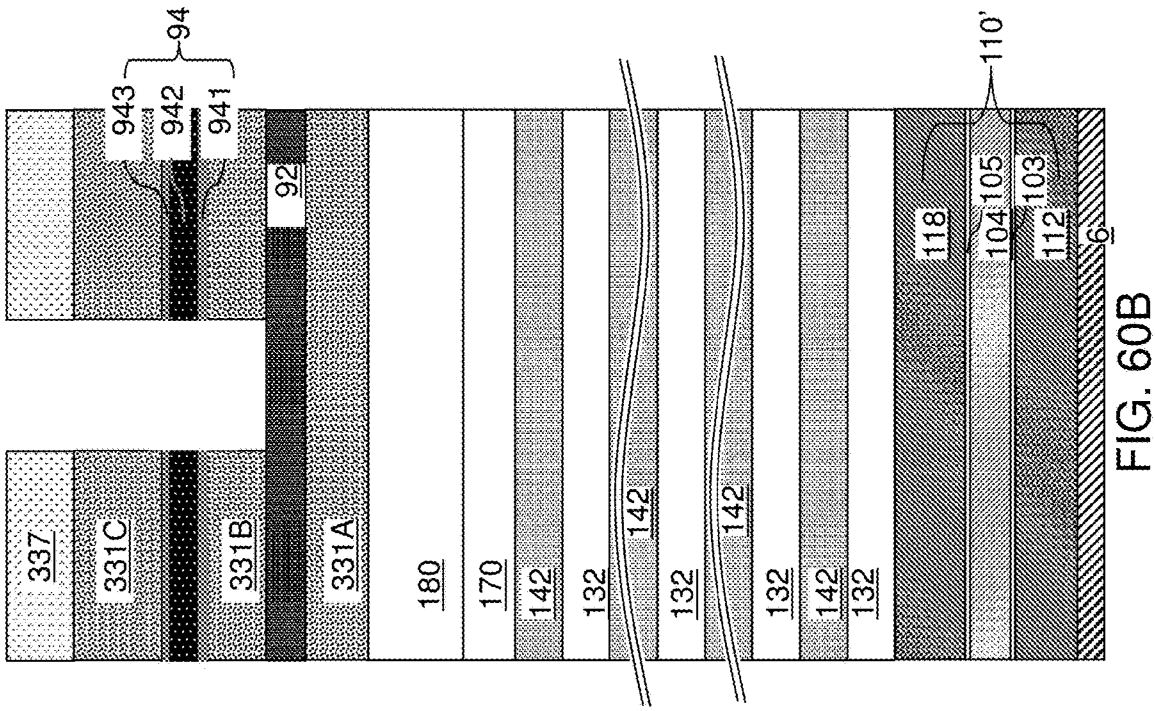
FIGS. 60A-60H are sequential vertical cross-sectional views of a region of a memory opening in a seventh configuration of the fourth exemplary structure during formation of the memory opening according to the fourth embodiment of the present disclosure.
Figure 60A:
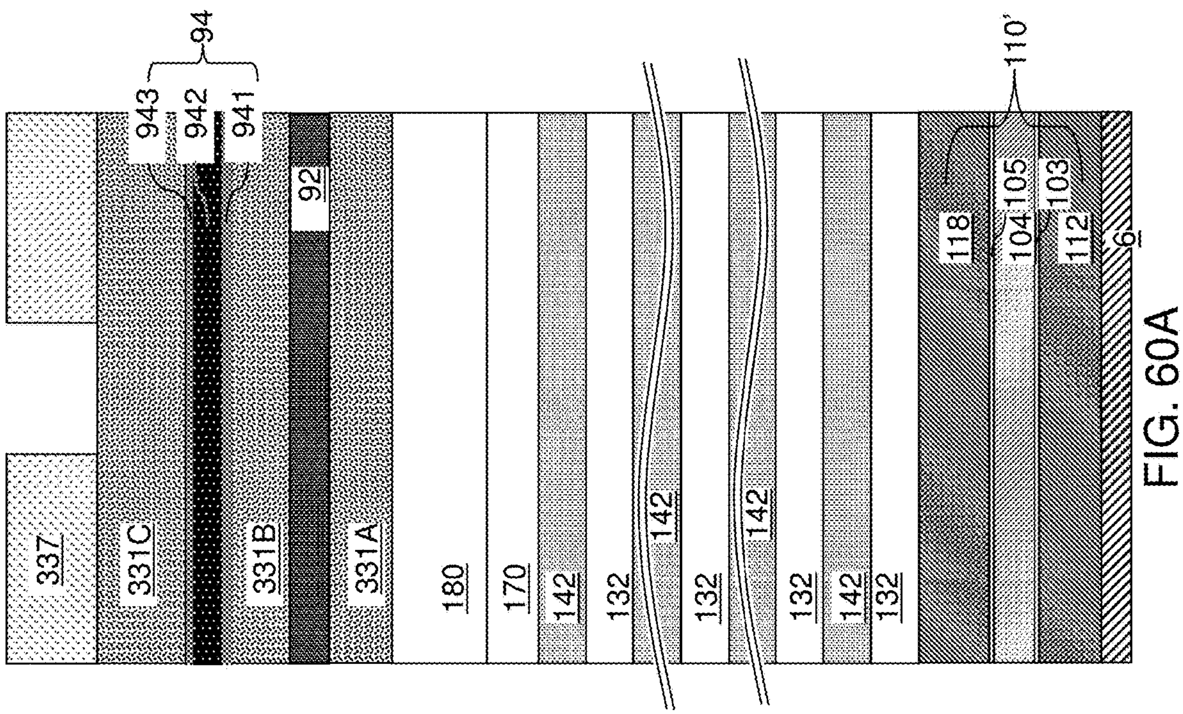
Figure 60C:
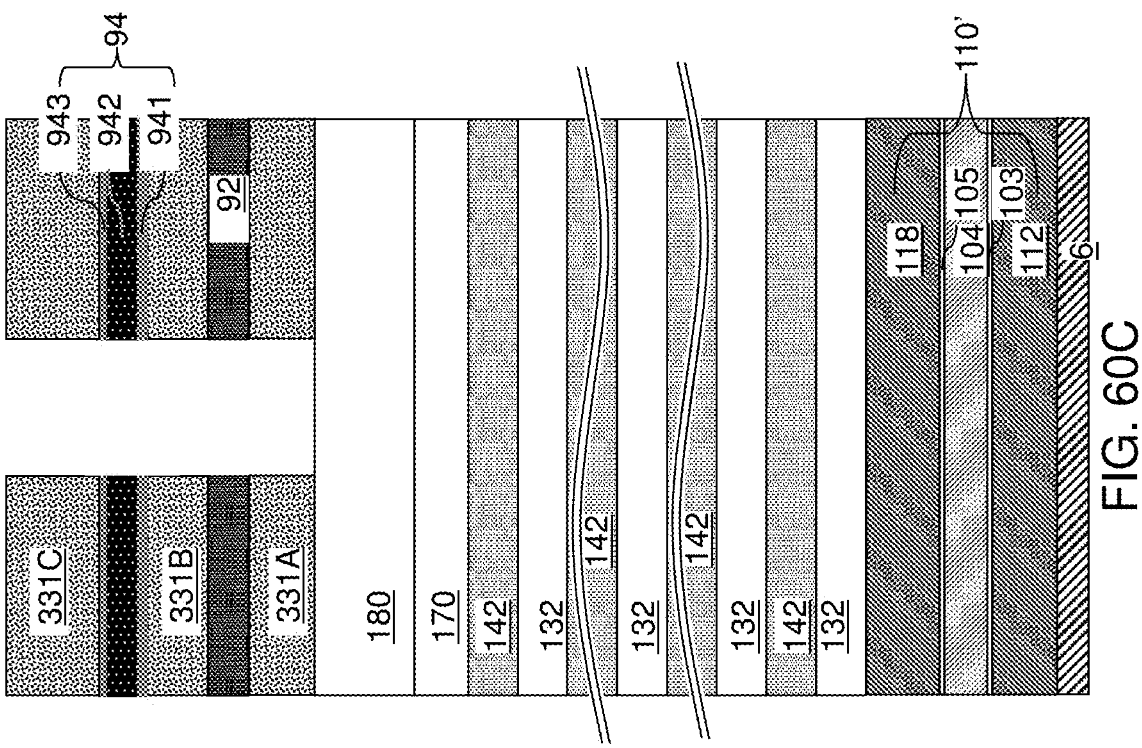
Figure 60D:
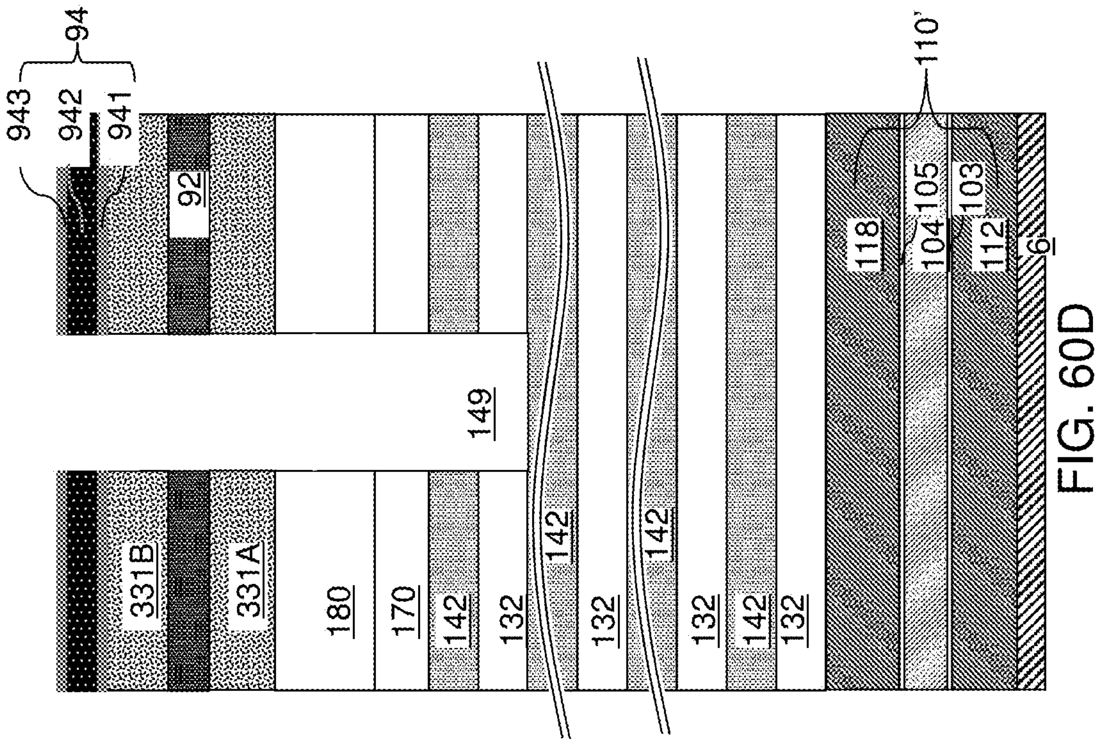
Figure 60F:
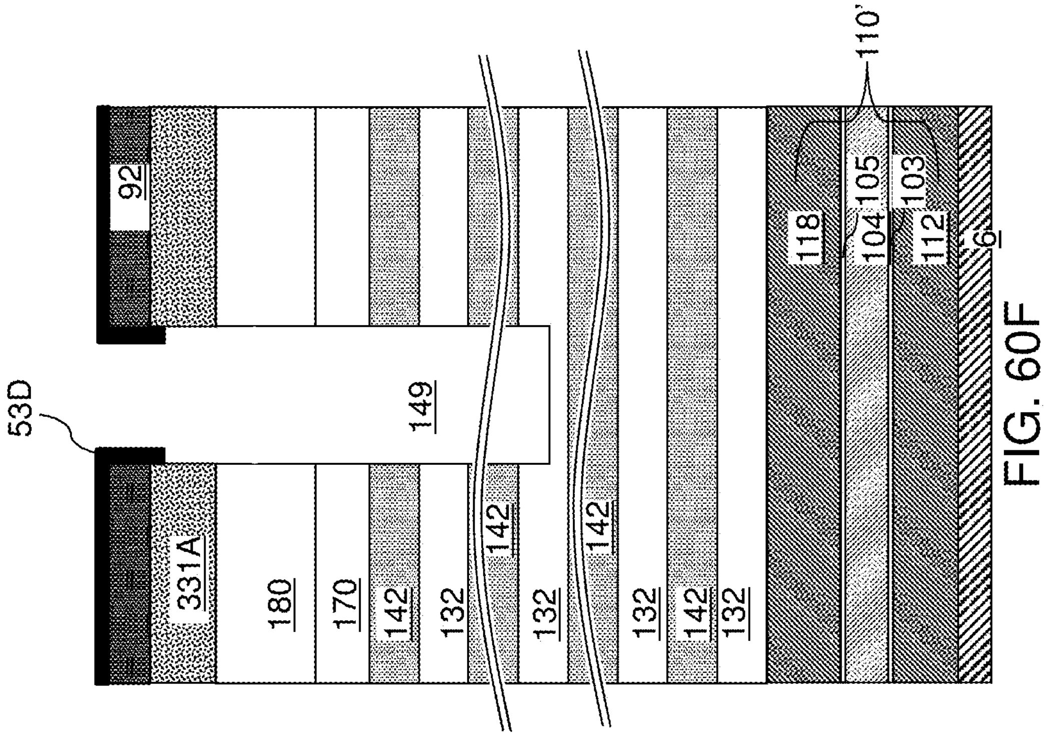
Figure 60E:
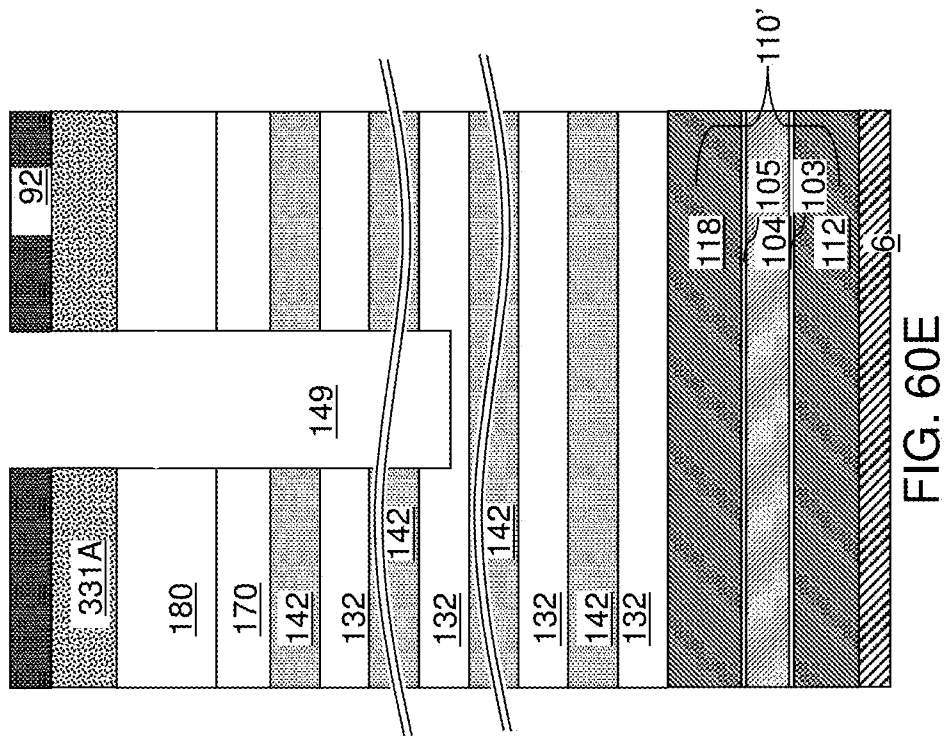
Figure 60H:
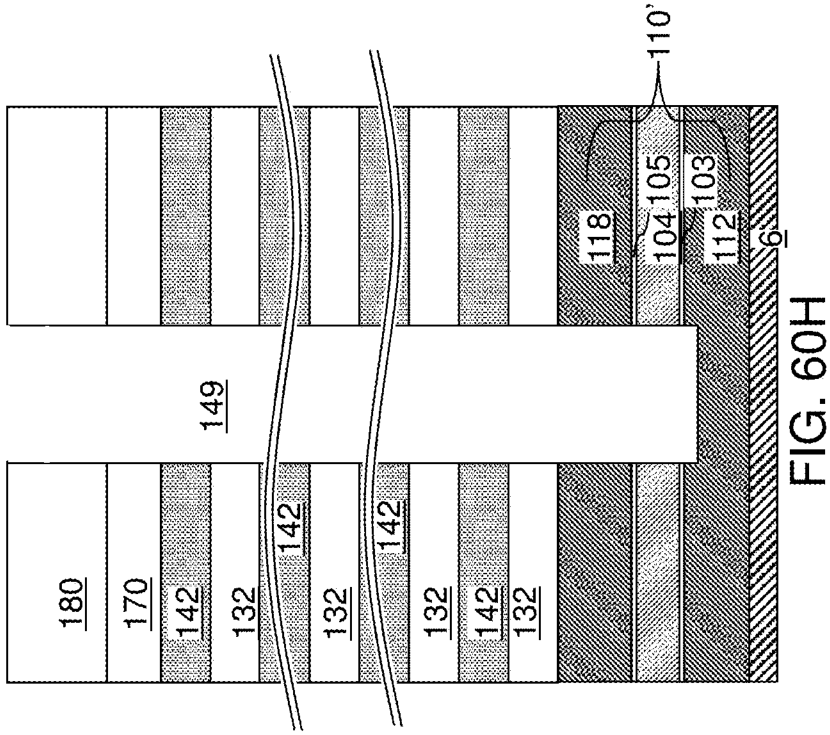
Figure 60G:
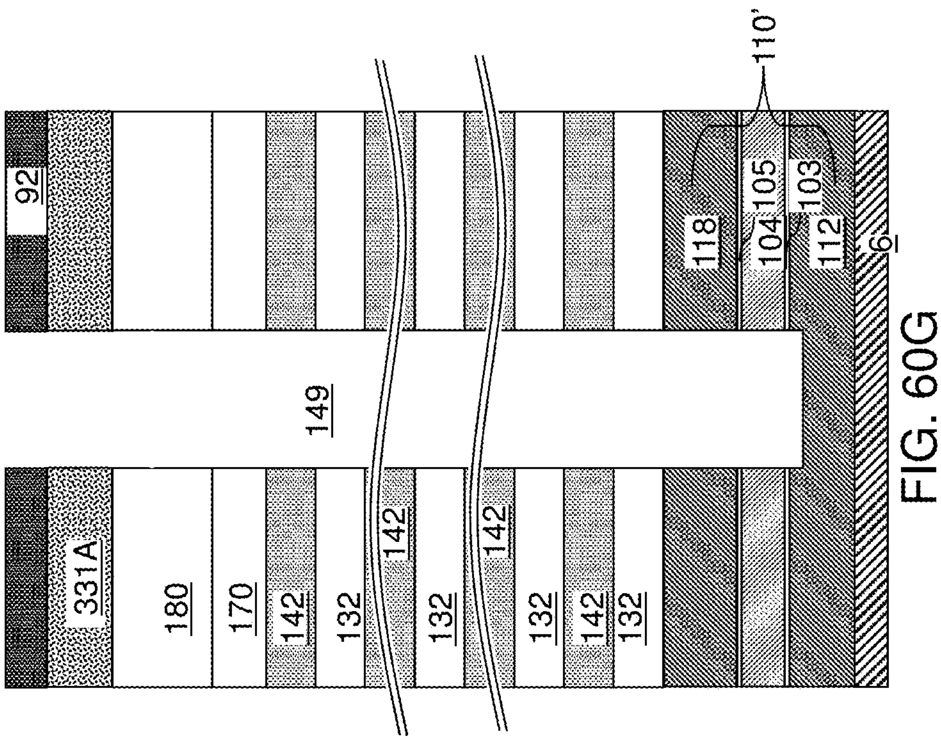

Referring to FIGS. 59G to 57H, the respective steps of FIGS. 56G to 56H can be performed. Subsequently, the processing steps described above with reference to FIGS. 29-45 or with reference to FIGS. 11A-19B may be performed. The etch methods of the present disclosure may also be employed to form various second-tier openings (249, 229) at the processing steps of FIGS. 31A and 31B.

FIGS. 60A-60H are sequential vertical cross-sectional view of a region of a memory opening in a seventh configuration of the fourth exemplary structure during formation of the memory opening according to the fourth embodiment of the present disclosure. Referring to FIGS. 60A to 60H, the respective steps of FIGS. 59A to 59H can be performed, with the modification that the additional cladding material layer 53D is formed on the surface of the first cladding material layer 92 when the upper surface of the first cladding material layer 92 is exposed, instead of or in addition to forming the additional cladding material layer 53D on the second cladding material layer 94.

FIGS. 61A-61M are sequential vertical cross-sectional views of a region of a memory opening in an eighth configuration of the fourth exemplary structure during formation of the memory opening according to the fourth embodiment of the present disclosure.

Figure 61B:
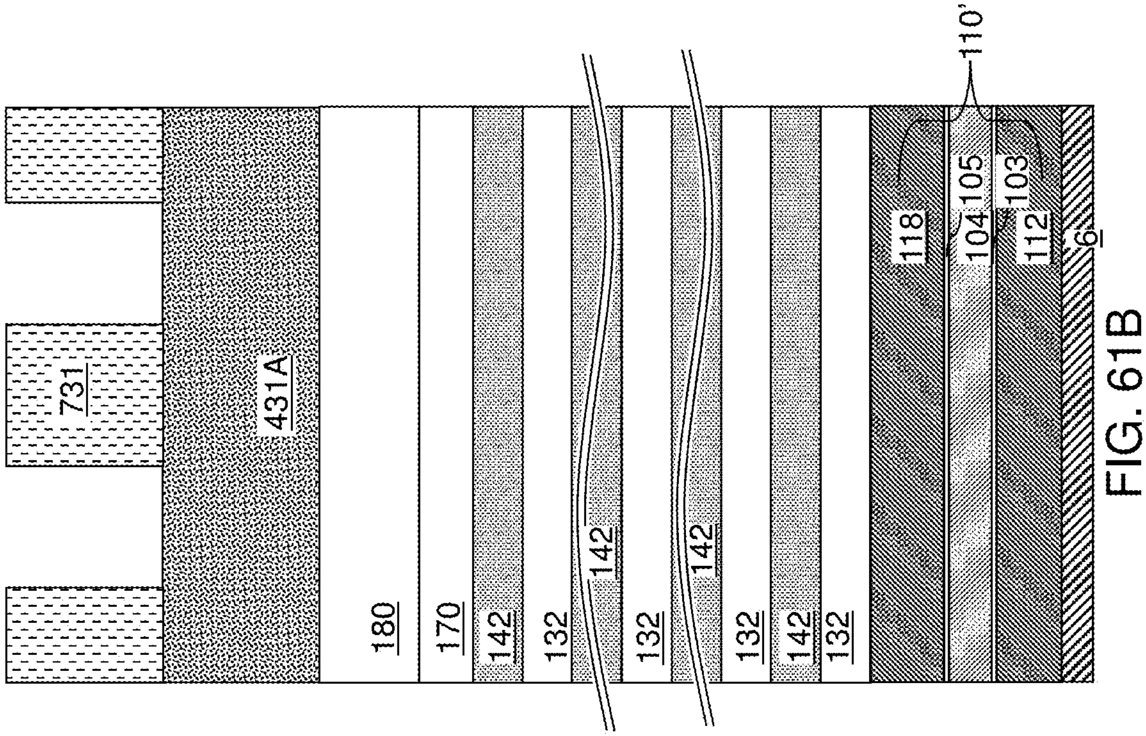
FIGS. 61A-61M are sequential vertical cross-sectional views of a region of a memory opening in an eighth configuration of the fourth exemplary structure during formation of the memory opening according to the fourth embodiment of the present disclosure.
Figure 61A:
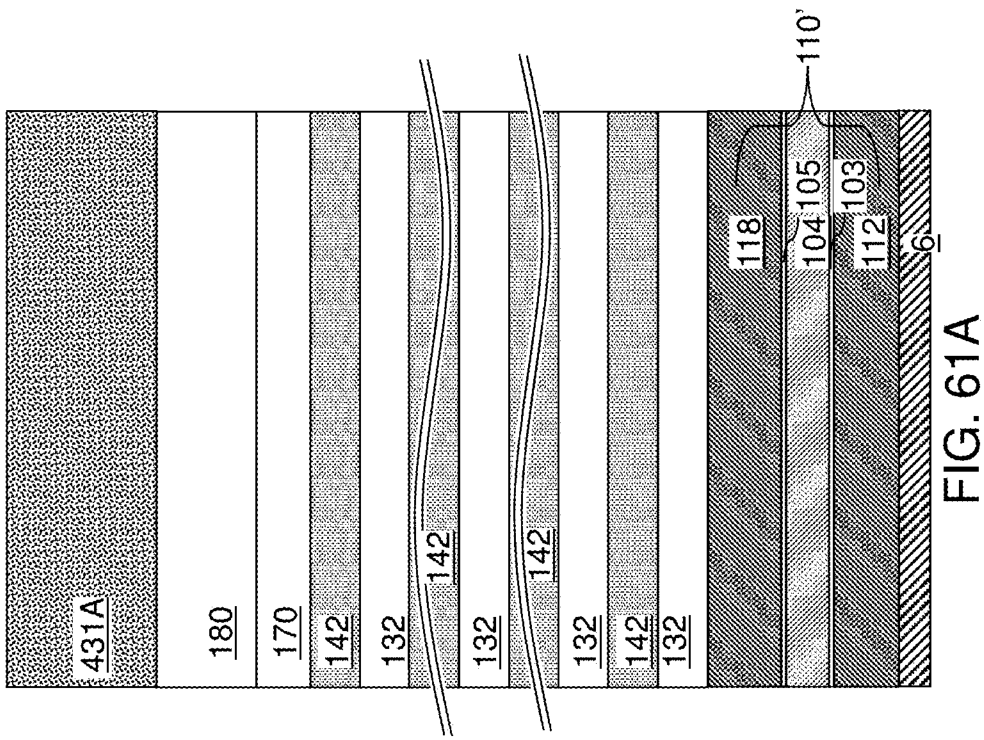

Referring to FIG. 61A, the eighth configuration of the fourth exemplary structure can be derived from the second exemplary structure illustrated in FIG. 22 by applying a first patterning film 431A over the top surface of the second exemplary structure illustrated in FIG. 22. A portion of the memory array region 100 is illustrated in FIG. 61A. Generally, at least one material layer can be formed over a substrate 8, which can be the same as the substrate 8 described above. The at least one material layer may comprise an alternating stack of first material layers and second material layers such as an alternating stack of insulating layers (32, 132) and sacrificial material layers (42, 142) described with reference to the first exemplary structure or the second exemplary structure. The first patterning film 431A may have the same material composition as the patterning film 331 described above, and may have a thickness in a range from 30% to 90% of the thickness of the patterning film 331 described above. In one embodiment, the first patterning film 431A comprises a first carbon-based material including carbon at a first atomic percentage in a range from 75% to 100%.

Referring to FIG. 61B, a first patterned photoresist layer 731 can be formed over the first patterning film 431A. The first patterned photoresist layer 731 can be formed by applying a blanket photoresist material layer and by lithographically patterning the blanket photoresist material layer within a pattern including memory openings and support openings. The pattern of the openings in the first patterned photoresist layer 731 may be the same as the pattern of the first-tier memory openings 149 and the first-tier support openings 119 described above, or may be the same as the pattern of the memory openings 49 and the support openings 19 described above. The openings through the first patterned photoresist layer 731 are herein referred to as first openings.

Figure 61D:
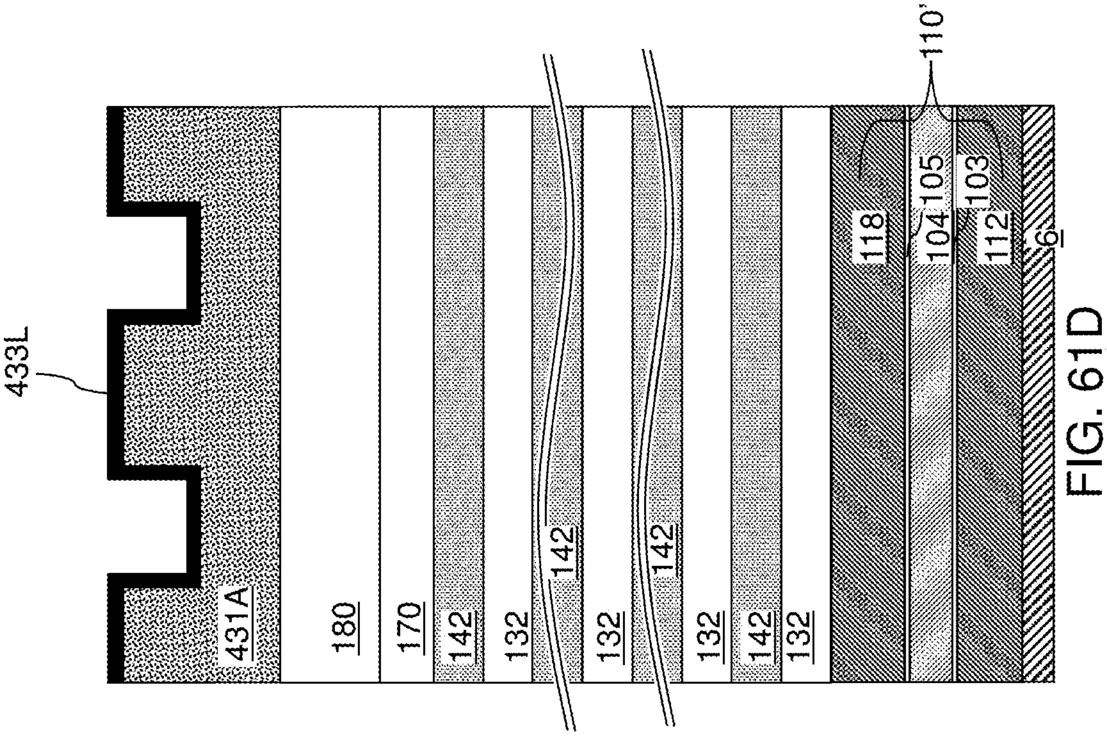
Figure 61C:
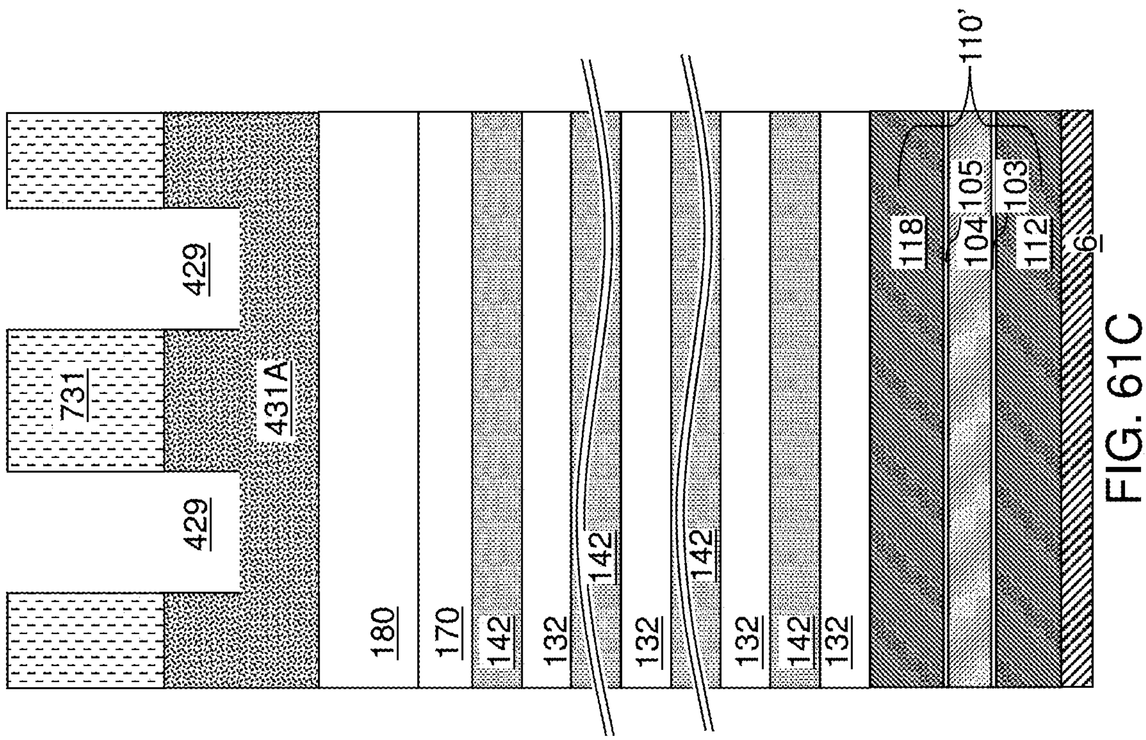

Referring to FIG. 61C, an anisotropic etch process can be performed to etch upper portions of the first patterning film 431A that are not masked by the first patterned photoresist layer 731. Recess cavities 429 can be formed at least in the upper region of the first patterning film 431A in the areas that are not masked by the first patterned photoresist layer 431A. In one embodiment, the recess cavities 429 may have a respective depth that is less than a thickness of the first patterning film 431A. The depth of the recess cavities 429 can be in a range from 10% to 90%, such as from 30% to 80%, of the thickness of the first patterning film 431A. In this embodiment, recessed surfaces of the first patterning film 431A may be physically exposed at a bottom of the recess cavities 429. In one embodiment, the bottom surface of each recess cavity 429 can be a recessed horizontal surface of the first patterning film 431A. In one embodiment, each the recess cavities 429 may have a respective horizontal cross-sectional shape of a circle or and ellipse. Generally, the pattern of the recess cavities 429 may include the pattern of the first-tier memory openings 149 and the first-tier support openings 119 described above, or may be the same as the pattern of the memory openings 49 and the support openings 19 described above. The first patterned photoresist layer 731 can be subsequently removed by any suitable method.

Referring to FIG. 61D, a cladding material layer 433L can be conformally deposited on physically exposed surfaces of the recess cavities 429 and over a top surface of the first patterning film 431A. The cladding material layer 433L may include any of the cladding materials described above. In one embodiment, the cladding material layer 433L may comprise, and/or may consist essentially of, a material selected from a transition metal, a metal nitride material, a metal carbide material, a semiconductor material, or a dielectric metal oxide material having a dielectric constant greater than 7.9. The thickness of the cladding material layer 433L may be in a range from 5 nm to 30 nm, such as from 10 nm to 20 nm, although lesser and greater thicknesses may also be employed. Generally, the thickness of the cladding material layer 433L may be in a range from 2% to 20% of the maximum lateral dimension of the recess cavities 429 as formed at the processing steps of FIG. 61C.

Figure 61E:
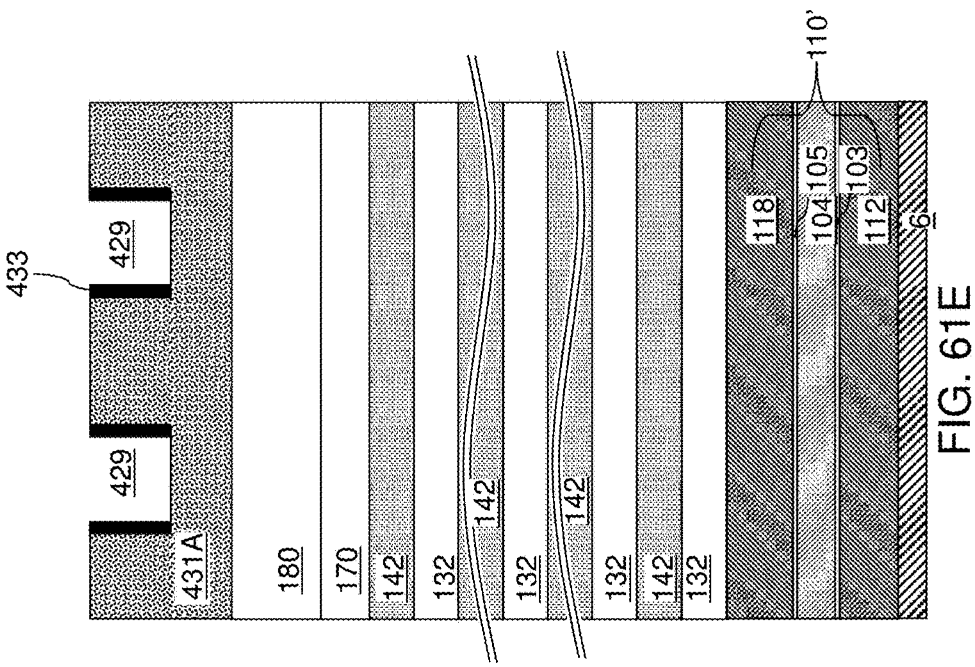

Referring to FIG. 61E, an anisotropic etch process (e.g., a sidewall spacer etch process) can be performed to remove horizontally-extending portions of the cladding material layer 433L by anisotropically etching the cladding material layer 433L, wherein a remaining portion of the cladding material layer 433L located inside the recess cavity 429 comprises the cylindrical cladding film (i.e., cladding film sidewall spacers) 433. A two-dimensional array of cylindrical cladding films 433 can be formed on the first patterning film 431A. Each of the cylindrical cladding films 433 can be formed on a sidewall of a respective recess cavity 429. Each of the cylindrical cladding films 433 comprises a cladding material that is selected from a transition metal, a metal nitride material, a metal carbide material, a semiconductor material, or a dielectric metal oxide material having a dielectric constant greater than 7.9.

Figure 61F:
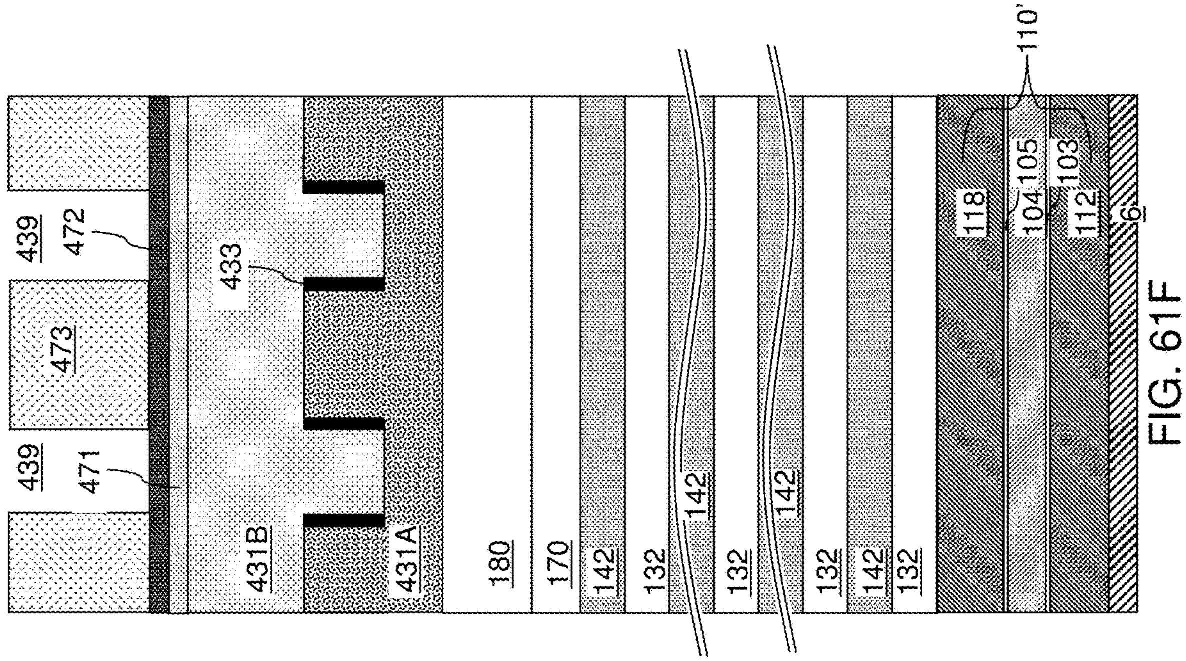

Referring to FIG. 61F, a second patterning film 431B can be formed over the cylindrical cladding film 433 and the first patterning film 431A such that it fills the recess cavities 429 and preferably extends above the top surface of the first patterning film 431A. Generally, the second patterning film 431B may have any material composition that the patterning film 331 described above may have, and may have a thickness in a range from 10% to 80% of the thickness of the patterning film 331 described above. In one embodiment, the first patterning film 431A comprises a second carbon-based material including carbon at a first atomic percentage in a range from 75% to 100%. The material composition of the second patterning film 431B may be the same as or may be different from the material composition of the first patterning film 431A. The second patterning film 431B may be self-planarizing, or may be planarized. Alternatively, the thickness of the second patterning film 431B may be selected such that the a topographical variation of the top surface of the second patterning film 431B does not adversely impact a lithographic patterning process to be subsequently employed.

At least one masking material layer (471, 472) can be over the second patterning film 431B. In one embodiment, the at least one masking material layer (471, 472) may comprise at least one of a spin-on-glass (SOG) layer 471 and/or a spin-on-carbon (SOC) layer 472. In one embodiment, the at least one masking material layer (471, 472) may comprise a layer stack including a spin-on-glass layer 471 and a spin-on-carbon layer 472. Generally, any material that may assist transfer of a lithographic pattern in a photoresist layer to be subsequently formed may be employed for the at least one masking material layer (471, 472).

A second patterned photoresist layer 473 can be formed over the at least one masking material layer (471, 472) by applying a blanket photoresist material layer on a top surface of the at least one masking material layer (471, 472), and by lithographically patterning the blanket photoresist material layer with a lithographic pattern. In one embodiment, the lithographic pattern formed in the second patterned photoresist layer 473 may be the same as the pattern of the first openings. The openings formed in the second patterned photoresist layer 473 are herein referred to as second openings 439. In one embodiment, the pattern of the second openings 439 formed in the second patterned photoresist layer 473 may be the same as the pattern of the first openings formed in the first patterned photoresist layer 471. In one embodiment, the size of the second openings in the second patterned photoresist layer 473 may be scaled down such that the periphery of each second opening in the second photoresist layer 473 is located between an inner sidewall and an outer sidewall of a respective underlying cylindrical cladding film 433 in a plan view. In one embodiment, the bottom periphery of each second opening 439 in the second photoresist layer 473 may be located between an inner sidewall and an outer sidewall of a respective underlying cylindrical cladding film 433 in the plan view. A plan view refers to a view along a vertical direction, such as a see-through top-down view.

Figure 61G:
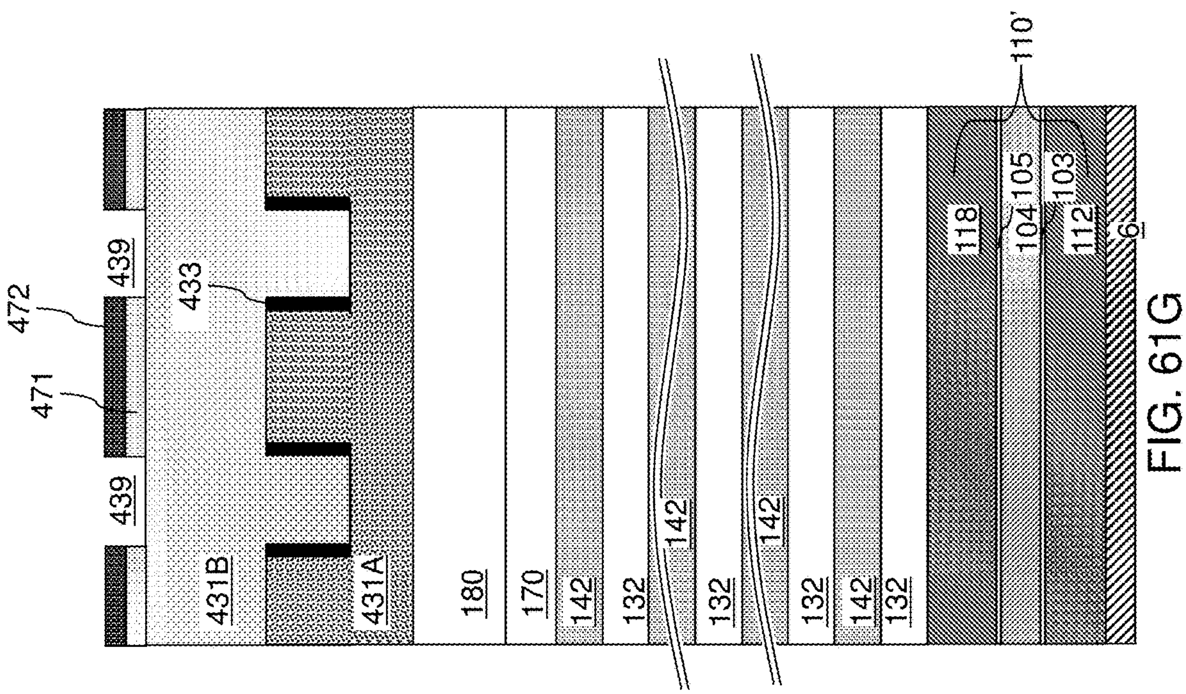

Referring to FIG. 61G, an anisotropic etch process can be performed to transfer the pattern in the second patterned photoresist layer 473 through the at least one masking material layer (471, 472). Unmasked portions of the at least one masking material layer (471, 472) can be anisotropically etched underneath the second openings in the second patterned photoresist layer 473. The remaining portion of the at least one masking material layer (471, 472) comprises a masking structure (471, 472). The masking structure (471, 472) may comprise a layer stack including a spin-on-glass layer 471 and a spin-on-carbon layer 472. In one embodiment, the masking structure (471, 472) may include at least one two-dimensional array of the second openings 439. Generally, the masking structure (471, 472) is formed over the second patterning film 431B with at least one discrete second opening 439. The discrete second openings 439 may have an areal overlap within an area of the respective one of the recess cavities 429, which is the area laterally enclosed by an outer sidewall of a respective one of the cylindrical cladding film 433. Generally, each discrete second opening 439 in the masking structure (471, 472) may have an area that overlaps with an entirety of an area enclosed by an inner sidewall of a respective underlying cylindrical cladding film 433, and is located entirely within an area enclosed by an outer sidewall of the respective underlying cylindrical cladding film 433. Thus, the area of each discrete second opening 439 in the masking structure (471, 472) in a plan view may be located entirely within an area enclosed by an outer sidewall of a respective underlying cylindrical cladding film 433. The pattern of the discrete second openings 439 in the masking structure (471, 472) is herein referred to as a first pattern. The second photoresist layer 473 may be removed by any suitable method after extending the second openings 439 into the masking structure (471, 472).

Figure 61H:
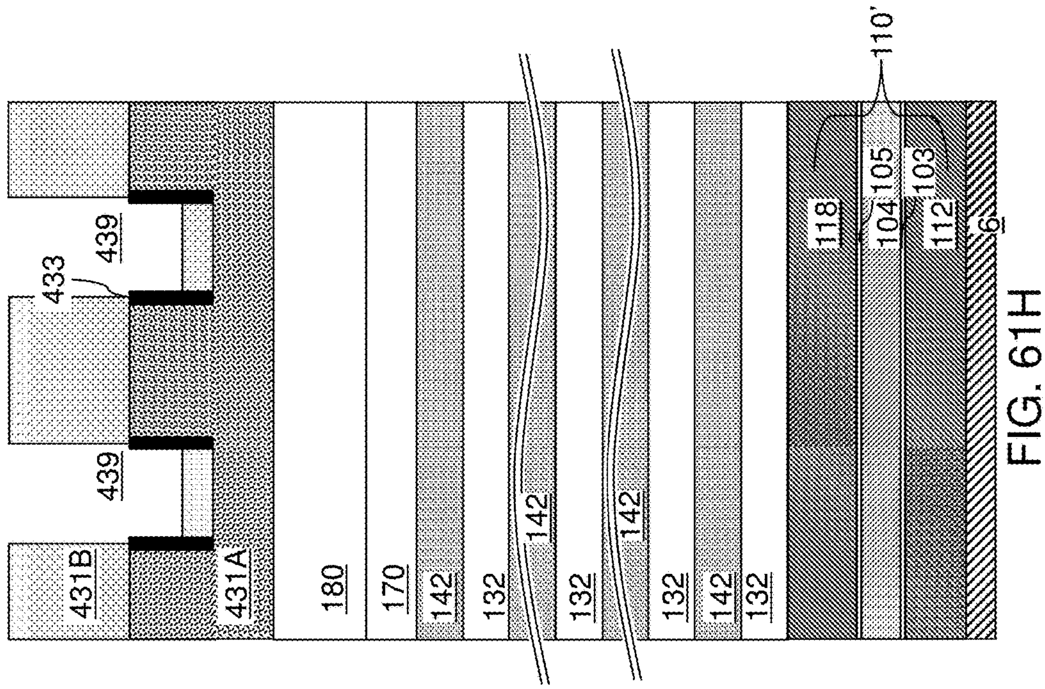

Referring to FIG. 61H, a first mask open etch step can be performed to transfer the first pattern of the discrete second openings 439 in the masking structure (471, 472) through the second patterning film 431B selective to the cylindrical cladding film 433. The first mask open etch step may employ a first mask open anisotropic etch process, which etches the material of the second patterning film 431B selective to the material(s) of the masking structure (471, 472) and selective to the material of the cylindrical cladding films 433. A predominant portion (i.e., more than 50) of each portion of the second patterning film 431B that is laterally surrounded by a respective cylindrical cladding film 433 can be removed by the first mask open etch step. In one embodiment, the entirety of each portion of the second patterning film 431B that is laterally surrounded by a respective cylindrical cladding film 433 can be removed by the first mask open etch step. The masking structure (471, 472) may be collaterally removed during the first mask open etch stop.

Figure 61J:
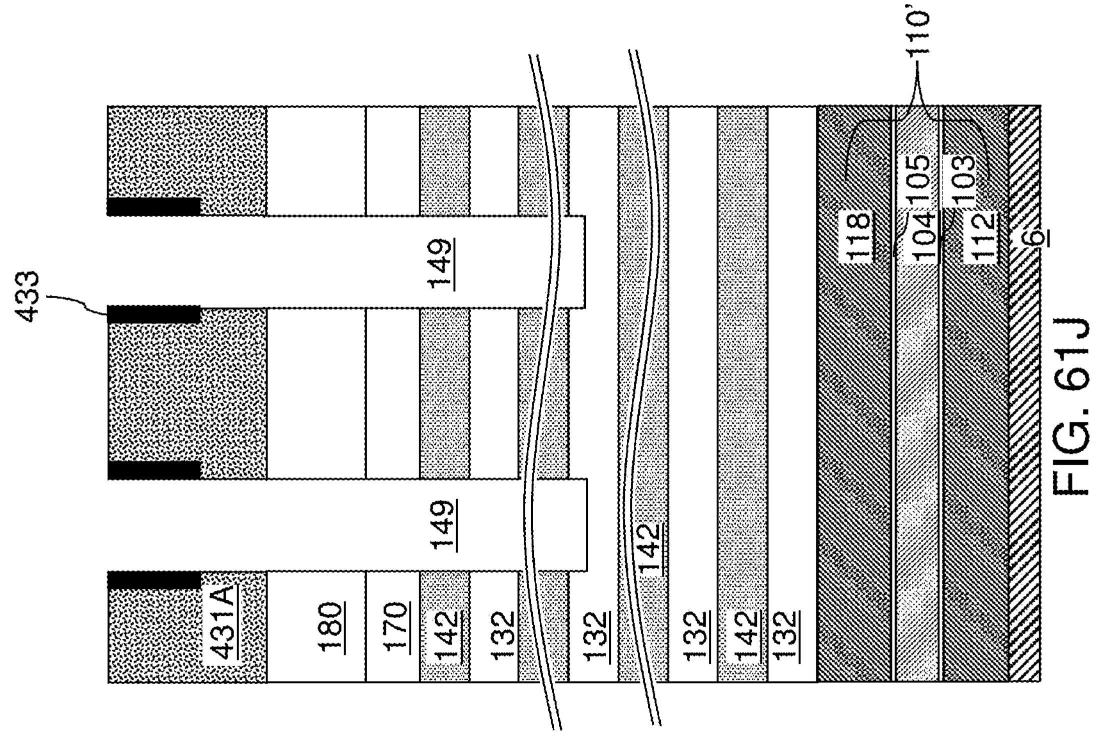
Figure 61I:
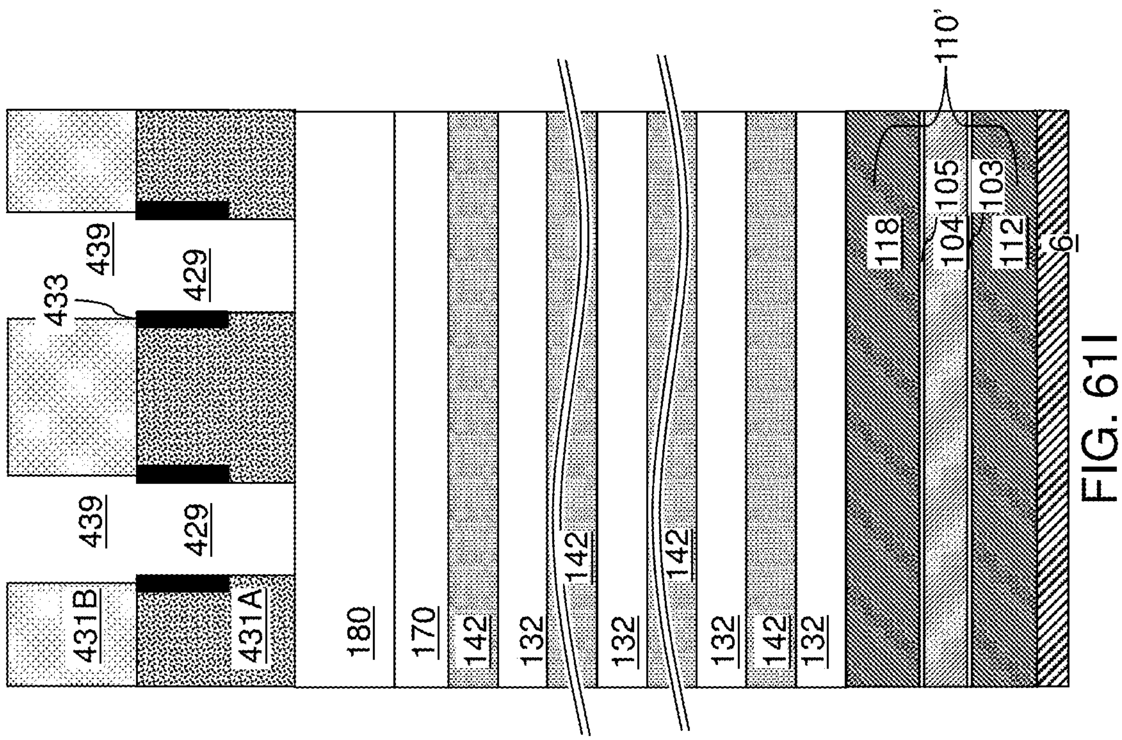

Referring to FIG. 61I, a second mask open etch step can be performed to transfer a second pattern of the second openings 439 in the area defined by an inner sidewall of the cylindrical cladding film 433 through the first patterning film 431A. The second mask open etch stop may employ a second mask open anisotropic etch process, which etches unmasked portions of the first patterning film 431A and may collaterally etch the second patterning film 431B. The second pattern can be a composite pattern employing a combination of the cylindrical cladding films 433 and the second patterning film 431B. Portions of the first patterning film 431A that are not covered by the combination of the cylindrical cladding films 433 and the second patterning film 431B are etched during the second mask open anisotropic etch process. The first patterning film 431A can be etched through in areas that are not covered by the combination of the cylindrical cladding films 433 and the second patterning film 431B. A top surface of the at least one underlying material layer (e.g., layer 180) that underlies the first patterning film 431A can be physically exposed underneath each opening through the first patterning film 431A.

Referring to FIG. 61J, the second pattern can be transferred into the at least one material layer by performing a main etch process. The main etch may form the memory openings 149 and/or the support openings through the alternating stack (132, 142) which underly the respective first and the second openings (429, 439). The second patterning film 431B can be collaterally removed during an initial step of the main etch process.

Figure 61L:
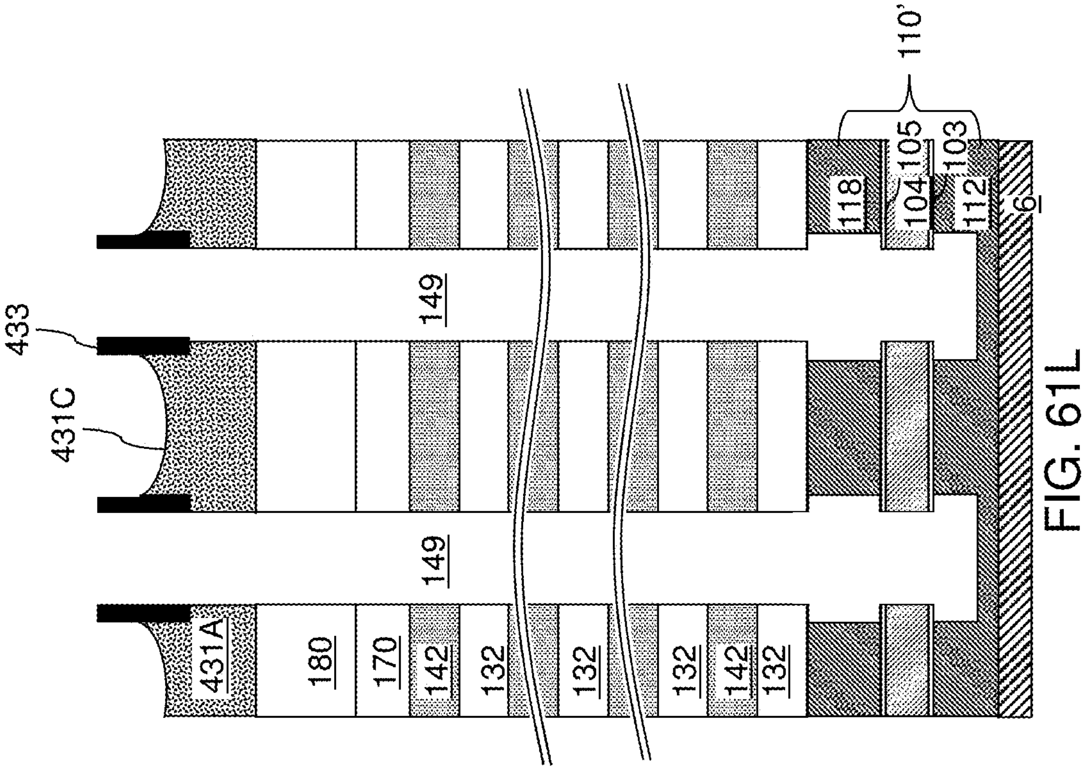
Figure 61K:
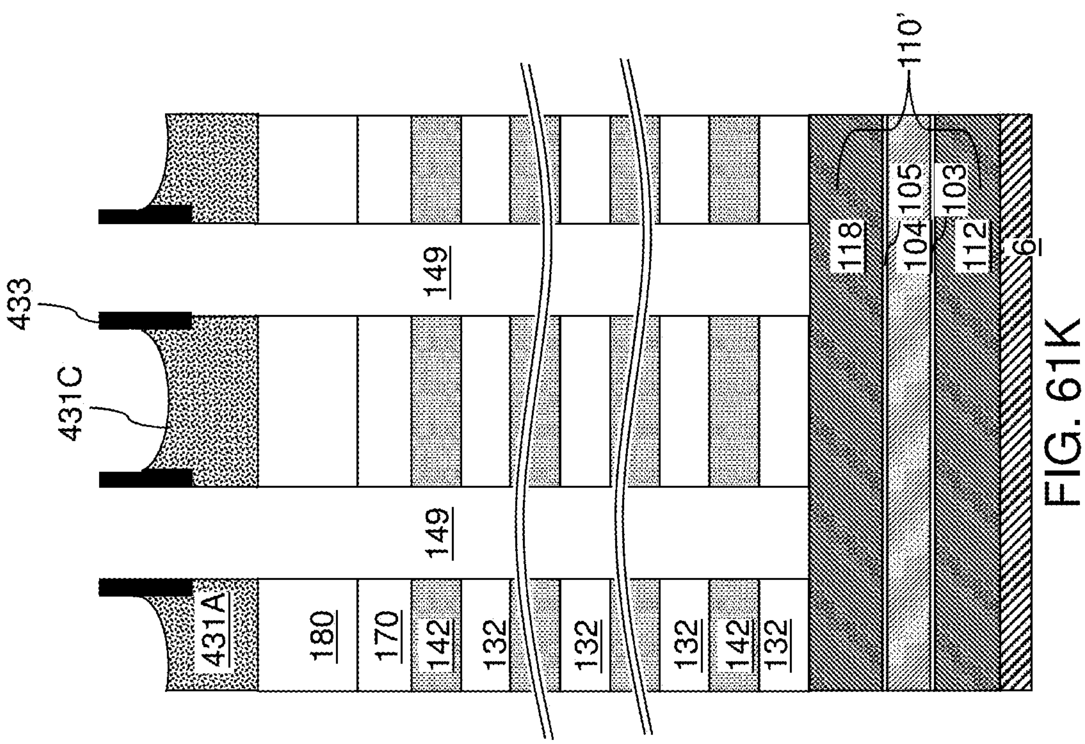

Referring to FIG. 61K, after the second patterning film 431B is removed, the combination of the first patterning film 431A and the cylindrical cladding films 433 can be employed as an etch mask during the remainder of the main etch process. In one embodiment, the main etch process comprises a reactive ion etch process in which a collateral etch rate of the first patterning film 431A is limited by a flux of etchant ions, and a collateral etch rate of the cylindrical cladding film 433 is lower than an average of the collateral etch rate of the first patterning film 431A. In one embodiment, a top surface of the first patterning film 431A may be vertically recessed below a top surface of the cylindrical cladding film 433 such that a region of the top surface of the first patterning film 431A that is proximal to the cylindrical cladding film 433 has a concave surface 431C in a terminal portion of the reactive ion etch process. In one embodiment, the at least one underlying material layer comprises an alternating stack of first insulating layers 132 and first sacrificial material layers 142, or an alternating stack of insulating layers 32 and sacrificial material layers 42. In this case, the alternating stack may be etched through during the anisotropic etch process.

The concave surface 431C has a middle portion located closer to the alternating stack than a peripheral portion. The concave surface 431C acts as an ion trap which traps the ions used during the reaction ion etching. The ion trap prevents or reduces the trapped ions from being deflected sideways by the etch mask (e.g., first patterning film 431 and cylindrical cladding film 433) onto the sidewalls of the via openings (49, 149). The decrease in deflected ions decreases undesirable bowing and/or critical diameter enlargement of the via openings. In contrast, for prior art etch masks having a convex top surface, ions are deflected sideways onto the sidewalls of the via openings, which causes undesirable bowing and/or critical diameter enlargement of the via openings.

Referring to FIG. 61L, in case the at least one underlying material layer comprises an in-process source-level material layers 110', via openings (such as first-tier memory openings 149 or memory openings 49) may be vertically extended into the in-process source-level material layers 110'.

Figure 61M:
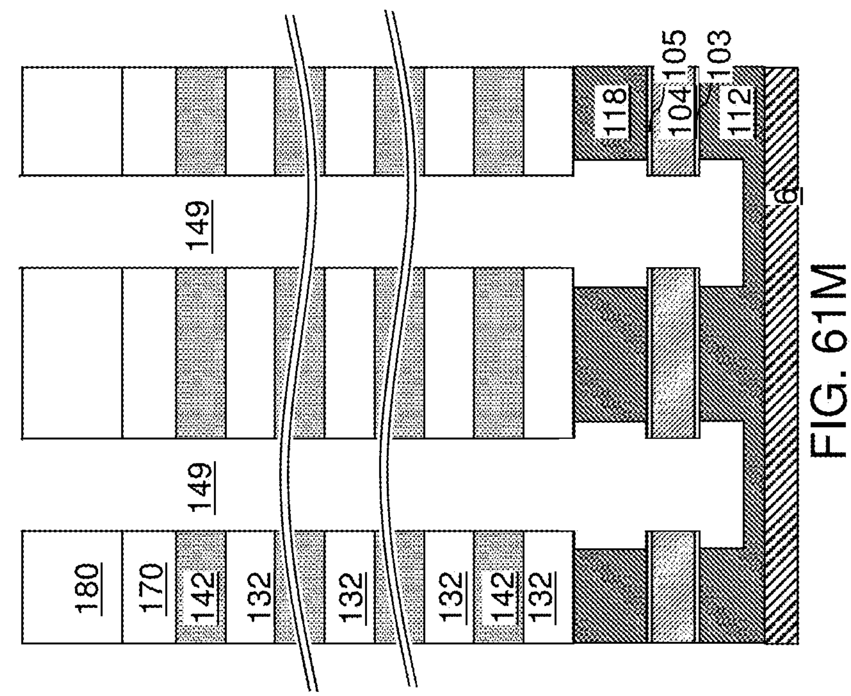

Referring to FIG. 61M, remaining portions of the first patterning film 431A and the cylindrical cladding film 433 can be removed. For example, the remaining portions of the first patterning film 431A and the cylindrical cladding film 433 can be removed during the etch of the in-process source-level material layers 110'. Alternatively, an ashing process can be performed to remove the first patterning film 431A and to lift-off and remove the cylindrical cladding film 433 after forming the via openings in the in-process source-level material layers 110'.

Subsequently, various processing steps described above with reference to the first or second exemplary structure may be performed. For example, a memory opening fill structure may be formed in each via opening that is formed through the alternating stack by the main etch process. Each of the memory opening fill structures may comprise a respective vertical semiconductor channel 60 and a respective vertical stack of memory elements.

FIGS. 62A-62G are sequential vertical cross-sectional views of a region of a memory opening in a ninth configuration of the fourth exemplary structure during formation of the memory opening according to the fourth embodiment of the present disclosure.

Figure 62B:
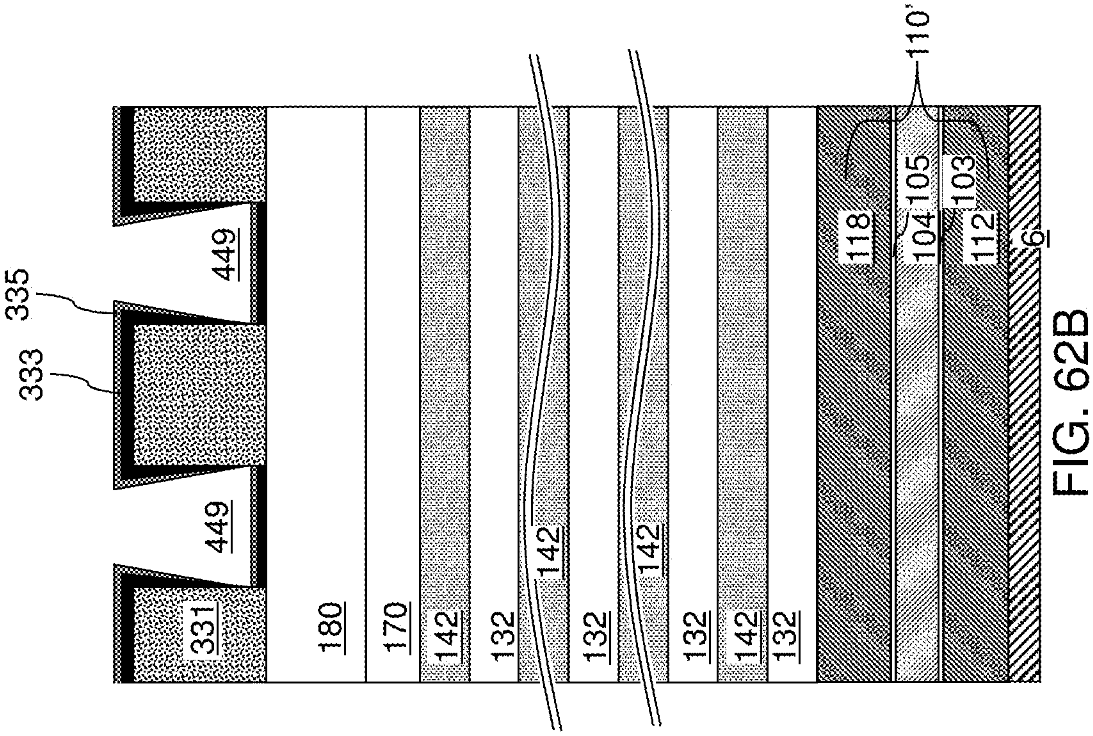
FIGS. 62A-62G are sequential vertical cross-sectional views of a region of a memory opening in a ninth configuration of the fourth exemplary structure during formation of the memory opening according to the fourth embodiment of the present disclosure.
Figure 62A:
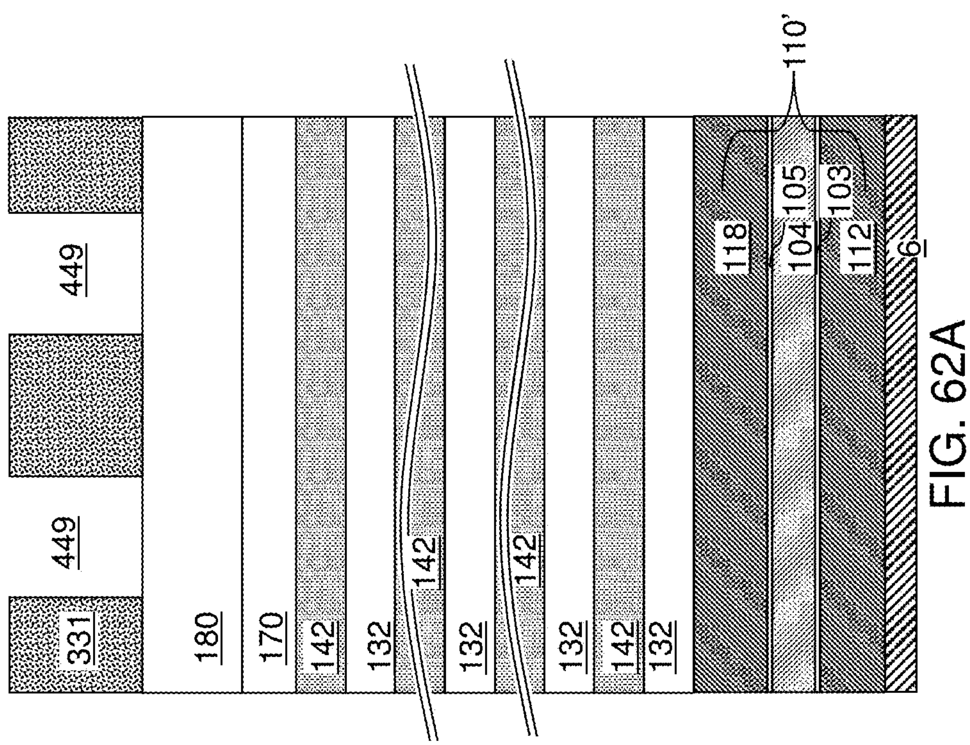

Referring to FIG. 62A, the ninth configuration of the fourth exemplary structure can be derived from the second exemplary structure illustrated in FIGS. 23A-23C by removing the photoresist layer 337 selective to the patterning film 331. Generally, at least one material layer can be formed over a substrate 8, which can be the same as the substrate 8 described above. The at least one material layer may comprise an alternating stack of first material layers and second material layers such as an alternating stack of insulating layers (32, 132) and sacrificial material layers (42, 142) described with reference to the first exemplary structure or the second exemplary structure. The patterning film 331 may have the same material composition as any of the patterning films described above, and may have the same thickness range as any of the patterning films described above. In one embodiment, the patterning film 331 comprises a carbon-based material including carbon at an atomic percentage in a range from 75% to 100%. Discrete openings 449 are formed through the patterning film 331. The discrete openings through the patterning film 331 may comprise at least one two-dimensional array of openings.

Referring to FIG. 62B, a first cladding material can be anisotropically deposited over the patterning film 331 employing a first anisotropic deposition process, such as a physical vapor deposition process or a plasma-enhanced chemical vapor deposition process. The first cladding material may be any of the cladding materials described above. In one embodiment, the first cladding material may be selected from a transition metal, a metal nitride material, a metal carbide material, a semiconductor material, or a dielectric metal oxide material having a dielectric constant greater than 7.9. The deposited first cladding material forms a first cladding material layer 333. The first cladding material layer 333 includes a first horizontally-extending cladding material portion overlying a top surface of the patterning film 331, first cylindrical tapered cladding material portions located on a sidewall of a respective one of the discrete openings 449, and optional first horizontal plate portions located at a bottom of a respective one of the discrete openings 449 and directly on a top surface of an underlying material layer (e.g., layer 180). The optional first horizontal plate portions may be omitted depending on the width of the discrete openings 449 and the deposition process used to deposit the first cladding material layer 333. In one embodiment, the first cylindrical tapered cladding material portions can have a variable lateral thickness that increases with a vertical distance from the substrate 8. The maximum lateral thickness of each first cylindrical tapered cladding material portion may be in a range from 2% to 20%, such as from 5% to 15%, of the maximum lateral dimension of a respective discrete opening 449 in the patterning film 331 in which the respective first cylindrical tapered cladding material portion is formed.

A second cladding material can be anisotropically deposited over the first cladding material layer 333 employing a second anisotropic deposition process, such as a physical vapor deposition process or a plasma-enhanced chemical vapor deposition process. The second cladding material may be any of the cladding materials described above. In one embodiment, the second cladding material may be selected from a transition metal, a metal nitride material, a metal carbide material, a semiconductor material, or a dielectric metal oxide material having a dielectric constant greater than 7.9. In one embodiment, the second cladding material may have a different material composition than the first cladding material. In one embodiment, the second cladding material may comprise a material that can provide a lower etch resistance than the first cladding material during a subsequent main etch process, which may be a reactive ion etch process. The deposited second cladding material forms a second cladding material layer 335. The second cladding material layer 335 includes a second horizontally-extending cladding material portion overlying a top surface of the first horizontally-extending cladding material portion of the first cladding material layer 333, a second cylindrical tapered cladding material portions located on a sidewall of a respective one of the first cylindrical tapered cladding material portions, and an optional second horizontal plate portions overlying a respective one of the first horizontal plate portions of the first cladding material layer 333. In one embodiment, the optional second horizontal plate portions may be omitted. The second cylindrical tapered cladding material portions can have a variable lateral thickness that increases with a vertical distance from the substrate 8. The maximum lateral thickness of each second cylindrical tapered cladding material portion may be in a range from 3% to 30%, such as from 6% to 20%, of the maximum lateral dimension of a respective discrete opening 449 in the patterning film 331 in which the respective second cylindrical tapered cladding material portion is formed. In one embodiment, the lateral thickness of each second cylindrical tapered cladding material portion within a horizontal plane including the top surface of the patterning film 331 can be greater than the lateral thickness of each first cylindrical tapered cladding material portion within the horizontal plane.

In one embodiment, the thickness of the second cladding material layer 335 is less than the thickness of the first cladding material layer 333. For example, the first horizontally-extending cladding material portion of the first cladding material layer 333 may be at least 20% thicker, such as 25% to 500% thicker than the second horizontally-extending cladding material portion of the second cladding material layer 335. In one embodiment, the first and the second cladding material layers (333, 335) may comprise two different metal layers, such as a tantalum layer and a ruthenium layer.

Figure 62D:
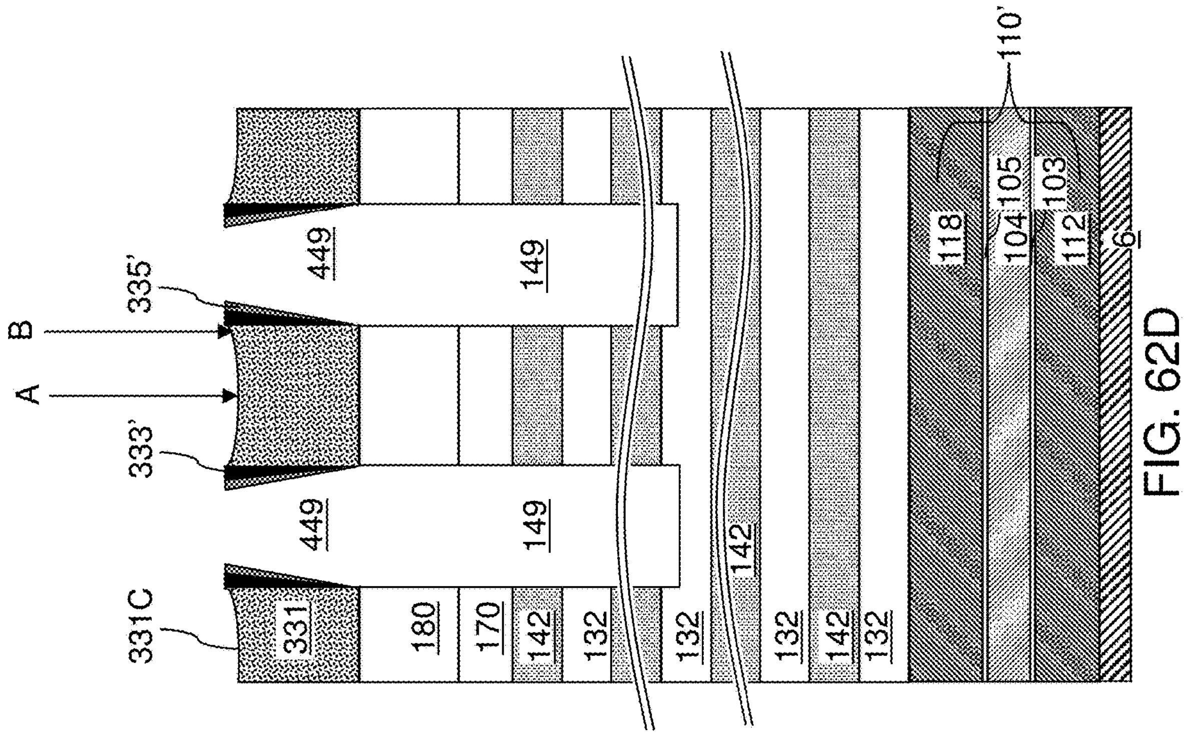
Figure 62C:
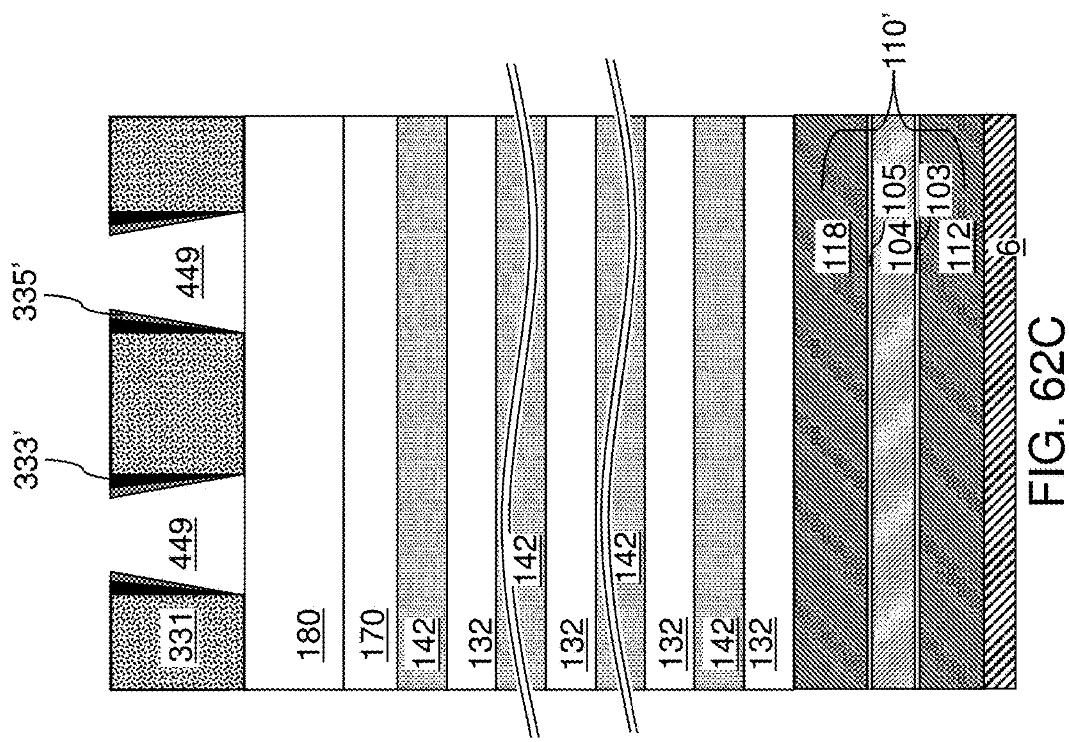

Referring to FIG. 62C, a mask open etch step can be performed to remove the second horizontally-extending cladding material portion and the second horizontal plate portions of the second cladding material layer 335 and the first horizontally-extending cladding material portion and the first horizontal plate portions of the first cladding material layer 333. For example, a mask open anisotropic etch process can be performed to anisotropically etch the second horizontally-extending cladding material portion and the second horizontal plate portions of the second cladding material layer 335 and the first horizontally-extending cladding material portion and the first horizontal plate portions of the first cladding material layer 333. The second cylindrical tapered cladding material portions 335' of the second cladding material layer 335 and the first cylindrical tapered cladding material portions 333' of the first cladding material layer 333 remain after the mask open etch step. Specifically, a nested stack of a first cylindrical tapered cladding material portion 333' and a second cylindrical tapered cladding material portion 335' can be located on a sidewall of each opening 449 through the patterning film 331.

Referring to FIG. 62D, a main etch process can be performed, which anisotropically etches portions of the at least one underlying material layer that underlie the discrete opening in the patterning film 331. The main etch process comprises an anisotropic etch process, such as a reactive ion etch process. The combination of the patterning film 331, the second cylindrical tapered cladding material portions 335', and the first cylindrical tapered cladding material portion 333' can be employed as an etch mask during the anisotropic etch process.

In one embodiment, the patterning film 331 has a higher average collateral etch rate than the second cylindrical tapered cladding material portions 335' and the first cylindrical tapered cladding material portions 333' during the main etch process. Thus, the top surface of the patterning film 331 becomes lower than the top surfaces of the second cylindrical tapered cladding material portions 335' and the first cylindrical tapered cladding material portions 333' by a greater vertical offset distance as the main etch process progresses. The top surface of the patterning film 331 is a concave top surface 331C that functions as the above described ion trap. The ion trap prevents or reduces lateral deflection of the ions used during the reactive ion etch process into the via cavities 149, as described above.

In one embodiment, the main etch process comprises a reactive ion etch process in which a collateral etch rate of the patterning film 331 is limited by a flux of etchant ions. In this case, impinging ions of the reactive ion etch process have a finite angular spread in the impinging direction. Thus, points on the concave top surface 331C of the patterning film 331 that are distal from adjacent openings 449 in the patterning film 331, such as the point A illustrated in FIG. 62D, are bombarded with more ions during the reactive ion etch process than points on the top surface of the patterning film 331 that are partially shielded from the impinging ions on one side, such as the point B illustrated in FIG. 62D. The geometrical shielding effect causes the concave top surface 331C of the patterning film 331 to develop concave surface profiles as the reactive ion etch process progresses.

In one embodiment, the etch rate of the peripheral portion of the etch mask (331, 333', 335') is lower than the etch rate of the central portion of the etch mask (331, 333', 335') during the main etch. For example, the materials of the first and second cylindrical tapered cladding material portions (333', 335) may have a lower etch rate than the carbon based material of the patterning film 331 during the main etch to form the concave top surface 331C of the ion trap.

Figure 62F:
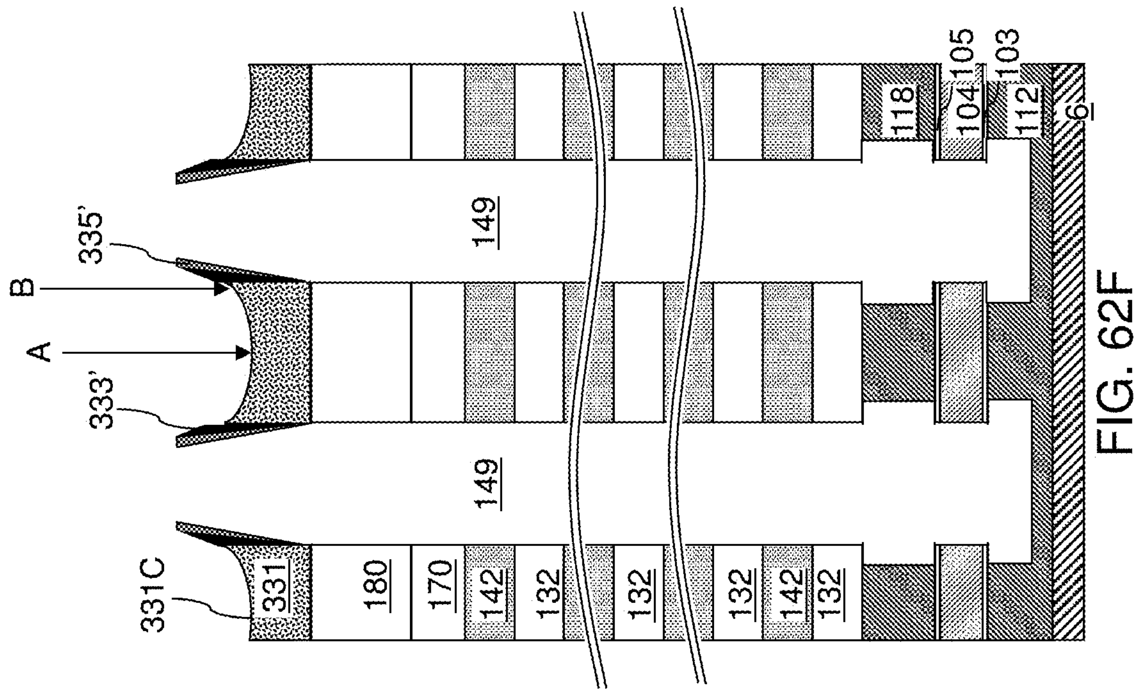
Figure 62E:
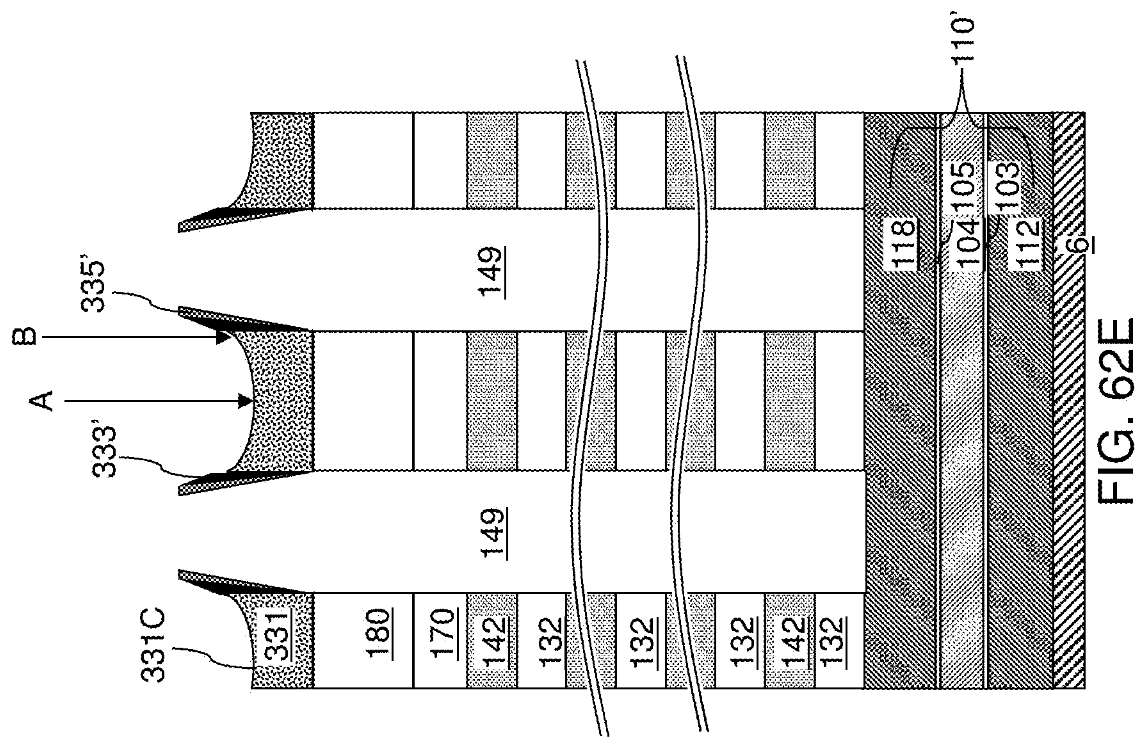

Referring to FIG. 62E, the at least one underlying material layer can be etched through as the main etch process progresses. In one embodiment, the at least one underlying material layer comprises an alternating stack of first insulating layers 132 and first sacrificial material layers 142, or an alternating stack of insulating layers 32 and sacrificial material layers 42. In this case, the alternating stack may be etched through during the anisotropic etch process.

In one embodiment, a collateral etch rate of the first cladding material of the first cylindrical tapered cladding material portions 333' during the main etch process is higher than a collateral etch rate of the second cladding material of the second cylindrical tapered cladding material portions 335' during the main etch process. In one embodiment, a top surface 331C of the patterning film 331 is vertically recessed below a top surface of the first cylindrical tapered cladding material portions 333' such that a region of the top surface 331C of the patterning film 331 that is proximal to a most proximal one of the first cylindrical tapered cladding material portions 333' has a concave surface profile in a terminal portion of the reactive ion etch process. In one embodiment, the top surfaces of the second cylindrical tapered cladding material portion 335' may be more distal from the substrate 8 (i.e., protrude upward higher) than the top surfaces of the first cylindrical tapered cladding material portions 333' in the terminal portion of the reactive ion etch process.

Referring to FIG. 62F, in case the at least one underlying material layer comprises an in-process source-level material layers 110', via openings (such as first-tier memory openings 149 or memory openings 49) may be vertically extended into the in-process source-level material layers 110'.

Figure 62G:
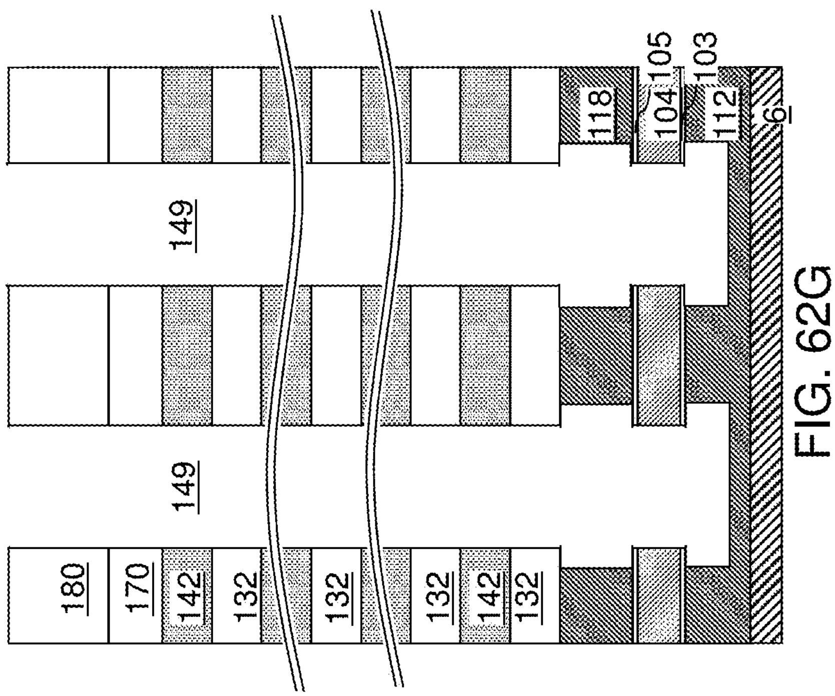

Referring to FIG. 62G, remaining portions of the patterning film 331, the first cylindrical tapered cladding material portions 333', and the second cladding material of the second cylindrical tapered cladding material portions 335' can be removed. For example, an ashing process can be performed to remove the patterning film 331, which lifts off and remove the remaining cladding material portions (333', 335').

Subsequently, various processing steps described above with reference to the first or second exemplary structure may be performed. For example, a memory opening fill structure may be formed in each via opening that is formed through the alternating stack by the main etch process. Each of the memory opening fill structures may comprise a respective vertical semiconductor channel 60 and a respective vertical stack of memory elements.

In one embodiment, the at least one underlying material layer comprises an alternating stack of first material layers and second material layers. In one embodiment, the first material layers comprise insulating layers (132, 32), and the second material layers are formed as, or are subsequently replaced with, electrically conductive layers (146, 46).

The embodiment ion traps can be employed to form via openings with reduced bowing and/or reduced widening of the top portion of the via openings. Vertical cross-sectional profiles of the via openings can be improved, such that memory opening fill structures with enhanced performance and/or with increased process yield are formed in the via openings.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word “comprise” or “include” contemplates all embodiments in which the word “consist essentially of” or the word “consists of” replaces the word “comprise” or “include,” unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a structure, comprising:

forming an alternating stack of first material layers and second material layers over a substrate;

forming a mask layer over the alternating stack;

forming a cavity in the mask layer;

forming a first cladding liner on a sidewall of the cavity in the mask layer; and forming a via opening in the alternating stack by performing an anisotropic etch process that transfers a pattern of the cavity in the mask layer through the alternating stack using a combination of the first cladding liner and the mask layer as an etch mask;

wherein:

the mask layer comprises a first patterning film having a concave upper surface; and the first cladding liner comprises a cylindrical cladding film that is formed by conformally depositing a cladding material layer on physically exposed surfaces of the cavity and over a top surface of the first patterning film and removing horizontally-extending portions of the cladding material layer by anisotropically etching the cladding material layer.

2. The method of claim 1, further comprising:

forming a second patterning film over the cylindrical cladding film and the first patterning film;

forming a masking structure including a discrete opening over the second patterning film, wherein the discrete opening has an areal overlap within an area of the cavity;

transferring a first pattern of the discrete opening in the masking structure through the second patterning film selective to the cylindrical cladding film by performing a first mask open etch step;

transferring a second pattern of an area defined by an inner sidewall of the cylindrical cladding film through the first patterning film by performing a second mask open etch step; and transferring the second pattern through the alternating by performing a main etch process to form the via opening while the concave upper surface functions as an ion trap during the main etch process.

3. The method of claim 2, wherein:

the cavity has a depth that is less than a thickness of the first patterning film; and a recessed surface of the first patterning film is physically exposed at a bottom of the cavity.

4. The method of claim 2, wherein an area of the discrete opening in the masking structure in a plan view is located entirely within an area enclosed by an outer sidewall of the cylindrical cladding film.

5. The method of claim 2, wherein an etch rate of the first patterning film during the main etch process is lower than an etch rate of the cylindrical cladding film during the main etch process.

6. The method of claim 2, wherein the masking structure comprises at least one of a spin-on-glass layer and a spin-on-carbon layer.

7. The method of claim 2, wherein:

the first patterning film comprises a first carbon-based material including carbon at a first atomic percentage in a range from 75% to 100%; and the second patterning film comprises a second carbon-based material including carbon at a second atomic percentage in a range from 75% to 100%.

8. The method of claim 7, wherein the cylindrical cladding film comprises a cladding material that is selected from:

a transition metal;

a metal nitride material;

a metal carbide material;

a semiconductor material; or a dielectric metal oxide material having a dielectric constant greater than 7.9.

9. The method of claim 2, further comprising:

forming a first patterned photoresist layer over the first patterning film, wherein the first patterned photoresist layer includes a first opening therethrough;

anisotropically etching a portion of the first patterning film underneath the first opening in the first patterned photoresist layer to form the cavity in the first patterning film;

removing the first patterned photoresist layer prior to formation of the cylindrical cladding film;

depositing at least one masking material layer over the second patterning film;

forming a second patterned photoresist layer over the at least one masking material layer, wherein the second patterned photoresist layer includes a second opening therethrough; and anisotropically etching a portion of the at least one masking material layer underneath the second opening in the second patterned photoresist layer to form the masking structure.

10. The method of claim 2, wherein:

the main etch process comprises a reactive ion etch process in which a collateral etch rate of the first patterning film is limited by a flux of etchant ions;

a collateral etch rate of the cylindrical cladding film is lower than an average of the collateral etch rate of the first patterning film; and a top surface of the first patterning film is vertically recessed below a top surface of the cylindrical cladding film to form the concave upper surface in a terminal portion of the reactive ion etch process.

11. A method of forming a structure, comprising:

forming an alternating stack of first material layers and second material layers over a substrate;

forming a mask layer over the alternating stack;

forming a cavity in the mask layer;

forming a first cladding liner on a sidewall of the cavity in the mask layer;

forming a via opening in the alternating stack by performing an anisotropic etch process that transfers a pattern of the cavity in the mask layer through the alternating stack using a combination of the first cladding liner and the mask layer as an etch mask; and forming a second cladding liner on first cladding liner located on the sidewall of the cavity in the mask layer, wherein:

the anisotropic etch process that transfers a pattern of the cavity in the mask layer through the alternating stack uses a combination of the first cladding liner, the second cladding liner and the mask layer as the etch mask; and the mask layer comprises a patterning film having a concave upper surface.

12. The method of claim 11, further comprising:

anisotropically depositing a first cladding material over the patterning film to form a first cladding material layer which includes a first horizontally-extending cladding material portion overlying a top surface of the patterning film and a first cylindrical tapered cladding material portion located on a sidewall of the discrete opening;

anisotropically depositing a second cladding material over the first cladding material layer to form a second cladding material layer which includes a second horizontally-extending cladding material portion overlying the first horizontally-extending cladding material portion and a second cylindrical tapered cladding material portion located on a sidewall of the first cylindrical tapered cladding material portion; and anisotropically etching the second horizontally-extending cladding material portion and the first horizontally-extending cladding material portion to form the first cladding liner and the second cladding liner.

13. The method of claim 11, wherein:

the anisotropic etch process that transfers the pattern of the cavity in the mask layer through the alternating stack comprises a main reactive ion etch process; and the concave upper surface functions as an ion trap during the main reactive ion etch process by reducing an amount of ions that are deflected by the mask layer into the via opening.

14. The method of claim 13, wherein:

the patterning film has a higher etch rate than the first and the second cladding liners during the main reactive ion etch process; and the first cladding liner is thicker than the second cladding liner.

15. The method of claim 14, wherein:

a collateral etch rate of the patterning film is limited by a flux of etchant ions during the main reactive ion etch process; and a top surface of the patterning film is vertically recessed below a top surface of the first cladding liner during the main reactive ion etch process to form the concave upper surface during a terminal portion of the main reactive ion etch process.

16. The method of claim 11, wherein the patterning film comprises a carbon-based material including carbon at an atomic percentage in a range from 75% to 100%.

17. The method of claim 16, wherein:

the second cladding liner has a different material composition than the first cladding liner; and each of the first cladding liner and the second cladding liner is independently selected from:

a transition metal;

a metal nitride material;

a metal carbide material;

a semiconductor material; or a dielectric metal oxide material having a dielectric constant greater than 7.9.

18. A method of forming a structure, comprising:

forming an alternating stack of first material layers and second material layers over a substrate;

forming a mask layer over the alternating stack;

forming a cavity in the mask layer;

forming a first cladding liner on a sidewall of the cavity in the mask layer; and forming a via opening in the alternating stack by performing an anisotropic etch process that transfers a pattern of the cavity in the mask layer through the alternating stack using a combination of the first cladding liner and the mask layer as an etch mask; and forming a memory opening fill structure in the via opening, wherein:

the memory opening fill structure comprises a vertical semiconductor channel and a memory film;

the first material layers comprise insulating layers; and the second material layers are formed as or are subsequently replaced with electrically conductive layers.

19. The method of claim 18, wherein the second material layers are formed as electrically conductive layers.

20. The method of claim 18, wherein the second material layers are subsequently replaced with electrically conductive layers.

* * * * *